United States Patent
Umezaki et al.

(10) Patent No.: US 8,520,159 B2
(45) Date of Patent: *Aug. 27, 2013

(54) DISPLAY DEVICE AND ELECTRONIC DEVICE

(75) Inventors: Atsushi Umezaki, Kanagawa (JP); Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/174,895

(22) Filed: Jul. 1, 2011

(65) Prior Publication Data

US 2011/0260169 A1    Oct. 27, 2011

Related U.S. Application Data

(63) Continuation of application No. 11/853,215, filed on Sep. 11, 2007, now Pat. No. 7,978,274.

(30) Foreign Application Priority Data

Sep. 29, 2006   (JP) .................................. 2006-269905

(51) Int. Cl.
*G02F 1/136* (2006.01)
*G02F 1/1343* (2006.01)

(52) U.S. Cl.
USPC ................................. 349/42; 349/41; 349/139

(58) Field of Classification Search
USPC ................... 349/41–43, 139; 257/59, 72, 52, 257/79
See application file for complete search history.

(56) References Cited

U.S. PATENT DOCUMENTS

| | | |
|---|---|---|
| 6,906,385 B2 | 6/2005 | Moon et al. |
| 7,106,292 B2 | 9/2006 | Moon |
| 7,173,676 B2 | 2/2007 | Jeon et al. |
| 7,333,586 B2 | 2/2008 | Jang |

(Continued)

FOREIGN PATENT DOCUMENTS

| | | |
|---|---|---|
| JP | 2004-157508 A | 6/2004 |
| JP | 2004-274050 A | 9/2004 |

(Continued)

OTHER PUBLICATIONS

Jin Young Choi et al.; "P-218L: Late-News Poster: A Compact and Cost-efficient TFT-LCD through the Triple-Gate Pixel Structure"; SID 06 Digest; pp. 274-276; 2006.

(Continued)

*Primary Examiner* — Dung Nguyen
(74) *Attorney, Agent, or Firm* — Fish & Richardson P.C.

(57) ABSTRACT

An object of the invention is to provide a circuit technique which enables reduction in power consumption and high definition of a display device. A switch controlled by a start signal is provided to a gate electrode of a transistor, which is connected to a gate electrode of a bootstrap transistor. When the start signal is input, a potential is supplied to the gate electrode of the transistor through the switch, and the transistor is turned off. The transistor is turned off, so that leakage of a charge from the gate electrode of the bootstrap transistor can be prevented. Accordingly, time for storing a charge in the gate electrode of the bootstrap transistor can be shortened, and high-speed operation can be performed.

16 Claims, 100 Drawing Sheets

(56) References Cited

U.S. PATENT DOCUMENTS

| | | |
|---|---|---|
| 7,486,268 B2 | 2/2009 | Jang et al. |
| 7,529,334 B2 | 5/2009 | Jang |
| 7,535,027 B2 | 5/2009 | Moon et al. |
| 7,842,951 B2 | 11/2010 | Park et al. |
| 7,978,274 B2 * | 7/2011 | Umezaki et al. ............ 349/42 |
| 8,008,690 B2 | 8/2011 | Moon et al. |
| 8,193,833 B2 * | 6/2012 | Inukai ............ 326/112 |
| 2003/0043104 A1 | 3/2003 | Lee et al. |
| 2005/0001805 A1 | 1/2005 | Jeon et al. |
| 2005/0264514 A1 | 12/2005 | Kim et al. |
| 2006/0044247 A1 | 3/2006 | Jang et al. |
| 2006/0227093 A1 | 10/2006 | Jang et al. |
| 2006/0256066 A1 | 11/2006 | Moon |
| 2007/0001991 A1 | 1/2007 | Jang et al. |
| 2007/0024770 A1 | 2/2007 | Jang et al. |
| 2011/0284850 A1 | 11/2011 | Moon et al. |

FOREIGN PATENT DOCUMENTS

| | | |
|---|---|---|
| JP | 2004-334216 A | 11/2004 |
| JP | 2005-181969 A | 7/2005 |
| JP | 2006-080472 A | 3/2006 |
| JP | 2006-190437 A | 7/2006 |
| JP | 2006-293299 A | 10/2006 |
| KR | 2005-0054333 A | 6/2005 |
| KR | 2006-0030697 A | 4/2006 |
| KR | 2006-0076991 A | 7/2006 |

OTHER PUBLICATIONS

YongSoon Lee et al.; "16.2: Adavanced TFT-LCD Data Line Reduction Method"; SID 06 Digest; pp. 1083-1086; 2006.

Chinese Office Action issued in Application No. 200710152981.1 on Jun. 24, 2010, and full English translation, 17 pages.

* cited by examiner

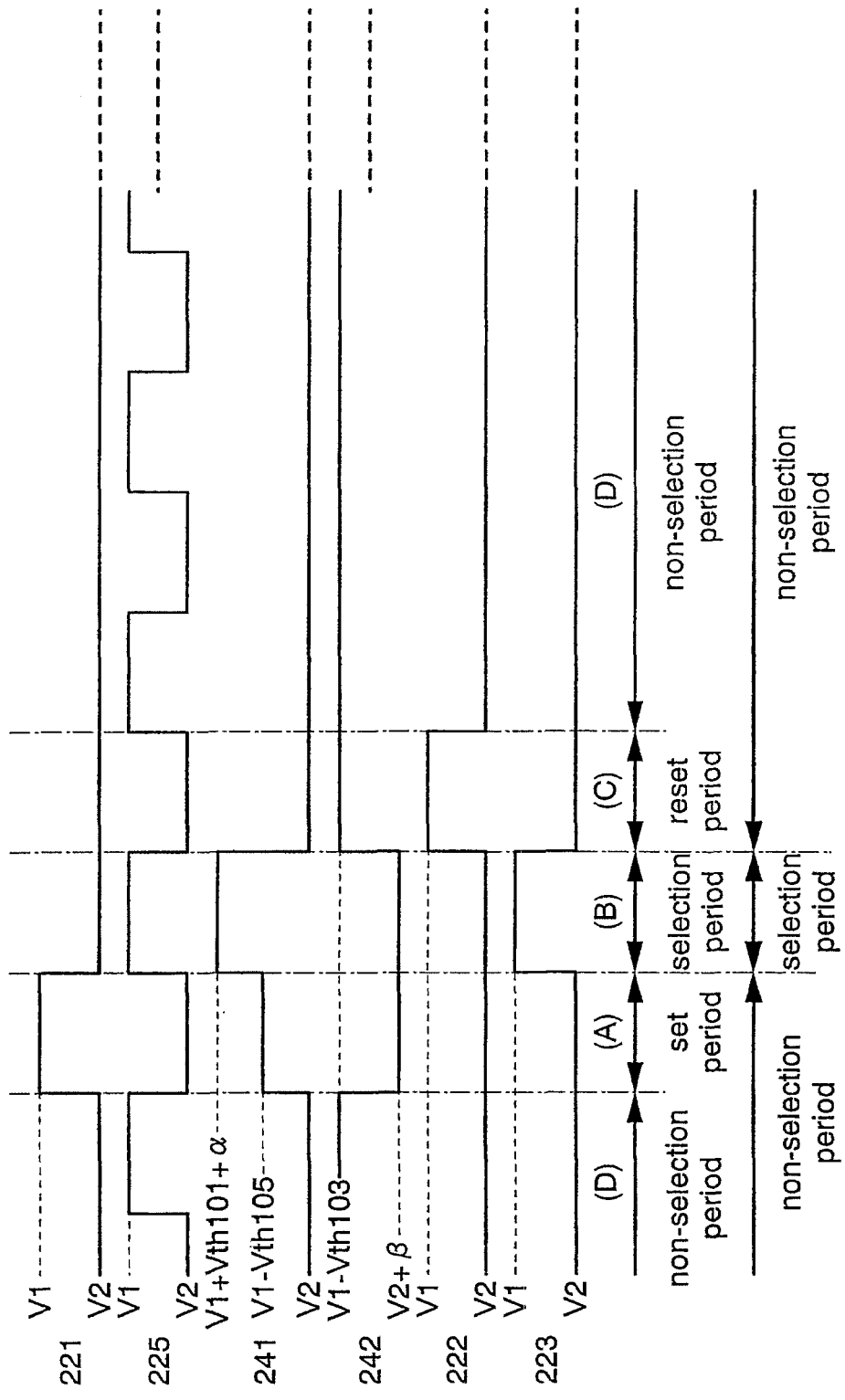

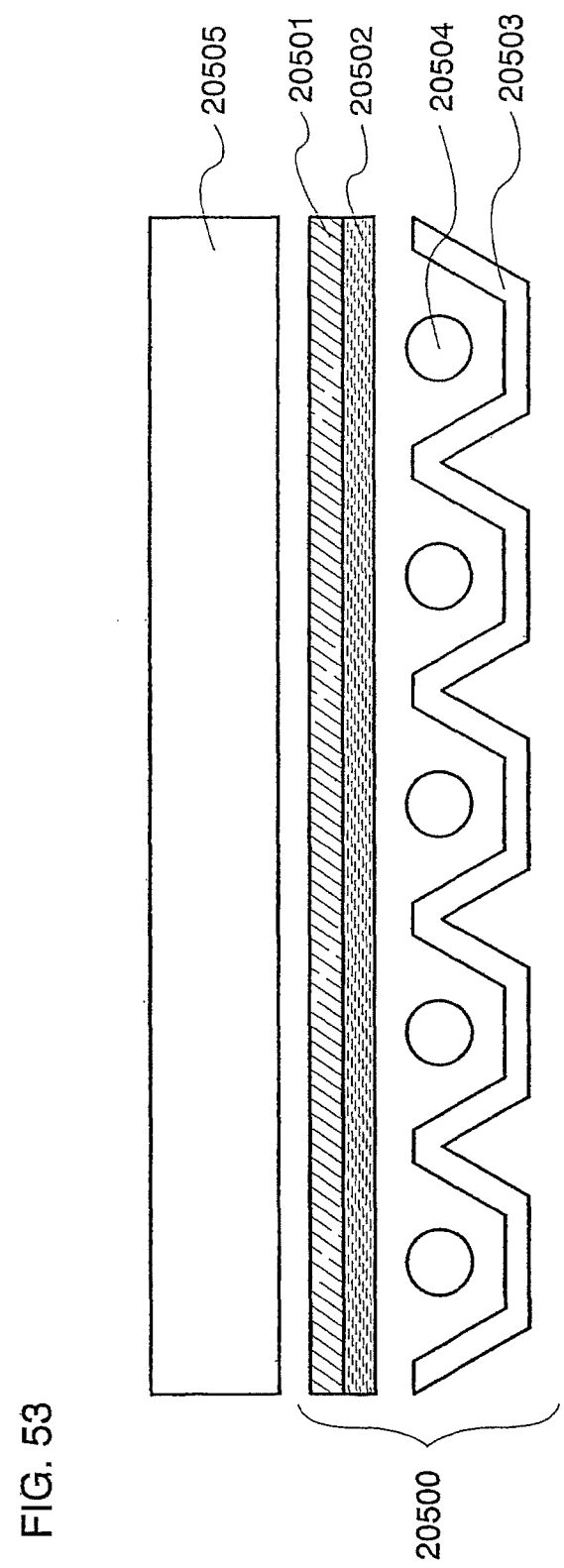

50303 50305 50301 50300

50304 50306 50302

50303 50305 50301 50300

50304 50306 50302

50313 50315 50311 50310

50314 50316 50312

50313 50315 50311 50310

50314 50316 50312

- semiconductor layer
- gate metal
- wiring
- transparent conductive film

FIG. 99A    FIG. 99B
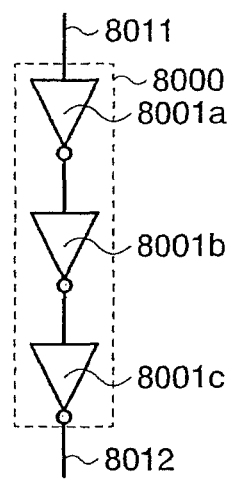
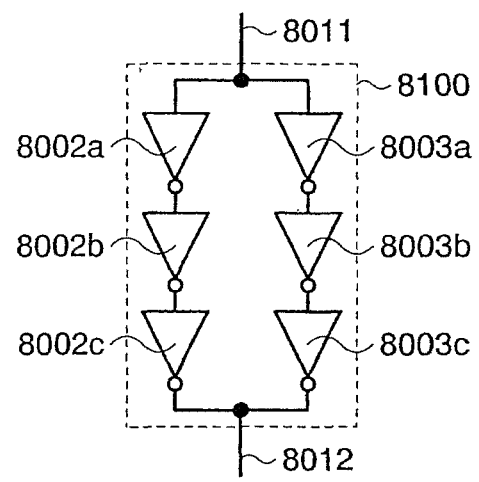
FIG. 99C    FIG. 99D
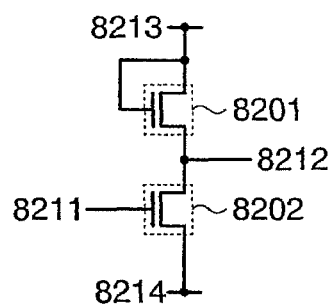
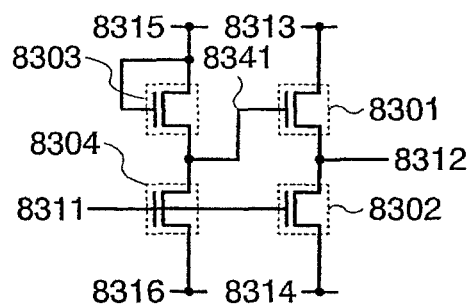

DISPLAY DEVICE AND ELECTRONIC DEVICE

CROSS-REFERENCE TO RELATED APPLICATIONS

This application is a continuation of U.S. application Ser. No. 11/853,215, filed Sep. 11, 2007, now allowed, which claims the benefit of a foreign priority application filed in Japan as Serial No. 2006-269905 on Sep. 29, 2006, both of which are incorporated by reference.

BACKGROUND OF THE INVENTION

1. Field of the Invention

The present invention relates to a display device including a circuit formed using a transistor. In particular, the present invention relates to a display device using an electrooptical element such as a liquid crystal element, a light-emitting element, or the like, and an operation method thereof.

2. Description of the Related Art

In recent years, with the increase of large display devices such as liquid crystal televisions, display devices have been actively developed. In particular, a technique for forming a pixel circuit and a driver circuit including a shift register and the like (hereinafter also referred to as an internal circuit) over the same insulating substrate by using transistors formed of a non-crystalline semiconductor (hereinafter also referred to as amorphous silicon) has been actively developed because the technique greatly contributes to reduction in power consumption and cost. The internal circuit formed over the insulating substrate is connected to a controller IC or the like (hereinafter also referred to as an external circuit) through an FPC (Flexible Printed Circuit) or the like, and its operation is controlled.

Among the aforementioned internal circuits, a shift register using transistors formed of a non-crystalline semiconductor (hereinafter also referred to as amorphous silicon transistors) has been devised. FIG. 100A shows a structure of a flip-flop included in a conventional shift register (Reference 1: Japanese Published Patent Application No. 2004-157508). The flip-flop in FIG. 100A includes a transistor 11 (a bootstrap transistor), a transistor 12, a transistor 13, a transistor 14, a transistor 15, a transistor 16, and a transistor 17, and is connected to a signal line 21, a signal line 22, a wiring 23, a signal line 24, a power supply line 25, and a power supply line 26. A start signal, a reset signal, a clock signal, a power supply potential VDD, and a power supply potential VSS are input to the signal line 21, the signal line 22, the signal line 24, the power supply line 25, and the power supply line 26, respectively. An operation period of the flip-flop in FIG. 100A is divided into a set period, a selection period, a reset period, and a non-selection period as shown in a timing chart in FIG. 100B.

In the set period, an H-level signal is input from the signal line 21 and a potential of a node 41 is increased to VDD−Vth15 (Vth15: a threshold voltage of the transistor 15), so that the node 41 is in a floating state while the transistor 11 is kept on. The transistor 16 is in an on state when an H-level signal is input from the signal line 21; and the transistor 16 is turned off when the transistor 14, a gate electrode of which is connected to the node 41, is turned on and a potential of a node 42 is at L level. That is, a charge is leaked from a gate electrode of the transistor 11 during a period from the time when an H-level signal is input from the signal line 21 until the transistor 16 is turned off.

Here, a signal with a potential of VDD is referred to as an H-level signal, and a signal a potential of which is VSS is referred to as an L-level signal. L level refers to a state where a potential of the L-level signal is VSS.

In display devices in References 2 and 3, a shift register formed of amorphous silicon transistors is used for a scan line driver circuit, and video signals are input to sub-pixels of R, G and B from one signal line, so that the number of signal lines is decreased to one third. Thus, in the display devices in References 2 and 3, the number of connections between a display panel and a driver IC is reduced (Reference 2: Jin Young Choi, et al., "A Compact and Cost-efficient TFT-LCD through the Triple-Gate Pixel Structure", SOCIETY FOR INFORMATION DISPLAY 2006 INTERNATIONAL SYMPOSIUM DIGEST OF TECHNICAL PAPERS, Volume(XXVII, pp. 274-276; and Reference 3: Yong Soon Lee, et al., "Advanced TFT-LCD Data Line Reduction Method", SOCIETY FOR INFORMATION DISPLAY 2006 INTERNATIONAL SYMPOSIUM DIGEST OF TECHNICAL PAPERS, Volume XXXVII, pp. 1083-1086).

SUMMARY OF THE INVENTION

According to the related art, the gate electrode of the bootstrap transistor is in a floating state while the bootstrap transistor is kept on. However, in the related art, time is required to make the gate electrode of the bootstrap transistor in a floating state while the bootstrap transistor is kept on; therefore, there is a problem that high-speed operation cannot be performed. Further, when amorphous silicon is used for a semiconductor layer of a transistor, there is a problem that a threshold voltage of the transistor is shifted. In addition, it has been suggested that the number of signal lines is decreased to one third and the number of connection points between a display panel and a driver IC is reduced (References 2 and 3); practically, the number of connection points of the driver IC is required to be further decreased.

That is, a circuit technique for operating a shift register with high speed and a circuit technique for suppressing variation of a threshold voltage of a transistor remain as problems which cannot be solved by the related art. Further, a technique for reducing the number of connection points of a driver IC mounted on a display panel, reduction in power consumption of a display device, and increase in size or definition of a display device also remain as problems.

In a display device in this specification, a gate electrode of a transistor, which is connected to a gate electrode of a bootstrap transistor, is provided with a switch controlled by a start signal. When the start signal is input, a potential is supplied to the gate electrode of the transistor through the switch, and the transistor is turned off. The transistor is turned off, so that leakage of a charge from the gate electrode of the bootstrap transistor can be prevented. Accordingly, time for storing a charge in the gate electrode of the bootstrap transistor can be shortened, and high-speed operation can be performed.

Note that various types of switches can be used as a switch shown in this document (a specification, a claim, a drawing, and the like). An electrical switch, a mechanical switch, and the like are given as examples. That is, any element can be used without being limited to a particular type as long as it can control a current flow. For example, a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used as a switch. Further, a logic circuit combining such elements can be used as a switch.

In the case where a transistor is used as a switch, polarity (a conductivity type) of the transistor is not particularly limited because it operates just as a switch. However, when off-current is preferably small, a transistor of polarity with smaller off-current is preferably used. However, when less off-current is preferable, a transistor of polarity with less off-current is preferably used. As a transistor with less off-current, a transistor having an LDD region, a transistor having a multi-gate structure, and the like are given as examples. Further, an n-channel transistor is preferably used when a potential of a source terminal of the transistor operating as a switch is close to a low potential side power supply (e.g., Vss, GND, or 0 V). On the other hand, a p-channel transistor is preferably used when the potential of the source terminal of the transistor operating as a switch is close to a high potential side power supply (e.g., Vdd). This is because when the potential of the source terminal of the n-channel transistor operating as a switch is close to a low potential side power supply or the potential of the source terminal of the p-channel transistor operating as a switch is close to a high potential side power supply, an absolute value of a gate-source voltage can be increased; thus, on/off of the switch can be easily switched. This is also because reduction in output voltage does not often occur since the transistor does not often perform a source follower operation.

A CMOS switch may also be employed by using both n-channel and p-channel transistors. A CMOS switch can easily function as a switch because current can flow when one of the n-channel transistor and the p-channel transistor is turned on. For example, a voltage can be output as appropriate whether a voltage of an input signal to the switch is high or low. Further, since a voltage amplitude value of a signal for turning on/off a switch can be decreased, power consumption can be reduced.

When a transistor is used as a switch, the switch includes an input terminal (one of a source terminal and a drain terminal), an output terminal (the other of the source terminal and the drain terminal), and a terminal (a gate terminal) for controlling electrical conduction. On the other hand, when a diode is used as a switch, the switch does not have a terminal for controlling electrical conduction in some cases. Therefore, when a diode is used as a switch, the number of wirings for controlling terminals can be reduced compared with the case where a transistor is used as a switch.

In this specification, when it is explicitly described that A and B are connected, the case where A and B are electrically connected, the case where A and B are functionally connected, and the case where A and B are directly connected are included. Here, each of A and B is an object (e.g., a device, an element, a circuit, a wiring, an electrode, a terminal, a conductive film, or a layer). Accordingly, in structures disclosed in this specification, another element may be provided in a connection relationship shown in drawings and texts, without being limited to a predetermined connection relationship, for example, connection relationships shown in the drawings and the texts.

For example, when A and B are electrically connected, one or more elements which enable electrical connection of A and B (e.g., a switch, a transistor, a capacitor, an inductor, a resistor, or a diode) may be provided between A and B. In addition, when A and B are functionally connected, one or more circuits which enable functional connection of A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a voltage step-up circuit or a voltage step-down circuit) or a level shifter circuit for changing a potential level of a signal; a voltage source; a current source; a switching circuit; or an amplifier circuit which can increase signal amplitude, the amount of current, or the like, such as an operational amplifier, a differential amplifier circuit, a source follower circuit, or a buffer circuit; a signal generation circuit; a memory circuit; or a control circuit may be provided between A and B. Alternatively, in the case where A and B are directly connected, A and B may be directly connected without interposing another element or another circuit therebetween.

When it is explicitly described that A and B are directly connected, the case where A and B are directly connected (i.e., the case where A and B are connected without interposing another element or another circuit therebetween) and the case where A and B are electrically connected (i.e., the case where A and B are connected by interposing another element or another circuit therebetween) are included.

When it is explicitly described that A and B are electrically connected, the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included. That is, when it is explicitly described that A and B are electrically connected, the description is the same as the case where it is explicitly only described that A and B are connected.

A display element, a display device which is a device including a display element, a light-emitting element, and a light-emitting device which is a device including a light-emitting element can employ various types and can include various elements. For example, as a display element, a display device, a light-emitting element, and a light-emitting device, a display medium, contrast, luminance, reflectivity, transmittance, or the like of which is changed by electromagnetic action, such as an EL element (e.g., an organic EL element, an inorganic EL element, or an EL element including both organic and inorganic materials), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used. Note that display devices using an EL element include an EL display; display devices using an electron emitter include a field emission display (FED), an SED-type flat panel display (SED: Surface-conduction Electron-emitter Display), and the like; display devices using a liquid crystal element include a liquid crystal display (e.g., a transmissive liquid crystal display, a transflective liquid crystal display, a reflective liquid crystal display, a direct-view liquid crystal display, or a projection type liquid crystal display); and display devices using electronic ink include electronic paper.

As a transistor disclosed in this document (the specification, the claim, the drawing, and the like), various types of transistors can be employed without being limited to a certain type. For example, a thin film transistor (TFT) including a non-single crystalline semiconductor film typified by amorphous silicon, polycrystalline silicon, microcrystalline (also referred to as semi-amorphous) silicon, or the like can be used. The use of the TFT has various advantages. For example, since the TFT can be formed at temperature lower than that of the case of using single crystalline silicon, reduction in manufacturing cost or increase in size of a manufacturing device can be realized. A transistor can be formed using a large substrate with increase in size of the manufacturing device. Therefore, a large number of display devices can be formed at low cost at the same time. Further, since manufacturing temperature is low, a substrate having low heat resistance can be used. Accordingly, a transistor can be formed over a light-transmitting substrate; thus, transmission of light in a display element can be controlled by using the transistor formed over the light-transmitting substrate. Alternatively, since the thickness of the transistor is thin, part of a film forming the transistor can transmit light; thus, an aperture ratio can be increased.

The use of a catalyst (e.g., nickel) when polycrystalline silicon is formed enables further improvement in crystallinity and formation of a transistor having excellent electrical characteristics. Thus, a gate driver circuit (a scan line driver circuit), a source driver circuit (a signal line driver circuit), and a signal processing circuit (e.g., a signal generation circuit, a gamma correction circuit, a DA converter circuit) can be formed over the same substrate.

The use of a catalyst (e.g., nickel) when microcrystalline silicon is formed enables further improvement in crystallinity and formation of a transistor having excellent electrical characteristics. At this time, crystallinity can be improved by performing only heat treatment without using laser. Thus, a gate driver circuit (a scan line driver circuit) and part of a source driver circuit (e.g., an analog switch) can be formed over the same substrate. Further, when a laser is not used for crystallization, unevenness of silicon crystallinity can be suppressed. Therefore, an image with high image quality can be displayed.

Note that polycrystalline silicon and microcrystalline silicon can be formed without using a catalyst (e.g., nickel).

A transistor can be formed using a semiconductor substrate, an SOI substrate, or the like. In this case, a MOS transistor, a junction transistor, a bipolar transistor, or the like can be used as a transistor described in this specification. Therefore, a small transistor with few variations in characteristics, sizes, shapes, or the like, with high current supply capacity can be formed. By using such a transistor, reduction in power consumption or high integration of circuits can be realized.

A transistor including a compound semiconductor or an oxide semiconductor such as zinc oxide (ZnO), amorphous oxide (a-InGaZnO), silicon germanium (SiGe), gallium arsenide (GaAs), indium zinc oxide (IZO), indium tin oxide (ITO), or tin oxide (SnO), or a thin film transistor or the like obtained by thinning such a compound semiconductor or a oxide semiconductor can be used. Therefore, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a transparent electrode. Further, since such an element can be formed at the same time as the transistor, cost can be reduced.

A transistor or the like formed by using an inkjet method or a printing method can also be used. Accordingly, the transistor can be formed at room temperature or at a low vacuum, or can be formed over a large substrate. In addition, since the transistor can be formed without using a mask (a reticle), layout of the transistor can be easily changed. Further, since it is not necessary to use a resist, material cost is reduced and the number of steps can be reduced. Furthermore, since a film is partially formed as appropriate, a material is not wasted and cost can be reduced compared with a manufacturing method in which etching is performed after the film is formed over the entire surface.

A transistor or the like including an organic semiconductor or a carbon nanotube can also be used. Accordingly, a transistor can be formed using a substrate which can be bent. Therefore, a device using the transistor including the organic semiconductor or the carbon nanotube, or the like can resist a shock.

In addition, various other transistors can be used.

A transistor can be formed using various types of substrates. The type of a substrate is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human may be used as a substrate. In addition, the transistor may be formed using one substrate, and then, the transistor may be transferred to another substrate. As a substrate to which the transistor is transferred, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, a skin (e.g., epidermis or corium) or hypodermal tissue of an animal such as a human may be used as a substrate to which the transistor is transferred. By using such a substrate, a transistor with excellent properties or a transistor with low power consumption can be formed, a device with high durability or high heat resistance can be formed, or reduction in weight can be realized.

A structure of a transistor can be various modes without being limited to a certain structure. For example, a multi-gate structure having two or more gate electrodes may be used. When the multi-gate structure is used, a structure where a plurality of transistors are connected in series is provided since channel regions are connected in series. The multi-gate structure realizes reduction in off-current or improvement in reliability due to improvement in withstand voltage of the transistor. Alternatively, by using the multi-gate structure, drain-source current does not change much even if drain-source voltage changes when the transistor operates in a saturation region; thus, voltage-current characteristics with a flat slope can be obtained. By utilizing the voltage-current characteristics with the flat slope, an ideal current source circuit or an active load having an extremely high resistance value can be realized. Thus, a differential circuit or a current mirror circuit having excellent properties can be realized. In addition, a structure where gate electrodes are formed above and below a channel may be used. By using the structure where gate electrodes are formed above and below the channel, a channel region is enlarged, the amount of current can be increased because the number of channel regions is increased, or an S-value can be reduced because a depletion layer is easily formed. When the gate electrodes are formed above and below the channel, a plurality of transistors are connected in parallel.

Further, a structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be employed. In addition, a source electrode or a drain electrode may overlap with a channel region (or part thereof). By using the structure where the source electrode or the drain electrode may overlap with the channel region (or part thereof), an unstable operation due to accumulation of charge in part of the channel region can be prevented. Further, an LDD region may be provided. By providing the LDD region, off-current can be reduced or the withstand voltage of the transistor can be increased to improve reliability. Alternatively, drain-source current does not fluctuate much even if drain-source voltage fluctuates when the transistor operates in the saturation region, so that characteristics where a slope of voltage-current characteristics is flat can be obtained.

Various types of transistors can be used for a transistor in this specification and the transistor can be formed using various types of substrates. Accordingly, all of circuits which are necessary to realize a predetermined function may be formed using the same substrate. For example, all of the circuits which are necessary to realize the predetermined function may be formed using a glass substrate, a plastic substrate, a single crystalline substrate, an SOI substrate, or any other substrate. When all of the circuits which are necessary to realize the predetermined function are formed using the same substrate, the number of component parts can be reduced to cut cost and the number of connections between circuit components can be reduced to improve reliability. Alternatively, part of the circuits which are necessary to realize the predetermined function may be formed using one substrate and another part of the circuits which are necessary to realize the predetermined function may be formed using another substrate. That is, not all of the circuits which are necessary to realize the predetermined function are required to be formed using the same substrate. For example, part of the circuits which are necessary to realize the predetermined function may be formed using transistors over a glass substrate and another part of the circuits which are necessary to realize the predetermined function may be formed using a single crystalline substrate, so that an IC chip formed by a transistor on the single crystalline substrate may be connected to the glass substrate by COG (Chip On Glass) and the IC chip may be provided over the glass substrate. Alternatively, the IC chip may be connected to the glass substrate by TAB (Tape Automated Bonding) or a printed wiring board. When part of the circuits are formed using the same substrate in this manner, the number of the component parts can be reduced to cut cost and the number of connections between the circuit components can be reduced to improve reliability. In addition, since circuits in a portion with high driving voltage or a portion with high driving frequency consume large power, the circuits in such portions are formed using a single crystalline substrate and using an IC chip formed by the circuit instead of using the same substrate; thus, increase in power consumption can be prevented.

In this specification, one pixel corresponds to one element brightness of which can be controlled. For example, one pixel corresponds to one color element and brightness is expressed with the one color element. Accordingly, in the case of a color display device having color elements of R (Red), G (Green), and B (Blue), the minimum unit of an image is formed of three pixels of an R pixel, a G pixel, and a B pixel. Note that the color elements are not limited to three colors, and color elements of more than three colors may be used or a color other than RGB may be added. For example, RGBW may be used by adding W (white). In addition, RGB added with one or more colors of yellow, cyan, magenta emerald green, vermilion, and the like may be used. Further, a color similar to at least one of R, G, and B may be added to RGB. For example, R, B1, and B2 may be used. Although both B1 and B2 are blue, they have slightly different frequency. Similarly, R1, R2, G, and B may be used. By using such color elements, display which is closer to the real object can be performed and power consumption can be reduced. As another example, in the case of controlling brightness of one color element by using a plurality of regions, one region may correspond to one pixel. For example, in the case of performing area ratio gray scale display or the case of including a subpixel, a plurality of regions which control brightness are provided in each color element and gray scales are expressed with all of the regions, and one region which controls brightness may correspond to one pixel. In that case, one color element includes a plurality of pixels. Alternatively, even when the plurality of the regions which control brightness are provided in one color element, these regions may be collected as one pixel. In that case, one color element includes one pixel. Further, when brightness is controlled by a plurality of regions in one color element, regions which contribute to display may have different area dimensions depending on pixels. In that case, in the plurality of the regions which control brightness in one color element, signals supplied to each region may be slightly varied to widen a viewing angle. That is, potentials of pixel electrodes included in the plurality of the regions in one color element may be different from each other. Accordingly, voltages applied to liquid crystal molecules are varied depending on the pixel electrodes. Therefore, the viewing angle can be widened.

Note that when it is explicitly described as one pixel (for three colors), it corresponds to the case where three pixels of R, G, and B are considered as one pixel. When it is explicitly described as one pixel (for one color), it corresponds to the case where the plurality of the regions are provided in each color element and collectively considered as one pixel.

In this document, pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. For example, in the case of performing full color display with three color elements (e.g., RGB), the following cases are included therein: the case where the pixels are arranged in stripes, the case where dots of the three color elements are arranged in a delta pattern, and the case where dots of the three color elements are provided in Bayer arrangement. Note that the color elements are not limited to three colors, and color elements of more than three colors may be employed, for example, RGBW (W corresponds to white), RGB added with one or more of yellow, cyan, magenta, and the like, or the like. Further, the size of display regions may be different between respective dots of color elements. Thus, power consumption can be reduced or the life of a light-emitting element can be prolonged.

In this document, an active matrix method in which an active element is included in a pixel or a passive matrix method in which an active element is not included in a pixel can be used.

In the active matrix method, as an active element (a non-linear element), not only a transistor but also various active elements (non-linear elements), for example, a MIM (Metal Insulator Metal), a TFD (Thin Film Diode), or the like can be used. Since such an element has few number of manufacturing steps, manufacturing cost can be reduced or a yield can be improved. Further, since the size of the element is small, an aperture ratio can be improved, and power consumption can be reduced and high luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Further, since an active element (a non-linear element) is not used, the aperture ratio can be improved, and power consumption can be reduced and high luminance can be achieved.

A transistor is an element having at least three terminals of a gate, a drain, and a source. The transistor includes a channel region between a drain region and a source region, and current can flow through the drain region, the channel region, and the source region. Here, since the source and the drain of the transistor may change depending on a structure, operating conditions, and the like of the transistor, it is difficult to define which is a source or a drain. Therefore, in this specification, a region functioning as a source and a drain is not called the source or the drain in some cases. In such a case, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a source region and the other thereof may be referred to as a drain region.

A transistor may be an element having at least three terminals of a base, an emitter, and a collector. In this case also, one of the emitter and the collector may be referred to as a first terminal and the other terminal may be referred to as a second terminal.

A gate corresponds to all or part of a gate electrode and a gate wiring (also referred to as a gate line, a gate signal line, a scan line, a scan signal line, or the like). A gate electrode corresponds to a conductive film which overlaps with a semiconductor forming a channel region with a gate insulating film interposed therebetween. Note that part of the gate electrode overlaps with an LDD (Lightly Doped Drain) region, the source region, or the drain region with the gate insulating film interposed therebetween in some cases. A gate wiring corresponds to a wiring for connecting a gate electrode of each transistor to each other, a wiring for connecting a gate electrode included in each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (the region, the conductive film, the wiring, or the like) functions as both a gate wiring and a gate electrode. Accordingly, such a portion (a region, a conductive film, a wiring, or the like) may be called either a gate electrode or a gate wiring.

A portion (a region, a conductive film, a wiring, or the like) which is formed of the same material as a gate electrode and forms the same island as the gate electrode to be connected to the gate electrode may also be called a gate electrode. Similarly, a portion (a region, a conductive film, a wiring, or the like) which is formed of the same material as a gate wiring and forms the same island as the gate wiring to be connected to the gate wiring may be called a gate wiring. In a strict sense, such a portion (a region, a conductive film, a wiring, or the like) does not overlap with a channel region or does not have a function to connect the gate electrode to another gate electrode in some cases. However, there is a portion (a region, a conductive film, a wiring, or the like) which is formed of the same material as a gate electrode or a gate wiring and forms the same island as the gate electrode or the gate wiring to be connected to the gate electrode or the gate wiring. Thus, such a portion (a region, a conductive film, a wiring, or the like) may also be called either a gate electrode or a gate wiring.

In a multi-gate transistor, for example, a gate electrode of one transistor is often connected to a gate electrode of another transistor by using a conductive film which is formed of the same material as the gate electrode. Since such a portion (a region, a conductive film, a wiring, or the like) is a portion (a region, a conductive film, a wiring, or the like) for connecting the gate electrode and another gate electrode, it may be called a gate wiring, and it may also be called a gate electrode since a multi-gate transistor can be considered as one transistor. That is, a portion (a region, a conductive film, a wiring, or the like) which is formed of the same material as a gate electrode or a gate wiring and forms the same island as the gate electrode or the gate wiring to be connected to the gate electrode or the gate wiring may be called either a gate electrode or a gate wiring. In addition, part of a conductive film which connects the gate electrode and the gate wiring and is formed of a material different from that of the gate electrode and the gate wiring may also be called either a gate electrode or a gate wiring.

A gate terminal corresponds to part of a portion (a region, a conductive film, a wiring, or the like) of a gate electrode or a portion (a region, a conductive film, a wiring, or the like) which is electrically connected to the gate electrode.

When a gate electrode is called a gate wiring, a gate line, a gate signal line, a scan line, a scan signal line, or the like, there is the case where a gate of a transistor is not connected to a wiring. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. As examples, a wiring for storage capacitance, a power supply line, a reference potential supply line, and the like can be given.

A source corresponds to all or part of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, namely, an LDD (Lightly Doped Drain) region is not included in the source region. A source electrode is part of a conductive layer formed of a material different from that of a source region and electrically connected to the source region. However, there is the case where a source electrode and a source region are collectively called a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in the case where a source region overlaps with part of an extended source wiring, the overlapped portion (the region, the conductive film, the wiring, or the like) functions as both a source wiring and a source electrode. Accordingly, such a portion (a region, a conductive film, a wiring, or the like) may be called either a source electrode or a source wiring.

A portion (a region, a conductive film, a wiring, or the like) which is formed of the same material as a source electrode and forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a region which is formed of the same material as a source wiring and forms the same island as the source wiring to be connected to the source wiring may also be called a source wiring. In a strict sense, such a portion (a region, a conductive film, a wiring, or the like) does not overlap with a channel region or does not have a function to connect the source electrode to another source electrode in some cases. However, there is a portion (a region, a conductive film, a wiring, or the like) which is formed of the same material as a source electrode or a source wiring and forms the same island as the source electrode or the source wiring to be connected to the source electrode or the source wiring. Thus, such a portion (a region, a conductive film, a wiring, or the like) may also be called either a source electrode or a source wiring.

For example, part of a conductive film which connects a source electrode and a source wiring and is formed of a material which is different from that of the source electrode or the source wiring may be called either a source electrode or a source wiring.

A source terminal corresponds to part of a source region, a source electrode, or a portion (a region, a conductive film, a wiring, or the like) which is electrically connected to the source electrode.

When a source electrode is called a source wiring, a source line, a source signal line, a data line, a data signal line, or the like, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed of the same material of the source (the drain) of the transistor, or a wiring formed at the same time as the source (the drain) of the transistor in some cases. As examples, a wiring for storage capacitance, a power supply line, a reference potential supply line, and the like can be given.

Note that a drain is similar to the source.

A semiconductor device corresponds to a device having a circuit including a semiconductor element (e.g., a transistor, a diode, or a thyristor). The semiconductor device may also include all devices which can function by utilizing semiconductor characteristics.

A display element corresponds to an optical modulation element, a liquid crystal element, a light-emitting element, an EL element (an organic EL element, an inorganic EL element, or an EL element including both organic and inorganic materials), an electron-emissive element, an electrophoresis element, a discharging element, a light-reflecting element, a light diffraction element, a DMD, or the like. Note that the present invention is not limited thereto.

A display device corresponds to a device including a display element. Note that the display device also refers to a display panel itself in which a plurality of pixels including display elements are formed over the same substrate as a peripheral driver circuit for driving the pixels. In addition, the display device may also include a peripheral driver circuit provided over a substrate by wire bonding or bump bonding, namely, an IC chip connected by so-called COG, TAB, or the like. Further, the display device may also include a FPC to which an IC chip, a resistor, a capacitor, an inductor, a transistor, or the like is attached. The display device may also include a printed wiring board (PWB) which is connected through an FPC and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

A lighting device corresponds to a device including a backlight unit, a light guide plate, a prism sheet, a diffusion sheet, a reflective sheet, a light source (e.g., an LED, a cold cathode fluorescent lamp, or a hot cathode fluorescent lamp), a cooling device, or the like.

A light-emitting device corresponds to a display device including a light-emitting element.

A reflective device corresponds to a device including a light-reflecting element, a light diffraction element, a light reflecting electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

A driving device corresponds to a device including a semiconductor element, an electric circuit, or an electronic circuit. For example, a transistor (also referred to as a selection transistor, a switching transistor, or the like) which controls input of a signal from a source signal line to a pixel, a transistor which supplies voltage or current to a pixel electrode, a transistor which supplies voltage or current to a light-emitting element, and the like are examples of the driving device. A circuit (also referred to as a gate driver, a gate line driver circuit, or the like) which supplies a signal to a gate signal line, a circuit (also referred to as a source driver, a source line driver circuit, or the like) which supplies a signal to a source signal line are also examples of the driving device.

A display device, a semiconductor device, a lighting device, a cooling device, a light-emitting device, a reflective device, a driving device, and the like overlap with each other in some cases. For example, a display device includes a semiconductor device and a light-emitting device in some cases. Further, a semiconductor device includes a display device and a driving device in some cases.

In this document, when it is explicitly described that B is formed on A or that B is formed over A, it does not necessarily mean that B is formed in direct contact with A. The description includes the case where A and B are not in direct contact with each other, that is, the case where another object is interposed between A and B. Here, each of A and B corresponds to an object (e.g., a device, an element, a circuit, a wiring, an electrode, a terminal, a conductive film, or a layer).

For example, when it is explicitly described that a layer B is formed on (or over) a layer A, it includes both the case where the layer B is formed in direct contact with the layer A, and the case where another layer (e.g., a layer C or a layer D) is formed in direct contact with the layer A and the layer B is formed over the layer C or D. Note that another layer (e.g., a layer C or a layer D) may be a single layer or a plurality of layers.

Similarly, when it is explicitly described that B is formed above A, it does not necessarily mean that B is in direct contact with A, and another object may be interposed between A and B. For example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed over the layer C or D. Note that another layer (e.g., a layer C or a layer D) may be a single layer or a plurality of layers.

When it is explicitly described that B is formed in direct contact with A, it does not include the case where another object is interposed between A and B and only includes the case where B is formed in direct contact with A.

Note that the same can be said when it is explicitly described that B is formed below or under A.

With a structure disclosed in this specification, a shift register can operate with high speed. In particular, even when amorphous silicon is used as a semiconductor layer of a transistor, a shift register can operate with high speed. Therefore, a semiconductor device such as a liquid crystal display device, to which the shift register is applied, can operate with high speed, and increase in size or high definition of the semiconductor device can be easily realized.

BRIEF DESCRIPTION OF THE DRAWINGS

FIG. 2 is a timing chart showing operations of the flip-flop shown in FIGS. 1A to 1C.

FIG. 53 shows a peripheral component of a semiconductor device according to the invention.

FIGS. 99A to 99D each show a structure of the buffer shown in FIG. 10.

DETAILED DESCRIPTION OF THE INVENTION

Figure 1A:
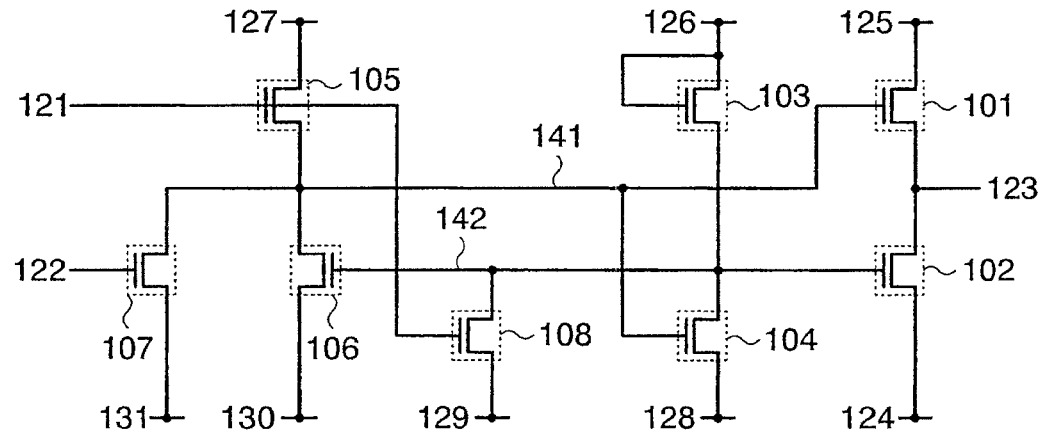
FIGS. 1A to 1C each show a structure of a flip-flop shown in Embodiment Mode 1.

Hereinafter, embodiment modes of the present invention will be described with reference to drawings. However, the present invention is not limited to the following description, and it is easily understood by those skilled in the art that modes and details can be variously changed without departing from the scope and the spirit of the present invention. Therefore, the present invention is not construed as being limited to description of the embodiment modes. Note that in structure of the embodiment modes described hereinafter, the same portions or portions having similar functions are denoted by the same reference numerals in different drawings, and repeated description is omitted.

Embodiment Mode 1

In this embodiment mode, structures and driving methods of a flip-flop, a driver circuit including the flip-flop, and a display device including the driver circuit are described.

A basic structure of a flip-flop in this embodiment mode is described with reference to FIG. 1A. A flip-flop of FIG. 1A includes a first transistor 101, a second transistor 102, a third transistor 103, a fourth transistor 104, a fifth transistor 105, a sixth transistor 106, a seventh transistor 107, and an eighth transistor 108. In this embodiment mode, the first transistor 101, the second transistor 102, the third transistor 103, the fourth transistor 104, the fifth transistor 105, the sixth transistor 106, the seventh transistor 107, and the eighth transistor 108 are n-channel transistors and each of them is turned on when a gate-source voltage (Vgs) exceeds a threshold voltage (Vth).

In the flip-flop in this embodiment mode, all the first to eighth transistors 101 to 108 are n-channel transistors. Further, in the flip-flop in this embodiment mode, amorphous silicon can be used as a semiconductor layer of each transistor. Therefore, simplification of a manufacturing process, reduction in manufacturing cost, and improvement in yield can be realized. Even when polysilicon or single crystalline silicon is used as the semiconductor layer of the transistor, simplification of a manufacturing process can be realized.

Connection relationships of the flip-flop in FIG. 1A are described. A first electrode (one of a source electrode and a drain electrode) of the first transistor 101 is connected to a fifth wiring 125, and a second electrode (the other of the source electrode and the drain electrode) of the first transistor 101 is connected to a third wiring 123. A first electrode of the second transistor 102 is connected to a fourth wiring 124, and a second electrode of the second transistor 102 is connected to the third wiring 123. A first electrode of the third transistor 103 is connected to a sixth wiring 126, a second electrode of the third transistor 103 is connected to a gate electrode of the second transistor 102, and a gate electrode of the third transistor 103 is connected to the sixth wiring 126. A first electrode of the fourth transistor 104 is connected to an eighth wiring 128, a second electrode of the fourth transistor 104 is connected to the gate electrode of the second transistor 102, and a gate electrode of the fourth transistor 104 is connected to a gate electrode of the first transistor 101. A first electrode of the fifth transistor 105 is connected to a seventh wiring 127, a second electrode of the fifth transistor 105 is connected to the gate electrode of the first transistor 101, and a gate electrode of the fifth transistor 105 is connected to the first wiring 121. A first electrode of the sixth transistor 106 is connected to a tenth wiring 130, a second electrode of the sixth transistor 106 is connected to the gate electrode of the first transistor 101, and a gate electrode of the sixth transistor 106 is connected to the gate electrode of the second transistor 102. A first electrode of the seventh transistor 107 is connected to an eleventh wiring 131, a second electrode of the seventh transistor 107 is connected to the gate electrode of the first transistor 101, and a gate electrode of the seventh transistor 107 is connected to the second wiring 122. A first electrode of the eighth transistor 108 is connected to a ninth wiring 129, a second electrode of the eighth transistor 108 is connected to the gate electrode of the second transistor 102, and a gate electrode of the eighth transistor 108 is connected to the first wiring 121.

A connection point of the gate electrode of the first transistor 101, the gate electrode of the fourth transistor 104, the second electrode of the fifth transistor 105, the second electrode of the sixth transistor 106, and the second electrode of the seventh transistor 107 are denoted by a node 141. A connection point of the gate electrode of the second transistor 102, the second electrode of the third transistor 103, the second electrode of the fourth transistor 104, the gate electrode of the sixth transistor 106, and the second electrode of the eighth transistor 108 is denoted by a node 142.

The first wiring 121, the second wiring 122, the third wiring 123, and the fifth wiring 125 may be referred to as a first signal line, a second signal line, a third signal line, and a fourth signal line, respectively. The fourth wiring 124, the sixth wiring 126, the seventh wiring 127, the eighth wiring 128, the ninth wiring 129, the tenth wiring 130, and the eleventh wiring 131 may be referred to as a first power supply line, a second power supply line, a third power supply line, a fourth power supply line, a fifth power supply line, a sixth power supply line, and a seventh power supply line, respectively.

Next, an operation of the flip-flop in FIG. 1A is described with reference to a timing chart of FIG. 2 and FIGS. 3A to 3D. The timing chart of FIG. 2 is described in which an operation period is divided into a set period, a selection period, a reset period, and a non-selection period. Note that a set period, a reset period, and a non-selection period may be collectively called a non-selection period in some cases.

A potential of V1 is supplied to the sixth wiring 126 and the seventh wiring 127. A potential of V2 is supplied to the fourth wiring 124, the eighth wiring 128, the ninth wiring 129, the tenth wiring 130, and the eleventh wiring 131. Here, V1>V2 is satisfied. A signal with a potential of V1 is referred to as an H-level signal, and a signal with a potential of V2 is referred to as an L-level signal.

A signal 221, a signal 225, and a signal 222 shown in FIG. 2 are input to the first wiring 121, the fifth wiring 125, and the second wiring 122, respectively. A signal 223 shown in FIG. 2 is output from the third wiring 123. Here, each of the signals 221, 225, 222, and 223 is a digital signal in which a potential of an H-level signal is V1 (hereinafter also referred to as H level) and a potential of an L-level signal is V2 (hereinafter also referred to as L level). The signals 221, 225, 222, and 223 may be referred to as a start signal, a clock signal, a reset signal, and an output signal, respectively.

Note that various signals, potentials, or currents may be input to each of the first wiring 121, the second wiring 122, and the fourth to eleventh wirings 124 to 131.

Figure 3B:
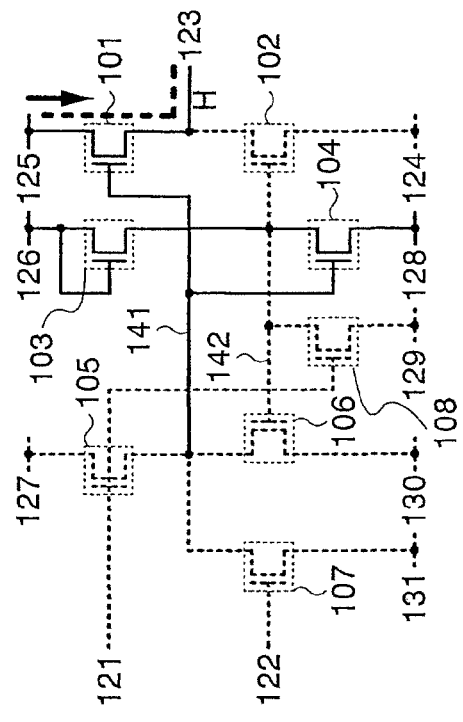
FIGS. 3A to 3D each show an operation of the flip-flop shown in FIGS. 1A to 1C.
Figure 3D:
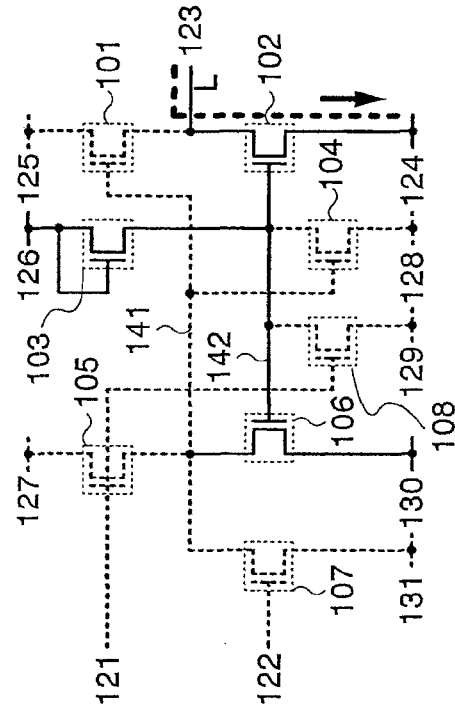
Figure 3A:
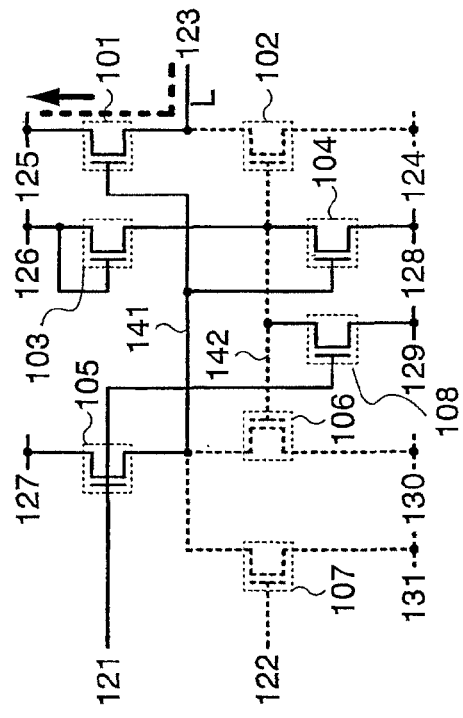

In a set period shown in (A) of FIG. 2 and FIG. 3A, the signal 221 becomes H level, and the fifth transistor 105 and the eighth transistor 108 are turned on. Since the signal 222 is L level, the seventh transistor 107 is turned off. At this time, a potential (a potential 241) of the node 141 becomes V1−Vth105 (Vth105: a threshold voltage of the fifth transistor 105), which is a value obtained by subtracting the threshold voltage of the fifth transistor 105 from a potential of the seventh wiring 127 since the second electrode of the fifth transistor 105 functions as a source electrode. Thus, the first transistor 101 and the fourth transistor 104 are tuned on, and the fifth transistor 105 is turned off. At this time, a potential difference (V1−V2) between a potential (V2) of the eighth wiring 128 and a potential (V1) of the sixth wiring 126 is divided by the third transistor 103, the fourth transistor 104, and the eighth transistor 108, so that a potential (a potential 242) of the node 142 becomes V2+β (β: a given positive number). Note that β<Vth102 (Vth102: a threshold voltage of the second transistor 102) and β<Vth106 (Vth106: a threshold voltage of the sixth transistor 106) are satisfied. Thus, the second transistor 102 and the sixth transistor 106 are turned off. Accordingly, in the set period, the third wiring 123 is electrically connected to the fifth wiring 125 to which an L-level signal is input, so that a potential of the third wiring 123 becomes V2. Therefore, the L-level signal is output from the third wiring 123. Further, the node 141 is in a floating state while the potential is kept at V1−Vth105.

The third transistor 103 and the fourth transistor 104 form an inverter in which the node 141 is an input terminal and the node 142 is an output terminal. Accordingly, the flip-flop in this embodiment mode may be provided with a circuit functioning as an inverter between the node 141 and the node 142.

In the flip-flop in this embodiment mode, V2 is supplied to the node 142 through the eighth transistor 108, and timing when the sixth transistor 106 is turned off is advanced. Thus, time when the potential of the node 142 becomes V1−Vth105 can be shortened. Accordingly, the flip-flop in this embodiment mode can operate with high speed and can be applied to a larger display device or a display device with higher definition.

Figure 4A:
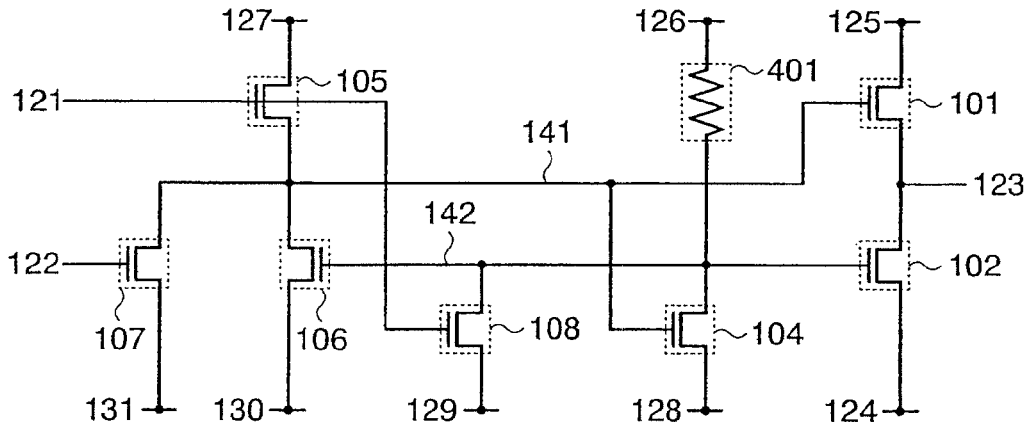
FIGS. 4A to 4C each show a structure of a flip-flop shown in Embodiment Mode 1.
Figure 4B:
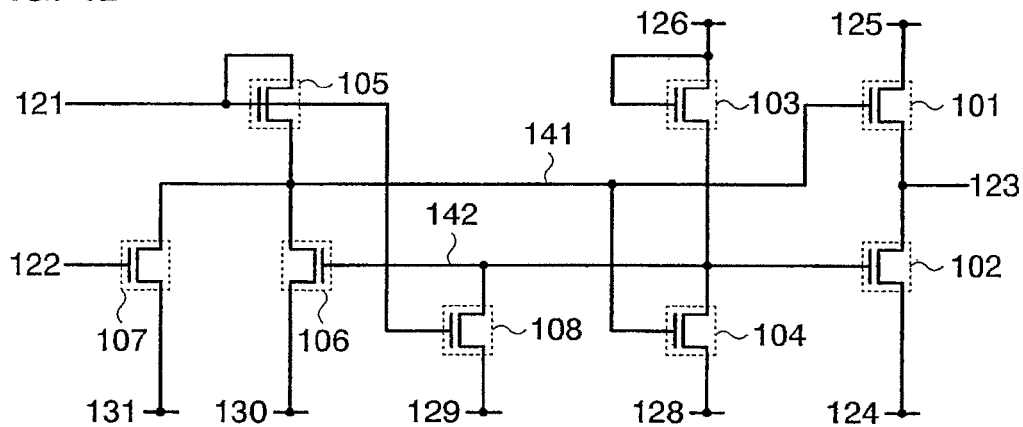

Even when the first electrode of the fifth transistor 105 is connected to the first wiring 121 as shown in FIG. 4B, the flip-flop in this embodiment mode can operate the same as in the above-described set period. Thus, the seventh wiring 127 is not needed in the flip-flop of FIG. 4B, so that improvement in yield can be realized. Further, reduction in layout area can be realized in the flip-flop of FIG. 4B.

In order to make the potential of the node 142 V2+β, it is preferable that a value of a ratio W/L of the channel width W to the channel length L of the fourth transistor 104 is at least ten times higher than a value of W/L of the third transistor 103. Accordingly, the transistor size (W×L) of the fourth transistor 104 is made larger. Consequently, the channel length L of the third transistor 103 is made larger, and preferably, twice to three times larger than the channel length L of the fourth transistor 104. Thus, the size of the fourth transistor 104 can be reduced, and reduction in layout can be realized.

In a selection period shown in (B) of FIG. 2 and FIG. 3B, the signal 221 becomes L level, and the fifth transistor 105 and the eighth transistor 108 are turned off. Since the signal 222 is kept at L level, the seventh transistor 107 is kept off. At this time, the potential of the node 141 is kept at V1−Vth105. Thus, the first transistor 101 and the fourth transistor 104 are kept on. Further, as this time, the potential of the node 142 is kept at V2+β. Thus, the second transistor 102 and the sixth transistor 106 are kept off. Here, an H-level signal is input to the fifth wiring 125, so that the potential of the third wiring 123 starts to increase. Then, the potential of the node 141 is increased from V1−Vth105 to V1+Vth101+α (Vth101: a threshold voltage of the first transistor 101; and α: a given positive number) by a bootstrap operation. Thus, a potential of the third wiring 123 becomes V1, which is equal to that of the fifth wiring 125. Accordingly, in the selection period, the third wiring 123 is electrically connected to the fifth wiring 125 to which the H-level signal is input, so that the potential of the third wiring 123 becomes V1. Therefore, the H-level signal is output from the third wiring 123.

Figure 1B:
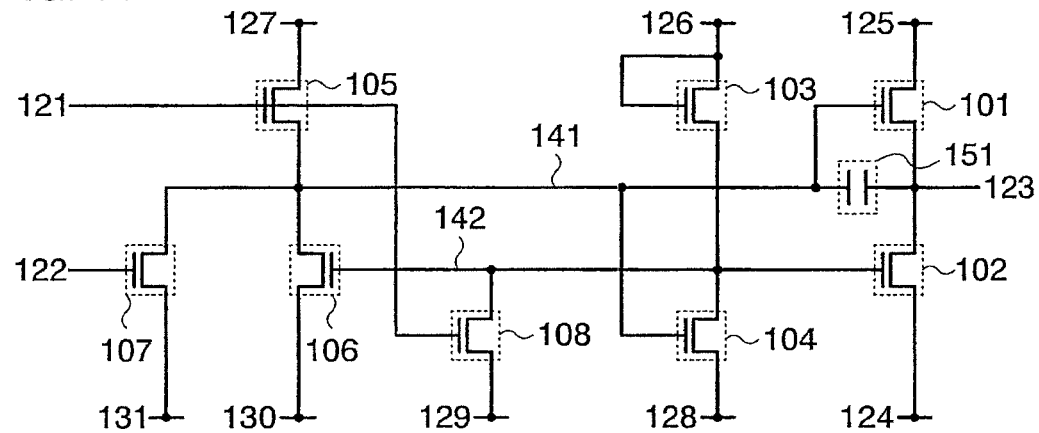

The bootstrap operation is performed by capacitive coupling of parasitic capacitance between the gate electrode and the second electrode of the first transistor 101. As shown in FIG. 1B, by provision of a capacitor 151 between the gate electrode and the second electrode of the first transistor 101, a stable bootstrap operation can be performed and parasitic capacitance of the first transistor 101 can be reduced. In the capacitor 151, a gate insulating film may be used as an insulating layer, and a gate electrode layer and a wiring layer may be used as a conductive layer. Alternatively, a gate insulating film may be used as the insulating layer, and a gate electrode layer and a semiconductor layer to which an impurity is added may be used as the conductive layer. Further alternatively, an interlayer film (an insulating film) may be used as the insulating layer, and a wiring layer and a transparent electrode layer may be used as the conductive layer. In the capacitor 151, when a gate electrode layer and a wiring layer are used as the conductive layer, it is preferable that the gate electrode layer be connected to the gate electrode of the first transistor 101 and the wiring layer be connected to the second electrode of the first transistor 101. When a gate electrode layer and a wiring layer are used as the conductive layer, it is more preferable that the gate electrode layer be directly connected to the gate electrode of the first transistor 101 and the wiring layer be directly connected to the second electrode of the first transistor 101. This is because increase in layout area of the flip-flop due to provision of the capacitor 151 can be suppressed.

Figure 1C:
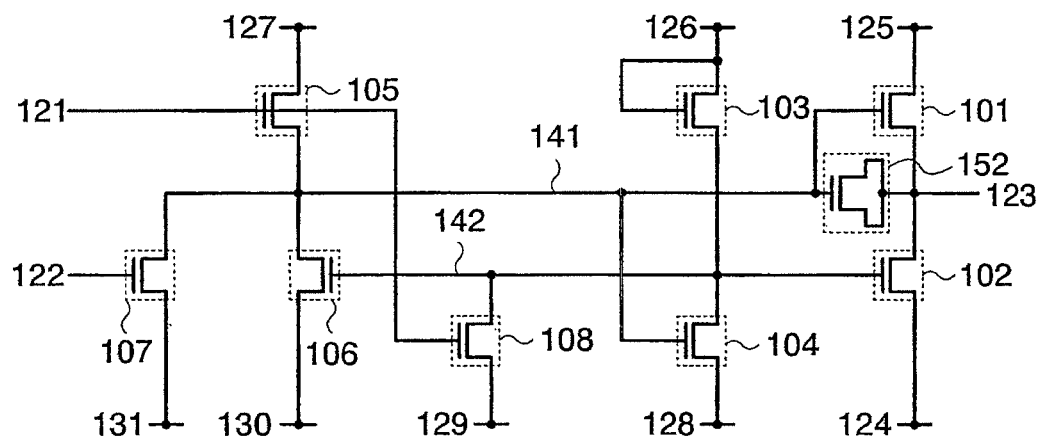

As shown in FIG. 1C, a transistor 152 may be used as the capacitor 151. When a gate electrode of the transistor 152 is connected to the node 141 and first and second electrodes of the transistor 152 are connected to the third wiring 123, the transistor 152 can function as a capacitor with a large capacity. Note that the transistor 152 can function as a capacitor even when one of the first and second electrodes is in a floating state.

It is necessary that the first transistor 101 supply an H-level signal to the third wiring 123. Therefore, in order to reduce fall time and rise time of the signal 223, a value of W/L of the first transistor 101 is preferably the highest among those of the first to eighth transistors 101 to 108.

In the set period, it is necessary that the fifth transistor 105 make the potential of the node 141 (the gate electrode of the first transistor 101) V1−Vth105. Therefore, a value of W/L of the fifth transistor 105 is preferably ½ to ⅕ times, more preferably ⅓ to ¼ times higher than that of the first transistor 101.

Figure 3C:
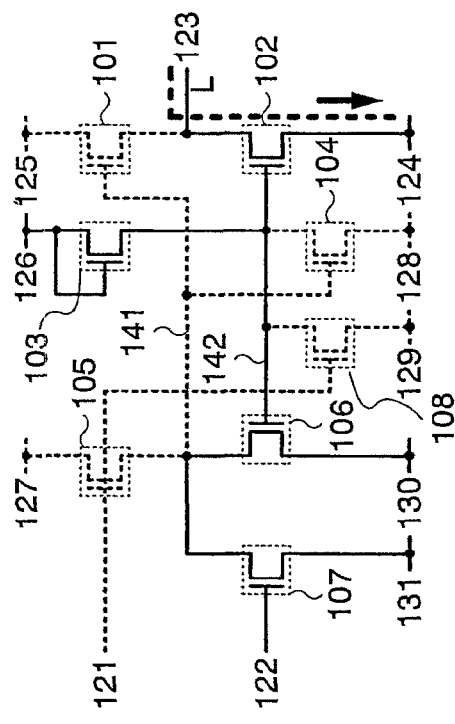

In a reset period shown in (C) of FIG. 2 and FIG. 3C, the signal 221 is kept at L level, and the fifth transistor 105 and the eighth transistor 108 are kept off. Since the signal 222 is at H level, the seventh transistor 107 is turned on. The potential of the node 141 at this time becomes V2 since a potential (V2) of the eleventh wiring 131 is supplied through the seventh transistor 107. Thus, the first transistor 101 and the fourth transistor 104 are turned off. The potential of the node 142 at this time becomes V1−Vth103 (Vth103: a threshold voltage of the third transistor 103), which is a value obtained by subtracting the threshold voltage of the third transistor 103 from a potential (V1) of the sixth wiring 126 since the second electrode of the third transistor 103 functions as a source electrode. Thus, the second transistor 102 and the sixth transistor 106 are turned on. Accordingly, in the reset period, the third wiring 123 is electrically connected to the fourth wiring 124 to which V2 is supplied, so that the potential of the third wiring 123 becomes V2. Therefore, an L-level signal is output from the third wiring 123.

By delaying timing when the seventh transistor 107 is turned on, fall time of the signal 223 can be reduced. This is because an L-level signal input to the fifth wiring 125 is supplied to the third wiring 123 through the first transistor 101 with a large value of W/L.

When the value of W/L of the seventh transistor 107 is reduced and fall time until the potential of the node 141 becomes V2 is increased, the fall time of the signal 223 can be reduced as well. In this case, the value of W/L of the seventh transistor 107 is preferably 1/10 to 1/40 times, more preferably 1/20 to 1/30 times higher than that of the first transistor 101.

Figure 4C:
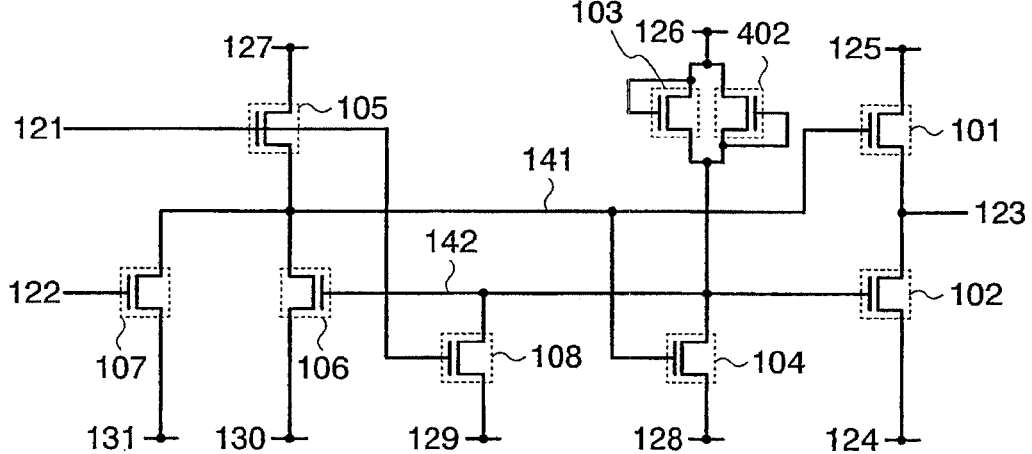

As shown in FIG. 4A, by using a resistor 410 instead of the third transistor 103, the potential of the node 142 can be made V1. Therefore, the second transistor 102 and the sixth transistor 106 can be easily turned on, and improvement in operation efficiency can be realized. Further, as shown in FIG. 4C, a transistor 402 may be connected in parallel with the third transistor 103.

In a non-selection period shown in (D) of FIG. 2 and FIG. 3D, the signal 221 is kept at L level, and the fifth transistor 105 and the eighth transistor 108 are kept off. Further, since the signal 222 becomes L level, the seventh transistor 107 is turned off. At this time, the potential of the node 142 is kept at V1−Vth103. Thus, the second transistor 102 and the sixth transistor 106 are kept on. At this time, the potential of the node 141 is kept at V2 since V2 is supplied through the sixth transistor 106. Thus, the first transistor 101 and the fourth transistor 104 are kept off. Accordingly, in the non-selection period, the third wiring 123 is electrically connected to the fourth wiring 124 to which V2 is supplied, so that the potential of the third wiring 123 is kept at V2. Therefore, an L-level signal is output from the third wiring 123.

By making the potential supplied to the sixth wiring 126 lower than V1, the potential of the node 142 can be lowered, and threshold voltage shifts of the second transistor 102 and the sixth transistor 106 can be suppressed. Therefore, in the flip-flop in this embodiment mode, deterioration in characteristics of the transistor can be suppressed even when amorphous silicon, in which deterioration in characteristics (a threshold voltage shift) obviously appears, is used as a semiconductor layer of the transistor.

Accordingly, since rise time of the potential of the node 141 can be reduced in the set period, the flip-flop in this embodiment mode can operate with high speed and can be applied to a larger display device or a display device with higher definition.

Here, functions of the first to eighth transistors 101 to 108 are described. The first transistor 101 has a function to select timing for supplying the potential of the fifth wiring 125 to the third wiring 123; and a function to increase the potential of the node 141 by a bootstrap operation, and functions as a bootstrap transistor. The second transistor 102 has a function to select timing for supplying a potential of the fourth wiring 124 to the third wiring 123, and functions as a switching transistor. The third transistor 103 has a function to divide the potential of the sixth wiring 126 and the potential of the eighth wiring 128, and functions as an element having a resistance component or a resistor. The fourth transistor 104 has a function to select timing for supplying the potential of the eighth wiring 128 to the node 142, and functions as a switching transistor. The fifth transistor 105 has a function to select timing for supplying the potential of the seventh wiring 127 to the node 141, and function as an input transistor. The sixth transistor 106 has a function to select timing for supplying a potential of the tenth wiring 130 to the node 141, and functions as a switching transistor. The seventh transistor 107 has a function to select timing for supplying the potential of the eleventh wiring 131 to the node 141, and functions as a switching transistor. The eighth transistor 108 has a function to select timing for supplying a potential of the ninth wiring 129 to the node 142, and functions as a switching transistor.

Note that the first to eighth transistors 101 to 108 are not limited to transistors as long as they have the aforementioned functions. For example, as the second transistor 102, the fourth transistor 104, the sixth transistor 106, the seventh transistor 107, and the eighth transistor 108 each functioning as the switching transistor, a diode, a CMOS analog switch, various logic circuits, or the like may be employed as long as it is an element having a switching function. Further, as the fifth transistor 105 functioning as the input transistor, a PN junction diode, a diode-connected transistor, or the like may be employed as long as it has a function to select timing for increasing the potential of the node 141 to be turned off.

Arrangement, the number, and the like of the transistors are not limited to those in FIGS. 1A to 1C as long as an operation similar to FIGS. 1A to 1C is obtained. In this embodiment mode, as is apparent from FIGS. 3A to 3D describing the operations of the flip-flop in FIG. 1A, electrical connections in the set period, the selection period, the reset period, and the non-selection period are performed as shown by solid lines in FIGS. 3A to 3D, respectively. Accordingly, a transistor, an element (e.g., a resistor or a capacitor), a diode, a switch, various logic circuits, or the like may be added as long as a structure is employed in which a transistor or the like is arranged to satisfy the above conditions so that a flip-flop can operate.

In addition, driving timing of the flip-flop in this embodiment mode is not limited to the timing chart of FIG. 2 as long as an operation similar to FIGS. 1A to 1C is obtained.

Figure 6:
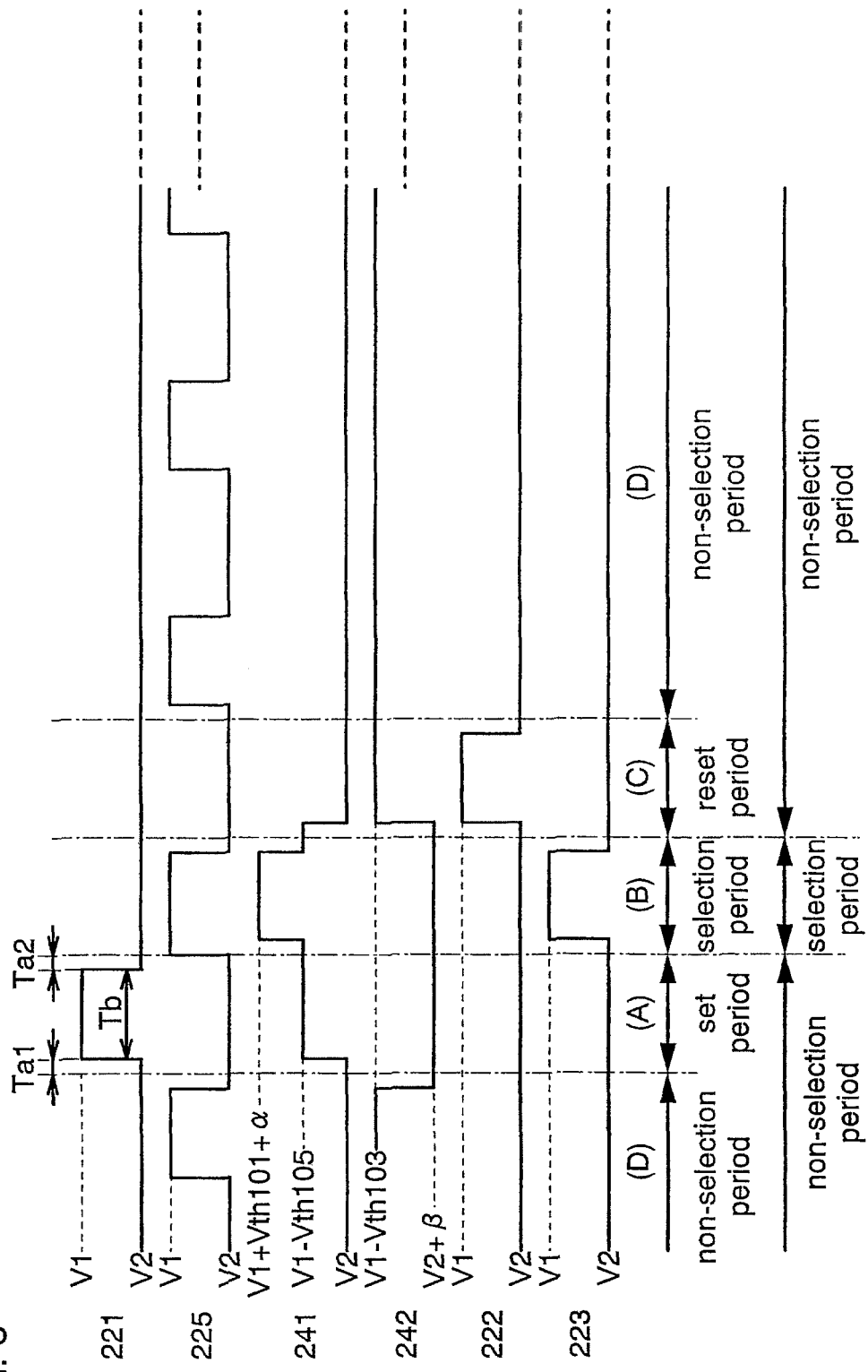
FIG. 6 is a timing chart showing operations of a flip-flop shown in Embodiment Mode 1.

For example, as shown in a timing chart of FIG. 6, a period for inputting H-level signals to the first wiring 121, the second wiring 122, and the fifth wiring 125 may be reduced. In FIG. 6, as compared with the timing chart of FIG. 2, timing when a signal is switched from L level to H level is delayed for a period Ta1, and timing when a signal is switched from H level to L level is advanced for a period Ta2. Thus, in a flip-flop to which the timing chart of FIG. 6 is applied, instantaneous current through each wiring is reduced, so that power saving, suppression of malfunction, improvement in operation efficiency, and the like can be realized. Further, in the flip-flop to which the timing chart of FIG. 6 is applied, fall time of a signal output from the third wiring 123 can be reduced in the reset period. This is because timing when the potential of the node 141 becomes L level is delayed for (the period Ta1+the period Ta2), so that an L-level signal input to the fifth wiring 125 is supplied to the third wiring 123 through the first transistor 101 with a high current capability (with a large channel width). Note that portions common to FIG. 2 are denoted by common reference numerals, and description thereof is omitted.

It is preferable that a relationship between the period Ta1, the period Ta2, and a period Tb satisfy $((Ta1+Tb)/(Ta1+Ta2+Tb))\times 100 < 10[\%]$. It is more preferable that the relation satisfy $((Ta1+Tb)/(Ta1+Ta2+Tb))\times 100 < 5[\%]$. Further, it is preferable to satisfy the period Ta1 the period Ta2.

Figure 5A:
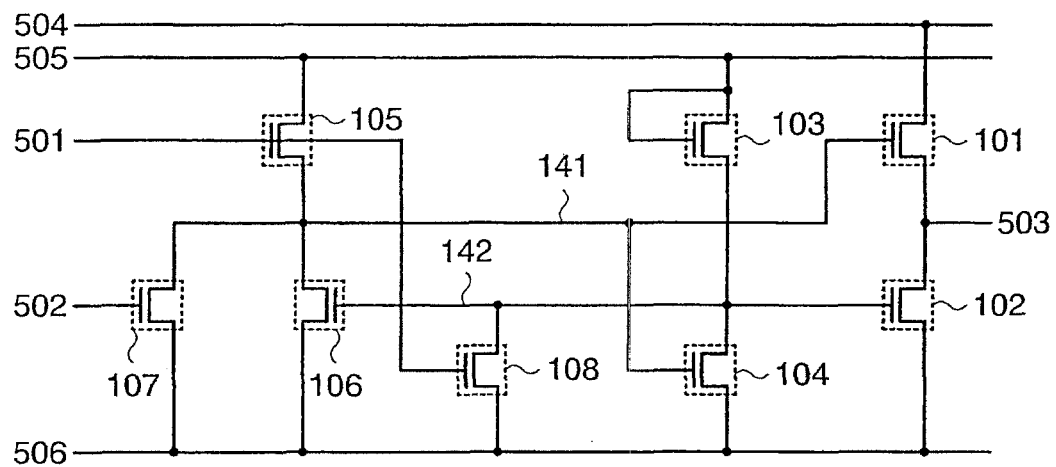
FIGS. 5A and 5B each show a structure of a flip-flop shown in Embodiment Mode 1.
Figure 5B:
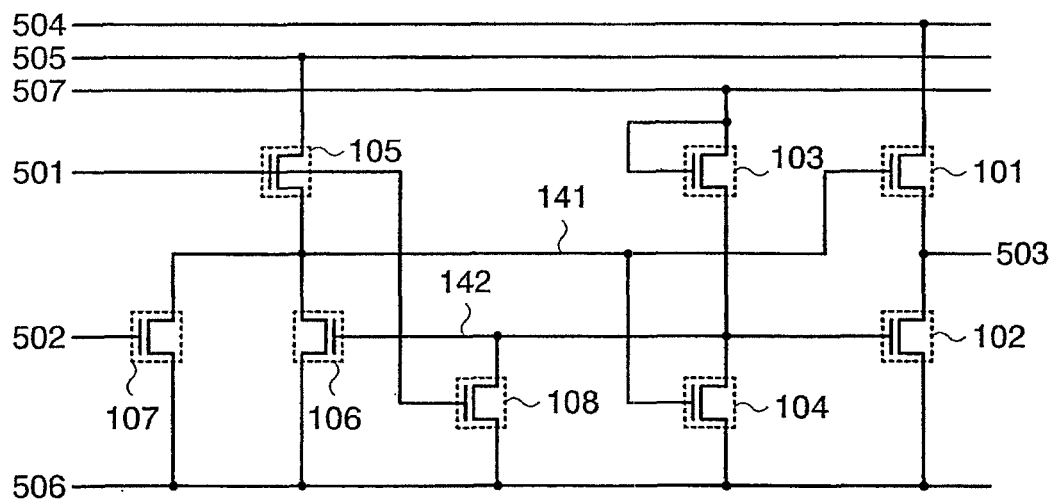

The first to eleventh wirings 121 to 131 can be freely connected as long as a flip-flop operates similarly to FIGS. 1A to 1C. For example, as shown in FIG. 5A, the first electrode of the second transistor 102, the first electrode of the fourth transistor 104, the first electrode of the sixth transistor 106, the first electrode of the seventh transistor 107, and the first electrode of the eighth transistor 108 may be connected to a sixth wiring 506. Further, the first electrode of the fifth transistor 105, and the first electrode and the gate electrode of the third transistor 103 may be connected to a fifth wiring 505. Alternatively, as shown in FIG. 5B, the first electrode and the gate electrode of the third transistor 103 may be connected to a seventh wiring 507. Here, a first wiring 501, a second wiring 502, a third wiring 503, and a fourth wiring 504 correspond to the first wiring 121, the second wiring 122, the third wiring 123, and the fifth wiring 125 in FIG. 1A.

In flip-flops of FIGS. 5A and 5B, the number of wirings can be reduced, so that improvement in yield and reduction in layout area can be realized. Further, in the flip-flops of FIGS. 5A and 5B, improvement in reliability and operation efficiency can be realized. In addition, in the flip-flop of FIG. 5B, a potential supplied to the sixth wiring 506 can be lowered, so that threshold voltage shifts of the second transistor 102 and the sixth transistor 106 can be suppressed.

Figure 29:
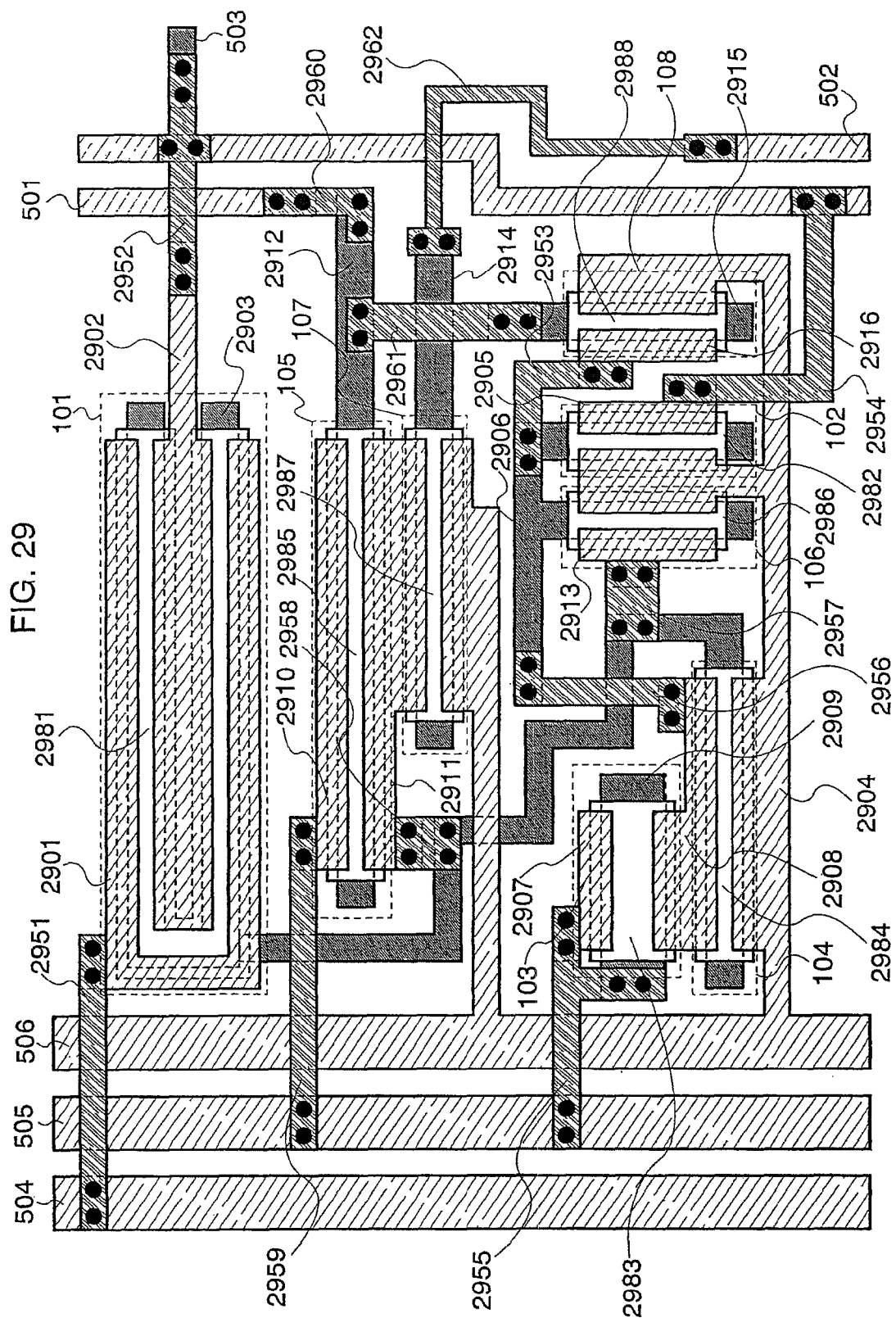
FIG. 29 is a top plan view of the flip-flop shown in FIG. 5A.

FIG. 29 shows an example of a top plan view of the flip-flop shown in FIG. 5A. A conductive layer 2901 includes a portion functioning as the first electrode of the first transistor 101, and is connected to the fourth wiring 504 through a wiring 2951. A conductive layer 2902 includes a portion functioning as the second electrode of the first transistor 101, and is connected to the third wiring 503 through a wiring 2952. A conductive layer 2903 includes portions functioning as the gate electrode of the first transistor 101 and the gate electrode of the fourth transistor 104. A conductive layer 2904 includes portions functioning as the first electrode of the second transistor 102, the first electrode of the sixth transistor 106, the first electrode of the fourth transistor 104, and the first electrode of the eighth transistor 108, and is connected to the sixth wiring 506. A conductive layer 2905 includes a portion functioning as the second electrode of the second transistor 102, and is connected to the third wiring 503 through a wiring 2954. A conductive layer 2906 includes portions functioning as the gate electrode of the second transistor 102 and the gate electrode of the sixth transistor 106. A conductive layer 2907 includes a portion functioning as the first electrode of the third transistor 103, and is connected to the fifth wiring 505 through a wiring 2955. A conductive layer 2908 includes portions functioning as the second electrode of the third transistor 103 and the second electrode of the fourth transistor 104, and is connected to the conductive layer 2906 through a wiring 2956. A conductive layer 2909 includes a portion functioning as the gate electrode of the third transistor 103, and is connected to the fifth wiring 505 through the wiring 2955. A conductive layer 2910 includes a portion functioning as the first electrode of the fifth transistor 105, and is connected to the fifth wiring 505 through a wiring 2959. A conductive layer 2911 includes portions functioning as the second electrode of the fifth transistor 105 and the second electrode of the seventh transistor 107, and is connected to the conductive layer 2903 through a wiring 2958. A conductive layer 2912 includes a portion functioning as the gate electrode of the fifth transistor 105, and is connected to the first wiring 501 through a wiring 2960. A conductive layer 2913 includes a portion functioning as the second electrode of the sixth transistor 106, and is connected to the conductive layer 2903 through a wiring 2957. A conductive layer 2914 includes a portion functioning as the gate electrode of the seventh transistor 107, and is connected to the second wiring 502 through a wiring 2962. A conductive layer 2915 includes a portion functioning as the gate electrode of the eighth transistor 108, and is connected to the conductive layer 2912 through a wiring 2961. A conductive layer 2916 includes a portion functioning as the second electrode of the eighth transistor 108, and is connected to the conductive layer 2906 through a wiring 2953.

Here, the width of the wiring 2962 is narrower than that of the wiring 2951, 2952, 2953, 2954, 2955, 2956, 2957, 2958, 2959, 2960, or 2961. Alternatively, the length of the wiring 2962 is long. That is, the wiring 2962 has a high resistance value. Accordingly, in the reset period, timing when a potential of the conductive layer 2914 becomes H level can be delayed. Thus, timing when the seventh transistor 107 is turned on can be delayed, so that a signal of the third wiring 503 can become L level in a shorter period. This is because timing when the node 141 becomes L level is delayed, and in this delay period, an L-level signal is supplied to the third wiring 503 through the first transistor 101.

Note that the wirings 2951, 2952, 2953, 2954, 2955, 2956, 2957, 2958, 2959, 2960, 2961, and 2962 are similar to pixel electrodes (also referred to as transparent electrodes or reflective electrodes), and formed using a similar process and material thereto.

The portions functioning as the gate electrode, the first electrode, and the second electrode of the first transistor 101 are portions where the conductive layers including each electrode overlap with a semiconductor layer 2981. The portions functioning as the gate electrode, the first electrode, and the second electrode of the second transistor 102 are portions where the conductive layers including each electrode overlap with a semiconductor layer 2982. The portions functioning as the gate electrode, the first electrode, and the second electrode of the third transistor 103 are portions where the conductive layers including each electrode overlap with a semiconductor layer 2983. The portions functioning as the gate electrode, the first electrode, and the second electrode of the fourth transistor 104 are portions where the conductive layers including each electrode overlap with a semiconductor layer 2984. The portions functioning as the gate electrode, the first electrode, and the second electrode of the fifth transistor 105 are portions where the conductive layers including each electrode overlap with a semiconductor layer 2985. The portions functioning as the gate electrode, the first electrode, and the second electrode of the sixth transistor 106 are portions where the conductive layers including each electrode overlap with a semiconductor layer 2986. The portions functioning as the gate electrode, the first electrode, and the second electrode of the seventh transistor 107 are portions where the conductive layers including each electrode overlap with a semiconductor layer 2987. The portions functioning as the gate electrode, the first electrode, and the second electrode of the eighth transistor 108 are portions where the conductive layers including each electrode overlap with a semiconductor layer 2988.

Next, a structure and a driving method of a shift register including the aforementioned flip-flop in this embodiment mode are described.

A structure of a shift register in this embodiment mode is described with reference to FIG. 7. The shift register in FIG. 7 includes n flip-flops (flip-flops 701_1 to 701_n).

Figure 7:
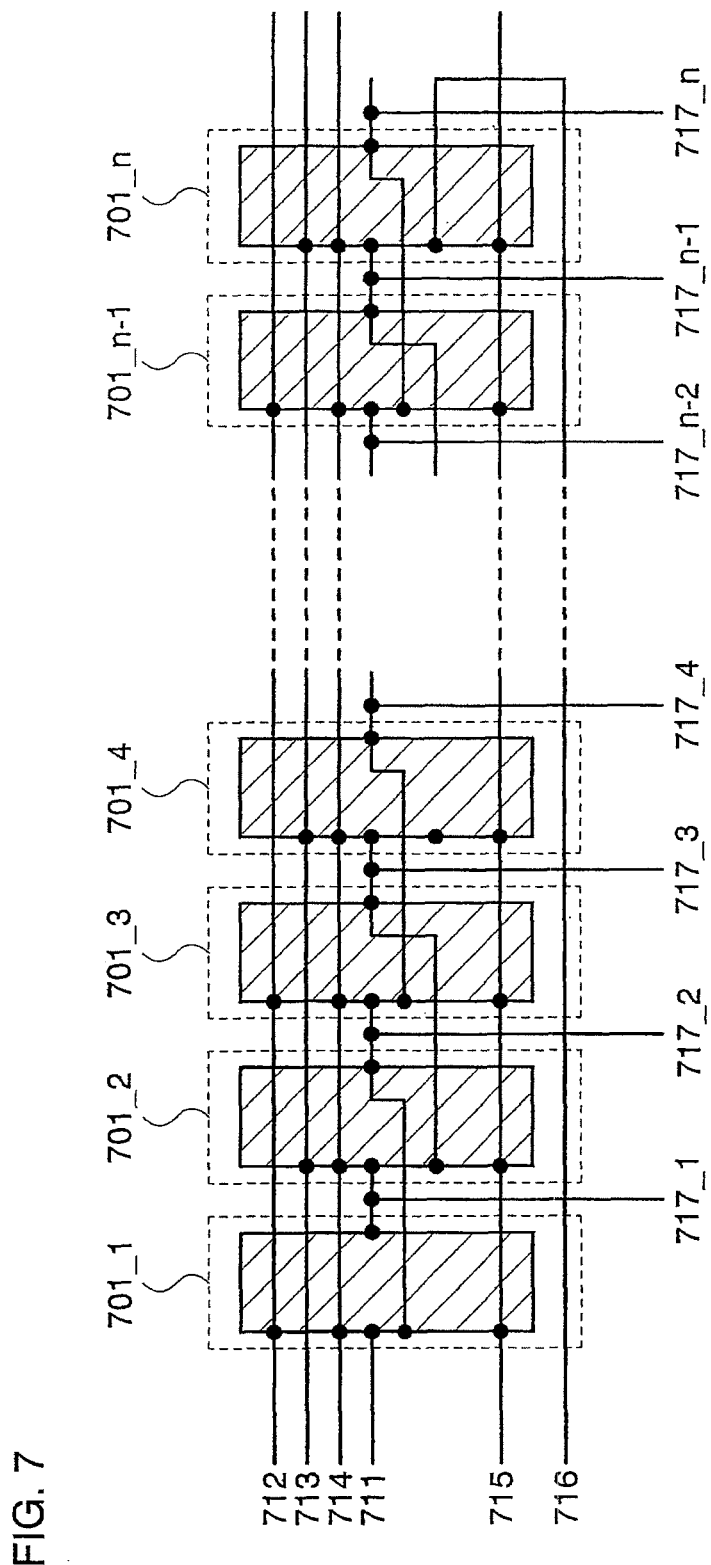
FIG. 7 shows a structure of a shift register shown in Embodiment Mode 1.

Connection relationships of the shift register in FIG. 7 are described. In a flip-flop 701_i in an i-th stage (one of the flip-flops 701_1 to 701_n) of the shift register in FIG. 7, the first wiring 121 shown in FIG. 1A is connected to a seventh wiring 717_i−1. The second wiring 122 shown in FIG. 1A is connected to a seventh wiring 717_i+1. The third wiring 123 shown in FIG. 1A is connected to a seventh wiring 717_i. The fourth wiring 124, the eighth wiring 128, the ninth wiring 129, the tenth wiring 130, and the eleventh wiring 131 shown in FIG. 1A are connected to a fifth wiring 715. The fifth wiring 125 shown in FIG. 1A is connected to a second wiring 712 in a flip-flop in an odd-numbered stage, and is connected to a third wiring 713 in a flip-flop in an even-numbered stage. The sixth wiring 126 and the seventh wiring 127 shown in FIG. 1A are connected to a fourth wiring 714. In the flip-flop 701_1 in a first stage, the first wiring 121 shown in FIG. 1A is connected to a first wiring 711. In the flip-flop 701_n in an n-th stage, the second wiring 122 shown in FIG. 1A is connected to a sixth wiring 716.

The first wiring 711, the second wiring 712, the third wiring 713, and the sixth wiring 716 may be referred to as a first signal line, a second signal line, a third signal line, and a fourth signal line, respectively. The fourth wiring 714 and the fifth wiring 715 may be referred to as a first power supply line and a second power supply line, respectively.

Figure 8:
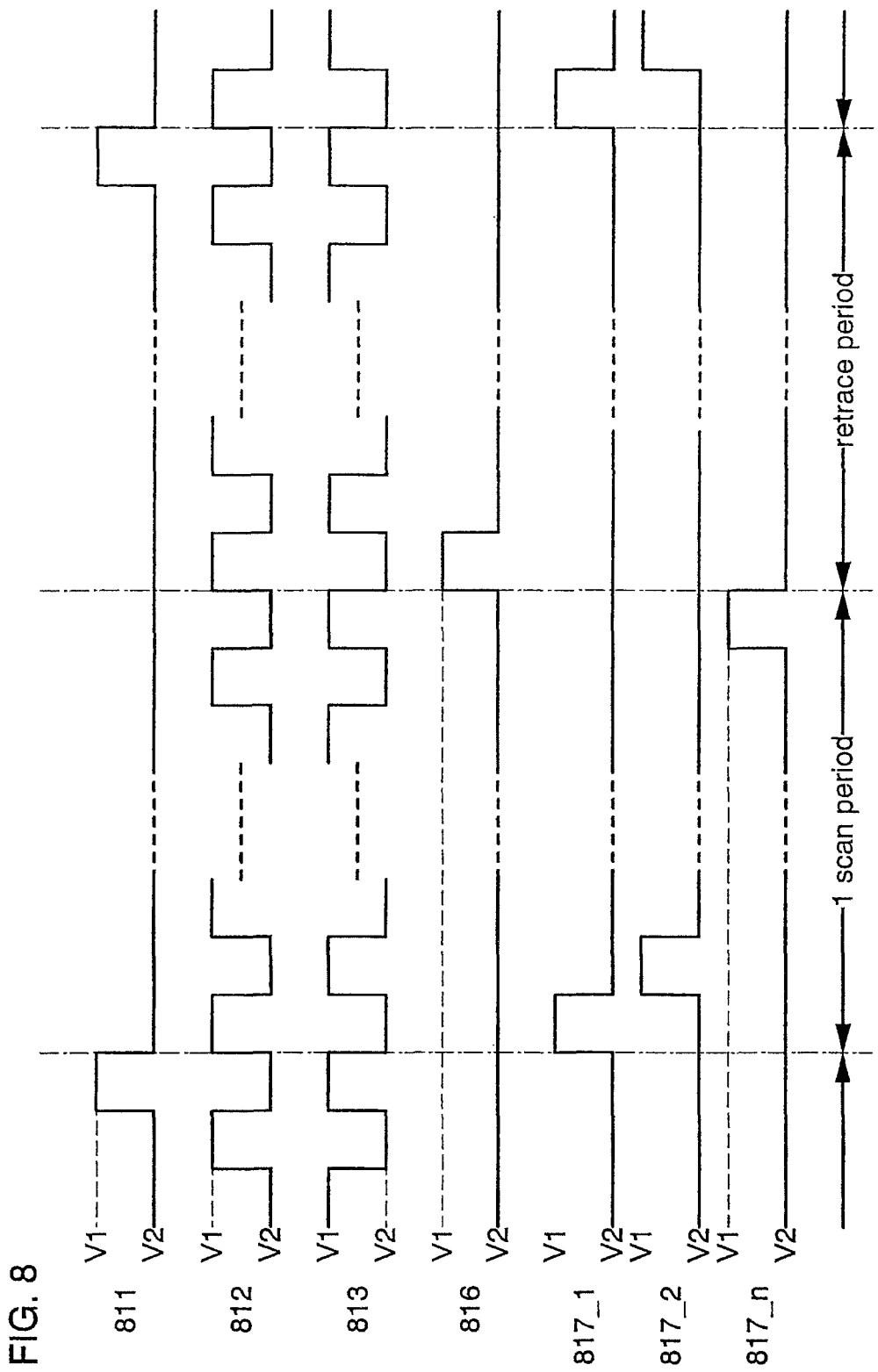
FIG. 8 is a timing chart showing operations of the shift register shown in FIG. 7.
Figure 9:
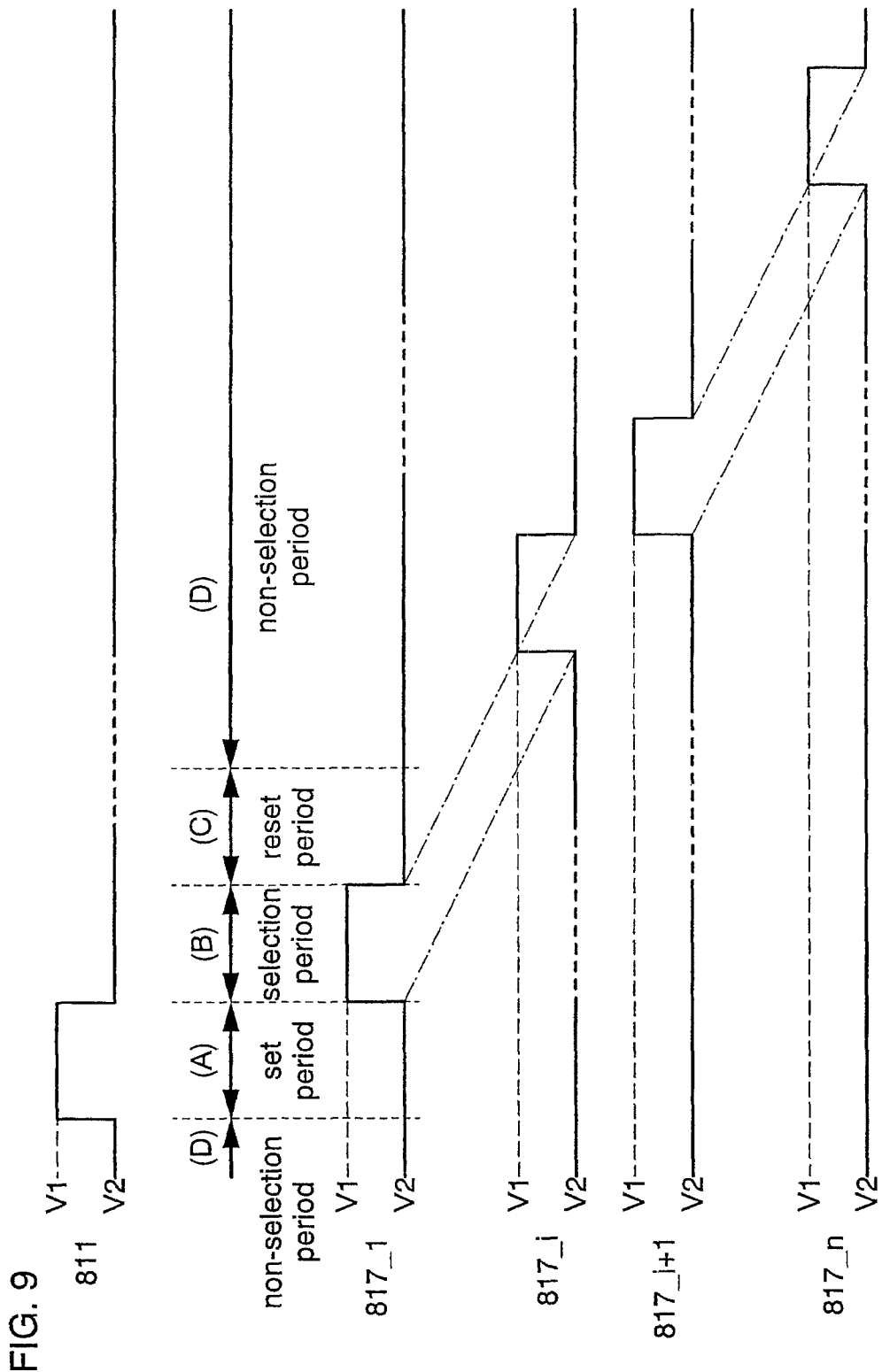
FIG. 9 is a timing chart showing operations of the shift register shown in FIG. 7.
Figure 10:
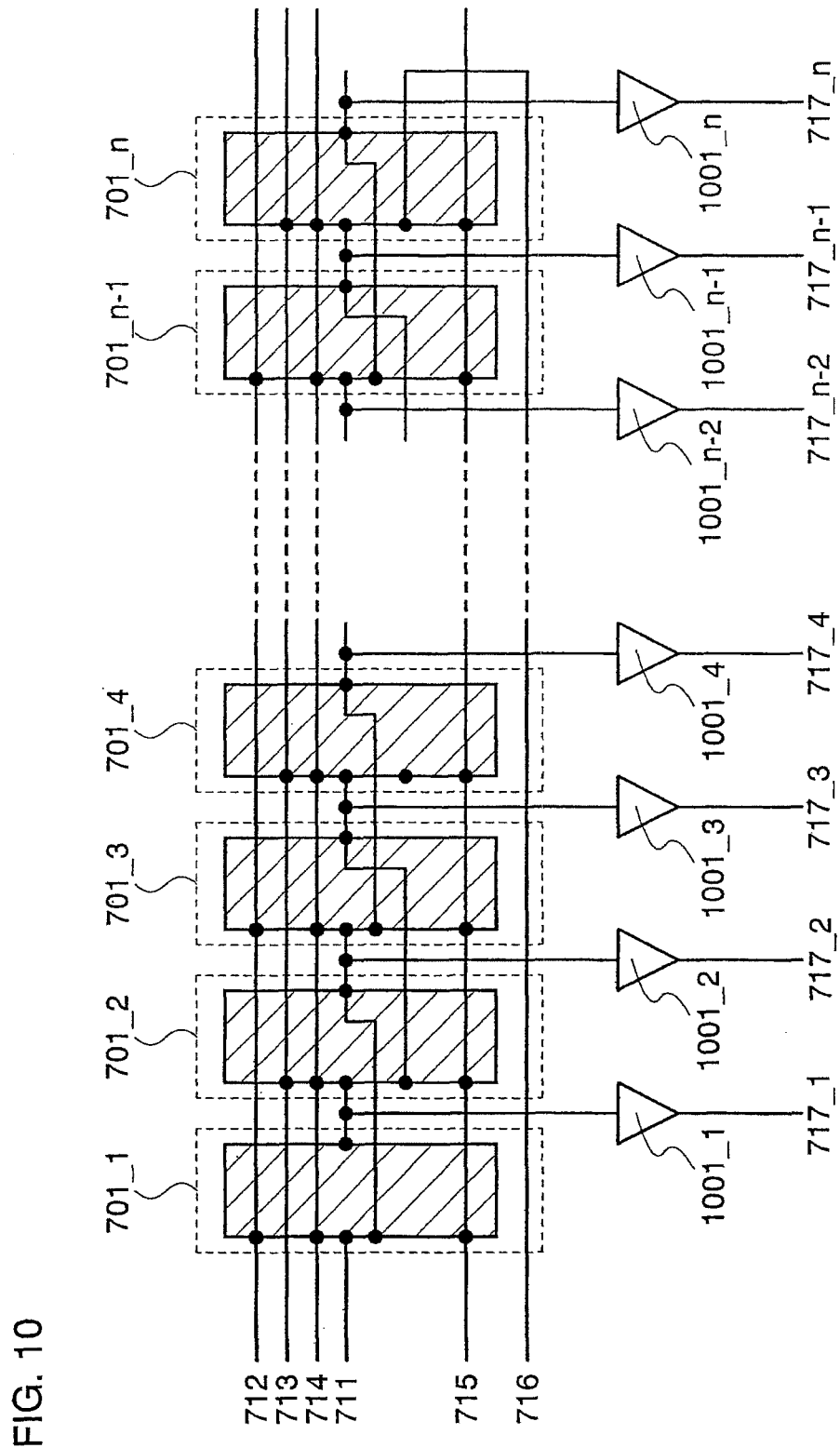
FIG. 10 shows a structure of a shift register shown in Embodiment Mode 1.

Next, an operation of a shift register in FIG. 10 is described with reference to timing charts of FIGS. 8 and 9. The timing chart of FIG. 8 is divided into a scan period and a retrace period. The scan period corresponds to a period from the time when output of a selection signal from a seventh wiring 717_1 starts to the time when output of a selection signal from a seventh wiring 717_n ends. The retrace period corresponds to a period from the time when output of the selection signal from the seventh wiring 717_n ends to the time when output of the selection signal from the seventh wiring 717_1 starts.

A potential of V1 is supplied to the fourth wiring 714, and a potential of V2 is supplied to the fifth wiring 715.

Signals 811, 812, 813, and 816 shown in FIG. 8 are input to the first wiring 711, the second wiring 712, the third wiring 713, and the sixth wiring 716, respectively. Here, each of the signals 811, 812, 813, and 816 is a digital signal in which a potential of an H-level signal is V1 and a potential of an L-level signal is V2. Further, the signals 811, 812, 813, and 816 may be referred to as a start signal, a first clock signal, a second clock signal (an inverted clock signal), and a reset signal, respectively.

Note that various signals, potentials, or currents may be input to each of the first to sixth wirings 711 to 716.

Digital signals 817_1 to 817_n in each of which a potential of an H-level signal is V1 and a potential of an L-level signal is V2 are output from the seventh wirings 717_1 to 717_n. Note that as shown in FIG. 10, the signals may be output from the seventh wirings 717_1 to 717_n through buffers 1001_1 to 1001_n, respectively. The shift register in FIG. 10 can easily operate since an output signal of the shift register and a transfer signal of each flip-flop can be separated.

Examples of the buffers 1001_1 to 1001_n included in the shift register of FIG. 10 are described with reference to FIGS. 99A and 99B. In a buffer 8000 shown in FIG. 99A, inverters 8001a, 8001b, and 8001c are connected between wirings 8011 and 8012, so that an inverted signal of a signal input to the wiring 8011 is output from the wiring 8012. Note that the number of inverters connected between the wirings 8011 and 8012 is not limited, and for example, when even-numbered inverters are connected between the wirings 8011 and 8012, signal with the same polarity as that input to the wiring 8011 are output from the wiring 8012. In addition, as shown in a buffer 8100 of FIG. 99B, inverters 8002a, 8002b, and 8002c connected in series and inverters 8003a, 8003b, and 8003c connected in series may be connected in parallel. In the buffer 8100 of FIG. 99B, since variation of deterioration in characteristics of transistors can be averaged, delay and distortion of the signal output from the wiring 8012 can be reduced. Further, outputs of the inverters 8002a and 8003a, and outputs of the inverters 8002b and 8003b may be connected.

In FIG. 99A, it is preferable to satisfy (W of a transistor included in the inverter 8001a)<(W of a transistor included in the inverter 8001b)<(W of a transistor included in the inverter 8001c). This is because drive capability of a flip-flop (specifically, a value W/L of the transistor 101 in FIG. 1A) can be small since W of the transistor included in the inverter 8001a is small; thus, layout area of a shift register in the invention can be reduced. Similarly, in FIG. 99B, it is preferable to satisfy (W of a transistor included in the inverter 8002a)<(W of a transistor included in the inverter 8002b)<(W of a transistor included in the inverter 8002c). Similarly, in FIG. 99B, it is preferable to satisfy (W of a transistor included in the inverter 8003a)<(W of a transistor included in the inverter 8003b)<(W of a transistor included in the inverter 8003c). Further, it is preferable to satisfy (W of the transistor included in the inverter 8002a)=(W of the transistor included in the inverter 8003a), (W of the transistor included in the inverter 8002b) (W of the transistor included in the inverter 8003b), and (W of the transistor included in the inverter 8002c)=(W of the transistor included in the inverter 8003c).

The inverters shown in FIGS. 99A and 99B are not particularly limited as long as they can output an inverted signal of a signal input thereto. For example, as shown in FIG. 99C, an inverter may be formed of a first transistor 8201 and a second transistor 8202. A signal is input to a first wiring 8211, a signal is output from a second wiring 8212, V1 is supplied to a third wiring 8213, and V2 is supplied to a fourth wiring 8214. When an H-level signal is input to the first wiring 8211, the inverter of FIG. 99C outputs a potential obtained by dividing V1–V2 by the first transistor 8201 and the second transistor 8202 ((W/L of the first transistor 8201)<(W/L of the second transistor 8202)) from the second wiring 8212. Further, when an L-level signal is input to the first wiring 8211, the inverter of FIG. 99C outputs V1–Vth8201 (Vth8201: a threshold voltage of the first transistor 8201) from the second wiring 8212. The first transistor 8201 may be a PN junction diode or simply a resistor as long as it has a resistance component.

As shown in FIG. 99D, an inverter may be formed of a first transistor 8301, a second transistor 8302, a third transistor 8303, and a fourth transistor 8304. A signal is input to a first wiring 8311, a signal is output from a second wiring 8312, V1 is supplied to a third wiring 8313 and a fifth wiring 8315, and V2 is supplied to a fourth wiring 8314 and a sixth wiring 8316. When an H-level signal is input to the first wiring 8311, the inverter of FIG. 99D outputs V2 from the second wiring 8312. At this time, a potential of a node 8341 is at L level, so that the first transistor 8301 is turned off. Further, when an L-level signal is input to the first wiring 8311, the inverter of FIG. 99D outputs V1 from the second wiring 8312. At this time, when the potential of the node 8341 becomes V1–Vth8303 (Vth8303: a threshold voltage of the third transistor 8303), the node 8341 is in a floating state. As a result, the potential of the node 8341 is higher than V1+Vth8301 (Vth8301; a threshold voltage of the first transistor 8301) by a bootstrap operation, so that the first transistor 8301 is turned on. Further, a capacitor may be provided between a second electrode and a gate electrode of the first transistor 8301 since the first transistor 8301 functions as a bootstrap transistor.

Figure 30A:
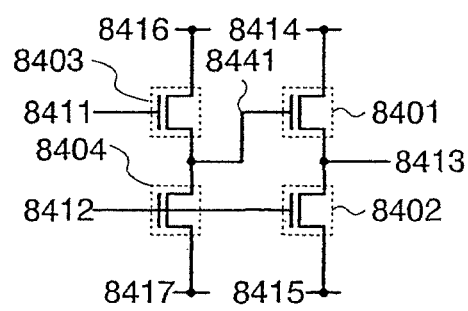
FIGS. 30A to 30C each show a structure of a buffer shown in FIG. 10.

As shown in FIG. 30A, an inverter may be formed of a first transistor 8401, a second transistor 8402, a third transistor 8403, and a fourth transistor 8404. The inverter of FIG. 30A is a two-input inverter, and can perform a bootstrap operation. A signal is input to a first wiring 8411, an inverted signal is input to a second wiring 8412, and a signal is output from a third wiring 8413. V1 is supplied to a fourth wiring 8414 and a sixth wiring 8416, and V2 is supplied to a fifth wiring 8415 and a seventh wiring 8417. When an L-level signal is input to the first wiring 8411 and an H-level signal is input to the second wiring 8412, the inverter of FIG. 30A outputs V2 from the third wiring 8413. At this time, a potential of a node 8441 becomes V2, so that the first transistor 8401 is turned off. Further, when an H-level signal is input to the first wiring 8411 and an L-level signal is input to the second wiring 8412, the inverter of FIG. 30A outputs V1 from the third wiring 8413. At this time, when the potential of the node 8441 becomes V1–Vth8403 (Vth8403: a threshold voltage of the third transistor 8403), the node 8441 is in a floating state. As a result, the potential of the node 8441 is higher than V1+Vth8401 (Vth8401: a threshold voltage of the first transistor 8401) by a bootstrap operation, so that the first transistor 8401 is turned on. Further, a capacitor may be provided between a second electrode and a gate electrode of the first transistor 8401 since the first transistor 8401 functions as a bootstrap transistor. It is preferable that one of the first wiring

8411 and the second wiring 8412 be connected to the third wiring 123 in FIG. 1A and the other thereof be connected to the node 142 in FIG. 1A.

Figure 30B:
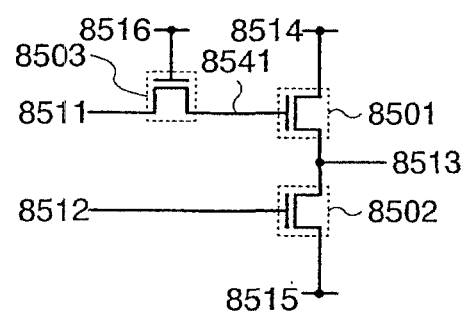

As shown in FIG. 30B, an inverter may be formed of a first transistor 8501, a second transistor 8502, and a third transistor 8503. The inverter of FIG. 30B is a two-input inverter, and can perform a bootstrap operation. A signal is input to a first wiring 8511, an inverted signal is input to a second wiring 8512, and a signal is output from a third wiring 8513. V1 is supplied to a fourth wiring 8514 and a sixth wiring 8516, and V2 is supplied to a fifth wiring 8515. When an L-level signal is input to the first wiring 8511 and an H-level signal is input to the second wiring 8512, the inverter of FIG. 30B outputs V2 from the third wiring 8513. At this time, a potential of a node 8541 becomes V2, so that the first transistor 8501 is turned off. Further, when an H-level signal is input to the first wiring 8511 and an L-level signal is input to the second wiring 8512, the inverter of FIG. 30B outputs V1 from the third wiring 8513. At this time, when the potential of the node 8541 becomes V1−Vth8503 (Vth8503: a threshold voltage of the third transistor 8503), the node 8541 is in a floating state. As a result, the potential of the node 8541 is higher than V1+Vth8501 (Vth8501: a threshold voltage of the first transistor 8501) by a bootstrap operation, so that the first transistor 8501 is turned on. Further, a capacitor may be provided between a second electrode and a gate electrode of the first transistor 8501 since the first transistor 8501 functions as a bootstrap transistor. It is preferable that one of the first wiring 8511 and the second wiring 8512 be connected to the third wiring 123 in FIG. 1A and the other thereof be connected to the node 142 in FIG. 1A.

Figure 30C:
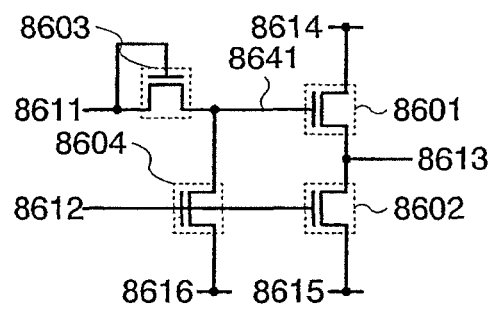

As shown in FIG. 30C, an inverter may be formed of a first transistor 8601, a second transistor 8602, a third transistor 8603, and a fourth transistor 8604. The inverter of FIG. 30C is a two-input inverter, and can perform a bootstrap operation. A signal is input to a first wiring 8611, an inverted signal is input to a second wiring 8612, and a signal is output from a third wiring 8613. V1 is supplied to a fourth wiring 8614, and V2 is supplied to a fifth wiring 8615 and a sixth wiring 8616. When an L-level signal is input to the first wiring 8611 and an H-level signal is input to the second wiring 8612, the inverter of FIG. 30C outputs V2 from the third wiring 8613. At this time, a potential of a node 8641 becomes V2, so that the first transistor 8601 is turned off. Further, when an H-level signal is input to the first wiring 8611 and an L-level signal is input to the second wiring 8612, the inverter of FIG. 30C outputs V1 from the third wiring 8613. At this time, when the potential of the node 8641 becomes V1−Vth8603 (Vth8603: a threshold voltage of the third transistor 8603), the node 8641 is in a floating state. As a result, the potential of the node 8641 is higher than V1+Vth8601 (Vth8601: a threshold voltage of the first transistor 8601) by a bootstrap operation, so that the first transistor 8601 is turned on. A capacitor may be provided between a second electrode and a gate electrode of the first transistor 8601 since the first transistor 8601 functions as a bootstrap transistor. It is preferable that one of the first wiring 8611 and the second wiring 8612 be connected to the third wiring 123 in FIG. 1A and the other thereof be connected to the node 142 in FIG. 1A.

In FIG. 7, a signal output from the seventh wiring 717_$i$−1 is used as a start signal of the flip-flop 701_$i$, and a signal output from the seventh wiring 717_$i$+1 is used as a reset signal. A start signal of the flip-flop 701_1 is input from the first wiring 711. A reset signal of the flip-flop 701_$n$ is input from the sixth wiring 716. Note that as the reset signal of the flip-flop 701_$n$, a signal output from the seventh wiring 717_1 or a signal output from the seventh wiring 717_2 may be used. Alternatively, a dummy flip-flop may be additionally provided, and an output signal of the dummy flip-flop may be used. Thus, the number of wirings and the number of signals can be reduced.

As shown in FIG. 9, for example, when the flip-flop 701_$i$ enters a selection period, an H-level signal (a selection signal) is output from the seventh wiring 717_$i$. At this time, the flip-flop 701_$i$+1 enters a set period. After that, the flip-flop 701_$i$ enters a reset period, and an L-level signal is output from the seventh wiring 717_$i$. At this time, the flip-flop 701_$i$+1 enters a selection period. After that, the flip-flop 701_$i$ enters a non-selection period, and an L-level signal is kept being output from the seventh wiring 717_$i$. At this time, the flip-flop 701_$i$+1 enters a reset period.

Thus, in the shift register of FIG. 7, a selection signal can be sequentially output from the seventh wiring 717_1 to the seventh wiring 717_$n$. That is, in the shift register of FIG. 7, the seventh wirings 717_1 to 717_$n$ can be scanned.

A shift register to which a flip-flop in this embodiment mode is applied can operate with high speed, and thus can be applied to a display device with higher definition or a larger display device. Further, in a shift register to which a flip-flop in this embodiment mode is applied, simplification of a manufacturing process, reduction in manufacturing cost, and improvement in yield can be realized.

Next, a structure and a driving method of a display device including the aforementioned shift register in this embodiment mode are described. Note that a display device in this embodiment mode includes at least a flip-flop in this embodiment mode.

A structure of a display device in this embodiment mode is described with reference to FIG. 11. The display device in FIG. 11 includes a signal line driver circuit 1101, a scan line driver circuit 1102, and a pixel portion 1104. The pixel portion 1104 includes a plurality of signal lines S1 to Sm provided to extend from the signal line driver circuit 1101 in a column direction, a plurality of scan lines G1 to Gn provided to extend from the scan line driver circuit 1102 in a row direction, and a plurality of pixels 1103 arranged in matrix corresponding to the signal lines S1 to Sm and the scan lines G1 to Gn. Each pixel 1103 is connected to the signal line Sj (one of the signal lines S1 to Sm) and the scan line Gi (one of the scan lines G1 to Gn).

A shift register in this embodiment mode can be applied to the scan line driver circuit 1102. It is needless to say that a shift register in this embodiment mode can be also used for the signal line driver circuit 1101.

The scan lines G1 to Gn are connected to the seventh wirings 717_1 to 717_$n$ shown in FIGS. 7 and 10.

The signal line and the scan line may be simply called wirings. The signal line driver circuit 1101 and the scan line driver circuit 1102 each may be called a driver circuit.

The pixel 1103 at least includes a switching element, a capacitor, and a pixel electrode. Note that the pixel 1103 may include a plurality of switching elements or a plurality of capacitors. Further, a capacitor is not always needed. The pixel 1103 may include a transistor operating in a saturation region. The pixel 1103 may include a display element such as a liquid crystal element or an EL element. As the switching element, a transistor or a PN junction diode can be used. When a transistor is used as the switching element, it preferably operates in a linear region. Further, when the scan line driver circuit 1102 includes only n-channel transistors, an n-channel transistor is preferably used as the switching element. When the scan line driver circuit 1102 includes only p-channel transistors, a p-channel transistor is preferably used as the switching element.

The scan line driver circuit 1102 and the pixel portion 1104 are formed over an insulating substrate 1105, and the signal line driver circuit 1101 is not formed over the insulating substrate 1105. The signal line driver circuit 1101 is formed on a single crystalline substrate, an SOI substrate, or another insulating substrate which is different from the insulating substrate 1105. The signal line driver circuit 1101 is connected to the signal lines S1 to Sm through a printed wiring board such as an FPC. Note that the signal line driver circuit 1101 may be formed over the insulating substrate 1105, or a circuit forming part of the signal line driver circuit 1101 may be formed over the insulating substrate 1105.

The signal line driver circuit 1101 inputs a voltage or a current as a video signal to the signal lines S1 to Sm. Note that the video signal may be an analog signal or a digital signal. Positive and negative polarity of the video signal may be inverted for each frame (i.e., frame inversion driving), may be inverted for each row (i.e., gate line inversion driving), may be inverted for each column (i.e., source line inversion driving), or may be inverted for each row and column (i.e., dot inversion driving). Further, the video signal may be input to the signal lines S1 to Sm with dot sequential driving or line sequential driving. The signal line driver circuit 1101 may input not only the video signal but also a certain voltage such as precharge voltage to the signal lines S1 to Sm. A certain voltage such as the precharge voltage is preferably input in each frame or in each gate selection period.

The scan line driver circuit 1102 inputs a signal to the scan lines G1 to Gn and selects (hereinafter also referred to as scans) the scan lines G1 to Gn sequentially from the first row. Then, the scan line driver circuit 1102 selects the plurality of pixels 1103 to be connected to the selected scan line. Here, one gate selection period refers to a period in which one scan line is selected, and a non-selection period refers to a period in which the scan line is not selected. A scan signal refers to a signal output to the scan line from the scan line driver circuit 1102. The maximum value of the scan signal is larger than the maximum value of the video signal or the maximum voltage of the signal line, and the minimum value of the scan signal is smaller than the minimum value of the video signal or the minimum voltage of the signal line.

When the pixel 1103 is selected, the video signal is input to the pixel 1103 from the signal line driver circuit 1101 through the signal line. When the pixel 1103 is not selected, the pixel 1103 maintains the video signal (a potential corresponding to the video signal) input in the selection period.

Although not shown, a plurality of potentials and a plurality of signals are supplied to the signal line driver circuit 1101 and the scan line driver circuit 1102.

Figure 11:
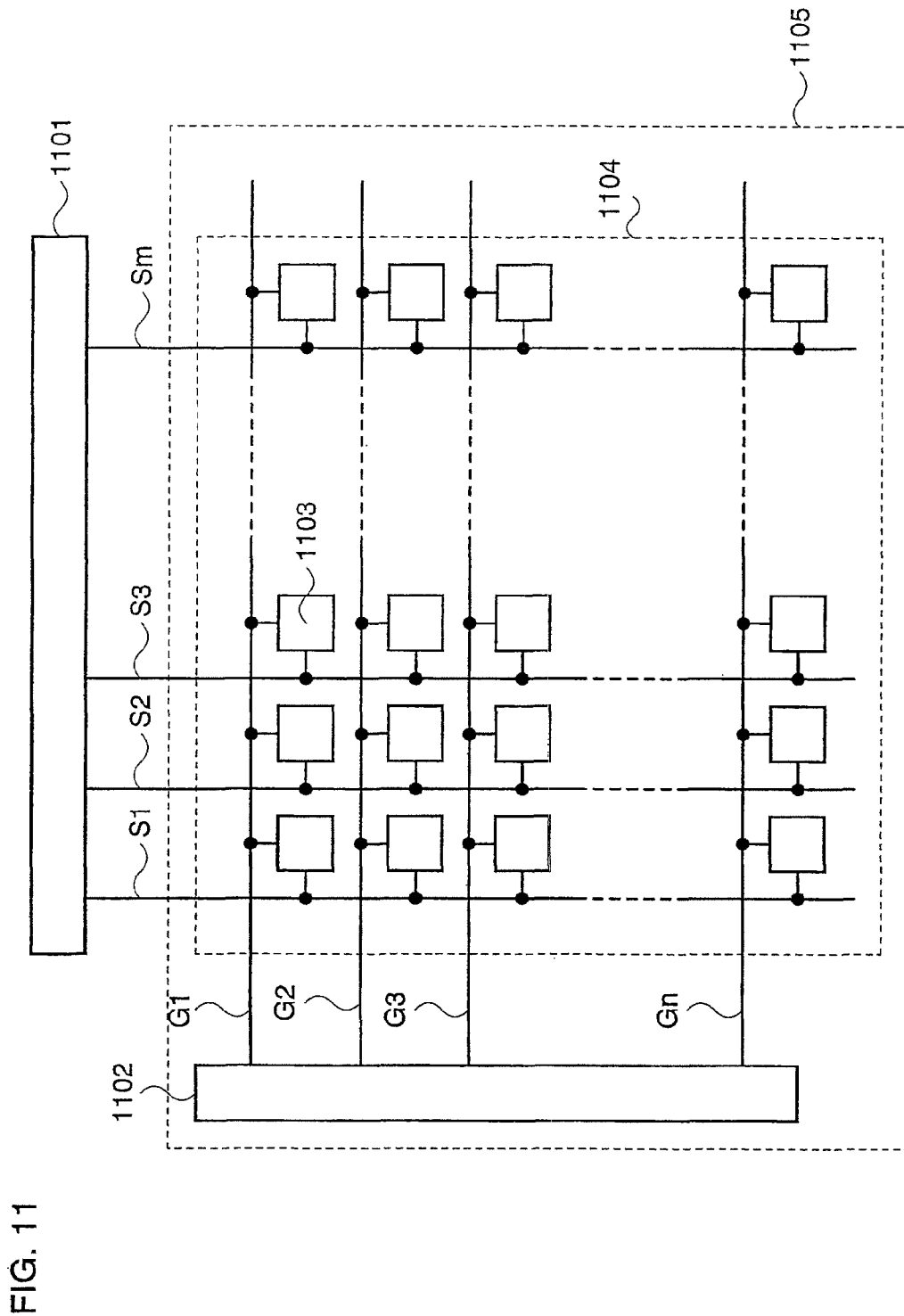
FIG. 11 shows a structure of a display device shown in Embodiment Mode 1.
Figure 12:
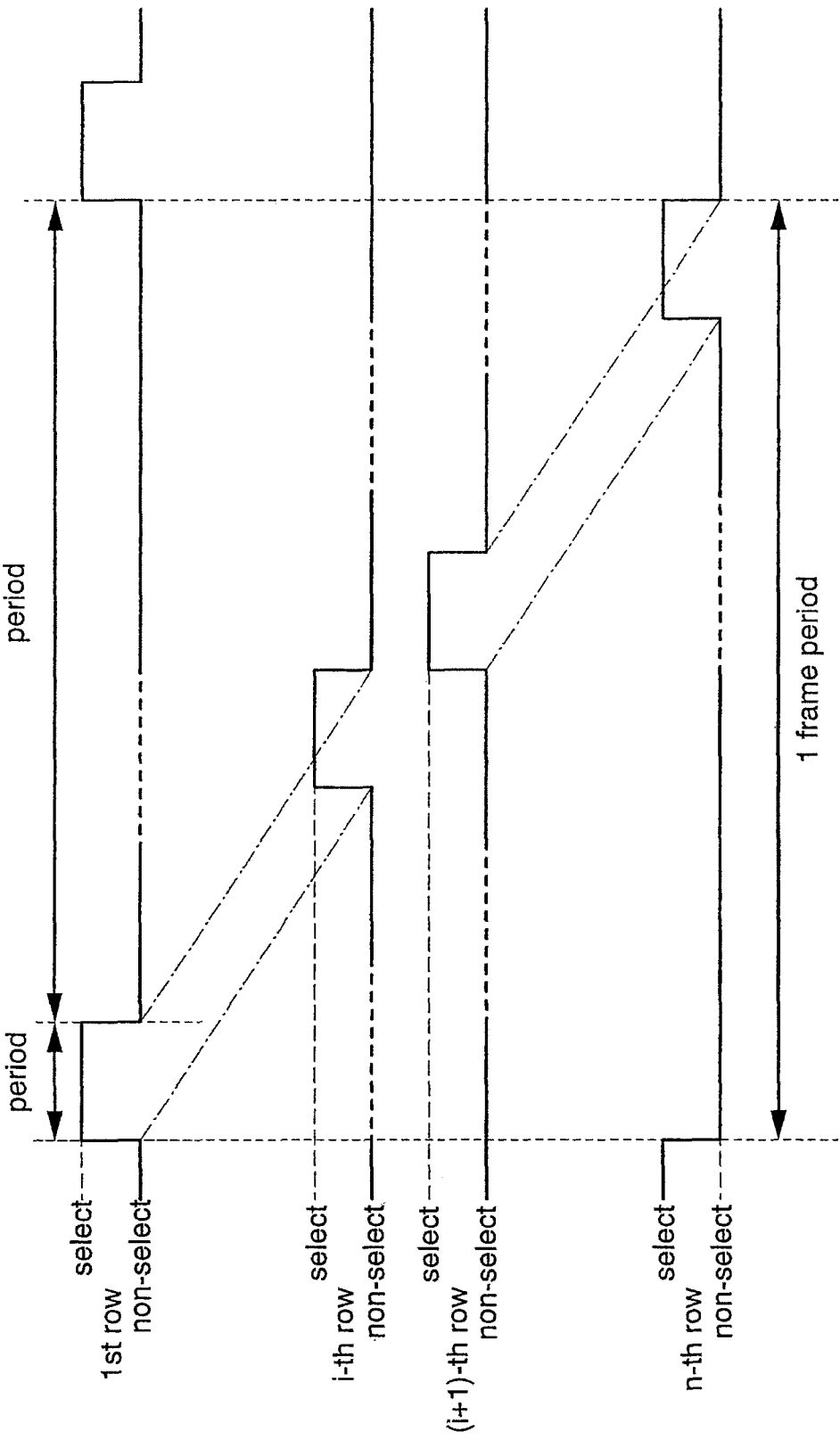
FIG. 12 is a timing chart showing a writing operation of the display device shown in FIG. 11.

Next, an operation of the display device shown in FIG. 11 is described with reference to a timing chart of FIG. 12. FIG. 12 shows one frame period corresponding to a period for displaying an image for one screen. Although one frame period is not particularly limited, it is preferably 1/60 seconds or less so that a person viewing an image does not perceive a flicker.

The timing chart of FIG. 12 shows each timing for selecting the scan line G1 in the first row, the scan line Gi in the i-th row, the scan line Gi+1 in the (i+1)th row, and the scan line Gn in the n-th row.

In FIG. 12, the scan line Gi in the i-th row is selected, for example, and the plurality of pixels 1103 connected to the scan line Gi are selected. Then, a video signal is input to each of the plurality of pixels 1103 connected to the scan line Gi, and each of the plurality of pixels 1103 maintains a potential corresponding to the video signal. After that, the scan line Gi in the i-th row is non-selected, the scan line Gi+1 in the (i+1)th row is selected, and the plurality of pixels 1103 connected to the scan line Gi+1 are selected. Then, a video signal is input to each of the plurality of pixels 1103 connected to the scan line Gi+1, and each of the plurality of pixels 1103 maintains a potential corresponding to the video signal. Thus, in one frame period, the scan lines G1 to Gn are sequentially selected, and the pixels 1103 connected to each scan line are also sequentially selected. A video signal is input to each of the plurality of pixels 1103 connected to each scan line, and each of the plurality of pixels 1103 maintains a potential corresponding to the video signal.

A display device which uses a shift register in this embodiment mode as the scan line driver circuit 1102 can operate with high speed; thus, higher definition or further increase in size of the display device can be realized. Further, in a display device in this embodiment mode, simplification of a manufacturing process, reduction in manufacturing cost, and improvement in yield can be realized.

In the display device of FIG. 11, the signal line driver circuit 1101 requiring high-speed operation is formed over a substrate different from that for the scan line driver circuit 1102 and the pixel portion 1104. Therefore, amorphous silicon can be used as semiconductor layers of the transistors included in the scan line driver circuit 1102 and the pixel 1103. As a result, simplification of a manufacturing process, reduction in manufacturing cost, and improvement in yield can be realized. Further, increase in size of a display device in this embodiment mode can be realized. Even when polysilicon or single crystalline silicon is used as the semiconductor layer of the transistor, simplification of a manufacturing process can be realized.

When the signal line driver circuit 1101, the scan line driver circuit 1102, and the pixel portion 1104 are formed over the same substrate, polysilicon or single crystalline silicon is preferably used as the semiconductor layers of the transistors included in the scan line driver circuit 1102 and the pixel 1103.

The number, arrangement, and the like of the driver circuits are not limited to those shown in FIG. 11 as long as a pixel can be selected and a video signal can be independently written to each pixel as shown in FIG. 11.

Figure 13:
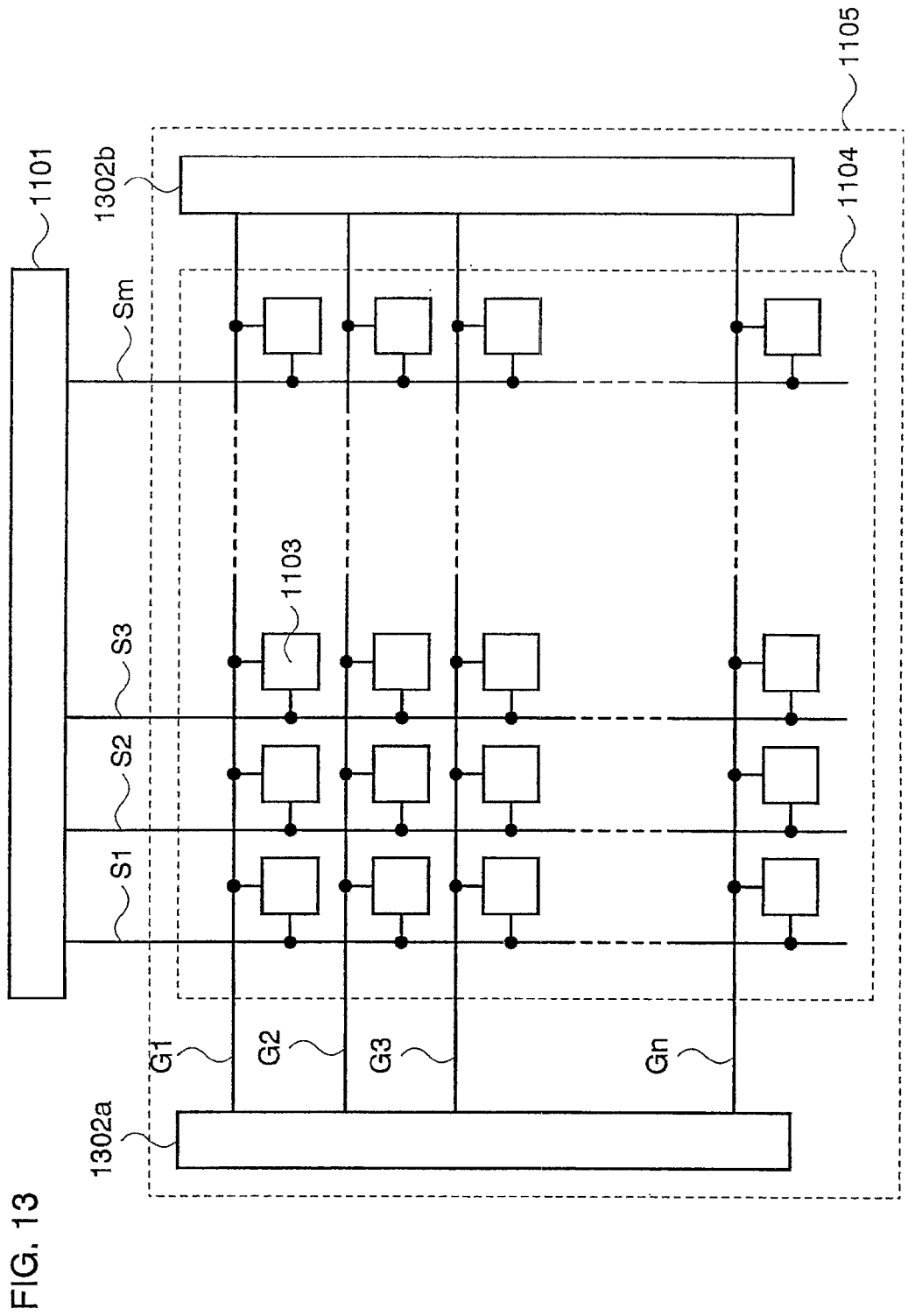
FIG. 13 shows a structure of a display device shown in Embodiment Mode 1.

For example, as shown in FIG. 13, the scan lines G1 to Gn may be scanned by a first scan line driver circuit 1302a and a second scan line driver circuit 1302b. The first scan line driver circuit 1302a and the second scan line driver circuit 1302b each have a structure similar to that of the scan line driver circuit 1102 in FIG. 11, and scan the scan lines G1 to Gn at the same timing. Further, the first scan line driver circuit 1302a and the second scan line driver circuit 1302b may be called a first driver circuit and a second driver circuit.

Even if a defect occurs in one of the first scan line driver circuit 1302a and the second scan line driver circuit 1302b, the scan lines G1 to Gn can be scanned by the other of the first scan line driver circuit 1302a and the second scan line driver circuit 1302b; thus, a display device in FIG. 13 can have redundancy. In the display device in FIG. 13, a load (wiring resistance of the scan lines and parasitic capacitance of the scan lines) of the first scan line driver circuit 1302a and a load of the second scan line driver circuit 1302b can be reduced to half of those in FIG. 11. Thus, delay and distortion of signals (output signals of the first scan line driver circuit 1302a and the second scan line driver circuit 1302b) input to the scan lines G1 to Gn can be reduced. Further, since the loads of the first scan line driver circuit 1302a and the second scan line driver circuit 1302b can be reduced in the display device of FIG. 13, the scan lines G1 to Gn can be scanned with high speed. Since the scan lines G1 to Gn can be scanned with high speed, increase in size or definition of a panel can be realized. Note that portions common to the structure of FIG. 11 are denoted by common reference numerals, and description thereof is omitted.

Figure 14:
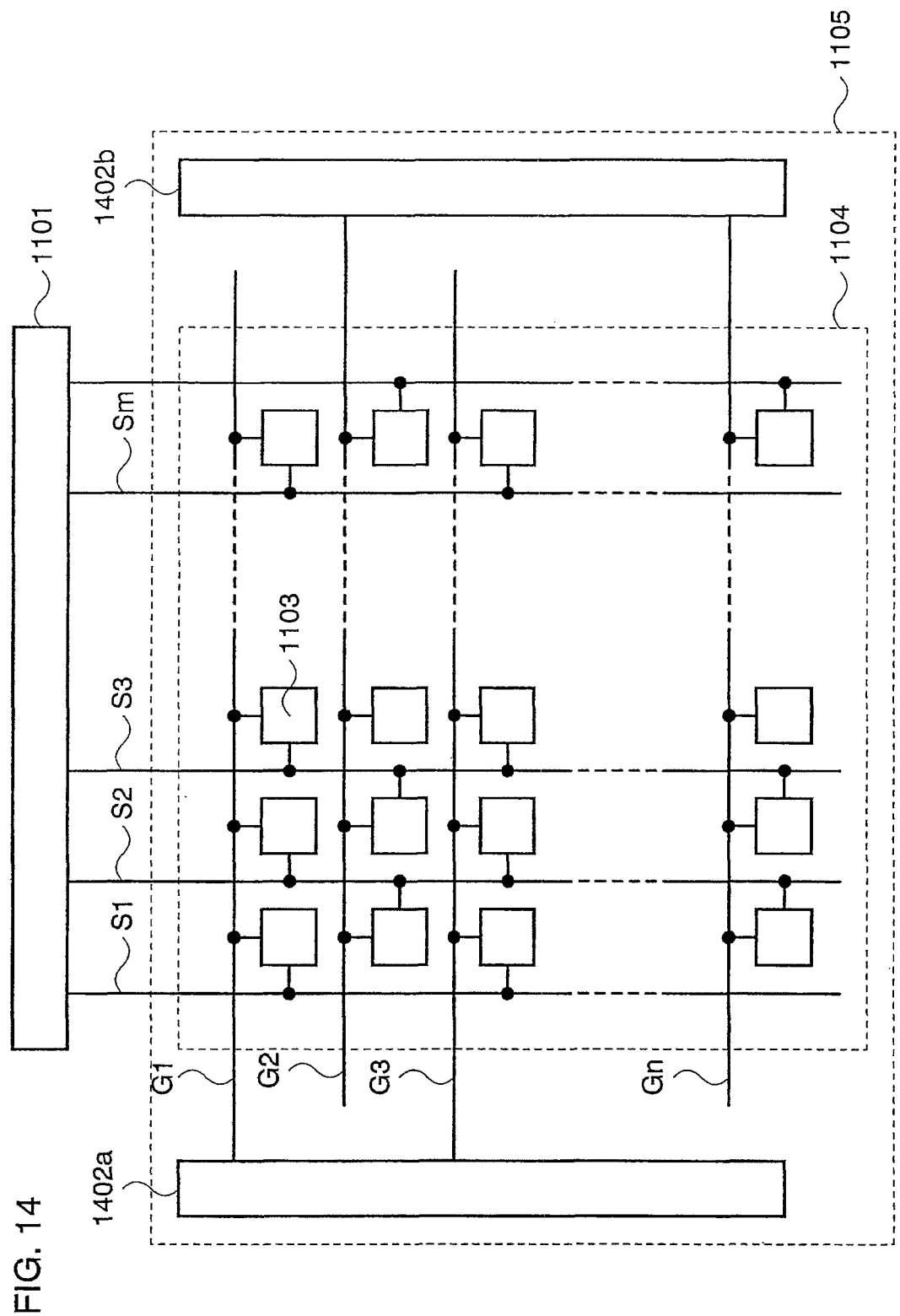
FIG. 14 shows a structure of a display device shown in Embodiment Mode 1.

As another example, FIG. 14 shows a display device in which a video signal can be written to a pixel with high speed. In the display device of FIG. 14, video signals are input to the pixels 1103 in odd-numbered rows from the signal lines in the odd-numbered columns, and are input to the pixels 1103 in even-numbered rows from the signal lines in the even-numbered columns. In the display device of FIG. 14, scan lines in odd-numbered stages among the scan lines G1 to Gn are scanned by a first scan line driver circuit 1402a, and scan lines in even-numbered stages among the scan lines G1 to Gn are scanned by a second scan line driver circuit 1402b. Further, input of a start signal to the first scan line driver circuit 1402a is delayed for ¼ period of a clock signal with respect to a start signal input to the second scan line driver circuit 1402b.

The display device of FIG. 14 can perform dot inversion driving simply by inputting a positive video signal and a negative video signal to the signal lines in each column in one frame period. Further, the display device of FIG. 14 can perform frame inversion driving by inverting polarity of the video signal input to each signal line in every one frame period.

Figure 15:
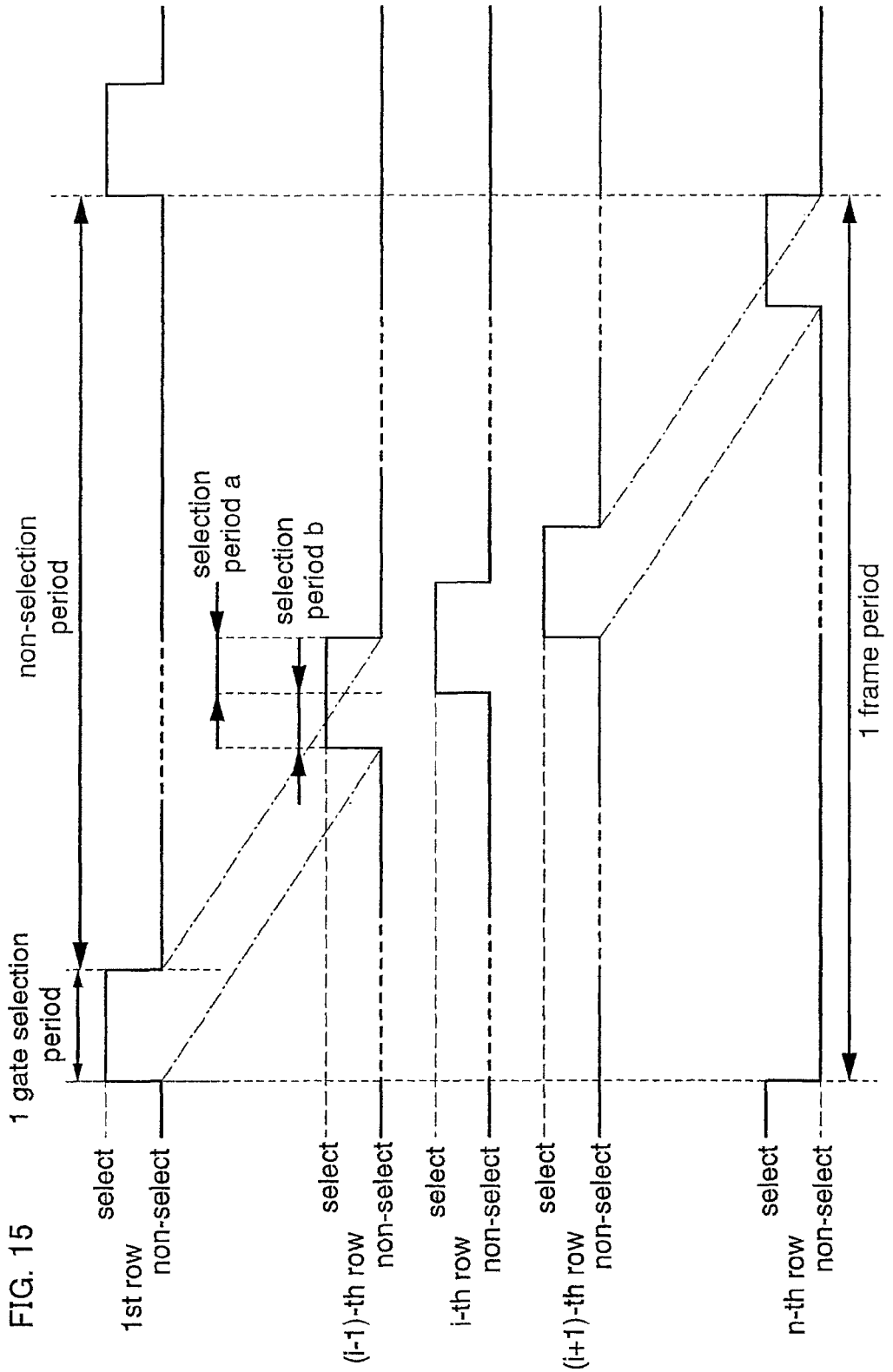
FIG. 15 is a timing chart showing a writing operation of the display device shown in FIG. 14.

An operation of the display device in FIG. 14 is described with reference to a timing chart of FIG. 15. The timing chart of FIG. 15 shows each timing for selecting the scan line G1 in the first row, the scan line Gi−1 in the (i−1)th row, the scan line Gi in the i-th row, the scan line Gi+1 in the (i+1)th row, and the scan line Gn in the n-th row. Further, in the timing chart of FIG. 15, one selection period is divided into a selection period a and a selection period b. The case where the display device in FIG. 14 performs dot inversion driving and frame inversion driving is described with reference to the timing chart of FIG. 15.

In FIG. 15, the selection period a of the scan line Gi in the i-th row, for example, overlaps with the selection period b of the scan line Gi−1 in the (i−1)th row. The selection period b of the scan line Gi in the i-th row overlaps with the selection period a of the scan line Gi+1 in the (i+1)th row. Therefore, in the selection period a, a video signal similar to that input to the pixel 1103 in the (i−1)th row and (j+1)th column is input to the pixel 1103 in the i-th row and j-th column. Further, in the selection period b, a video signal similar to that input to the pixel 1103 in the i-th row and j-th column is input to the pixel 1103 in the (i+1)th row and (j+1)th column. Note that a video signal input to the pixel 1103 in the selection period b is an original video signal, and a video signal input to the pixel 1103 in the selection period a is a video signal for precharging the pixel 1103. Accordingly, in the selection period a, each pixel 1103 is precharged by the video signal input to the pixel 1103 in the (i−1)th row and (j+1)th column, and in the selection period b, an original video signal (in the i-th row and j-th column) is input to each pixel 1103.

Accordingly, since the video signal can be written to the pixel 1103 with high speed, increase in size and definition of the display device in FIG. 14 can be realized. Further, in the display device of FIG. 14, since the video signals with the same polarity are input to respective signal lines in one frame period, the amount of charging and discharging of each signal line is decreased, and reduction in power consumption can be realized. Further, since a load of an IC for inputting the video signal can be greatly decreased in display device of FIG. 14, heat generation, power consumption, and the like of the IC can be reduced. Furthermore, since driving frequency of the first scan line driver circuit 1402a and the second scan line driver circuit 1402b in the display device of FIG. 14 can be decreased to approximately half, power saving can be realized.

In the display device in this embodiment mode, various driving methods can be performed depending on a structure and a driving method of the pixel 1103. For example, in one frame period, a scan line driver circuit may scan the scan lines a plurality of times.

A wiring or the like may be added to the display devices in FIGS. 11, 13, and 14 depending on a structure of the pixel 1103. For example, a power supply line maintained at a constant potential, a capacitor line, another scan line, or the like may be added. When another scan line is added, a scan line driver circuit to which a shift register in this embodiment mode is applied may be added as well. As another example, a pixel portion may be provided with a dummy scan line, signal line, power supply line, or capacitor line.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 2

In this embodiment mode, structures and driving methods of a flip-flop different from those in Embodiment Mode 1, a driver circuit including the flip-flop, and a display device including the driver circuit are described. Note that portions common to Embodiment Mode 1 are denoted by common reference numerals, and detailed description of the same portions and portions having similar functions is omitted.

As a structure of a flip-flop in this embodiment mode, a structure similar to that of the flip-flop in Embodiment Mode 1 can be used. Thus, in this embodiment mode, description of the structure of the flip-flop is omitted. Note that timing for driving the flip-flop is different from that in Embodiment Mode 1.

The case where driving timing in this embodiment mode is applied to FIG. 1A is described. Note that the driving timing in this embodiment mode can be freely combined with each flip-flop in FIGS. 1B, 1C, 4A to 4C, 5A, and 5B as well. Further, the driving timing in this embodiment mode can be freely combined with the driving timing in Embodiment Mode 1 as well.

Figure 16:
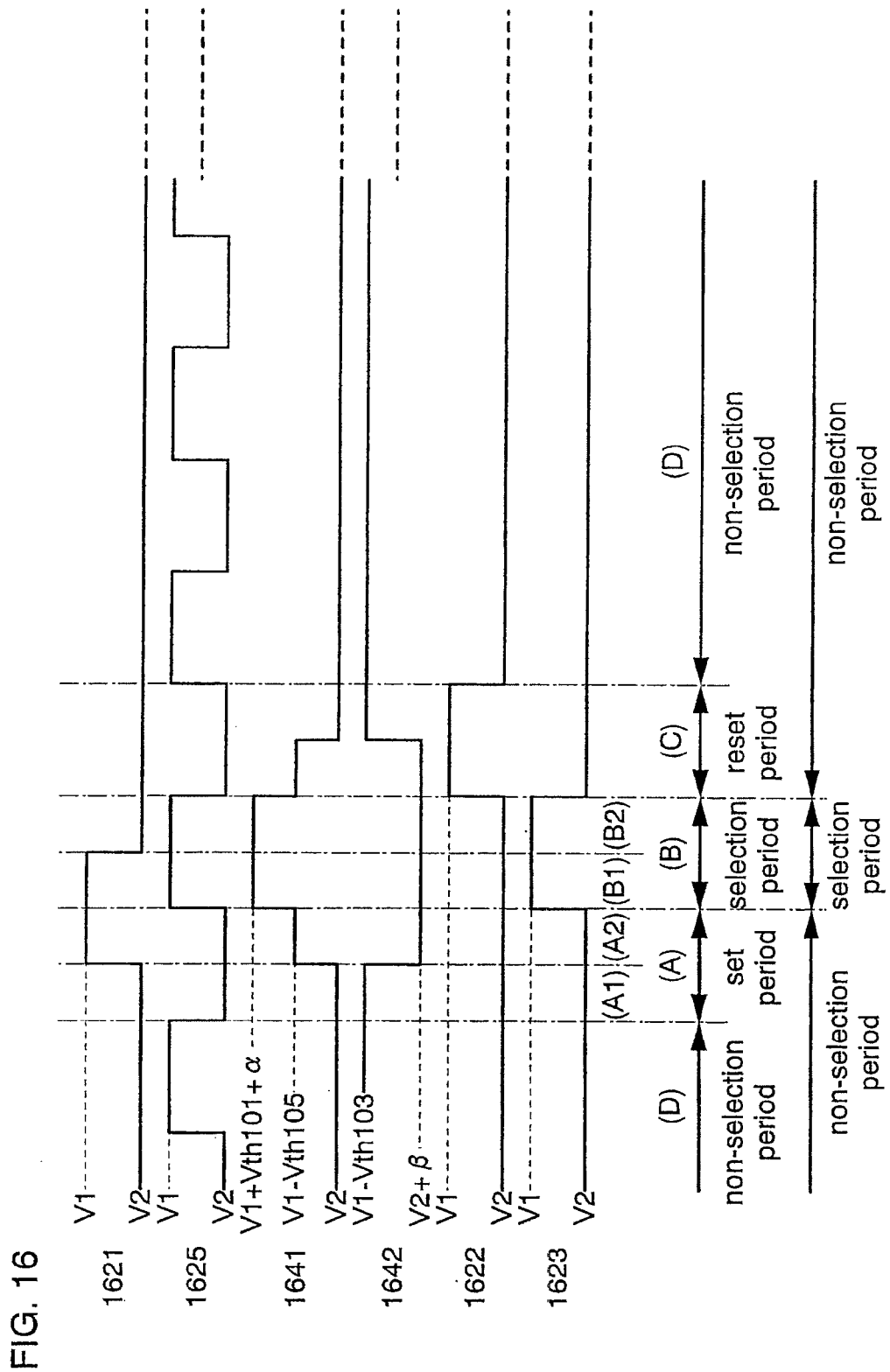
FIG. 16 is a timing chart showing operations of a flip-flop shown in Embodiment Mode 2.

An operation of the flip-flop in this embodiment mode is described with reference to the flip-flop in FIG. 1A and a timing chart of FIG. 16. The timing chart of FIG. 16 is described in which an operation period is divided into a set period, a selection period, a reset period, and a non-selection period. Note that the set period is divided into a first set period and a second set period, and the selection period is divided into a first selection period and a second selection period.

A signal 1621, a signal 1625, and a signal 1622 in FIG. 16 are input to the first wiring 121, the fifth wiring 125, and the second wiring 122, respectively. A signal 1623 in FIG. 16 is output from the third wiring 123. Here, the signals 1621, 1625, 1622, and 1623 correspond to the signals 221, 225, 222, and 223 in FIG. 2, respectively. The signals 1621, 1625, 1622, and 1623 may be referred to as a start signal, a clock signal, a reset signal, and an output signal, respectively.

The flip-flop in this embodiment mode basically operates similarly to the flip-flop in Embodiment Mode 1. The flip-flop in this embodiment mode is different from the flip-flop in Embodiment Mode 1 in that timing when an H-level signal is input to the first wiring 121 is delayed for ¼ period of a clock signal.

In the first set period (A1), the second set period (A2), the reset period (C), and the non-selection period (D) shown in FIG. 16, the flip-flop in this embodiment mode operates similarly in the non-selection period (D), the set period (A), the reset period (C), and the non-selection period (D) shown in FIG. 2, and description thereof is omitted.

Figure 17:
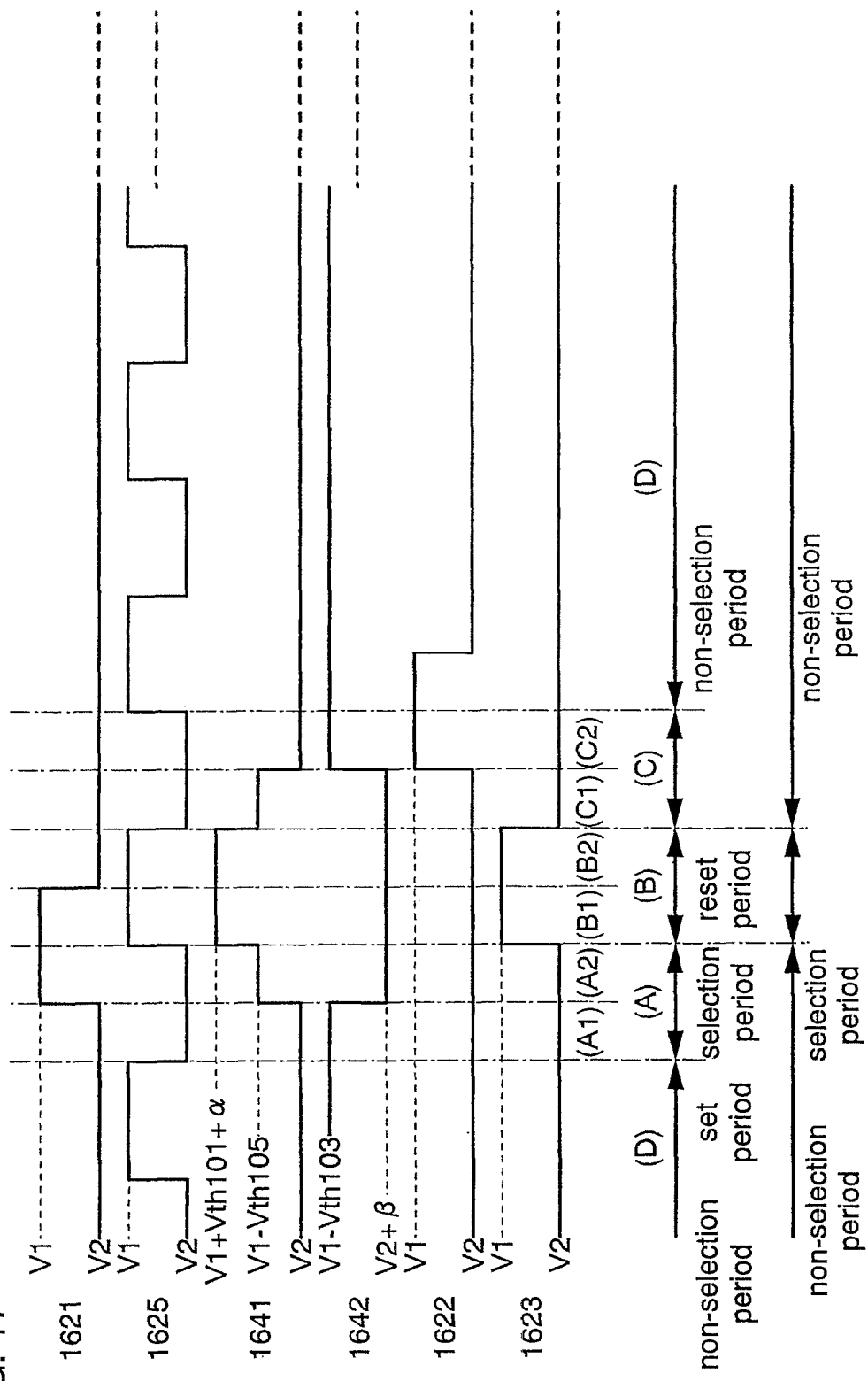
FIG. 17 is a timing chart showing operations of a flip-flop shown in Embodiment Mode 2.

As shown in FIG. 17, in the flip-flop in this embodiment mode, the timing when the H-level signal is input to the second wiring 122 is delayed for ¼ period of the clock signal, so that fall time of an output signal can be significantly decreased. That is, in the flip-flop in this embodiment mode to which FIG. 17 is applied, an L-level signal is input to the fifth wiring 125, and the potential of the node 141 is decreased to approximately V1+Vth101 in a first reset period shown in FIG. 17. Thus, the first transistor 101 is kept on, and an L-level signal is output from the third wiring 123. An L-level signal is input to the third wiring 123 through the first transistor 101 with the large value of W/L. Therefore, time for the potential of the third wiring 123 to change from H level to L level can be significantly reduced. After that, in the flip-flop in this embodiment mode, to which FIG. 17 is applied, the seventh transistor 107 is turned on, and the potential of the node 141 becomes V2 in a second reset period (C2) in FIG. 17. The potential (a potential 1642) of the node 142 at this time becomes V1−Vth103, and the third transistor 103 is turned on; thus, an L-level signal is output from the third wiring 123.

The flip-flop in this embodiment mode can obtain advantageous effects similar to those of the flip-flop in Embodiment Mode 1.

Next, a structure and a driving method of a shift register including the aforementioned flip-flop in this embodiment mode are described.

A structure of a shift register in this embodiment mode is described with reference to FIG. 18. The shift register in FIG. 18 includes n flip-flops (flip-flops 1801_1 to 1801_n).

Figure 18:
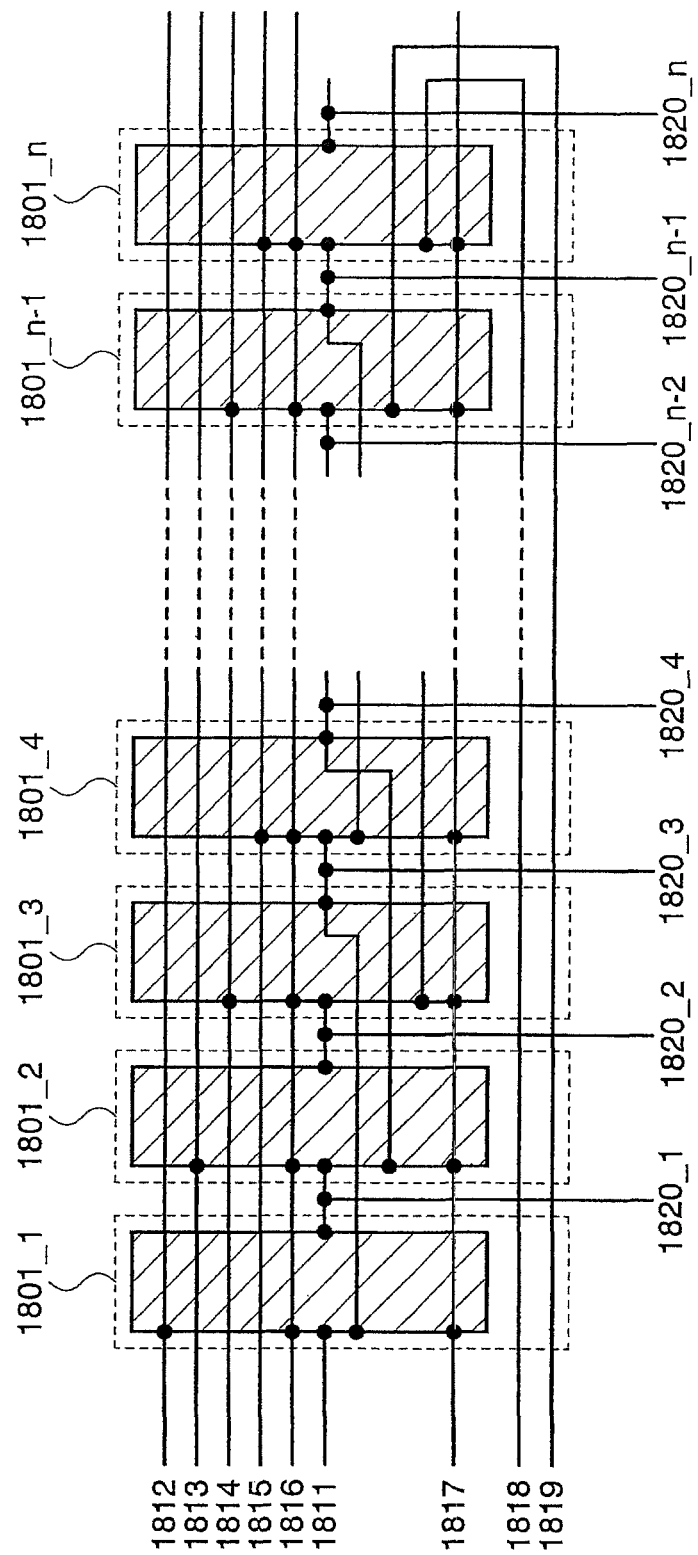
FIG. 18 shows a structure of a shift register shown in Embodiment Mode 2.

Connection relationships of the shift register in FIG. 18 are described. In a flip-flop 1801_i in an i-th stage (one of the flip-flops 1801_1 to 1801_n) of the shift register in FIG. 18, the first wiring 121 shown in FIG. 1A is connected to a tenth wiring 1820_i−1. The second wiring 122 shown in FIG. 1A is connected to a tenth wiring 1820_i+2. The third wiring 123 shown in FIG. 1A is connected to a tenth wiring 1820_i. The fourth wiring 124, the eighth wiring 128, the ninth wiring 129, the tenth wiring 130, and the eleventh wiring 131 shown in FIG. 1A are connected to a seventh wiring 1817. The fifth wiring 125 shown in FIG. 1A is connected to a second wiring 1812 in a flip-flop in a (4N−3)th stage (N is a natural number of 1 or more), to a third wiring 1813 in a flip-flop in a (4N−2)th stage, to a fourth wiring 1814 in a flip-flop in a (4N−1)th stage, and to a fifth wiring 1815 in a flip-flop in a 4N-th stage. The sixth wiring 126 and the seventh wiring 127 shown in FIG. 1A are connected to a sixth wiring 1816. Note that in the flip-flop 1801_1 in a first stage, the first wiring 121 shown in FIG. 1A is connected to a first wiring 1811. In the flip-flop 1801_n−1 in an (n−1)th stage, the second wiring 122 shown in FIG. 1A is connected to a ninth wiring 1819. In the flip-flop 1801_n in an n-th stage, the second wiring 122 shown in FIG. 1A is connected to an eighth wiring 1818.

When the timing chart of FIG. 17 is applied to the flip-flop in this embodiment mode, in the flip-flop 1801_i in the i-th stage, the second wiring 122 in FIG. 1A is connected to a tenth wiring 1820_i+3. Accordingly, in the flip-flop 1801_n−3 in an (n−3)th stage, an additional wiring is connected to the second wiring 122 in FIG. 1A.

The first wiring 1811, the second wiring 1812, the third wiring 1813, the fourth wiring 1814, the fifth wiring 1815, the eighth wiring 1818, and the ninth wiring 1819 may be referred to as a first signal line, a second signal line, a third signal line, a fourth signal line, a fifth signal line, a sixth signal line, and a seven signal line, respectively. The sixth wiring 1816 and the seventh wiring 1817 may be referred to as a first power supply line and a second power supply line, respectively.

Next, an operation of the shift register in FIG. 18 is described with reference to timing charts of FIGS. 19 and 20. Here, the timing chart of FIG. 19 is divided into a scan period and a retrace period.

The potential of V1 is supplied to the sixth wiring 1816, and the potential of V2 is supplied to the seventh wiring 1817.

Figure 19:
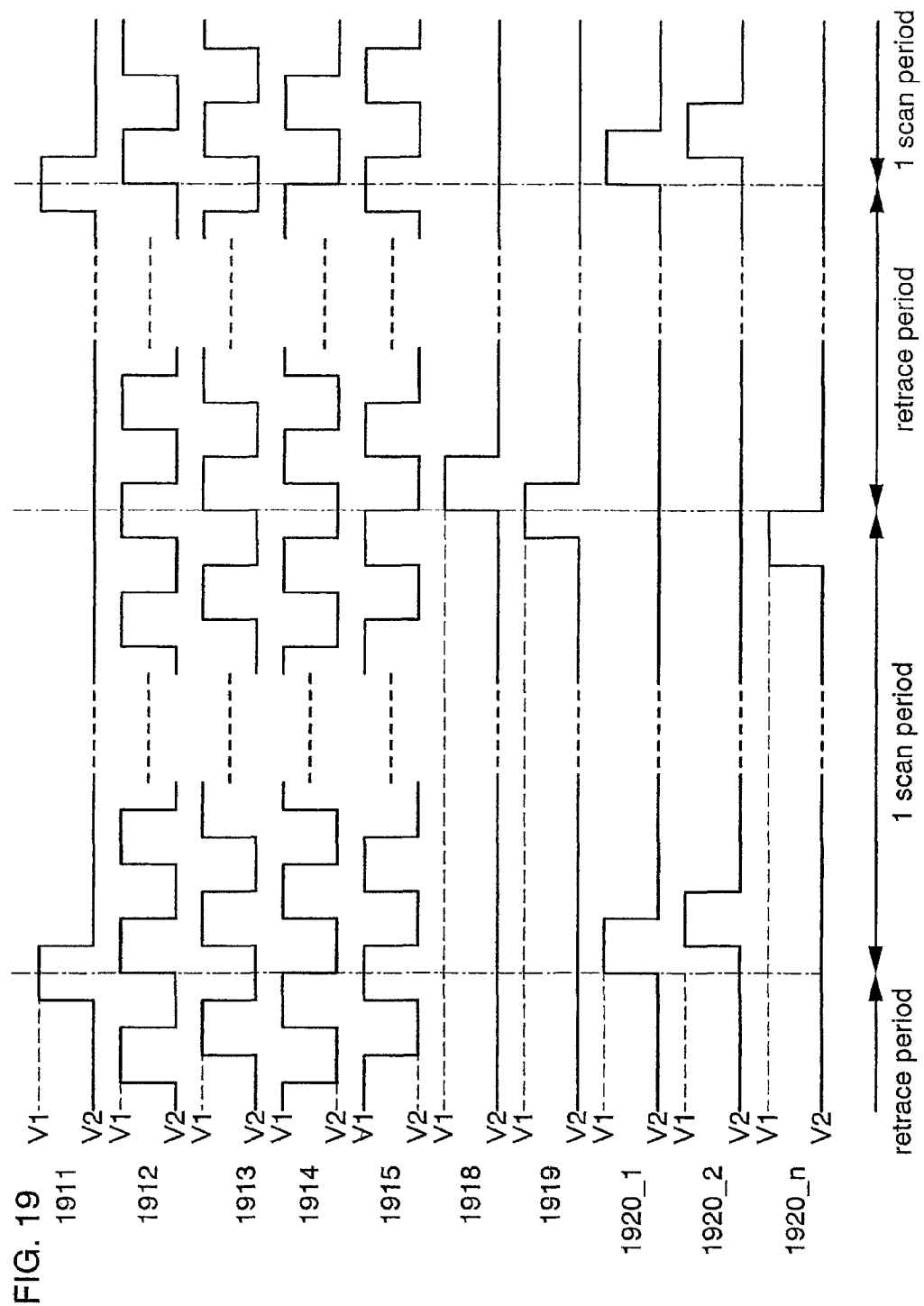
FIG. 19 is a timing chart showing operations of the shift register shown in FIG. 18.

Signals 1911, 1912, 1913, 1914, 1915, 1918, and 1919 shown in FIG. 19 are input to the first wiring 1811, the second wiring 1812, the third wiring 1813, the fourth wiring 1814, the fifth wiring 1815, the eighth wiring 1818, and the ninth wiring 1819, respectively. Here, each of the signals 1911, 1912, 1913, 1914, 1915, 1918, and 1919 is a digital signal in which a potential of an H-level signal is V1 and a potential of an L-level signal is V2. Further, the signals 1911, 1912, 1913, 1914, 1915, 1918, and 1919 may be referred to as a start signal, a first clock signal, a second clock signal, a third clock signal, a fourth clock signal, a first reset signal, and a second reset signal, respectively.

Note that various signals, potentials, or currents may be input to each of the first to ninth wirings 1811 to 1819.

Digital signals 1920_1 to 1920_n in each of which a potential of an H-level signal is V1 and a potential of an L-level signal is V2 are output from the tenth wirings 1820_1 to 1820_n. Similarly to Embodiment Mode 1, the tenth wirings 1820_1 to 1820_n are connected to respective buffers, so that the shift register can easily operate.

A signal output from the tenth wiring 1820_i−1 is used as a start signal of the flip-flop 1801_i, and a signal output from the tenth wiring 1820_i+2 is used as a reset signal. Here, a start signal of the flip-flop 1801_1 is input from the first wiring 1811. A second reset signal of the flip-flop 1801_n−1 is input from the ninth wiring 1819. A first reset signal of the flip-flop 1801_n is input from the eighth wiring 1818. Note that a signal output from the tenth wiring 1820_1 may be used as the second reset signal of the flip-flop 1801_n−1, or a signal output from the tenth wiring 1820_2 may be used as the first reset signal of the flip-flop 1801_n. Alternatively, the signal output from the tenth wiring 1820_2 may be used as the second reset signal of the flip-flop 1801_n−1, and a signal output from the tenth wiring 1820_3 may be used as the first reset signal of the flip-flop 1801_n. Further alternatively, first and second dummy flip-flops may be additionally provided, and output signals of the first and second dummy flip-flops may be used as the first and second reset signals. Thus, the number of wirings and the number of signals can be reduced.

Figure 20:
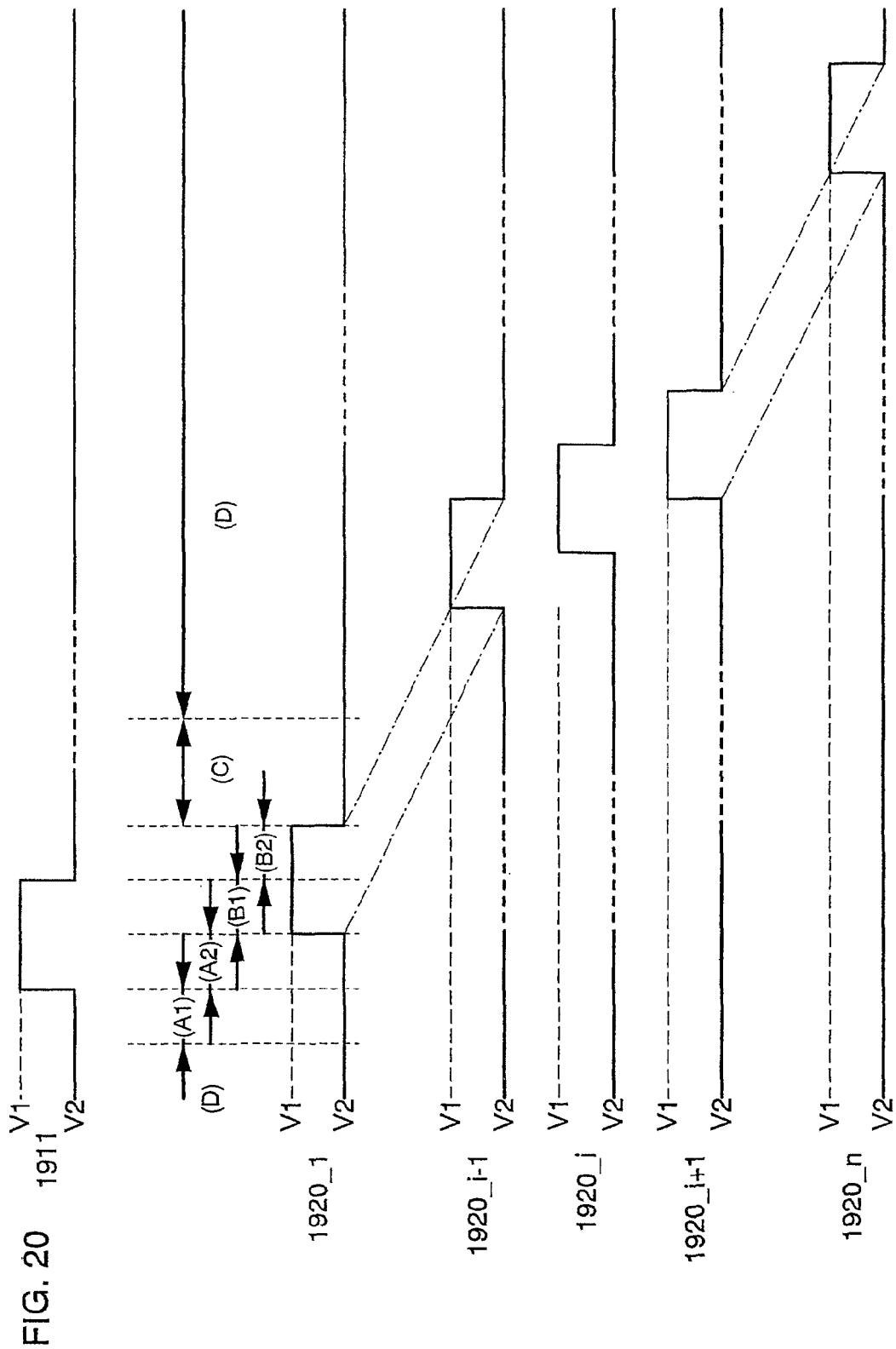
FIG. 20 is a timing chart showing operations of the shift register shown in FIG. 18.

As shown in FIG. 20, for example, when the flip-flop 1801_$i$ enters a first selection period, an H-level signal (a selection signal) is output from the tenth wiring 1820_$i$. At this time, the flip-flop 1801_$i$+1 enters a second set period. Then, even after the flip-flop 1801_$i$ enters a second selection period, the H-level signal is kept being output from the tenth wiring 1820_$i$. At this time, the flip-flop 1801_$i$+1 enters a first selection period. After that, when the flip-flop 1801_$i$ enters a reset period, an L-level signal is output from the tenth wiring 1820_$i$. At this time, the flip-flop 1801_$i$+1 enters a second selection period. Then, even after the flip-flop 1801_$i$ enters a non-selection period, the L-level signal is kept being output from the tenth wiring 1820_$i$. At this time, the flip-flop 1801_$i$+1 enters a reset period.

Thus, the shift register of FIG. 18 can output a selection signal sequentially from the tenth wiring 1820_1 to the tenth wiring 1820_$n$. Further, in the shift register of FIG. 18, the second selection period of the flip-flop 1801_$i$ and the first selection period of the flip-flop 1801_$i$+1 are the same period; thus, the selection signal can be output from the tenth wiring 1820_$i$ and the tenth wiring 1820_$i$+1 in the same period.

A shift register to which a flip-flop in this embodiment mode is applied can be applied to a display device with high definition or a large display device. Further, a shift register in this embodiment mode can obtain advantageous effects similar to those of the shift register in Embodiment Mode 1.

Next, a structure and a driving method of a display device including the aforementioned shift register in this embodiment mode are described. Note that a display device in this embodiment mode includes at least a flip-flop in this embodiment mode.

A structure of a display device in this embodiment mode is described with reference to FIG. 21. In the display device of FIG. 21, the scan lines G1 to Gn are scanned by a scan line driver circuit 2102. Further, in the display device of FIG. 21, video signals are input to the pixels 1103 in the odd-numbered rows from the signal lines in the odd-numbered rows, and are input to the pixels 1103 in the even-numbered rows from the signal lines in the even-numbered rows. Note that portions common to the structure of FIG. 11 are denoted by common reference numerals, and description thereof is omitted.

Figure 21:
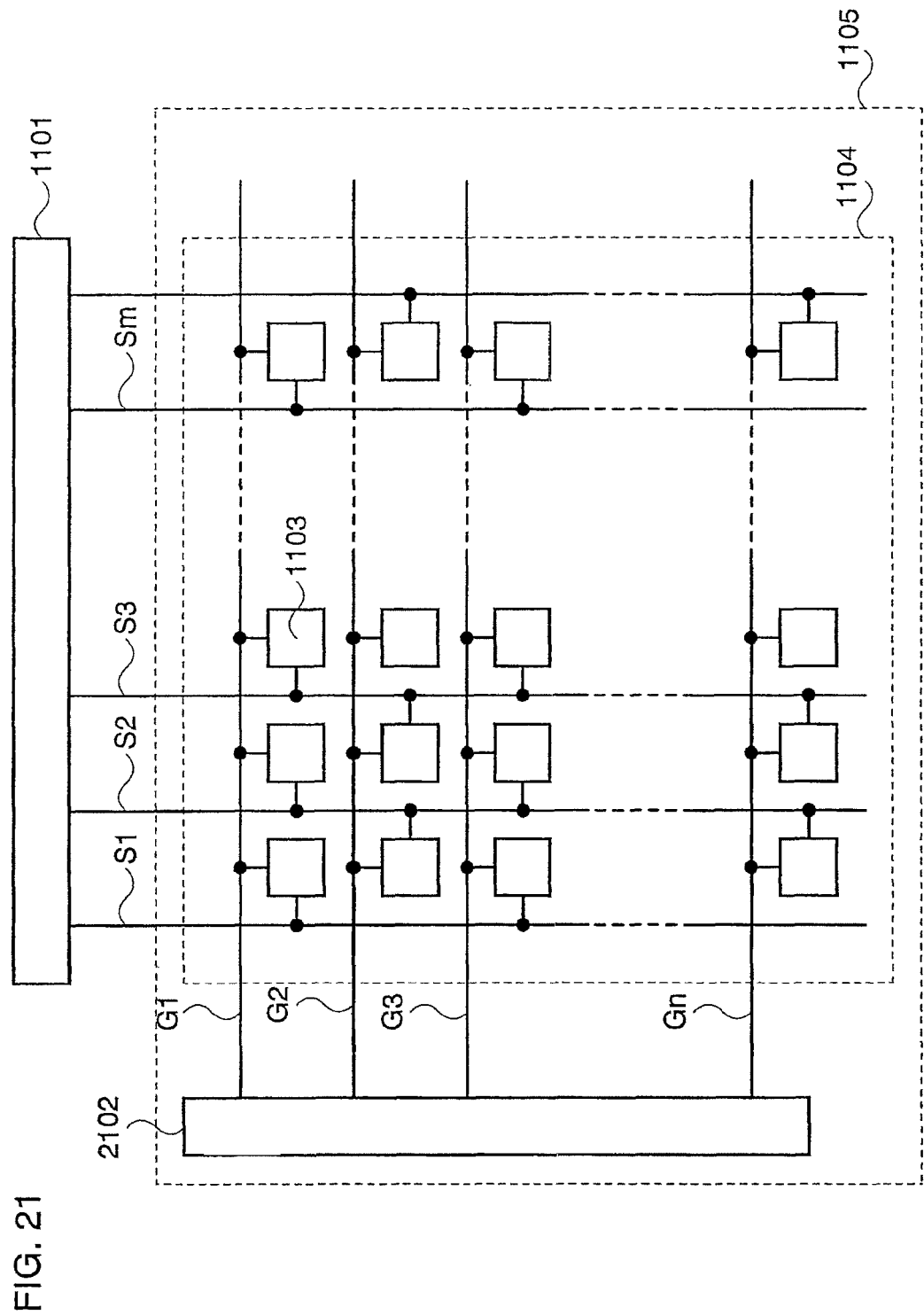
FIG. 21 shows a structure of a display device shown in Embodiment Mode 2.

When a shift register in this embodiment mode is applied to the scan line driver circuit 2102, the display device of FIG. 21 can operate similarly to the display device of FIG. 14 by one scan line driver circuit. Thus, advantageous effects similar to those of the display device of FIG. 14 can be obtained.

Figure 22:
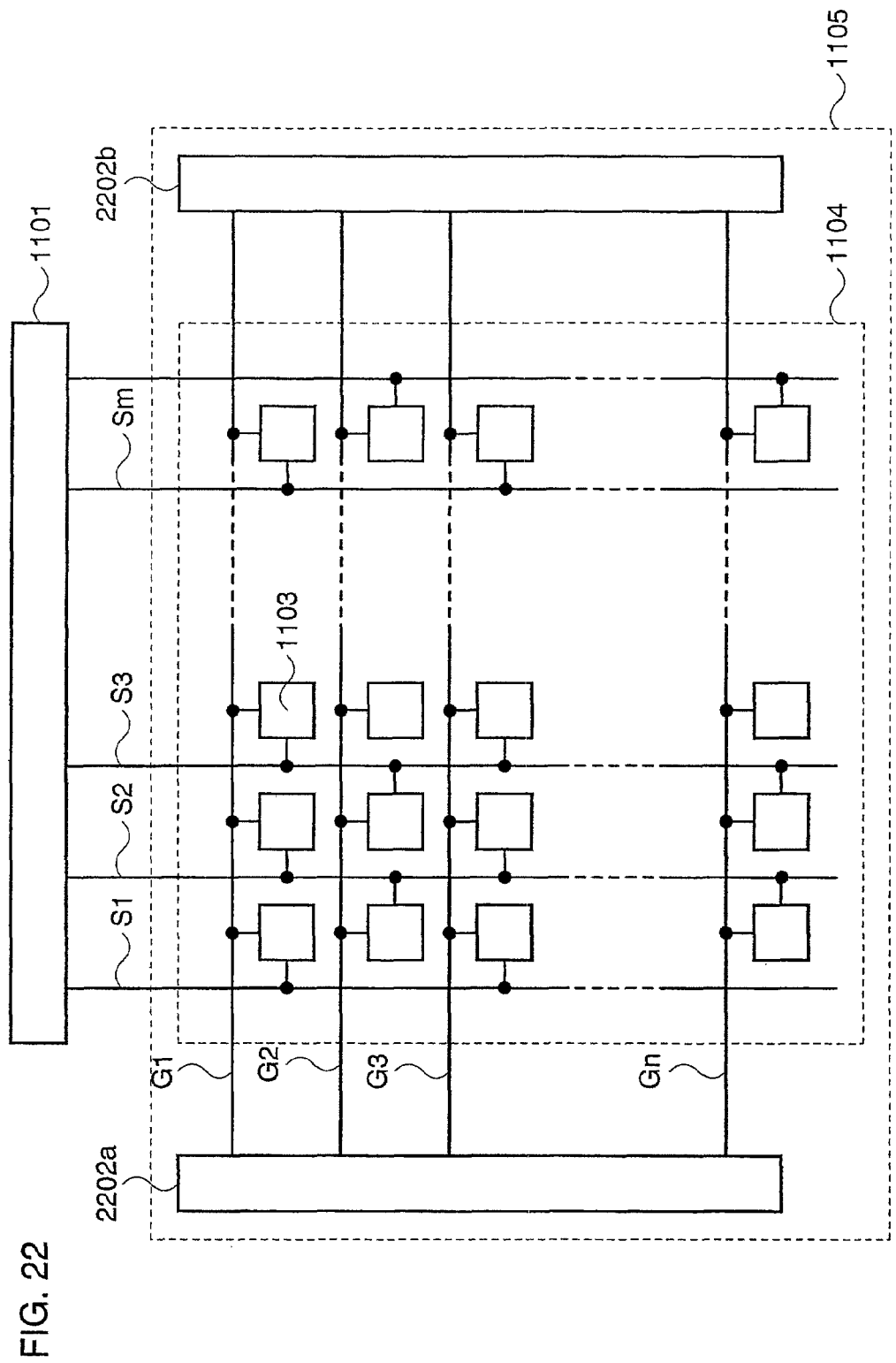
FIG. 22 shows a structure of a display device shown in Embodiment Mode 2.

Similarly to FIG. 13, the scan lines G1 to Gn may be scanned by a first scan line driver circuit 2202$a$ and a second scan line driver circuit 2202$b$. Thus, advantageous effects similar to those of the display device of FIG. 13 can be obtained. FIG. 22 shows a structure in this case.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 3

In this embodiment mode, structures and driving methods of a flip-flop different from those in Embodiment Modes 1 and 2, a driver circuit including the flip-flop, and a display device including the driver circuit are described. In a flip-flop in this embodiment mode, an output signal and a transfer signal of the flip-flop are output from different wirings by different transistors. Note that portions common to Embodiment Modes 1 and 2 are denoted by common reference numerals, and detailed description of the same portions and portions having similar functions is omitted.

A basic structure of a flip-flop in this embodiment mode is described with reference to FIG. 23. The flip-flop in FIG. 23 is similar to the flip-flop in FIG. 1A to which a ninth transistor 109 and a tenth transistor 110 are added.

Figure 23:
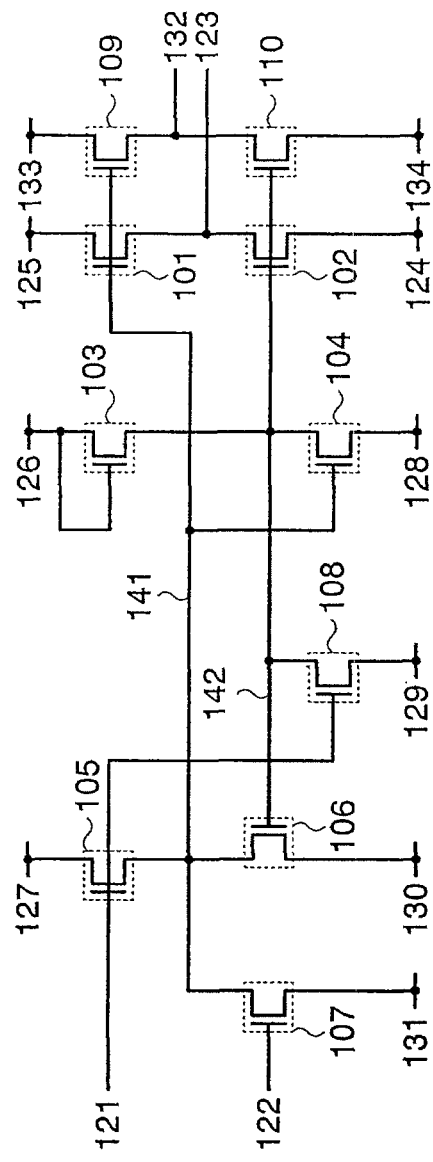
FIG. 23 shows a structure of a flip-flop shown in Embodiment Mode 3.

Connection relationships of the flip-flop in FIG. 23 are described. A first electrode of the ninth transistor 109 is connected to a thirteenth wiring 133, a second electrode of the ninth transistor 109 is connected to a twelfth wiring 132, and a gate electrode of the ninth transistor 109 is connected to the node 141. A first electrode of the tenth transistor 110 is connected to a fourteenth wiring 134, a second electrode of the tenth transistor 110 is connected to the twelfth wiring 132, and a gate electrode of the tenth transistor 110 is connected to the node 142. Other connection relationships are similar to FIG. 1A.

The thirteenth wiring 133 and the fourteenth wiring 134 may be referred to as a fifth signal line and an eighth power supply line, respectively.

Figure 24:
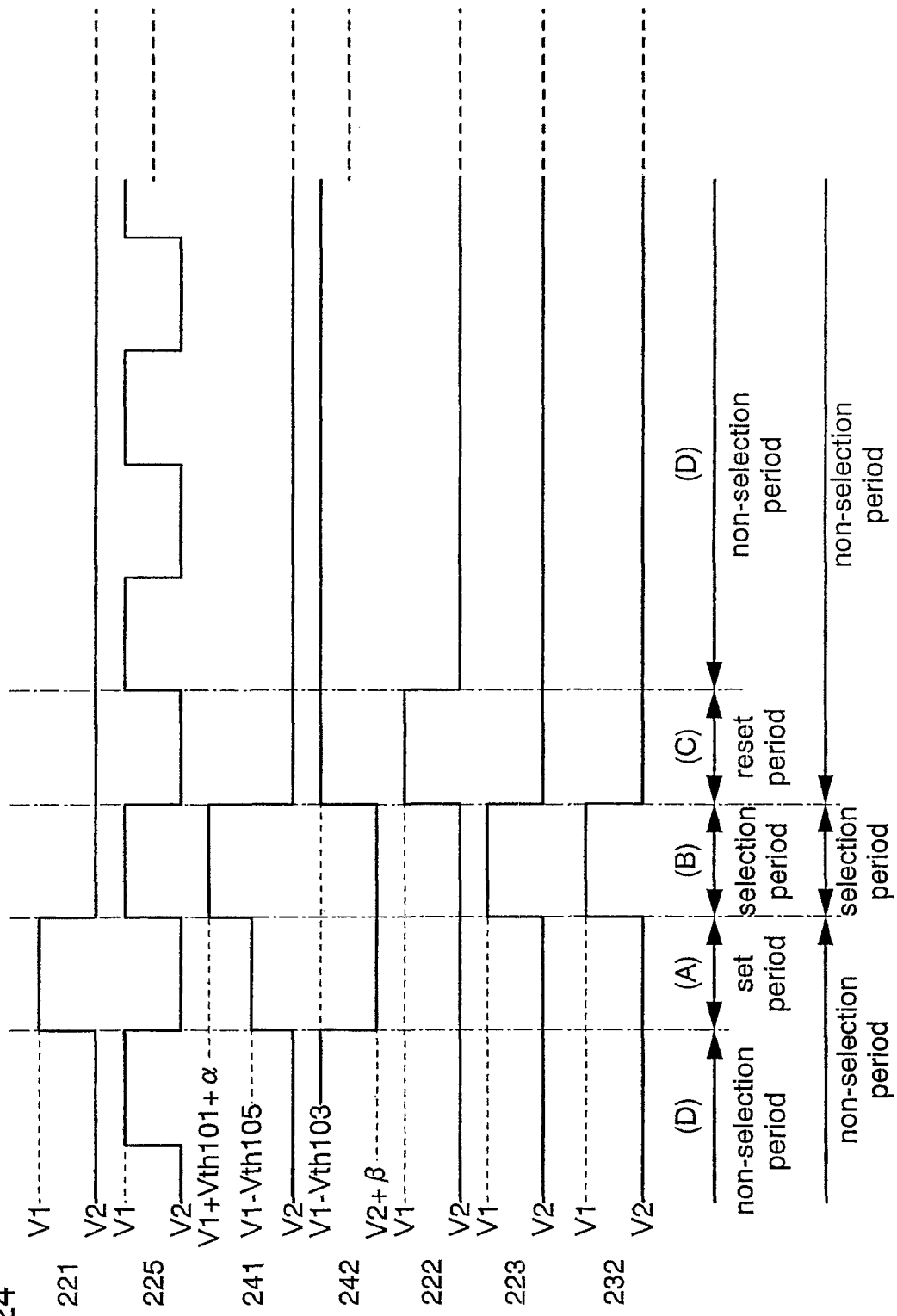
FIG. 24 is a timing chart showing operations of the flip-flop shown in FIG. 23.

Next, an operation of the flip-flop in FIG. 23 is described with a timing chart of FIG. 24. Here, the timing chart of FIG. 24 is described in which an operation period is divided into a set period, a selection period, a reset period, and a non-selection period. Note that a set period, a reset period, and a non-selection period may be collectively called a non-selection period in some cases.

The signal 223 and a signal 232 are output from the third wiring 123 and the twelfth wiring 132, respectively. The signal 232 is an output signal of the flip-flop, and the signal 223 is a transfer signal of the flip-flop. Note that the signal 223 may be used as the output signal of the flip-flop, and the signal 232 may be used as the transfer signal of the flip-flop.

When the signal 232 is used as the output signal of the flip-flop, and the signal 223 is used as the transfer signal of the flip-flop, a value of W/L of the ninth transistor 109 is preferably the highest among those of the first to tenth transistors 101 to 110. When the signal 223 is be used as the output signal of the flip-flop, and the signal 232 is be used as the transfer signal of the flip-flop, the value of W/L of the first transistor 101 is preferably the highest among those of the first to tenth transistors 101 to 110.

As has been described above, in this embodiment mode, the output signal and the transfer signal of the flip-flop are output from different wirings by different transistors. That is, in the flip-flop of FIG. 23, a signal is output from the third wiring 123 by the first transistor 101 and the second transistor 102. Further, a signal is output from the twelfth wiring 132 by the ninth transistor 109 and the tenth transistor 110. The ninth transistor 109 and the tenth transistor 110 are connected in the same manner as the first transistor 101 and the second transistor 102; thus, as shown in FIG. 24, the signal (the signal 232) output from the twelfth wiring 132 has approximately the same waveform as the signal (the signal 223) output from the third wiring 123.

The first transistor 101 is acceptable as long as it can supply charges to the gate electrode of the eighth transistor 108 and the gate electrode of the fifth transistor 105 in the next stage; thus, the value of the W/L of the first transistor 101 is preferably twice or less the value of the W/L of the fifth transistor 105. More preferably, the value of the W/L, of the first transistor 101 is equal to or less than the value of the W/L of the fifth transistor 105.

The ninth transistor 109 and the tenth transistor 110 have functions similar to those of the first transistor 101 and the second transistor 102, respectively. Further, the ninth transistor 109 and the tenth transistor 110 may be referred to as a buffer portion.

As described above, even when a large load is connected to the twelfth wiring 132 and delay, distortion, or the like of the signal 232 occurs, malfunction of the flip-flop in FIG. 23 can be prevented. This is because delay, distortion, or the like of the output signal does not affect the flip-flop in FIG. 23 since the output signal and the transfer signal of the flip-flop are output from different wirings by different transistors.

The flip-flop in FIG. 23 can obtain advantageous effects similar to those of the flip-flops in Embodiment Modes 1 and 2.

A flip-flop in this embodiment mode can be freely combined with any of FIGS. 1B, 1C, 4A to 4C, 5A, and 5B. Further, a flip-flop in this embodiment mode can be combined with each driving timing in Embodiment Modes 1 and 2.

Next, a structure and a driving method of a shift register including the aforementioned flip-flop in this embodiment mode are described.

A structure of a shift register in this embodiment mode is described with reference to FIG. 25. The shift register in FIG. 25 includes n flip-flops (flip-flops 2501_1 to 2501_n).

The flip-flops 2501_1 to 2501_n, a first wiring 2511, a second wiring 2512, a third wiring 2513, a fourth wiring 2514, a fifth wiring 2515, and a sixth wiring 2516 correspond to the flip-flops 701_1 to 701_n, the first wiring 711, the second wiring 712, the third wiring 713, the fourth wiring 714, the fifth wiring 715, and the sixth wiring 716 in FIG. 7; and a similar signal or a similar power supply voltage thereto is supplied. Seventh wirings 2517_1 to 2517_n and eighth wirings 2518_1 to 2518_n correspond to the seventh wirings 717_1 to 717_n in FIG. 7.

Figure 25:
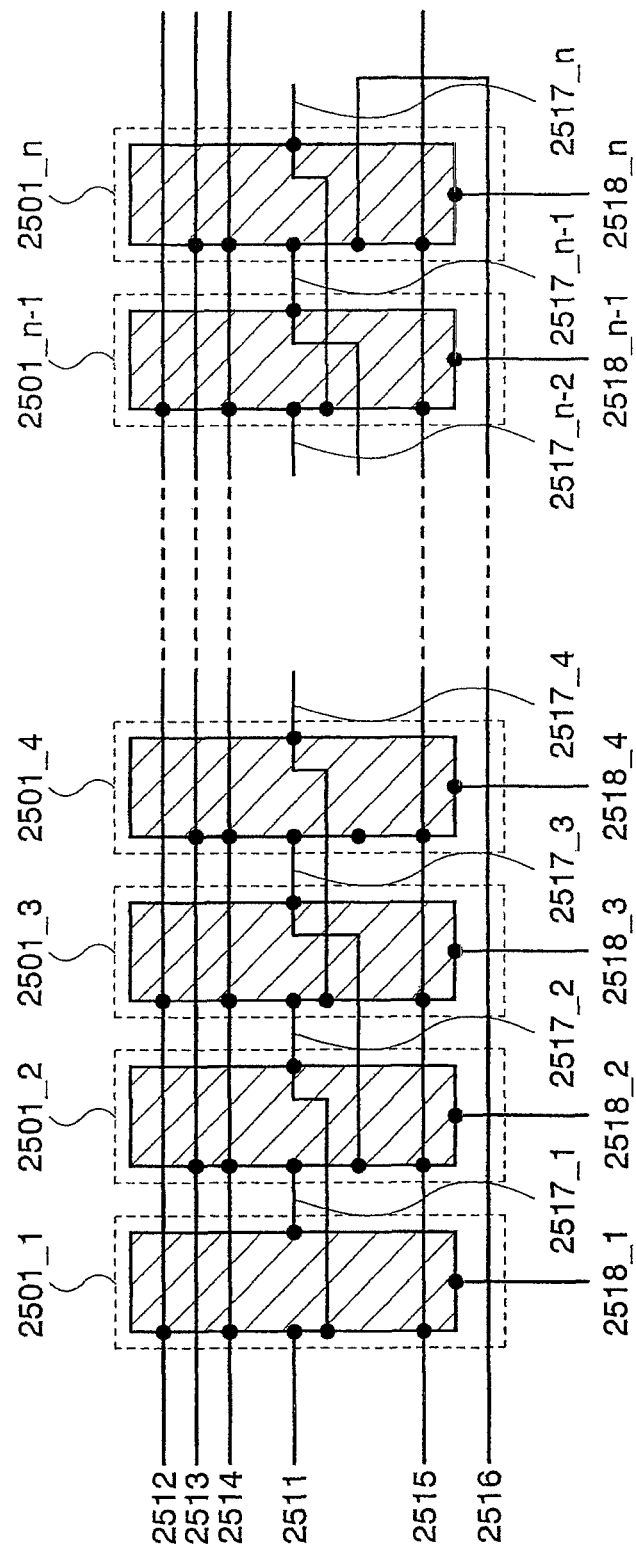
FIG. 25 shows a structure of a shift register shown in Embodiment Mode 3.
Figure 26:
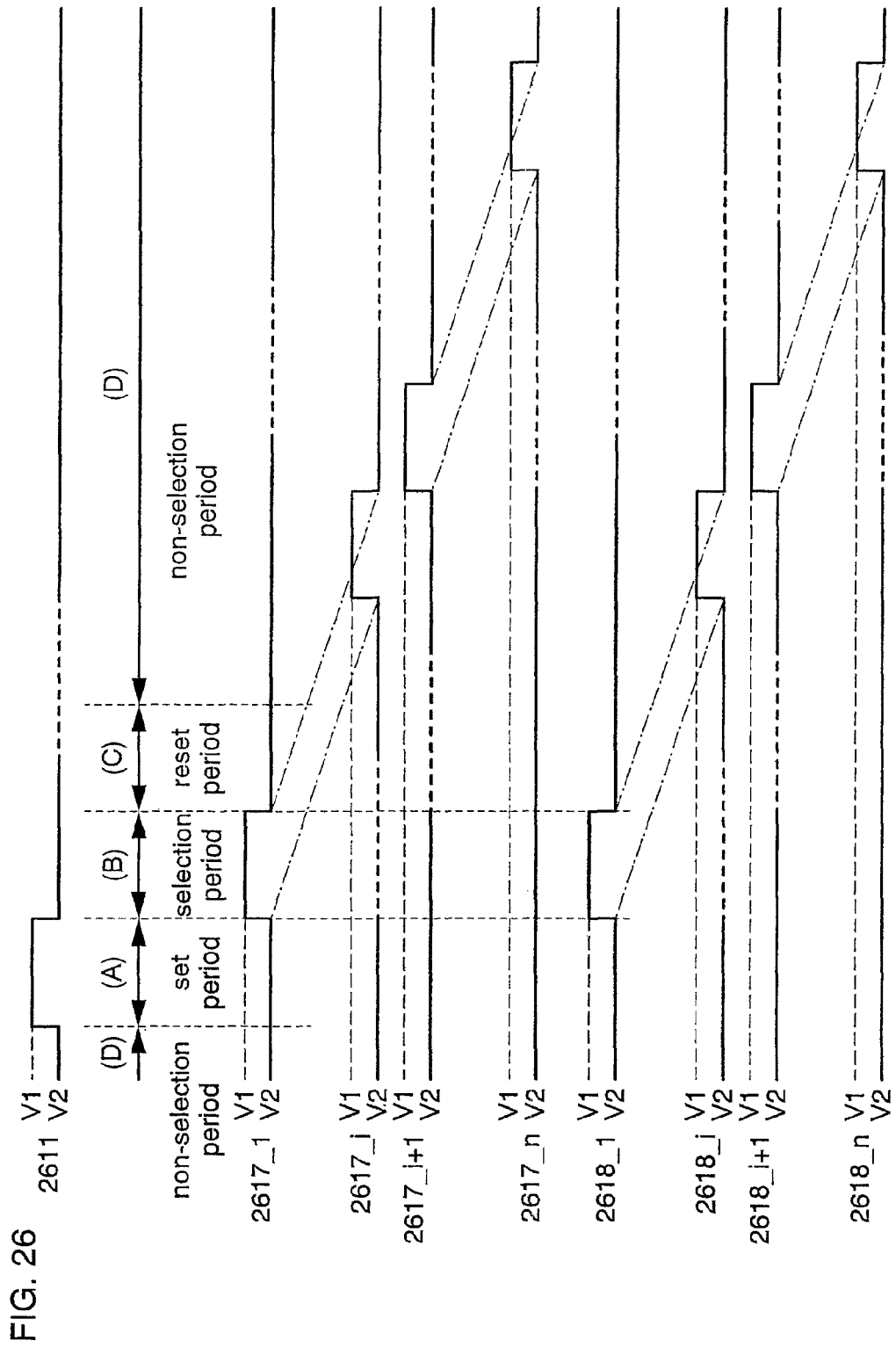
FIG. 26 is a timing chart showing operations of the shift register shown in FIG. 25.

Next, an operation of the shift register in FIG. 25 is described with reference to a timing chart of FIG. 26.

The operation of the shift register in FIG. 25 is different from that of the shift register in FIG. 7 in that the output signal and the transfer signal are output to different wirings. Specifically, the output signals are output to the eighth wirings 2518_1 to 2518_n, and the transfer signals are output to the seventh wirings 2517_1 to 2517_n.

Even when a large load (e.g., resistance or capacitance) is connected to the eighth wirings 2518_1 to 2518_n, the shift register in FIG. 25 can operate without being affected by the load. Further, even when any of the eighth wirings 2518_1 to 2518_n is short-circuited with the power supply line or the signal line, the shift register in FIG. 25 can continue to operate normally. Accordingly, in the shift register in FIG. 25, improvement in operation efficiency, reliability, and yield can be realized. This is because the transfer signal and the output signal of each flip-flop are divided in the shift register in FIG. 25.

A shift register to which a flip-flop in this embodiment mode is applied can obtain advantageous effects similar to those of the shift registers in Embodiment Modes 1 and 2.

A shift register in this embodiment mode can be combined with each shift register in FIGS. 7 and 10. Further, a shift register in this embodiment mode can be combined with the description in Embodiment Modes 1 and 2.

As a display device in this embodiment mode, each display device in FIGS. 11, 13, 14, 21, and 22 can be used. Thus, a display device in this embodiment mode can obtain advantageous effects similar to those of the display devices in Embodiment Modes 1 and 2.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 4

In this embodiment mode, the case where a p-channel transistor is applied to a transistor included in a flip-flop in this specification is described. In addition, structures and driving methods of a driver circuit including the flip-flop and a display device including the driver circuit are described.

As a flip-flop in this embodiment, the case where a p-channel transistor is used as each transistor included in the flip-flop of FIG. 1A is described. Thus, a flip-flop in FIG. 27 can obtain advantageous effects similar to those of the flip-flop in FIG. 1A. Note that a p-channel transistor may be used as each transistor included in each flip-flop shown in FIGS. 1B, 1C, 4A to 4C, 5A, 5B, and 23. Note also that a flip-flop in this embodiment mode can be freely combined with the description in Embodiment Modes 1 to 3.

A basic structure of a flip-flop in this embodiment mode is described with reference to FIG. 27. The flip-flop in FIG. 27 includes first to eighth transistors 2701 to 2708. The first to eighth transistors 2701 to 2708 correspond to the first to eighth transistors 101 to 108 in FIG. 1A. Note that the first to eighth transistors 2701 to 2708 are p-channel transistors, and each of them is turned on when an absolute value of a gate-source voltage (|Vgs|) exceeds an absolute value of a threshold voltage (|Vth|), that is, when Vgs becomes lower than Vth.

In the flip-flop in this embodiment mode, the first to eighth transistors 2701 to 2708 are p-channel transistors. Thus, simplification of a manufacturing process, reduction in manufacturing cost, and improvement in yield can be realized in the flip-flop in this embodiment mode.

Figure 27:
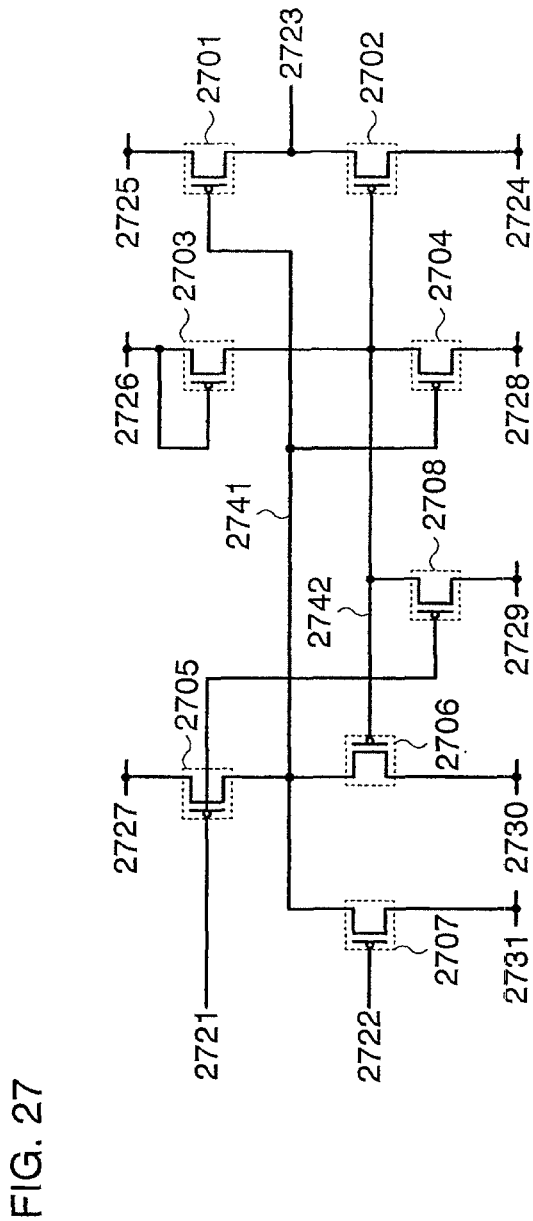
FIG. 27 shows a structure of a flip-flop shown in Embodiment Mode 4.

Connection relationships of the flip-flop in FIG. 27 are similar to those in FIG. 1A, and description thereof is omitted.

First to eleventh wirings 2721 to 2731 in FIG. 27 correspond to the first to eleventh wirings 121 to 131.

Figure 28:
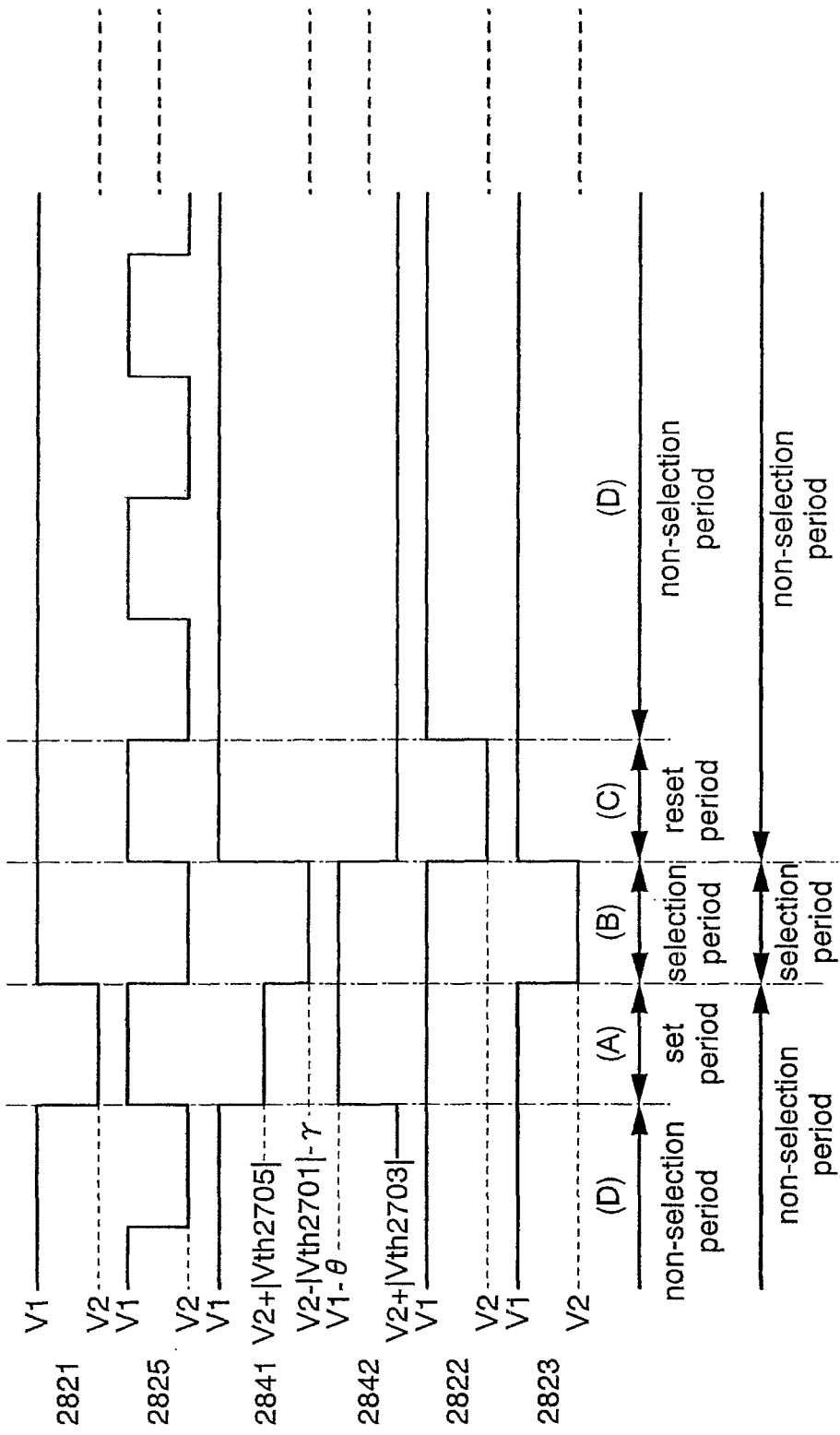
FIG. 28 is a timing chart showing operations of the flip-flop shown in FIG. 27.

Next, an operation of the flip-flop in FIG. 27 is described with reference to a timing chart of FIG. 28. Here, the timing chart of FIG. 28 is described in which an operation period is divided into a set period, a selection period, a reset period, and a non-selection period. Note that a set period, a reset period, and a non-selection period may be collectively called a non-selection period in some cases.

The timing chart of FIG. 28 is similar to the timing chart in which H level and L level are reversed in FIG. 2. That is, the flip-flop in FIG. 27 is different from the flip-flop in FIG. 1A only in that H level and L level of an input signal and an output signal are reversed. Note that signals 2821, 2825, 2841, 2842, 2822, and 2823 correspond to the signals 221, 225, 241, 242, 222, and 223 in FIG. 2.

Note that V1 and V2 of power supply voltage supplied to the flip-flop in FIG. 27 are reversed to those of the flip-flop of FIG. 1A.

First, an operation of the flip-flop in the set period denoted by (A) of FIG. 28 is described. A potential 2841 of a node 2741 becomes V2+|Vth2705|. Then, the node 2741 enters a floating state while the potential is kept at V2+|Vth2705|. At this time, a potential 2842 of a node 2742 becomes V1−θ (θ: a given positive integer). Note that since the first transistor 2701 and the second transistor 2702 are turned on, an H-level signal is output from the third wiring 2723.

An operation of the flip-flop in the selection period denoted by (B) of FIG. 28 is described. The potential 2841 of the node 2741 becomes V2−|Vth2701|−γ (Vth2701: a threshold voltage of the first transistor 2701; and γ: a given positive integer). Thus, the first transistor 2701 is turned on, and an L-level signal is output from the third wiring 2723.

An operation of the flip-flop in the reset period denoted by (C) of FIG. 28 is described. The seventh transistor 2707 is turned on, so that the potential 2841 of the node 2741 becomes V1. Thus, the first transistor 2701 is turned off. At this time, the potential 2842 of the node 2742 becomes V2+|Vth2703|, and the second transistor 2702 is turned on. Thus, an H-level signal is output from the third wiring 2723.

An operation of the flip-flop in the non-selection period denoted by (D) of FIG. 28 is described. The potential 2841 of the node 2741 is kept at V1. The potential 2842 of the node 2742 is kept at V2+|Vth2703|, and the second transistor 2702 is kept on. Thus, an H-level signal is output from the third wiring 2723.

In a shift register in this embodiment mode, the flip-flop in this embodiment mode can be combined with each shift register in Embodiment Modes 1 to 3. For example, in the shift register in this embodiment mode, the flip-flop in this embodiment mode can be combined with each shift register in FIGS. 7, 10, and 25. Note that in the shift register in this embodiment mode, H level and L level are reversed to those of each shift register in Embodiment Modes 1 to 3.

In a display device in this embodiment mode, the shift register in this embodiment mode can be combined with each display device in Embodiment Modes 1 to 3. For example, the display device in this embodiment mode can be combined with any of the display devices in FIGS. 11, 13, 14, 21, and 22. Note that in display device in this embodiment mode, H level and L level are reversed to those of each display device in Embodiment Modes 1 to 3.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 5

In this embodiment mode, a signal line driver circuit included in each display device shown in Embodiment Modes 1 to 4 is described.

Figure 31:
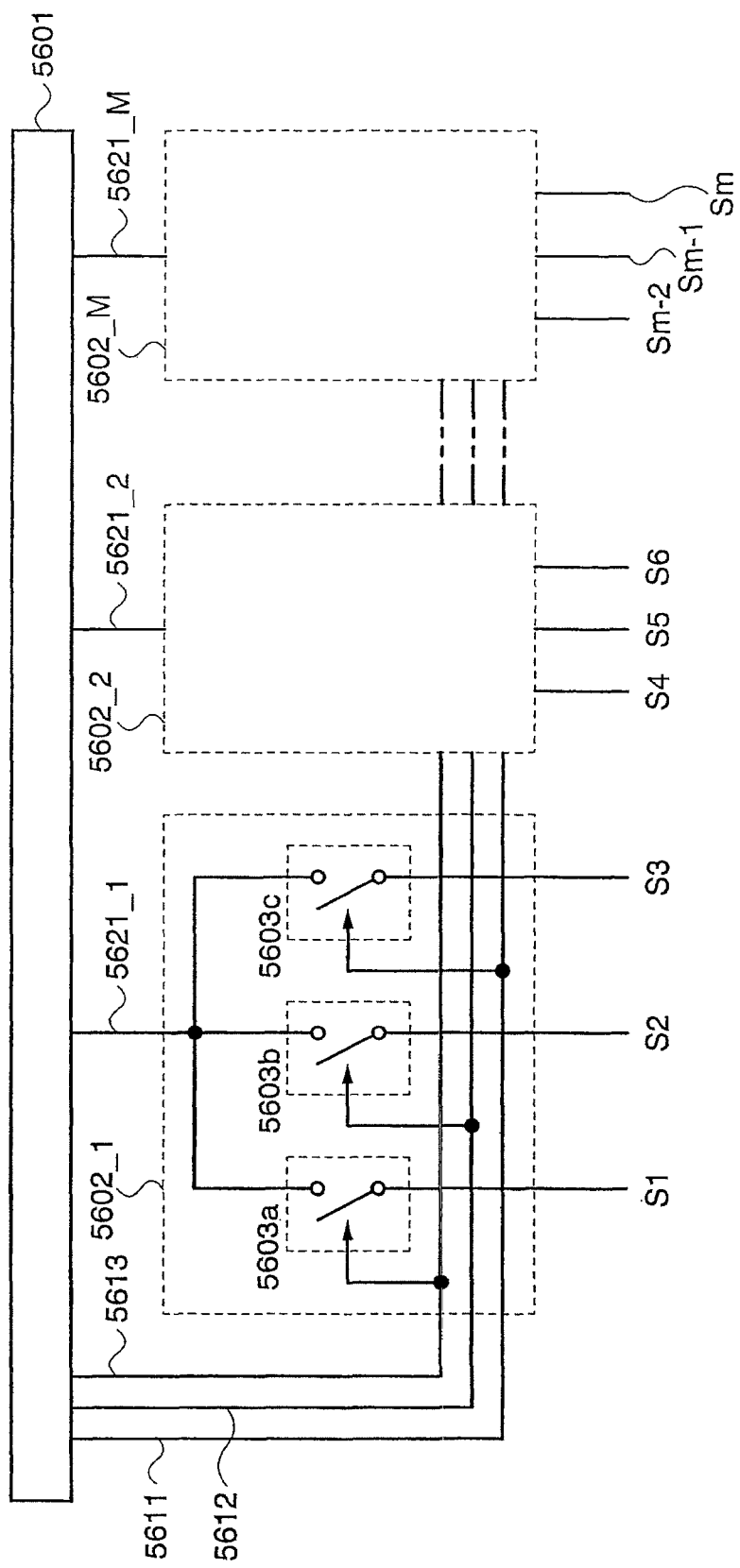
FIG. 31 shows a structure of a signal line driver circuit shown in Embodiment Mode 5.

A signal line driver circuit in FIG. 31 is described. The signal line driver circuit in FIG. 56 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first switch 5603a, a second switch 5603b, and a third switch 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and each one of the wirings 5621_1 to 5621_M corresponding to the switch groups 5602_1 to 5602_M, respectively. Each of the wirings 5621_1 to 5621_M is connected to three signal lines through the first switch 5603a, the second switch 5603b, and the third switch 5603c. For example, the wiring 5621_J in the J-th column (one of the wirings 5621_1 to 5621_M) is connected to a signal line Sj−1, a signal line Sj, and a signal line Sj+1 through the first switch 5603a, the second switch 5603b, and the third switch 5603c included in the switch group 5602_J.

A signal is input to each of the first wiring 5611, the second wiring 5612, and the third wiring 5613.

The driver IC 5601 is preferably formed using a single crystalline substrate or a glass substrate using a polycrystalline semiconductor. The switch groups 5602_1 to 5602_M are preferably formed over the same substrate as the pixel portion shown in Embodiment Mode 1. Therefore, the driver IC 5601 and the switch groups 5602_1 to 5602_M are preferably connected through an FPC or the like.

Figure 32:
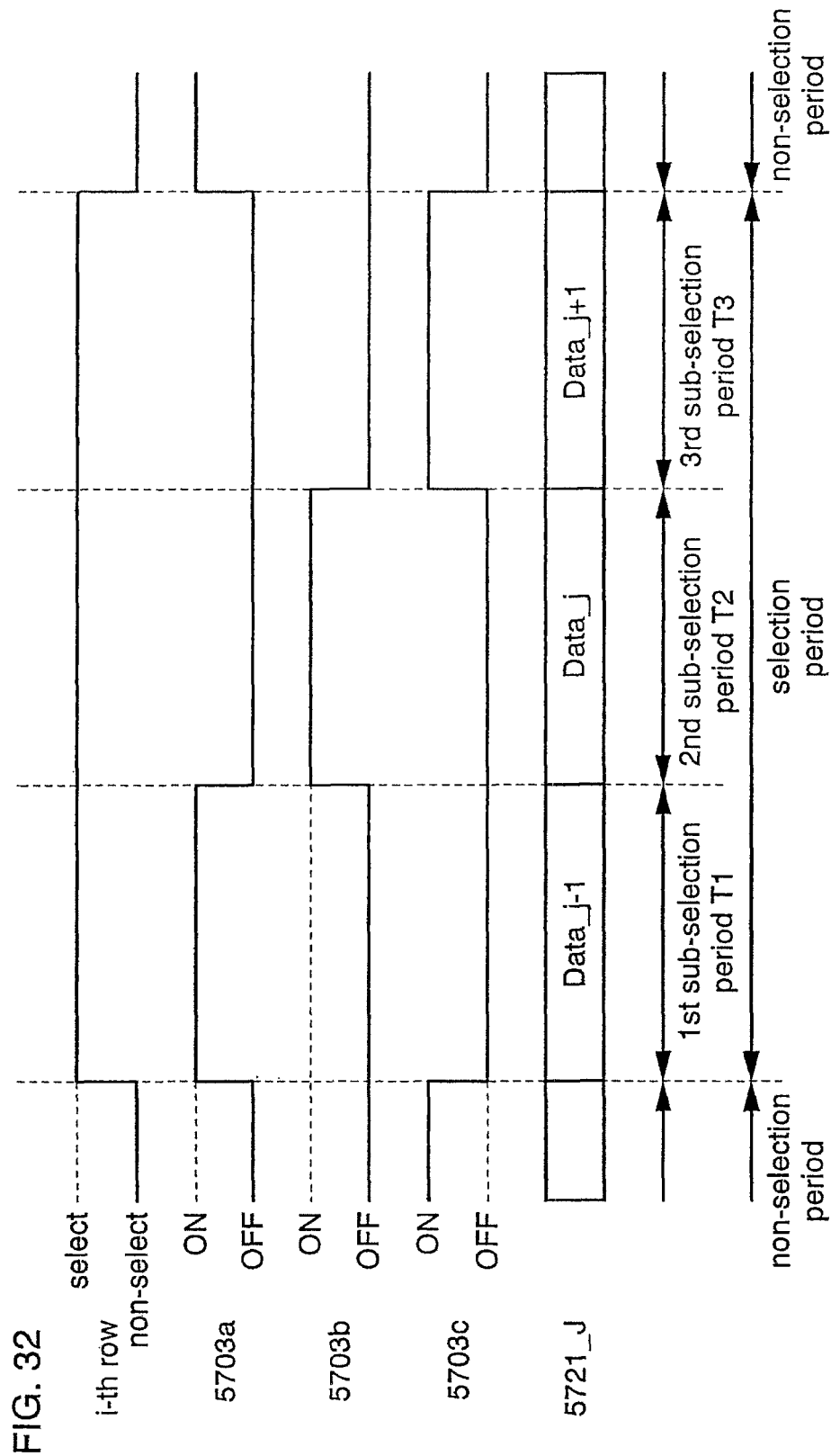
FIG. 32 is a timing chart showing operations of the signal line driver circuit shown in FIG. 31.

Next, an operation of the signal line driver circuit in FIG. 31 is described with reference to a timing chart of FIG. 32. The timing chart of FIG. 32 shows the case where a scan line Gi in the i-th row is selected. A selection period of the scan line Gi in the i-th row is divided into a first sub-selection period T1, a second sub-selection period T2, and a third sub-selection period T3. Note that the signal line driver circuit in FIG. 31 operates similarly to FIG. 32 even when a scan line in another row is selected.

The timing chart of FIG. 32 shows the case where the wiring 5621_J in the J-th column is connected to the signal line Sj−1, the signal line Sj, and the signal line Sj+1 through the first switch 5603a, the second switch 5603b, and the third switch 5603c.

The timing chart of FIG. 32 shows timing when the scan line Gi in the i-th row is selected, timing 5703a of on/off of the first switch 5603a, timing 5703b of on/off of the second switch 5603b, timing 5703c of on/off of the third switch 5603c, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In the first sub-selection period T1, the second sub-selection period T2, and the third sub-selection period T3, the video signals input to the wiring 5621_J are denoted by Dataj−1, Dataj, and Dataj+1.

As shown in FIG. 32, in the first sub-selection period T1, the first switch 5603a is turned on, and the second switch 5603b and the third switch 5603c are turned off. At this time, Dataj−1 input to the wiring 5621_J is input to the signal line Sj−1 through the first switch 5603a. In the second sub-selection period T2, the second switch 5603b is turned on, and the first switch 5603a and the third switch 5603c are turned off. At this time, Dataj input to the wiring 5621_J is input to the signal line Sj through the second switch 5603b. In the third sub-selection period T3, the third switch 5603c is turned on, and the first switch 5603a and the second switch 5603b are turned off. At this time, Dataj+1 input to the wiring 5621_J is input to the signal line Sj+1 through the third switch 5603c.

As described above, in the signal line driver circuit of FIG. 31, one gate selection period is divided into three; thus, video signals can be input to three signal lines from one wiring 5621 in one gate selection period. Therefore, in the signal line driver circuit in FIG. 31, the number of connections in which the substrate provided with the driver IC 5601 and the substrate provided with the pixel portion are connected can be approximately one third of the number of signal lines. The number of connections is reduced to approximately one third of the number of signal lines; therefore, reliability, yield, and the like of the signal line driver circuit in FIG. 31 can be improved.

By applying the signal line driver circuit in this embodiment mode to each display device shown in Embodiment Modes 1 to 4, the number of connections in which the substrate provided with the pixel portion and an external substrate are connected can be further reduced. Therefore, reliability and yield of the display device in the invention can be improved.

Next, the case where n-channel transistors are used for the first switch 5603a, the second switch 5603b, and the third switch 5603c is described with reference to FIG. 33. Note that portions similar to FIG. 31 are denoted by the same reference numerals, and detailed description of the same portions and portions having similar functions is omitted.

Figure 33:
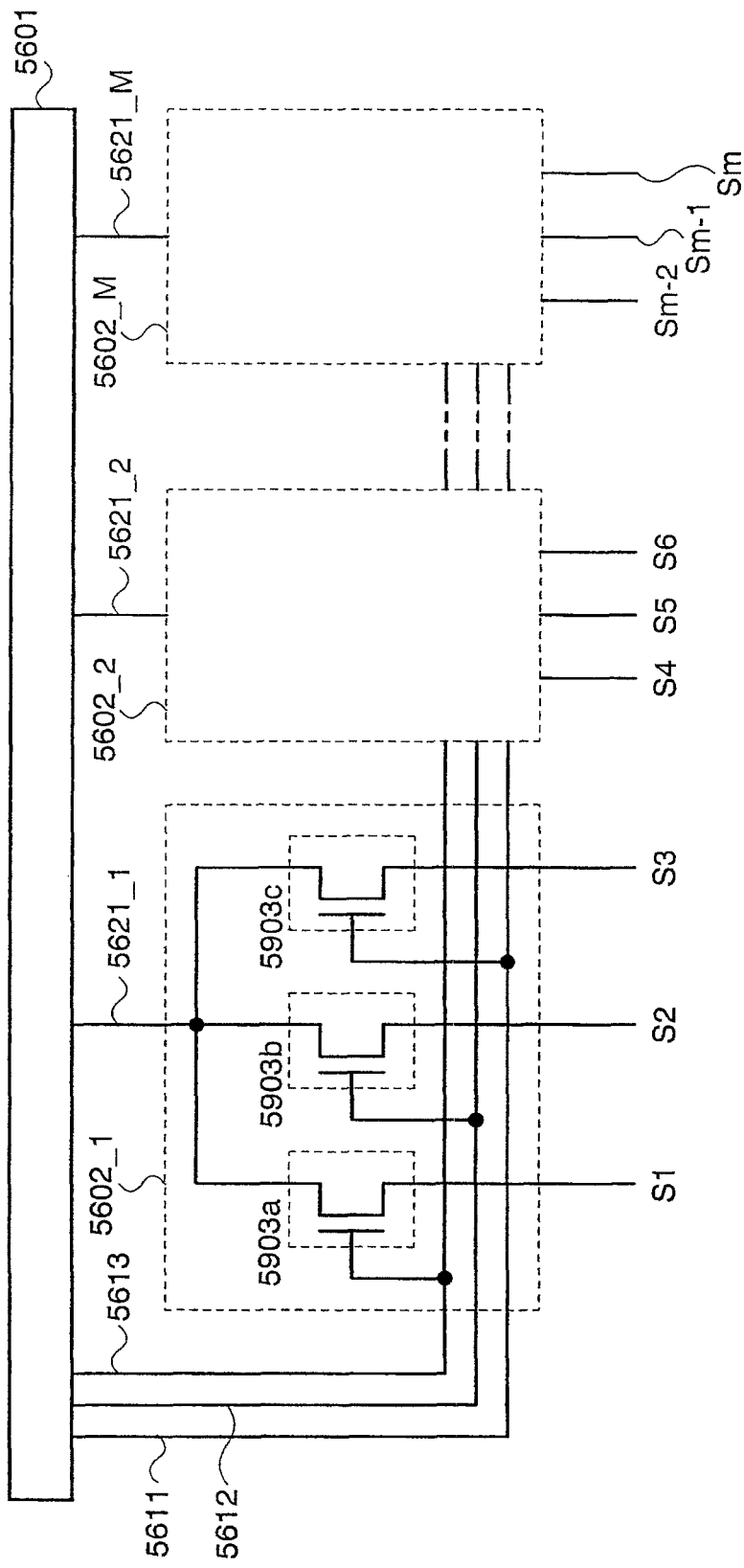
FIG. 33 shows a structure of a signal line driver circuit shown in Embodiment Mode 5.

A first transistor 5903a in FIG. 33 corresponds to the first switch 5603a in FIG. 31. A second transistor 5903b in FIG. 33 corresponds to the second switch 5603b in FIG. 31. A third transistor 5903c in FIG. 33 corresponds to the third switch 5603c in FIG. 31.

For example, in the case of the switch group 5602_J, a first electrode of the first transistor 5903a is connected to the wiring 5621_J, a second electrode of the first transistor 5903a is connected to the signal line Sj−1, and a gate electrode of the first transistor 5903a is connected to the first wiring 5611. A first electrode of the second transistor 5903b is connected to the wiring 5621_J, a second electrode of the second transistor 5903b is connected to the signal line Sj, and a gate electrode of the second transistor 5903b is connected to the second wiring 5612. A first electrode of the third transistor 5903c is connected to the wiring 5621_J, a second electrode of the third transistor 5903c is connected to the signal line Sj+1, and a gate electrode of the third transistor 5903c is connected to the third wiring 5613.

The first transistor 5903a, the second transistor 5903b, and the third transistor 5903c each function as a switching transistor. Further, each of the first transistor 5903a, the second transistor 5903b, and the third transistor 5903c is turned on when a signal input to each gate electrode is at H level, and is turned off when a signal input to each gate electrode is at L level.

When n-channel transistors are used for the first switch 5603a, the second switch 5603b, and the third switch 5603c, amorphous silicon can be used for a semiconductor layer of a transistor; thus, simplification of a manufacturing process, reduction in manufacturing cost, and improvement in yield can be realized. Further, a semiconductor device such as a large display panel can be formed. Even when polysilicon or single crystalline silicon is used for the semiconductor layer of the transistor, simplification of a manufacturing process can also be realized.

In the signal line driver circuit in FIG. 33, n-channel transistors are used for the first transistor 5903a, the second transistor 5903b, and the third transistor 5903c; however, p-channel transistors may be used for the first transistor 5903a, the second transistor 5903b, and the third transistor 5903c. In the latter case, each transistor is turned on when a signal input to the gate electrode is at L level, and is turned off when a signal input to the gate electrode is at H level.

Note that arrangement, the number, a driving method, and the like of a switch are not limited as long as one gate selection period is divided into a plurality of sub-selection periods and video signals are input to a plurality of signal lines from one wiring in each of the plurality of sub-selection periods as shown in FIG. 31.

For example, when video signals are input to three or more signal lines from one wiring in each of three or more sub-selection periods, a switch and a wiring for controlling the switch may be added. Note that when one selection period is divided into four or more sub-selection periods, one sub-selection period becomes too short. Therefore, one selection period is preferably divided into two or three sub-selection periods.

Figure 34:
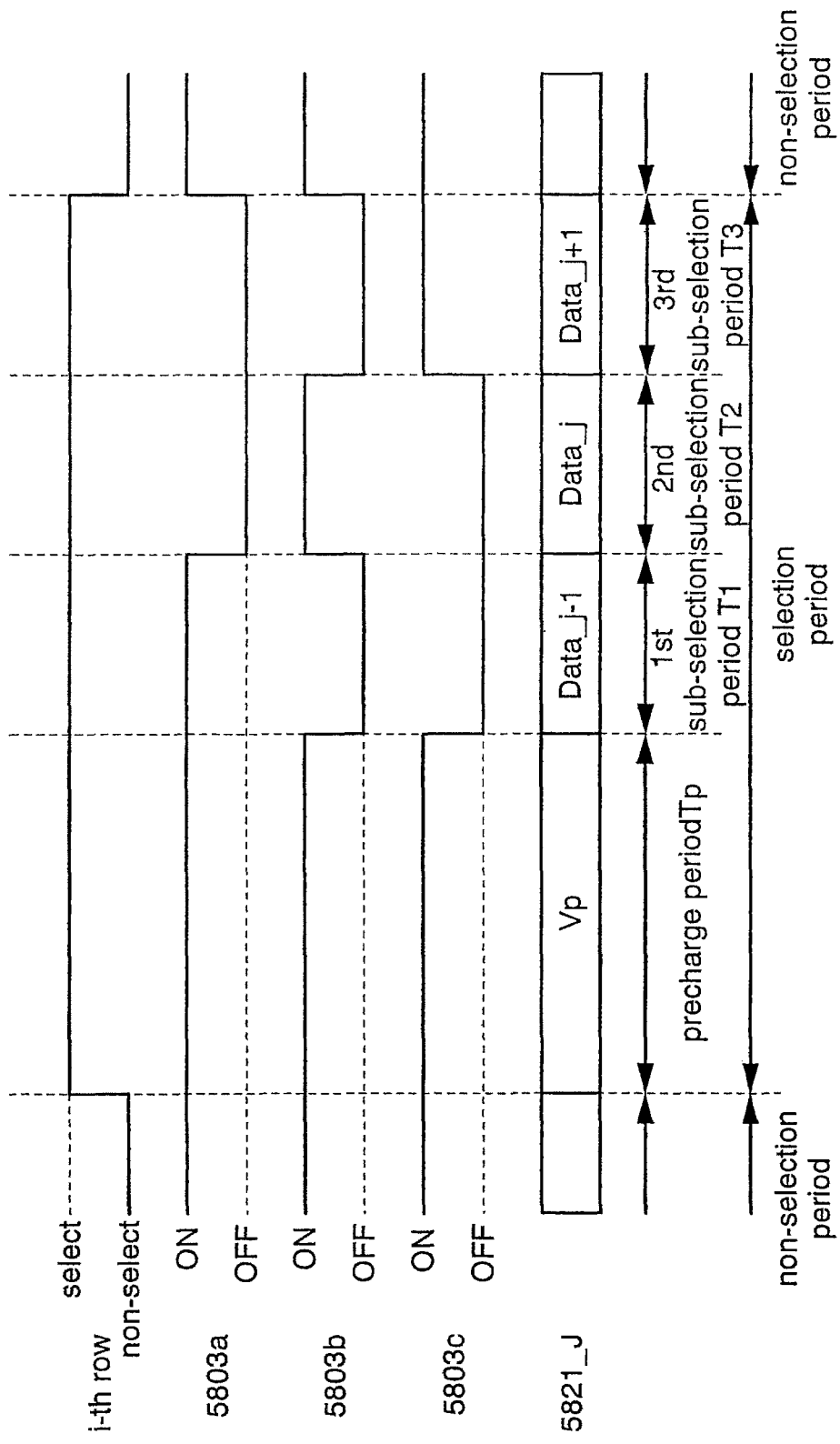
FIG. 34 is a timing chart showing operations of the signal line driver circuit shown in FIG. 33.

As another example, as shown in a timing chart of FIG. 34, one selection period may be divided into a precharge period Tp, the first sub-selection period T1, the second sub-selection period T2, and the third sub-selection period T3. The timing chart of FIG. 34 shows timing when the scan line Gi in the i-th row is selected, timing 5803a of on/off of the first switch 5603a, timing 5803b of on/off of the second switch 5603b, timing 5803c of on/off of the third switch 5603c, and a signal 5821_J input to the wiring 5621_J in the J-th column. As shown in FIG. 34, the first switch 5603a, the second switch 5603b, and the third switch 5603c are tuned on in the precharge period Tp. At this time, a precharge voltage Vp input to the wiring 5621_) is input to each of the signal line Sj−1, the signal line Sj, and the signal line Sj+1 through the first switch 5603a, the second switch 5603b, and the third switch 5603c. In the first sub-selection period T1, the first switch 5603a is turned on, and the second switch 5603b and the third switch 5603c are turned off. At this time, Dataj−1 input to the wiring 5621_J is input to the signal line Sj−1 through the first switch 5603a. In the second sub-selection period T2, the second switch 5603b is turned on, and the first switch 5603a and the third switch 5603c are turned off. At this time, Dataj input to the wiring 5621_J is input to the signal line Sj through the second switch 5603b. In the third sub-selection period T3, the third switch 5603c is turned on, and the first switch 5603a and the second switch 5603b are turned off. At this time, Dataj+1 input to the wiring 5621_J is input to the signal line Sj+1 through the third switch 5603c.

As described above, in the signal line driver circuit of FIG. 31, to which the timing chart of FIG. 34 is applied, since a precharge selection period is provided before a sub-selection period, a signal line can be precharged; thus, a video signal can be written to a pixel with high speed. Note that portions similar to FIG. 32 are denoted by the same reference numerals, and detailed description of the same portions and portions having similar functions is omitted.

Figure 35:
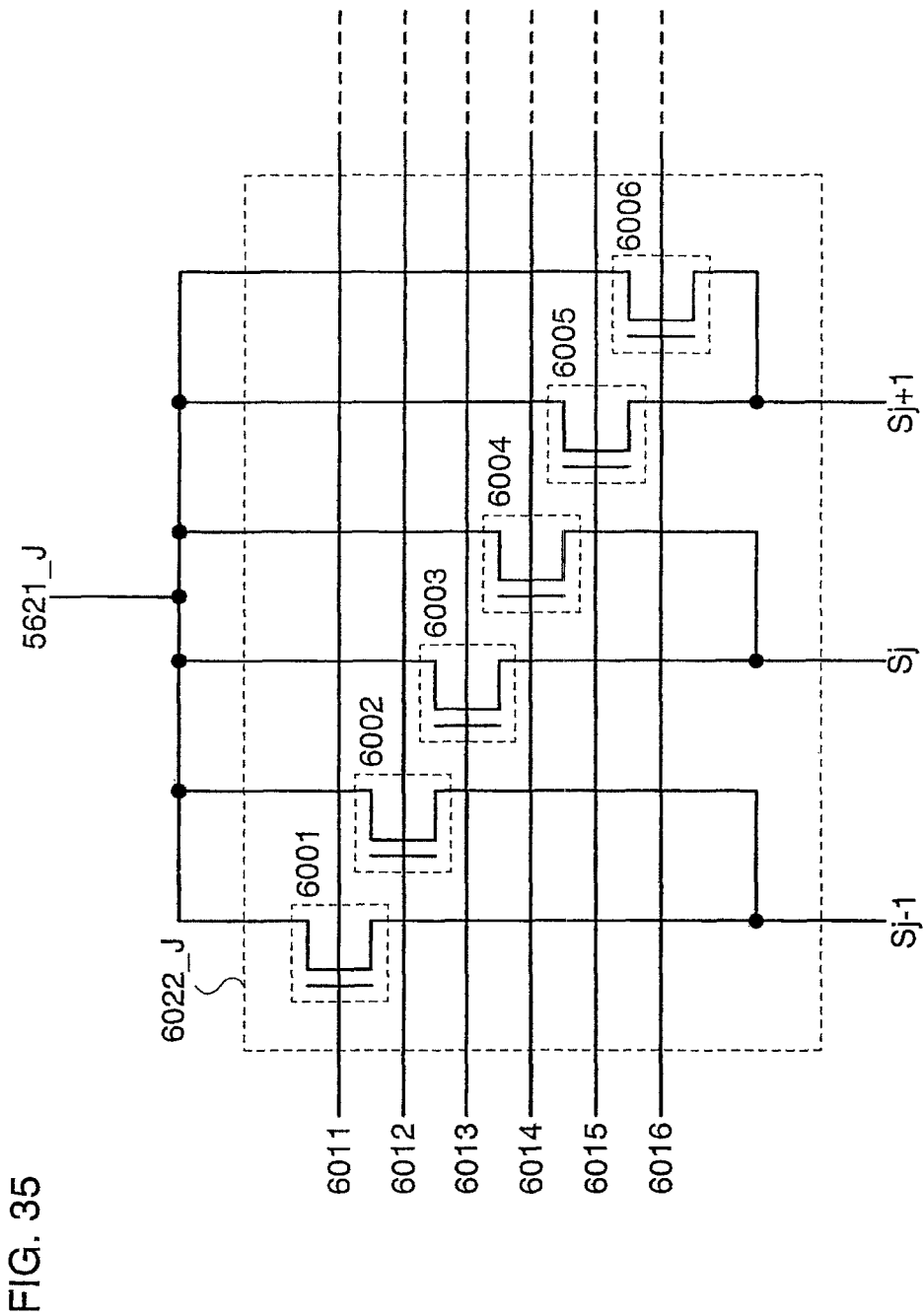
FIG. 35 shows a structure of a signal line driver circuit shown in Embodiment Mode 5.

Also in FIG. 35, one gate selection period can be divided into a plurality of sub-selection periods and video signals can be input to a plurality of signal lines from one wiring in each of the plurality of sub-selection periods as shown in FIG. 31. Note that FIG. 35 shows only a switch group 6022_J in the J-th column in a signal line driver circuit. The switch group 6022_J includes a first transistor 6001, a second transistor 6002, a third transistor 6003, a fourth transistor 6004, a fifth transistor 6005, and a sixth transistor 6006. The first transistor 6001, the second transistor 6002, the third transistor 6003, the fourth transistor 6004, the fifth transistor 6005, and the sixth transistor 6006 are n-channel transistors. The switch group 6022_J is connected to a first wiring 6011, a second wiring 6012, a third wiring 6013, a fourth wiring 6014, a fifth wiring 6015, a sixth wiring 6016, the wiring 5621_J, the signal line Sj−1, the signal line Sj, and the signal line Sj+1.

A first electrode of the first transistor 6001 is connected to the wiring 5621_J, a second electrode of the first transistor 6001 is connected to the signal line Sj−1, and a gate electrode of the first transistor 6001 is connected to the first wiring 6011. A first electrode of the second transistor 6002 is connected to the wiring 5621_J, a second electrode of the second transistor 6002 is connected to the signal line Sj−1, and a gate electrode of the second transistor 6002 is connected to the second wiring 6012. A first electrode of the third transistor 6003 is connected to the wiring 5621_J, a second electrode of the third transistor 6003 is connected to the signal line Sj, and a gate electrode of the third transistor 6003 is connected to the third wiring 6013. A first electrode of the fourth transistor 6004 is connected to the wiring 5621_J, a second electrode of the fourth transistor 6004 is connected to the signal line Sj, and a gate electrode of the fourth transistor 6004 is connected to the fourth wiring 6014. A first electrode of the fifth transistor 6005 is connected to the wiring 5621_J, a second electrode of the fifth transistor 6005 is connected to the signal line Sj+1, and a gate electrode of the fifth transistor 6005 is connected to the fifth wiring 6015. A first electrode of the sixth transistor 6006 is connected to the wiring 5621_J, a second electrode of the sixth transistor 6006 is connected to the signal line Sj+1, and a gate electrode of the sixth transistor 6006 is connected to the sixth wiring 6016.

The first transistor 6001, the second transistor 6002, the third transistor 6003, the fourth transistor 6004, the fifth transistor 6005, and the sixth transistor 6006 each function as a switching transistor. Further, each of first transistor 6001, the second transistor 6002, the third transistor 6003, the fourth transistor 6004, the fifth transistor 6005, and the sixth transistor 6006 is turned on when a signal input to each gate electrode is at H level, and is turned off when a signal input to each gate electrode is at L level.

The first wiring 6011 and the second wiring 6012 in FIG. 35 correspond to a first wiring 5611 in FIG. 33. The third wiring 6013 and the fourth wiring 6014 in FIG. 35 correspond to a second wiring 5612 in FIG. 33. The fifth wiring 6015 and the sixth wiring 6016 in FIG. 35 correspond to a third wiring 5613 in FIG. 33. Note that the first transistor 6001 and the second transistor 6002 in FIG. 35 correspond to the first transistor 5903a in FIG. 33. The third transistor 6003 and the fourth transistor 6004 in FIG. 35 correspond to the second transistor 5903b in FIG. 33. The fifth transistor 6005 and the sixth transistor 6006 in FIG. 35 correspond to the third transistor 5903c in FIG. 33.

In FIG. 35, in the first sub-selection period T1 shown in FIG. 32, one of the first transistor 6001 and the second transistor 6002 is turned on. In the second sub-selection period T2, one of the third transistor 6003 and the fourth transistor 6004 is turned on. In the third sub-selection period T3, one of the fifth transistor 6005 and the sixth transistor 6006 is turned on. Further, in the precharge period Tp shown in FIG. 34, either the first transistor 6001, the third transistor 6003, and the fifth transistor 6005; or the second transistor 6002, the fourth transistor 6004, and the sixth transistor 6006 are turned on.

Thus, in FIG. 35, since the on time of each transistor can be reduced, deterioration in characteristics of the transistor can be suppressed. This is because in the first sub-selection period T1 shown in FIG. 32, for example, the video signal can be input to the signal line Sj−1 when one of the first transistor 6001 and the second transistor 6002 is turned on. Here, in the first sub-selection period T1 shown in FIG. 32, for example, when both the first transistor 6001 and the second transistor 6002 are turned on at the same time, the video signal can be input to the signal line Sj−1 with high speed.

Two transistors are connected in parallel between the wiring 5621 and the signal line in FIG. 35; however, the invention is not limited thereto, and three or more transistors may be connected in parallel between the wiring 5621 and the signal line. Thus, deterioration in characteristics of each transistor can be further suppressed.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 6

In this embodiment mode, a structure for preventing a defect due to electrostatic discharge damage in the display device shown in Embodiment Modes 1 to 4 is described.

Electrostatic discharge damage refers to instant discharge through an input/output terminal of a semiconductor device when positive or negative charges stored in the human body or the object touch the semiconductor device, and damage caused by supplying a large current flowing within the semiconductor device.

Figures 36A, 36B:
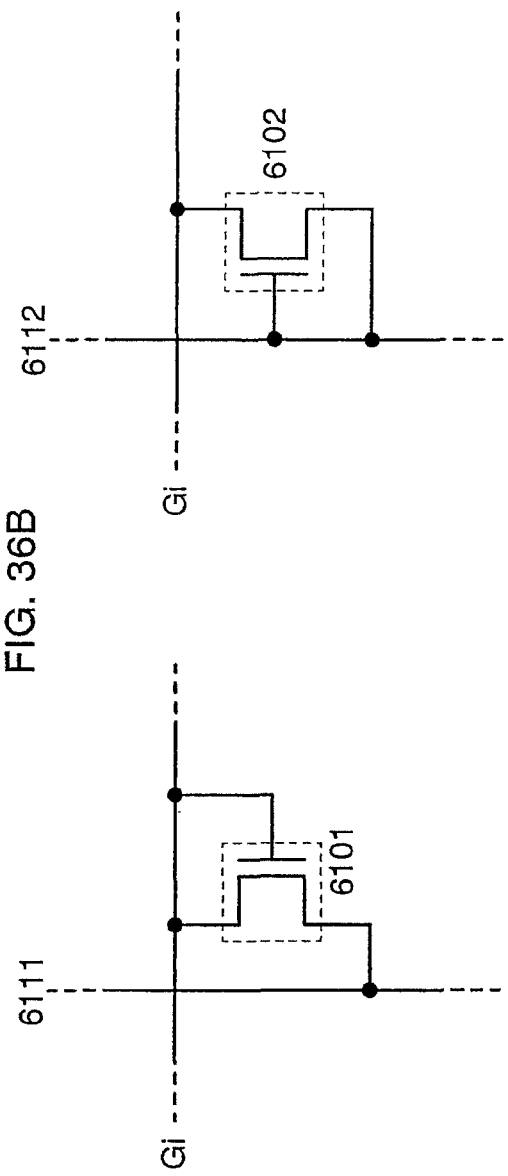
FIGS. 36A to 36C each show a structure of a protective diode shown in Embodiment Mode 6.

FIG. 36A shows a structure for preventing electrostatic discharge damage caused in a scan line by a protective diode. FIG. 36A shows a structure where the protective diode is provided between a wiring 6111 and the scan line. Although not shown, a plurality of pixels are connected to the scan line Gi in the i-th row. A transistor 6101 is used as the protective diode. The transistor 6101 is an n-channel transistor; however, a p-channel transistor may be used, and polarity of the transistor 6101 may be the same as that of a transistor included in a scan line driver circuit or a pixel.

One protective diode is arranged here; however, a plurality of protective diodes may be arranged in series, in parallel, or in series-parallel.

A first electrode of the transistor 6101 is connected to the scan line Gi in the i-th row, a second electrode of the transistor 6101 is connected to the wiring 6111, and a gate electrode of the transistor 6101 is connected to the scan line Gi in the i-th row.

An operation of FIG. 36A is described. A certain potential is input to the wiring 6111, which is lower than L level of a signal input to the scan line Gi in the i-th row. When positive or negative charges are not discharged to the scan line Gi in the i-th row, a potential of the scan line Gi in the i-th row is at H level or L level, so that the transistor 6101 is off. On the other hand, when negative charges are discharged to the scan line Gi in the i-th row, the potential of the scan line Gi in the i-th row decreases instantaneously. At this time, the potential of the scan line Gi in the i-th row is lower than a value obtained by subtracting a threshold voltage of the transistor 6101 from a potential of the wiring 6111, so that the transistor 6101 is turned on. Thus, a current flows to the wiring 6111 through the transistor 6101. Therefore, the structure shown in FIG. 36A can prevent a large current from flowing to the pixel, so that electrostatic discharge damage of the pixel can be prevented.

FIG. 36B shows a structure for preventing electrostatic discharge damage when positive charges are discharged to the scan line Gi in the i-th row. A transistor 6102 functioning as a protective diode is provided between a scan line and a wiring 6112. Note that one protective diode is arranged here; however, a plurality of protective diodes may be arranged in series, in parallel, or in series-parallel. The transistor 6102 is an n-channel transistor; however, a p-channel transistor may be used, and polarity of the transistor 6102 may be the same as that of the transistor included in the scan line driver circuit or the pixel. A first electrode of the transistor 6102 is connected to the scan line Gi in the i-th row, a second electrode of the transistor 6102 is connected to the wiring 6112, and a gate electrode of the transistor 6102 is connected to the wiring 6112. Note that a potential higher than H level of the signal input to the scan line Gi in the i-th row is input to the wiring 6112. Therefore, when charges are not discharged to the scan line Gi in the i-th row, the transistor 6102 is off. On the other hand, when positive charges are discharged to the scan line Gi in the i-th row, the potential of the scan line Gi in the i-th row increases instantaneously. At this time, the potential of the scan line Gi in the i-th row is higher than the sum of a potential of the wiring 6112 and a threshold voltage of the transistor 6102, so that the transistor 6102 is turned on. Thus, a current flows to the wiring 6112 through the transistor 6102. Therefore, the structure shown in FIG. 36B can prevent a large current from flowing to the pixel, so that electrostatic discharge damage of the pixel can be prevented.

Figure 36C:
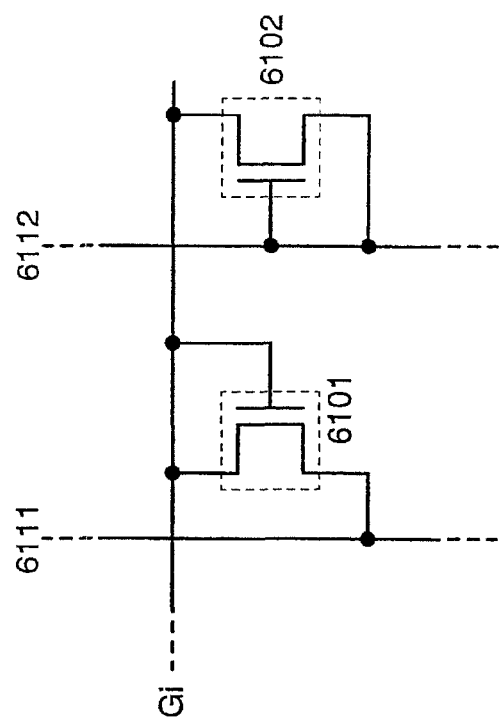

As shown in FIG. 36C, with a structure which combines FIGS. 36A and 36B, electrostatic discharge damage of the pixel can be prevented when positive or negative charges are discharged to the scan line Gi in the i-th row. Note that portions similar to FIGS. 36A and 36B are denoted by the same reference numerals, and detailed description of the same portions and portions having similar functions is omitted.

Figure 37A:
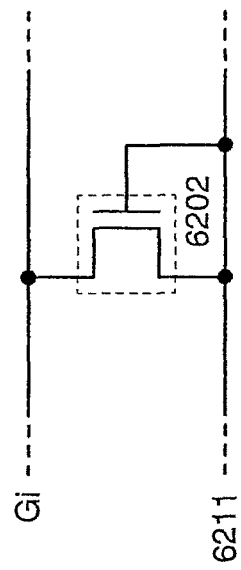
FIGS. 37A and 37B each show a structure of a protective diode shown in Embodiment Mode 6.

FIG. 37A shows a structure where a transistor 6201 functioning as a protective diode is connected between a scan line and a storage capacitor line. Note that one protective diode is arranged here; however, a plurality of protective diodes may be arranged in series, in parallel, or in series-parallel. The transistor 6201 is an n-channel transistor; however, a p-channel transistor may be used. Polarity of the transistor 6201 may be the same as that of the transistor included in the scan line driver circuit or the pixel. Note that a wiring 6211 functions as a storage capacitor line. A first electrode of the transistor 6201 is connected to the scan line Gi in the i-th row, a second electrode of the transistor 6201 is connected to the wiring 6211, and a gate electrode of the transistor 6201 is connected to the scan line Gi in the i-th row. Note that a potential lower than L level of the signal input to the scan line Gi in the i-th row is input to the wiring 6211. Therefore, when charges are not discharged to the scan line Gi in the i-th row, the transistor 6210 is off. On the other hand, when negative charges are discharged to the scan line Gi in the i-th row, the potential of the scan line Gi in the i-th row decreases instantaneously. At this time, the potential of the scan line Gi in the i-th row is lower than a value obtained by subtracting a threshold voltage of the transistor 6201 from a potential of the wiring 6211, so that the transistor 6201 is turned on. Thus, a current flows to the wiring 6211 through the transistor 6201. Therefore, the structure shown in FIG. 37A can prevent a large current from flowing to the pixel, so that electrostatic discharge damage of the pixel can be prevented. Further, since the storage capacitor line is utilized as a wiring for discharging charges in the structure shown in FIG. 37A, a wiring is not required to be added.

Figure 37B:
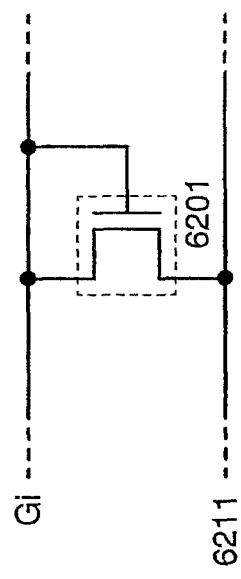

FIG. 37B shows a structure for preventing electrostatic discharge damage when positive charges are discharged to the scan line Gi in the i-th row. Here, a potential higher than H level of the signal input to the scan line Gi in the i-th row is input to the wiring 6211. Therefore, when charges are not discharged to the scan line Gi in the i-th row, a transistor 6202 is off. On the other hand, when positive charges are discharged to the scan line Gi in the i-th row, the potential of the scan line Gi in the i-th row increases instantaneously. At this time, the potential of the scan line Gi in the i-th row is higher than the sum of a potential of the wiring 6211 and a threshold voltage of the transistor 6202, so that the transistor 6202 is turned on. Thus, a current flows to the wiring 6211 through the transistor 6202. Therefore, the structure shown in FIG. 37B can prevent a large current from flowing to the pixel, so that electrostatic discharge damage of the pixel can be prevented. Further, since the storage capacitor line is utilized for discharging charges in the structure shown in FIG. 37B, a wiring is not needed to be added. Note that portions similar to FIG. 37A are denoted by the same reference numerals, and detailed description of the same portions and portions having similar functions is omitted.

Figure 38C:
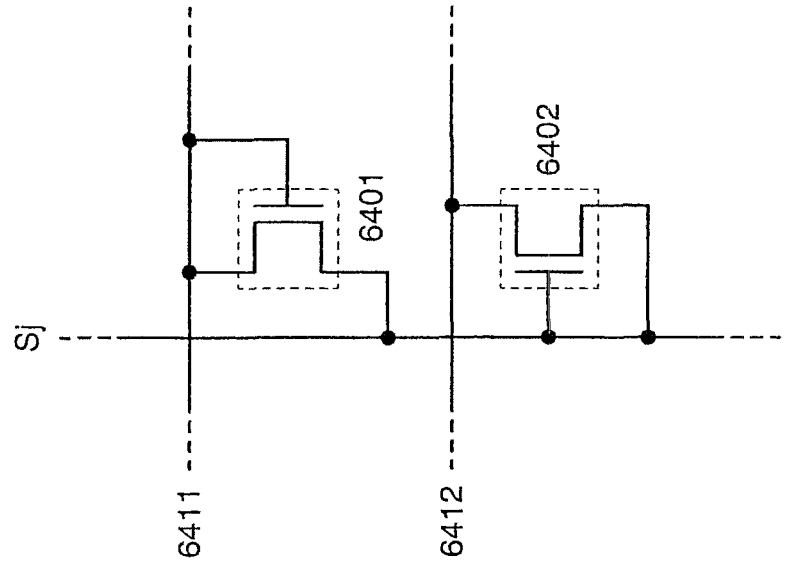
FIGS. 38A to 38C each show a structure of a protective diode shown in Embodiment Mode 6.
Figure 38A:
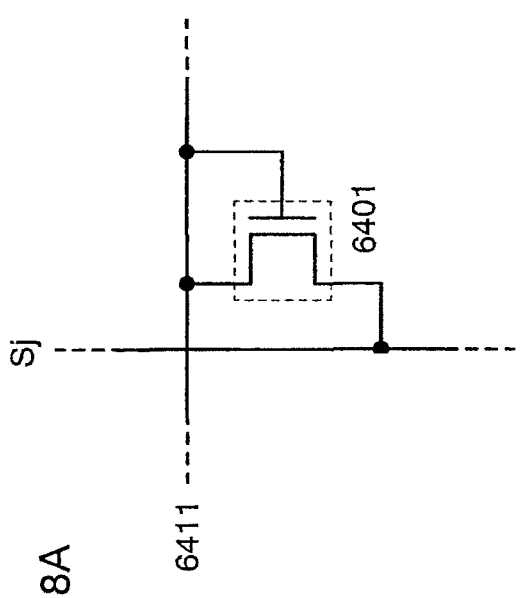

Next, FIG. 38A shows a structure for preventing electrostatic discharge damage caused in a signal line by a protective diode. FIG. 38A shows a structure where the protective diode is provided between a wiring 6411 and the signal line. Although not shown, a plurality of pixels are connected to the signal line Sj in the j-th column. A transistor 6401 is used as the protective diode. The transistor 6401 is an n-channel transistor; however, a p-channel transistor may be used. Polarity of the transistor 6401 may be the same as that of a transistor included in a signal line driver circuit or the pixel.

Note that one protective diode is arranged here; however, a plurality of protective diodes may be arranged in series, in parallel, or in series-parallel.

A first electrode of the transistor 6401 is connected to the signal line Sj in the j-th column, a second electrode of the transistor 6401 is connected to the wiring 6411, and a gate electrode of the transistor 6401 is connected to the signal line Sj in the j-th column.

An operation of FIG. 38A is described. A certain potential is input to the wiring 6411, which is lower than the smallest value of a video signal input to the signal line Sj in the j-th column. When positive or negative charges are not discharged to the signal line Sj in the j-th column, a potential of the signal line Sj in the j-th column is the same as the video signal, so that the transistor 6401 is off. On the other hand, when negative charges are discharged to the signal line Sj in the j-th column, the potential of the signal line Sj in the j-th column decreases instantaneously. At this time, the potential of the signal line Sj in the j-th column is lower than a value obtained by subtracting a threshold voltage of the transistor 6401 from a potential of the wiring 6411, so that the transistor 6401 is turned on. Thus, a current flows to the wiring 6411 through the transistor 6401. Therefore, the structure shown in FIG. 38A can prevent a large current from flowing to the pixel, so that electrostatic discharge damage of the pixel can be prevented.

Figure 38B:
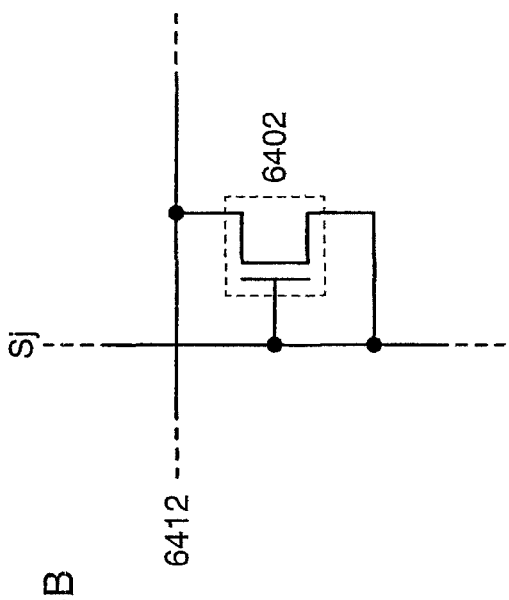

FIG. 38B shows a structure for preventing electrostatic discharge damage when positive charges are discharged to the signal line Sj in the j-th column. A transistor 6402 functioning as a protective diode is provided between the signal line and a wiring 6412. Note that one protective diode is arranged here; however, a plurality of protective diodes may be arranged in series, in parallel, or in series-parallel. The transistor 6402 is an n-channel transistor; however, a p-channel transistor may be used. Polarity of the transistor 6402 may be the same as that of the transistor included in the signal line driver circuit or the pixel. A first electrode of the transistor 6402 is connected to the signal line Sj in the j-th column, a second electrode of the transistor 6402 is connected to the wiring 6412, and a gate electrode of the transistor 6402 is connected to the wiring 6412. Note that a potential higher than the largest value of a video signal input to the signal line Sj in the j-th column is input to the wiring 6412. Therefore, when charges are not discharged to the signal line Sj in the j-th column, the transistor 6402 is off. On the other hand, when positive charges are discharged to the signal line Sj in the j-th column, the potential of the signal line Sj in the j-th column increases instantaneously. At this time, the potential of the signal line Sj in the j-th column is higher than the sum of a potential of the wiring 6412 and a threshold voltage of the transistor 6402, so that the transistor 6402 is turned on. Thus, a current flows to the wiring 6412 through the transistor 6402. Therefore, the structure shown in FIG. 38B can prevent a large current from flowing to the pixel, so that electrostatic discharge damage of the pixel can be prevented.

As shown in FIG. 38C, with a structure which combines FIGS. 38A and 38B, electrostatic discharge damage of the pixel can be prevented when positive or negative charges are discharged to the signal line Sj in the j-th column. Note that portions similar to FIGS. 38A and 38B are denoted by the same reference numerals, and detailed description of the same portions and portions having similar functions is omitted.

In this embodiment mode, the structures for preventing electrostatic discharge damage of the pixel connected to the scan line and the signal line are described. However, the structure in this embodiment mode is not only used for preventing electrostatic discharge damage of the pixel connected to the scan line and the signal line. For example, when this embodiment mode is used for the wiring to which a signal or a potential is input, which is connected to the scan line driver circuit and the signal line driver circuit shown in Embodiment Modes 1 to 4, electrostatic discharge damage of the scan line driver circuit and the signal line driver circuit can be prevented.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 7

In this embodiment mode, another structure of a display device which can be applied to each display device shown in Embodiment Modes 1 to 4 is described.

Figure 39A:
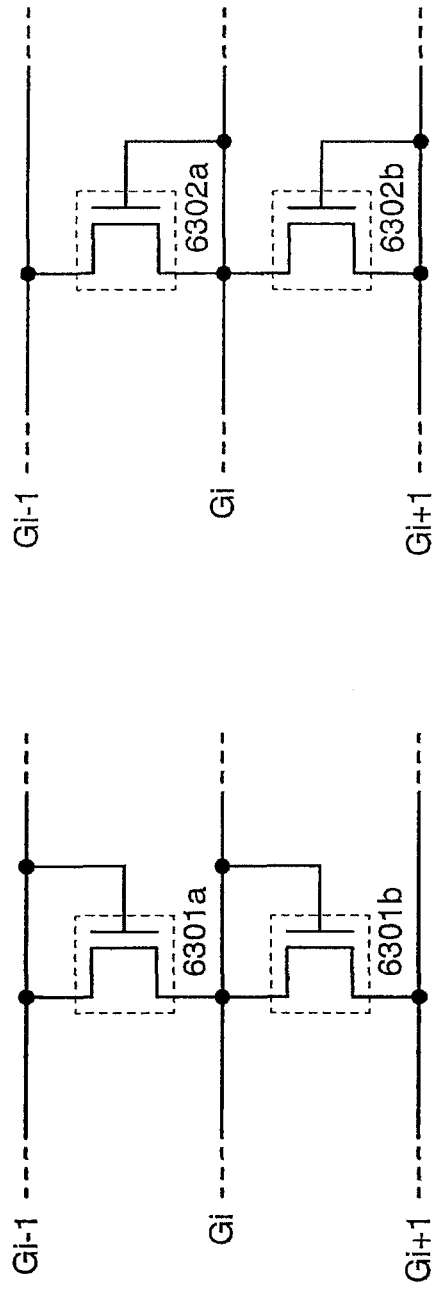
FIGS. 39A to 39C each show a structure of a display device shown in Embodiment Mode 7.

FIG. 39A shows a structure where a diode-connected transistor is provided between a scan line and another scan line. FIG. 39A shows a structure where a diode-connected transistor 6301a is provided between the scan line Gi−1 in the (i−1)th row and the scan line Gi in the i-th row, and a diode-connected transistor 6301b is provided between the scan line Gi in the i-th row and the scan line Gi+1 in the (i+1)th row. Note that the transistors 6301a and 6301b are n-channel transistors; however, p-channel transistors may be used. Polarity of the transistors 6301a and 6301b may be the same as that of a transistor included in a scan line driver circuit or a pixel.

Note that in FIG. 39A, the scan line Gi−1 in the (i−1)th row, the scan line Gi in the i-th row, and the scan line Gi+1 in the (i+1)th row are typically shown, and a diode-connected transistor is similarly provided between other scan lines.

A first electrode of the transistor 6301a is connected to the scan line Gi in the i-th row, a second electrode of the transistor 6301a is connected to the scan line Gi−1 in the (i−1)th row, and a gate electrode of the transistor 6301*a* is connected to the scan line Gi−1 in the (i−1)th row. A first electrode of the transistor 6301*b* is connected to the scan line Gi+1 in the (i+1)th row, a second electrode of the transistor 6301*b* is connected to the scan line Gi in the i-th row, and a gate electrode of the transistor 6301*b* is connected to the scan line Gi in the i-th row.

An operation of FIG. 39A is described. In each scan line driver circuit shown in Embodiment Modes 1 to 4, the scan line Gi−1 in the (i−1)th row, the scan line Gi in the i-th row, and the scan line Gi+1 in the (i+1)th row are kept at L level in the non-selection period. Therefore, the transistors 6301*a* and 6301*b* are turned off. However, when the potential of the scan line Gi in the i-th row is increased due to noise or the like, for example, a pixel is selected by the scan line Gi in the i-th row and a wrong video signal is written to the pixel. Accordingly, by providing the diode-connected transistor between the scan lines as shown in FIG. 39A, writing of a wrong video signal to the pixel can be prevented. This is because when the potential of the scan line Gi in the i-th row is increased to more than the sum of a potential of the scan line Gi−1 in the (i−1)th row and a threshold voltage of the transistor 6301*a*, the transistor 6301*a* is turned on and the potential of the scan line Gi in the i-th row is decreased; thus, a pixel is not selected by the scan line Gi in the i-th row.

The structure of FIG. 39A is particularly advantageous when a scan line driver circuit and a pixel portion are formed over the same substrate, because in the scan line driver circuit including only n-channel transistors or only p-channel transistors, a scan line is sometimes in a floating state and noise is easily caused in the scan line.

Figure 39B:
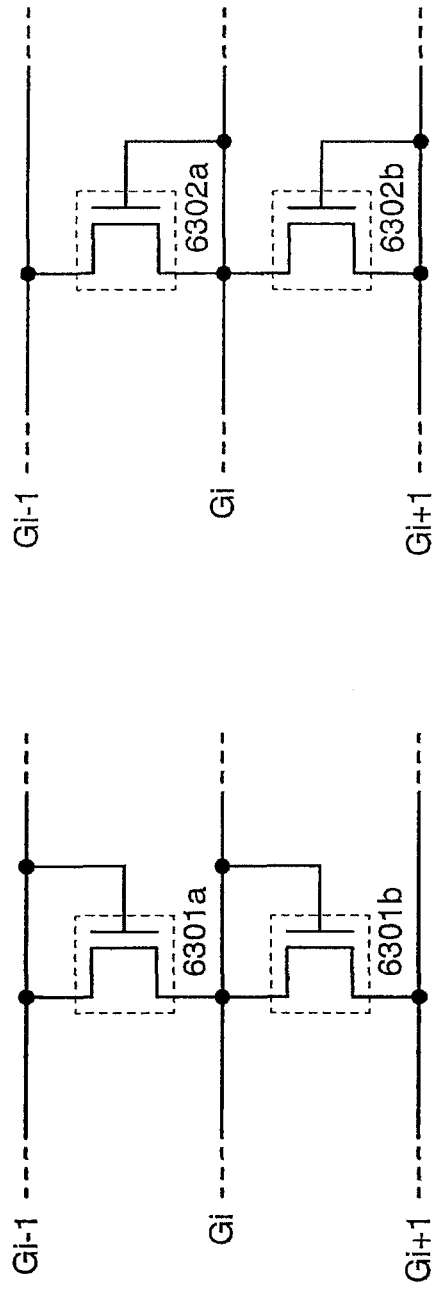

FIG. 39B shows a structure where a direction of a diode-connected transistor provided between the scan lines is reversed to that in FIG. 39A. Note that transistors 6302*a* and 6302*b* are n-channel transistors; however, p-channel transistors may be used. Polarity of the transistors 6302*a* and 6302*b* may be the same as that of the transistor included in the scan line driver circuit or the pixel. In FIG. 39B, a first electrode of the transistor 6302*a* is connected to the scan line Gi in the i-th row, a second electrode of the transistor 6302*a* is connected to the scan line Gi−1 in the (i−1)th row, and a gate electrode of the transistor 6302*a* is connected to the scan line Gi in the i-th row. A first electrode of the transistor 6302*b* is connected to the scan line Gi+1 in the (i+1)th row, a second electrode of the transistor 6302*b* is connected to the scan line Gi in the i-th row, and a gate electrode of the transistor 6302*b* is connected to the scan line Gi+1 in the (i+1)th row. In FIG. 39B, similarly to FIG. 38A, when the potential of the scan line Gi in the i-th row is increased to more than the sum of the potential of the scan line Gi+1 in the (i+1)th row and a threshold voltage of the transistor 6302*b*, the transistor 6302*b* is turned on and the potential of the scan line Gi in the i-th row is decreased. Thus, a pixel is not selected by the scan line Gi in the i-th row, and writing of a wrong video signal to the pixel can be prevented.

Figure 39C:
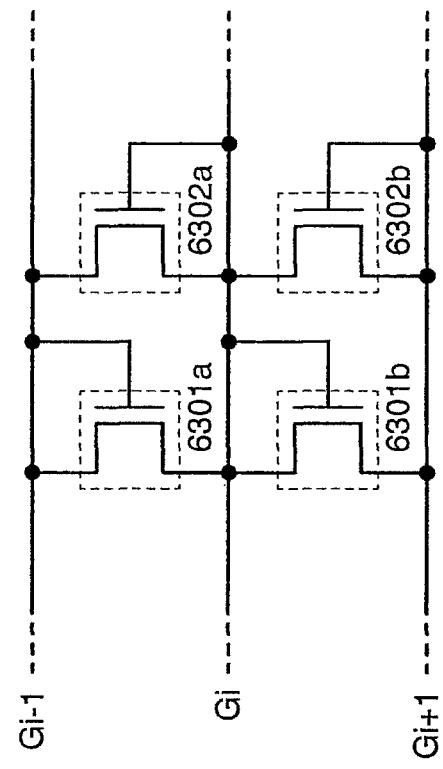

As shown in FIG. 39C, with a structure which combines FIGS. 39A and 39B, even when the potential of the scan line Gi in the i-th row is increased, the transistors 6301*a* and 6301*b* are tuned on, so that the potential of the scan line Gi in the i-th row is decreased. Note that in FIG. 39C, since a current flows through two transistors, larger noise can be removed. Note that portions similar to FIGS. 15, 39A and 39B are denoted by the same reference numerals, and detailed description of the same portions and portions having similar functions is omitted.

Note that as shown in FIGS. 37A and 37B, when a diode-connected transistor is provided between the scan line and the storage capacitor line, advantageous effects similar to FIGS. 39A, 39B, and 39C can be obtained.

Although this embodiment mode is described with reference to various drawings, the contents (or part of the contents) described in each drawing can be applied to or combined with the contents (or part of the contents) described in another drawing. Further, much more drawings can be formed by combining each part with another part in the above-described drawings.

The contents (or part of the contents) described in each drawing in this embodiment mode can be freely applied to or combined with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents described in other embodiment modes, an example of related part thereof, or the like. Therefore, the contents described in other embodiment modes can be applied to or combined with this embodiment mode.

Embodiment Mode 8

In this embodiment mode, a structure and a manufacturing method of a transistor are described.

Figure 40A:
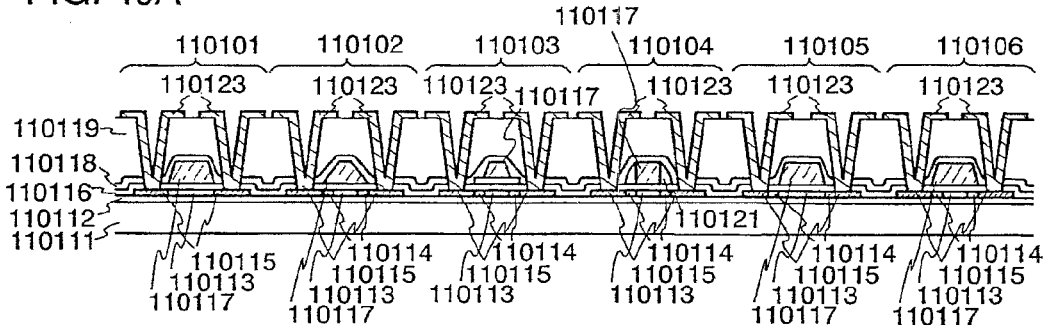
FIGS. 40A to 40G show a process for manufacturing a semiconductor device according to the invention.
Figure 40B:
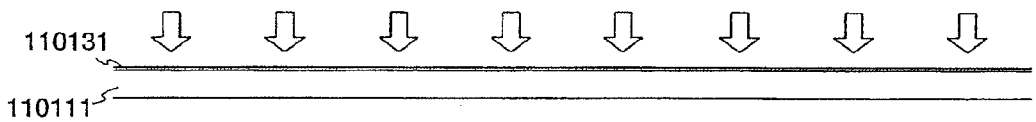
Figure 40C:
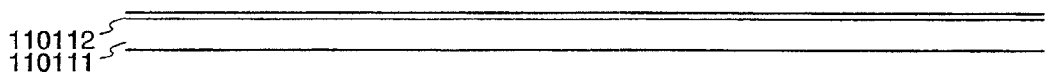
Figure 40D:
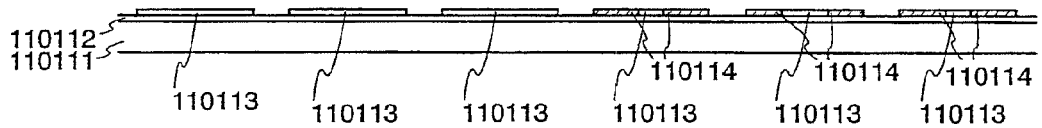
Figure 40E:
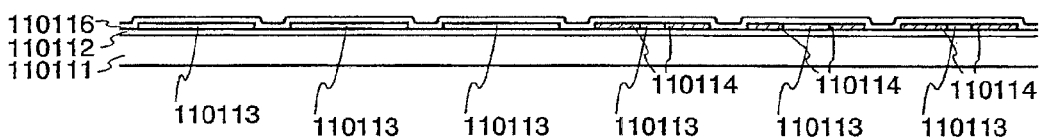
Figure 40F:
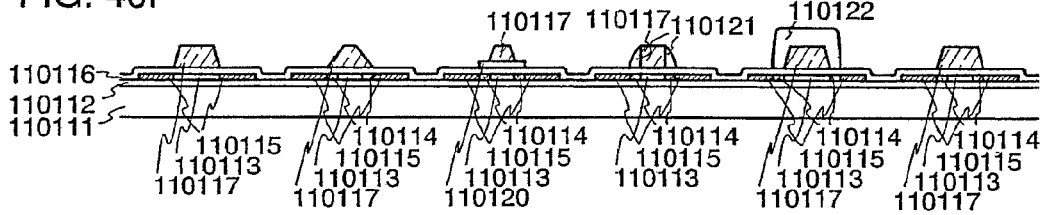
Figure 40G:
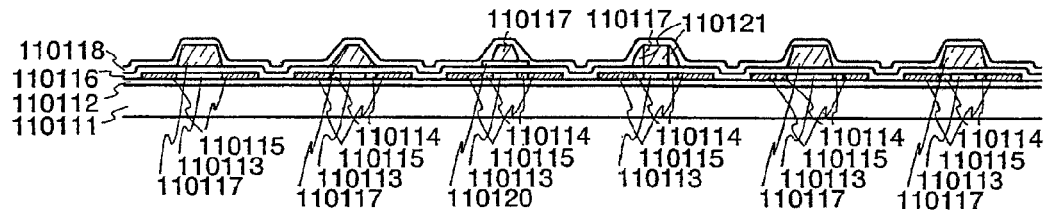

FIG. 40A shows a structure example of a transistor. FIGS. 40B to 40G show an example of a manufacturing method of the transistor.

Note that the structure and the manufacturing method of a transistor are not limited to those shown in FIGS. 40A to 40Q and various structures and manufacturing methods can be employed.

First, a structure example of a transistor is described with reference to FIG. 40A. FIG. 40A is a cross-sectional view of a plurality of transistors each having a different structure. Here, in FIG. 40A, the plurality of transistors each having a different structure are juxtaposed, which is for describing structures of the transistors. Therefore, the transistors are not needed to be actually juxtaposed as shown in FIG. 40A and can be separately formed as needed.

Next, characteristics of each layer forming the transistor are described.

A substrate 110111 can be a glass substrate using barium borosilicate glass, alumino borosilicate glass, or the like, a quartz substrate, a ceramic substrate, a metal substrate containing stainless steel, or the like. In addition, a substrate formed of plastics typified by polyethylene terephthalate (PET), polyethylene naphthalate (PEN), or polyethersulfone (PES), or a substrate formed of a flexible synthetic resin such as acrylic can also be used. By using a flexible substrate, a semiconductor device capable of being bent can be formed. A flexible substrate has no strict limitations on an area or a shape of the substrate. Therefore, for example, when a substrate having a rectangular shape, each side of which is 1 meter or more, is used as the substrate 110111, productivity can be significantly improved. Such an advantage is highly favorable as compared with the case where a circular silicon substrate is used.

An insulating film 110112 functions as a base film and is provided to prevent alkali metal such as Na or alkaline earth metal from the substrate 110111 from adversely affecting characteristics of a semiconductor element. The insulating film 110112 can have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y). For example, when the insulating film 110112 is provided to have a two-layer structure, it is preferable that a silicon nitride oxide film be used as a first insulating film and a silicon oxynitride film be used as a second insulating film. As another example, when the insulating film 110112 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 110113, 110114, and 110115 can be formed using an amorphous semiconductor, a microcrystalline semiconductor, or a semi-amorphous semiconductor (SAS). Alternatively, a polycrystalline semiconductor layer may be used. SAS is a semiconductor having an intermediate structure between amorphous and crystalline (including single crystal and polycrystalline) structures and having a third state which is stable in free energy. Moreover, SAS includes a crystalline region with a short-range order and lattice distortion. A crystalline region of 0.5 to 20 nm can be observed at least in part of a film. When silicon is contained as a main component, Raman spectrum shifts to a wave number side lower than 520 cm$^{-1}$. The diffraction peaks of (111) and (220) which are thought to be derived from a silicon crystalline lattice are observed by X-ray diffraction. SAS contains hydrogen or halogen of at least 1 atomic % or more to compensate dangling bonds. SAS is formed by glow discharge decomposition (plasma CVD) of a material gas. As the material gas, $SiH_4$, $Si_2H_6$, $SiH_2Cl_2$, $SiHCl_3$, $SiCl_4$, $SiF_4$, or the like can be used. Further, $GeF_4$ may be mixed. Alternatively, the material gas may be diluted with $H_2$, or $H_2$ and one or more kinds of rare gas elements selected from He, Ar, Kr, and Ne. A dilution ratio is in the range of 2 to 1000 times. Pressure is in the range of approximately 0.1 to 133 Pa, and a power supply frequency is 1 to 120 MHz, preferably 13 to 60 MHz. A substrate heating temperature may be 300° C. or lower. A concentration of impurities in atmospheric components such as oxygen, nitrogen, and carbon is preferably $1\times10^{20}$ cm$^{-1}$ or less as impurity elements in the film. In particular, an oxygen concentration is $5\times10^{19}$/cm$^3$ or less, preferably $1\times10^{19}$/cm$^3$ or less. Here, an amorphous silicon layer is formed using a material containing silicon (Si) as its main component (e.g., $Si_xGe_{1-x}$: 0<x<1) by a sputtering method, an LPCVD method, a plasma CVD method, or the like. Then, the amorphous silicon layer is crystallized by a crystallization method such as a laser crystallization method, a thermal crystallization method using RTA or an annealing furnace, or a thermal crystallization method using a metal element which promotes crystallization.

An insulating film 110116 can have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y).

A gate electrode 110117 can have a single-layer structure of a conductive film or a stacked-layer structure of two or three conductive films. As a material for the gate electrode 110117, for example, a single film of an element such as tantalum (Ta), titanium (Ti), molybdenum (Mo), tungsten (W), chromium (Cr), silicon (Si), or the like; a nitride film containing the aforementioned element (typically, a tantalum nitride film, a tungsten nitride film, or a titanium nitride film); an alloy film in which the aforementioned elements are combined (typically, a Mo—W alloy or a Mo—Ta alloy); a silicide film containing the aforementioned element (typically, a tungsten silicide film or a titanium silicide film); and the like can be used. Note that the aforementioned single film, nitride film, alloy film, silicide film, and the like can have a single-layer structure or a stacked-layer structure.

An insulating film 110118 can have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y); or a film containing carbon, such as a DLC (Diamond-Like Carbon), by a sputtering method, a plasma CVD method, or the like.

An insulating film 110119 can have a single-layer structure or a stacked-layer structure of a siloxane resin; an insulating film containing oxygen or nitrogen, such as silicon oxide (SiOx), silicon nitride (SiNx), silicon oxynitride (SiOxNy) (x>y), or silicon nitride oxide (SiNxOy) (x>y); a film containing carbon, such as a DLC (Diamond-Like Carbon); or an organic material such as epoxy, polyimide, polyamide, polyvinyl phenol, benzocyclobutene, or acrylic. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or an aryl group) is used. Alternatively, a fluoro group, or a fluoro group and an organic group containing at least hydrogen can be used as a substituent. Note that the insulating film 110119 can be provided to cover the gate electrode 110117 directly without provision of the insulating film 110118.

As a conductive film 110123, a single film of an element such as Al, Ni, C, W, Mo, Ti, Pt, Cu, Ta, Au, Mn, or the like, a nitride film containing the aforementioned element, an alloy film in which the aforementioned elements are combined, a silicide film containing the aforementioned element, or the like can be used. For example, as an alloy containing the plurality of elements, an Al alloy containing C and Ti, an Al alloy containing Ni, an Al alloy containing C and Ni, an Al alloy containing C and Mn, or the like can be used. When the conductive film has a stacked-layer structure, a structure can be such that Al is interposed between Mo, Ti, or the like; thus, resistance of Al to heat and chemical reaction can be improved.

Next, characteristics of each structure are described with reference to the cross-sectional view of the plurality of transistors each having a different structure in FIG. 40A.

A transistor 110101 is a single drain transistor. Since it can be formed by a simple method, it is advantageous in low manufacturing cost and high yield. Here, the semiconductor layers 110113 and 110115 have different concentrations of impurities, and the semiconductor layer 110113 is used as a channel region and the semiconductor layers 110115 are used as a source region and a drain region. By controlling the concentration of impurities in this manner, resistivity of the semiconductor layer can be controlled. Further, an electrical connection state of the semiconductor layer and the conductive film 110123 can be closer to ohmic contact. Note that as a method of separately forming the semiconductor layers each having different concentration of impurities, a method where impurities are doped in the semiconductor layer using the gate electrode 110117 as a mask can be used.

In a transistor 110102, the gate electrode 110117 has a tapered angle. Here, the tapered angle is 45° or more and less than 95°, and preferably, 60° or more and less than 95°. Note that the tapered angle may be less than 45°. Here, the semiconductor layers 110113, 110114, and 110115 have different concentrations of impurities. The semiconductor layer 110113 is used as a channel region, the semiconductor layers 110114 as lightly doped drain (LDD) regions, and the semiconductor layers 110115 as a source region and a drain region. By controlling the concentration of impurities in this manner, resistivity of the semiconductor layer can be controlled. Further, an electrical connection state of the semiconductor layer and the conductive film 110123 can be closer to ohmic contact. Moreover, since the transistor includes the LDD regions, high electric field is hardly applied inside the transistor, so that deterioration of the element due to hot carriers can be suppressed. Note that as a method of separately forming the semiconductor layers having different concentrations of impurities, a method where impurities are doped in the semiconductor layer using the gate electrode 110117 as a mask can be used. In the transistor 110102, since the gate electrode 110117 has a tapered angle, gradient of the concentration of impurities doped in the semiconductor layer through the gate electrode 110117 can be provided, and the LDD region can be easily formed. Thus, it is advantageous in low manufacturing cost and high yield.

A transistor 110103 has a structure where the gate electrode 110117 is formed of at least two layers and a lower gate electrode is longer than an upper gate electrode. In this specification, such a shape of the lower and upper gate electrodes is called a hat shape. When the gate electrode 110117 has a hat shape, an LDD region can be formed without addition of a photomask. Note that a structure where the LDD region overlaps with the gate electrode 110117, like the transistor 110103, is particularly called a GOLD (Gate Overlapped LDD) structure. As a method of forming the gate electrode 110117 with a hat shape, the following method may be used.

First, when the gate electrode 110117 is patterned, the lower and upper gate electrodes are etched by dry etching so that side surfaces thereof are inclined (tapered). Then, an inclination of the upper gate electrode is processed to be almost perpendicular by anisotropic etching. Thus, the gate electrode a cross section of which is a hat shape is formed. After that, impurity elements are doped twice, so that the semiconductor layer 110113 used as the channel region, the semiconductor layers 110114 used as the LDD regions, and the semiconductor layers 110115 used as a source electrode and a drain electrode are formed.

Note that part of the LDD region, which overlaps with the gate electrode 110117, is referred to as an Lov region, and part of the LDD region, which does not overlap with the gate electrode 110117, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is highly effective in preventing deterioration in the on-current value by relieving the electric field in the vicinity of the drain, whereas it is not very effective in suppressing the off-current value. Thus, it is preferable to form a transistor having a structure appropriate for characteristics of each of the various circuits. For example, when a semiconductor device is used for a display device, a transistor having an Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

A transistor 110104 includes a sidewall 110121 in contact with the side surface of the gate electrode 110117. When the transistor includes the sidewall 110121, a region overlapping with the sidewall 110121 can be made to be an LDD region.

In a transistor 110105, an LDD (Loff) region is formed by doping in the semiconductor layer with use of a mask. Thus, the LDD region can surely be formed, and an off-current value of the transistor can be reduced.

In a transistor 110106, an LDD (Lov) region is formed by doping in the semiconductor layer with use of a mask. Thus, the LDD region can surely be formed, and deterioration in an on-current value can be prevented by relieving the electric field in the vicinity of the drain of the transistor.

Next, an example of a method for manufacturing a transistor is described with reference to FIGS. 40B to 40G.

In this embodiment mode, surfaces of the substrate 110111, the insulating film 110112, the semiconductor layers 110113, 110114, and 110115, the insulating film 110116, the insulating film 110118, or the insulating film 110119 are oxidized or nitrided by plasma treatment, so that the semiconductor layer or the insulating film can be oxidized or nitrided. By oxidizing or nitriding the semiconductor layer or the insulating film by plasma treatment in such a manner, a surface of the semiconductor layer or the insulating film is modified, and the insulating film can be formed to be denser than an insulating film formed by a CVD method or a sputtering method. Thus, a defect such as a pinhole can be suppressed, and characteristics and the like of a semiconductor device can be improved.

Silicon oxide (SiOx) or silicon nitride (SiNx) can be used for the sidewall 110121. As a method of forming the sidewall 110121 on the side surface of the gate electrode 110117, a method where a silicon oxide (SiOx) film or a silicon nitride (SiNx) film is formed after the gate electrode 110117 is formed, and then, the silicon oxide (SiOx) film or the silicon nitride (SiNx) film is etched by anisotropic etching can be used, for example. Thus, the silicon oxide (SiOx) film or the silicon nitride (SiNx) film remains only on the side surface of the gate electrode 110117, so that the sidewall 110121 can be formed on the side surface of the gate electrode 110117.

Figure 44:
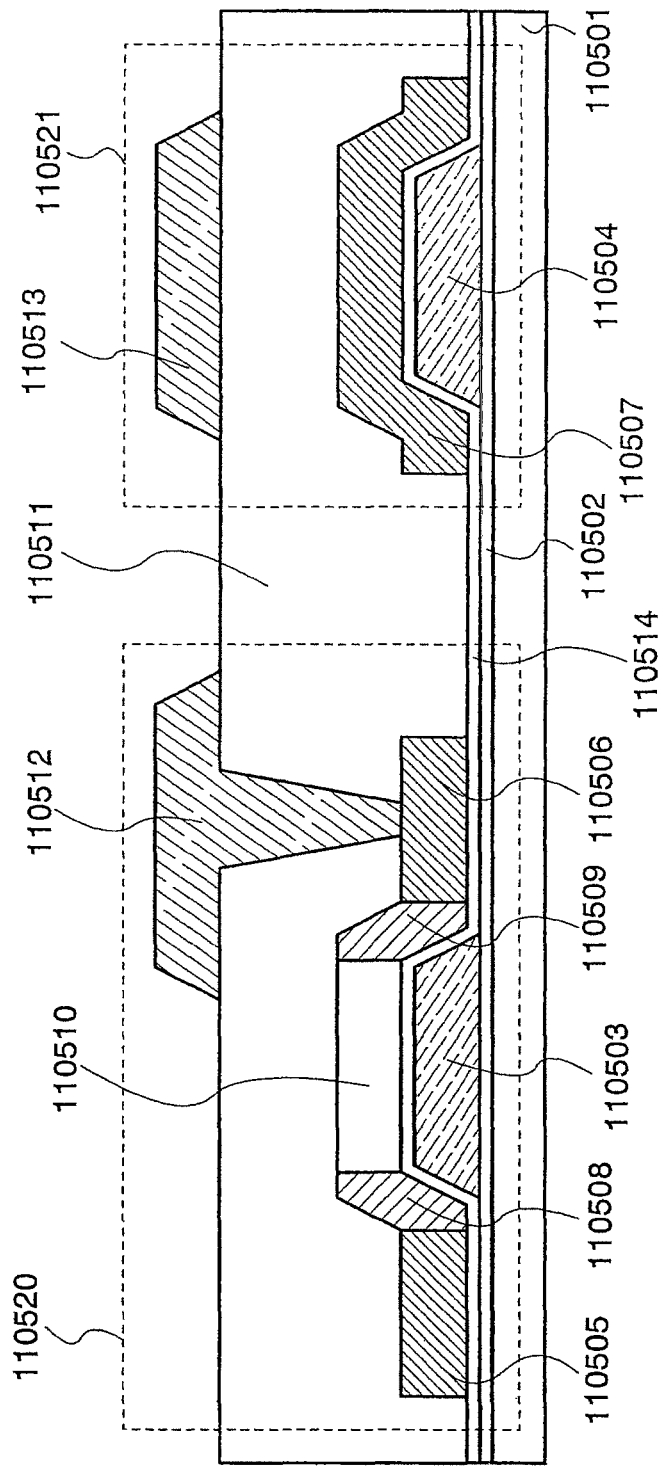
FIG. 44 shows a structure of a semiconductor device according to the invention.

FIG. 44 shows cross-sectional structures of a bottom-gate transistor and a capacitor.

A first insulating film (an insulating film 110502) is formed over an entire substrate 110501. Note that the structure is not limited thereto, and the first insulating film (the insulating film 110502) is not formed in some cases. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

A first conductive layer (a conductive layer 110503 and a conductive layer 110504) is formed over the first insulating film. The conductive layer 110503 includes a portion functioning as a gate electrode of a transistor 110520. The conductive layer 110504 includes a portion functioning as a first electrode of a capacitor 110521. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A second insulating film (an insulating film 110514) is formed to cover at least the first conductive layer. The second insulating film functions as a gate insulating film. As the second insulating film, a single layer or a stacked layer of a silicon oxide film, a silicon nitride film, a silicon oxynitride film (SiOxNy), or the like can be used.

As a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used as a portion of the second insulating film in contact with Mo. This is because the silicon oxide film does not oxidize Mo.

A semiconductor layer is formed in part of a portion over the second insulating film, which overlaps with the first conductive layer, by a photolithography method, an inkjet method, a printing method, or the like. Part of the semiconductor layer extends to a portion over the second insulating film, which does not overlap with the first conductive layer. The semiconductor layer includes a channel formation region (a channel formation region 110510), an LDD region (LDD regions 110508 and 110509), and an impurity region (impurity regions 110505, 110506, and 110507). The channel formation region 110510 functions as a channel formation region of the transistor 110520. The LDD regions 110508 and 110509 function as LDD regions of the transistor 110520. Note that the LDD regions 110508 and 110509 are not necessarily formed. The impurity region 110505 includes a portion functioning as one of a source electrode and a drain electrode of the transistor 110520. The impurity region 110506 includes a portion functioning as the other of the source electrode and the drain electrode of the transistor 110520. The impurity region 110507 includes a portion functioning as a second electrode of the capacitor 110521.

A third insulating film (an insulating film 110511) is formed entirely over the impurity region 110505, the LDD region 110508, the channel formation region 110510, the LDD region 110509, the impurity region 110506, the second insulating film 110514, and the impurity region 110507. A contact hole is selectively formed in part of the third insulating film. The insulating film 110511 functions as an interlayer film. As the third insulating film, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane may be used. Note that siloxane is a material in which a skeleton structure is formed by a bond of silicon (Si) and oxygen (O). As a substitute, an organic group containing at least hydrogen (such as an alkyl group or an aryl group) is used. Alternatively, a fluoro group, or a fluoro group and an organic group containing at least hydrogen may be used as a substituent.

A second conductive layer (a conductive layer 110512 and a conductive layer 110513) is formed over the third insulating film. The conductive layer 110512 is connected to the other of the source electrode and the drain electrode of the transistor 110520 through the contact hole formed in the third insulating film. Thus, the conductive layer 110512 includes a portion functioning as the other of the source electrode and the drain electrode of the transistor 110520. When the conductive layer 110513 is electrically connected to the conductive layer 110504, the conductive layer 110513 includes a portion functioning as the first electrode of the capacitor 110521. Alternatively, when the conductive layer 110513 is electrically connected to the conductive layer 110507, the conductive layer 110513 includes a portion functioning as the second electrode of the capacitor 110521. Further alternatively, when the conductive layer 110513 is not connected to the conductive layers 110504 and 110507, another capacitor is formed other than the capacitor 110521. In this capacitor, the conductive layer 110513, the conductive layer 110507, and the insulating film 110511 are used as a first electrode, a second electrode, and an insulating film, respectively. Note that as the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

Next, structures of a transistor and a capacitor are described in the case where an amorphous silicon (a-Si) film, a microcrystal silicon film, or the like is used as a semiconductor layer of the transistor.

Figure 41:
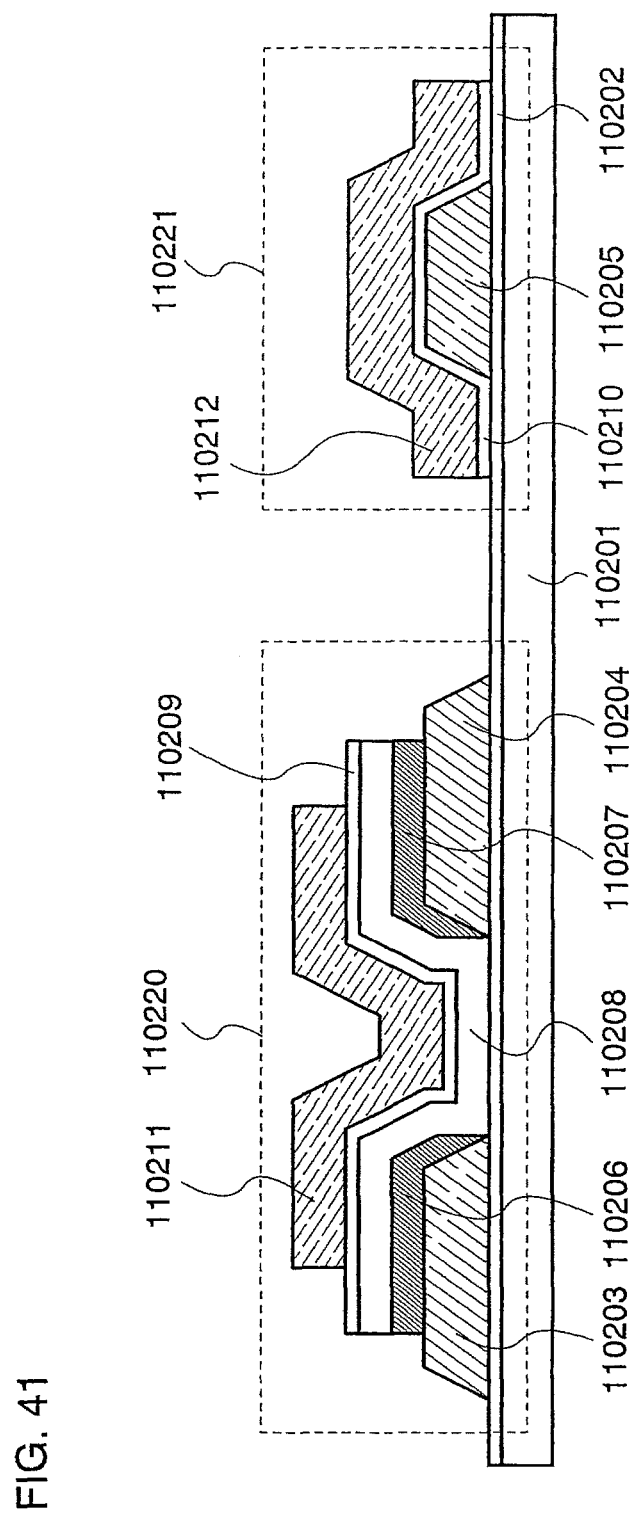
FIG. 41 shows a structure of a semiconductor device according to the invention.

FIG. 41 shows cross-sectional structures of a top-gate transistor and a capacitor.

A first insulating film (an insulating film 110202) is formed over an entire substrate 110201. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

Note that the first insulating film is not necessarily formed. When the first insulating film is not formed, reduction in the number of steps and manufacturing cost can be realized. Further, since the structure can be simplified, the yield can be improved.

A first conductive layer (a conductive layer 110203, a conductive layer 110204, and a conductive layer 110205) is formed over the first insulating film. The conductive layer 110203 includes a portion functioning as one of a source electrode and a drain electrode of a transistor 110220. The conductive layer 110204 includes a portion functioning as the other of the source electrode and the drain electrode of the transistor 110220. The conductive layer 110205 includes a portion functioning as a first electrode of a capacitor 110221. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A first semiconductor layer (a semiconductor layer 110206 and a semiconductor layer 110207) is formed above the conductive layers 110203 and 110204. The semiconductor layer 110206 includes a portion functioning as one of the source electrode and the drain electrode. The semiconductor layer 110207 includes a portion functioning as the other of the source electrode and the drain electrode. As the first semiconductor layer, silicon containing phosphorus or the like can be used.

A second semiconductor layer (a semiconductor layer 110208) is formed over the first insulating film and between the conductive layer 110203 and the conductive layer 110204. Part of the semiconductor layer 110208 extends over the conductive layers 110203 and 110204. The semiconductor layer 110208 includes a portion functioning as a channel region of the transistor 110220. As the second semiconductor layer, a semiconductor layer having no crystallinity such as amorphous silicon (a-Si:H), a semiconductor layer such as microcrystal (μ-Si:H), or the like can be used.

A second insulating film (an insulating film 110209 and an insulating film 110210) is formed to cover at least the semiconductor layer 110208 and the conductive layer 110205. The second insulating film functions as a gate insulating film. As the second insulating film, a single layer or a stacked layer of a silicon oxide film, a silicon nitride film, a silicon oxynitride film (SiOxNy), or the like can be used.

As a portion of the second insulating film, which is in contact with the second semiconductor layer, a silicon oxide film is preferably used. This is because the trap level at the interface between the second semiconductor layer and the second insulating film is lowered.

Note that when the second insulating film is in contact with Mo, a silicon oxide film is preferably used as a portion of the second insulating film in contact with Mo. This is because the silicon oxide film does not oxidize Mo.

A second conductive layer (a conductive layer 110211 and a conductive layer 110212) is formed over the second insulating film. The conductive layer 110211 includes a portion functioning as a gate electrode of the transistor 110220. The conductive layer 110212 functions as a second electrode of the capacitor 110221 or a wiring. As the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

Figure 42:
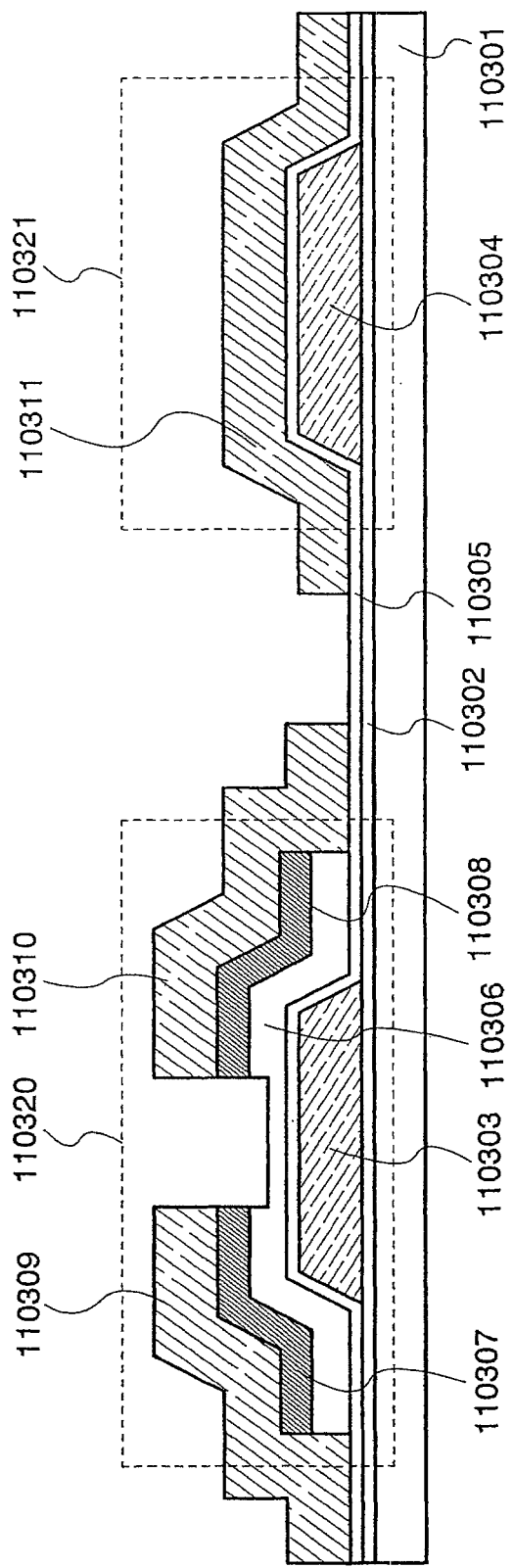
FIG. 42 shows a structure of a semiconductor device according to the invention.

FIG. 42 shows cross-sectional structures of an inversely staggered (bottom gate) transistor and a capacitor. In particular, the transistor shown in FIG. 42 has a channel etch structure.

A first insulating film (an insulating film 110302) is formed over an entire substrate 110301. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

Note that the first insulating film is not necessarily formed. When the first insulating film is not formed, reduction in the number of steps and manufacturing cost can be realized. Further, since the structure can be simplified, the yield can be improved.

A first conductive layer (a conductive layer 110303 and a conductive layer 110304) is formed over the first insulating film. The conductive layer 110303 includes a portion functioning as a gate electrode of a transistor 110320. The conductive layer 110304 includes a portion functioning as a first electrode of a capacitor 110321. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A second insulating film (an insulating film 110305) is formed to cover at least the first conductive layer. The second insulating film functions as a gate insulating film. As the second insulating film, a single layer or a stacked layer of a silicon oxide film, a silicon nitride film, a silicon oxynitride film (SiOxNy), or the like can be used.

As a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used as a portion of the second insulating film in contact with Mo. This is because the silicon oxide film does not oxidize Mo.

A first semiconductor layer (a semiconductor layer 110306) is formed in part of a portion over the second insulating film, which overlaps with the first conductive layer, by a photolithography method, an inkjet method, a printing method, or the like. Part of the semiconductor layer 110306 extends to a portion over the second insulating film, which does not overlap with the first conductive layer. The semiconductor layer 110306 includes a portion functioning as a channel region of the transistor 110320. As the semiconductor layer 110306, a semiconductor layer having no crystallinity such as amorphous silicon (a-Si:H), a semiconductor layer such as microcrystal (μ-Si:H), or the like can be used.

A second semiconductor layer (a semiconductor layer 110307 and a semiconductor layer 110308) is formed over part of the first semiconductor layer. The semiconductor layer 110307 includes a portion functioning as one of a source electrode and a drain electrode. The semiconductor layer 110308 includes a portion functioning as the other of the source electrode and the drain electrode. As the second semiconductor layer, silicon containing phosphorus or the like can be used.

A second conductive layer (a conductive layer 110309, a conductive layer 110310, and a conductive layer 110311) is formed over the second semiconductor layer and the second insulating film. The conductive layer 110309 includes a portion functioning as one of a source electrode and a drain electrode of the transistor 110320. The conductive layer 110310 includes a portion functioning as the other of the source electrode and the drain electrode of the transistor 110320. The conductive layer 110311 includes a portion functioning as a second electrode of the capacitor 110321. As the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

Note that in steps after forming the second conductive layer, various insulating films or various conductive films may be formed.

Here, an example of a process of forming a channel etch type transistor is described. The first semiconductor layer and the second semiconductor layer can be formed using the same mask. Specifically, the first semiconductor layer and the second semiconductor layer are sequentially formed. At this time, the first semiconductor layer and the second semiconductor layer are formed using the same mask.

Another example of a process of forming a channel etch type transistor is described. Without using an additional mask, a channel region of a transistor can be formed. Specifically, after the second conductive layer is formed, part of the second semiconductor layer is removed using the second conductive layer as a mask. Alternatively, part of the second semiconductor layer is removed by using the same mask as the second conductive layer. The first semiconductor layer below the removed second semiconductor layer functions as a channel region of the transistor.

Figure 43:
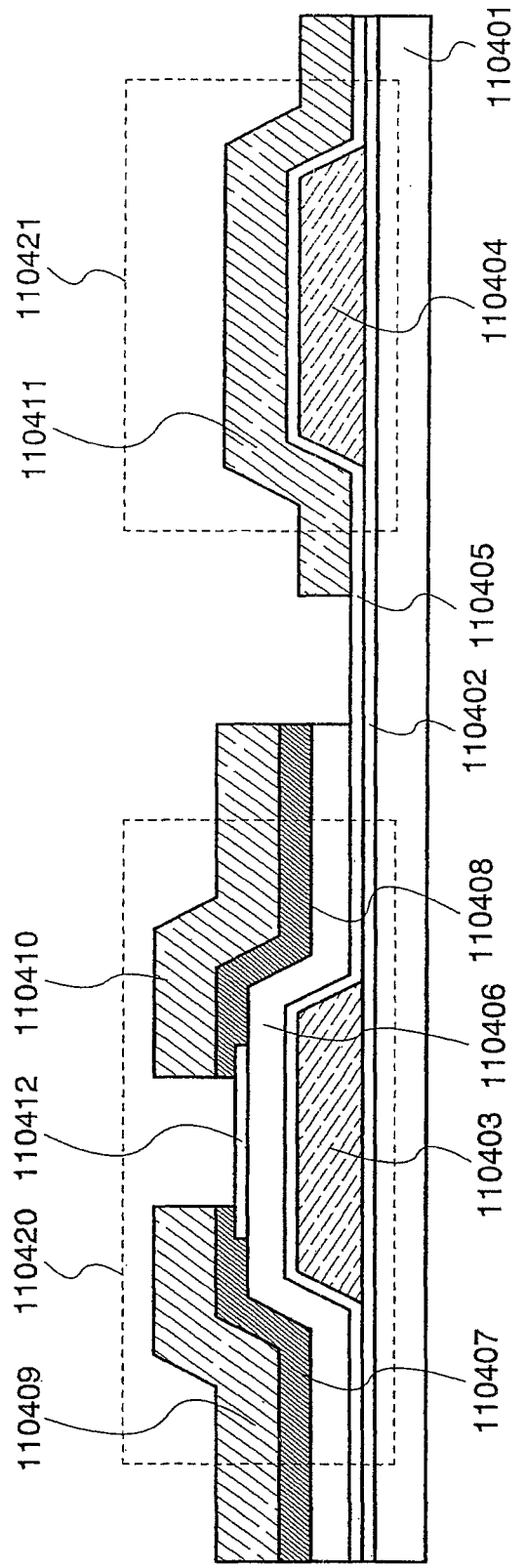
FIG. 43 shows a structure of a semiconductor device according to the invention.

FIG. 43 shows cross-sectional structures of an inversely staggered (bottom gate) transistor and a capacitor. In particular, the transistor shown in FIG. 43 has a channel protection (channel stop) structure.

A first insulating film (an insulating film 110402) is formed over an entire substrate 110401. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

Note that the first insulating film is not necessarily formed. When the first insulating film is not formed, reduction in the number of steps and manufacturing cost can be realized. Further, since the structure can be simplified, the yield can be increased.

A first conductive layer (a conductive layer 110403 and a conductive layer 110404) is formed over the first insulating film. The conductive layer 110403 includes a portion functioning as a gate electrode of a transistor 110420. The conductive layer 110404 includes a portion functioning as a first electrode of a capacitor 110421. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A second insulating film (an insulating film 110405) is formed to cover at least the first conductive layer. The second insulating film functions as a gate insulating film. As the second insulating film, a single layer or a stacked layer of a silicon oxide film, a silicon nitride film, a silicon oxynitride film (SiOxNy), or the like can be used.

As a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used as a portion of the second insulating film in contact with Mo. This is because the silicon oxide film does not oxidize Mo.

A first semiconductor layer (a semiconductor layer 110406) is formed in part of a portion over the second insulating film, which overlaps with the first conductive layer, by a photolithography method, an inkjet method, a printing method, or the like. Part of the semiconductor layer 110406 extends to a portion over the second insulating film, which does not overlap with the first conductive layer. The semiconductor layer 110406 includes a portion functioning as a channel region of the transistor 110420. As the semiconductor layer 110406, a semiconductor layer having no crystallinity such as amorphous silicon (a-Si:H), a semiconductor layer such as microcrystal (μ-Si:H), or the like can be used.

A third insulating film (an insulating film 110412) is formed over part of the first semiconductor layer. The insulating film 110412 has a function to prevent the channel region of the transistor 110420 from being removed by etching. That is, the insulating film 110412 functions as a channel protection film (a channel stop film). As the third insulating film, a single layer or a stacked layer of a silicon oxide film, a silicon nitride film, a silicon oxynitride film (SiOxNy), or the like can be used.

A second semiconductor layer (a semiconductor layer 110407 and a semiconductor layer 110408) is formed over part of the first semiconductor layer and part of the third insulating film. The semiconductor layer 110407 includes a portion functioning as one of a source electrode and a drain electrode. The semiconductor layer 110408 includes a portion functioning as the other of the source electrode and the drain electrode. As the second semiconductor layer, silicon containing phosphorus or the like can be used.

A second conductive layer (a conductive layer 110409, a conductive layer 110410, and a conductive layer 110411) is formed over the second semiconductor layer. The conductive layer 110409 includes a portion functioning as one of the source electrode and the drain electrode of the transistor 110420. The conductive layer 110410 includes a portion functioning as the other of the source electrode and the drain electrode of the transistor 110420. The conductive layer 110411 includes a portion functioning as a second electrode of the capacitor 110421. As the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

The above is the description of the structures and manufacturing methods of transistors. Here, a wiring, an electrode, a conductive layer, a conductive film, a terminal, a via, a plug, and the like are preferably formed of one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); or a compound or an alloy material including one or more of the aforementioned elements (e.g., indium tin oxide (ITO), indium zinc oxide (IZO), indium tin oxide containing silicon oxide (ITSO), zinc oxide (ZnO), tin oxide (SnO), cadmium tin oxide (CTO), aluminum neodymium (Al—Nd), magnesium silver (Mg—Ag), or molybdenum-niobium (Mo—Nb)); a substance in which these compounds are combined; or the like. Alternatively, they are preferably formed to contain a substance including a compound (silicide) of silicon and one or more of the aforementioned elements (e.g., aluminum silicon, molybdenum silicon, or nickel silicide); or a compound of nitrogen and one or more of the aforementioned elements (e.g., titanium nitride, tantalum nitride, or molybdenum nitride).

Silicon (Si) may include an n-type impurity (such as phosphorus) or a p-type impurity (such as boron). When silicon contains the impurity, the conductivity is increased, and a function similar to a general conductor can be realized. Thus, such silicon can be utilized easily as a wiring, an electrode, or the like.

Silicon with various levels of crystallinity, such as single crystalline silicon, polycrystalline silicon, or microcrystalline silicon can be used. Alternatively, silicon having no crystallinity, such as amorphous silicon can be used. By using single crystalline silicon or polycrystalline silicon, resistance of a wiring, an electrode, a conductive layer, a conductive film, a terminal, or the like can be reduced. By using amorphous silicon or microcrystalline silicon, a wiring or the like can be formed by a simple process.

Aluminum and silver have high conductivity, and thus can reduce a signal delay. Further, since aluminum and silver can be easily etched, they can be easily patterned and minutely processed.

Copper has high conductivity, and thus can reduce a signal delay. When copper is used, a stacked-layer structure is preferably employed since copper increases adhesion.

Molybdenum and titanium are preferable since even if molybdenum or titanium is in contact with an oxide semiconductor (e.g., ITO or IZO) or silicon, molybdenum or titanium does not cause defects. Further, molybdenum and titanium are easily etched and has high heat resistance.

Tungsten is preferable since it has an advantage such as high heat resistance.

Neodymium is also preferable since it has an advantage such as high heat resistance. In particular, an alloy of neodymium and aluminum is preferable since heat resistance is increased and aluminum hardly causes hillocks.

Silicon can be formed at the same time as a semiconductor layer included in a transistor. Silicon is preferable since it has an advantage such as high heat resistance.

Since ITO, IZO, ITSO, zinc oxide (ZnO), silicon (Si), tin oxide (SnO), and cadmium tin oxide (CTO) have light-transmitting properties, they can be used as a portion which transmits light. For example, they can be used for a pixel electrode or a common electrode.

IZO is preferable since it is easily etched and processed. In etching IZO, a residue is hardly left. Thus, when IZO is used for a pixel electrode, defects (such as short circuit or orientation disorder) of a liquid crystal element or a light-emitting element can be reduced.

A wiring, an electrode, a conductive layer, a conductive film, a terminal, a via, a plug, or the like may have a single-layer structure or a multi-layer structure. By employing a single-layer structure, each manufacturing process of a wiring, an electrode, a conductive layer, a conductive film, a terminal, or the like can be simplified, the number of steps can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a stacked-layer structure where a low heat-resistant material is interposed between high heat-resistant materials is employed, heat resistance of a wiring, an electrode, and the like can be increased, utilizing advantages of the low heat-resistance material. For example, it is preferable to employ a stacked-layer structure where a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

The term "wiring" indicates provision of a conductor. A wiring may be extended linearly or may be short without extension. Therefore, an electrode is included in a wiring.

Note that a carbon nanotube may be used for a wiring, an electrode, a conductive layer, a conductive film, a terminal, a via, a plug, or the like. Since a carbon nanotube has light-transmitting properties, it can be used for a portion which transmits light. For example, a carbon nanotube can be used for a pixel electrode or a common electrode.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 9

In this embodiment mode, a structure of a display device is described.

Figure 47A:
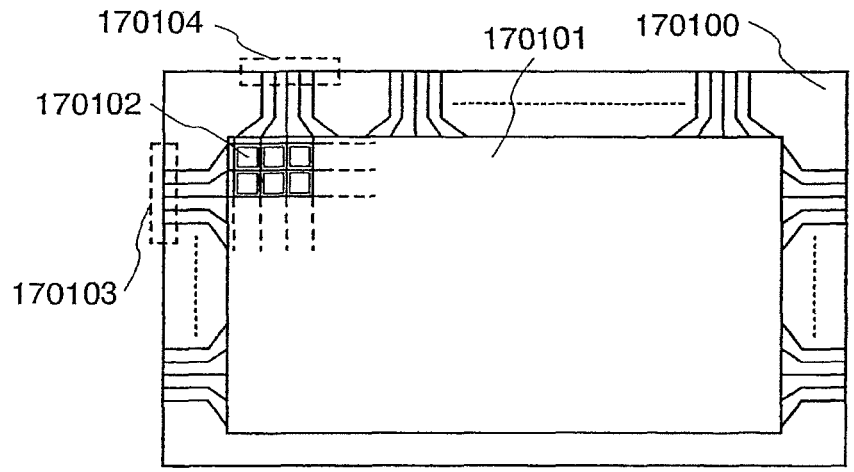
FIGS. 47A to 47C each show a structure of a display device in a semiconductor device according to the invention.

A structure of a display device is described with reference to FIG. 47A. FIG. 47A is a top plan view of the display device.

A pixel portion 170101, a scan line input terminal 170103, and a signal line input terminal 170104 are formed over a substrate 170100. Scan lines extending in a row direction from the scan line input terminal 170103 are formed over the substrate 170100, and signal lines extending in a column direction from the signal line input terminal 170104 are formed over the substrate 170100. Pixels 170102 are arranged in matrix in a region of the pixel portion 170101, in which the scan lines and the signal lines are crossed.

The above is the description of the case where a signal is input from an external driver circuit; however, the invention is not limited thereto, and an IC chip can be mounted on a display device.

Figure 48A:
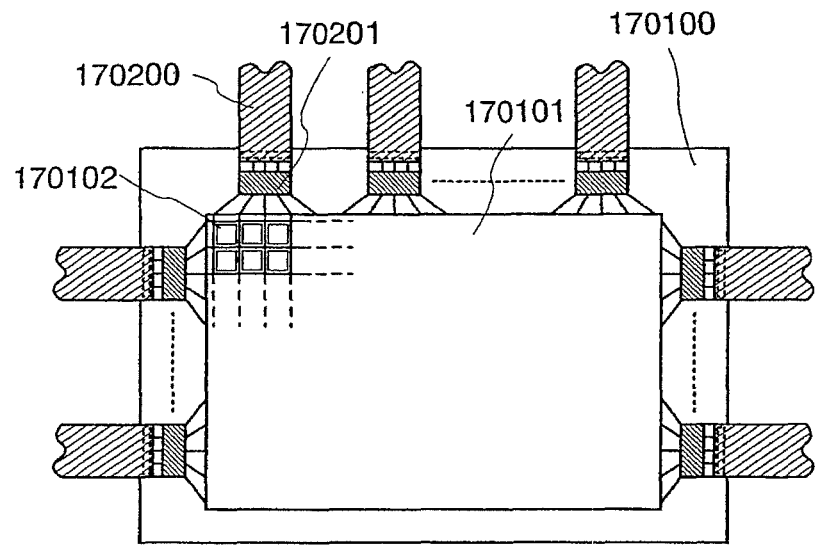
FIGS. 48A and 48B each show a structure of a peripheral circuit in a semiconductor device according to the invention.

For example, as shown in FIG. 48A, an IC chip 170201 can be mounted on the substrate 170100 by a COG (Chip On Glass) method. In this case, the IC chip 170201 can be examined before being mounted on the substrate 170100, so that improvement in yield and reliability of the display device can be realized. Note that portions common to those in FIG. 47A are denoted by common reference numerals, and description thereof is omitted.

Figure 48B:
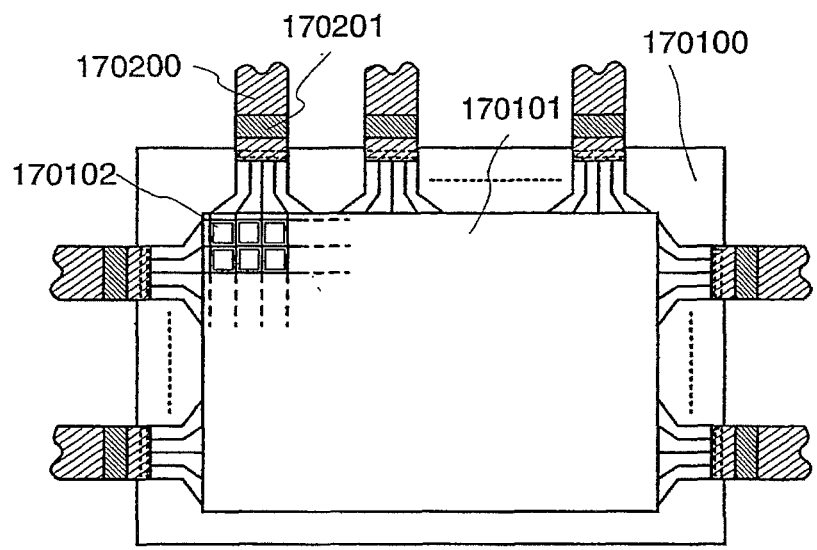

As another example, as shown in FIG. 48B, the IC chip 170201 can be mounted on an FPC (Flexible Printed Circuit) 170200 by a TAB (Tape Automated Bonding) method. In this case, the IC chip 170201 can be examined before being mounted on the FPC 170200, so that improvement in yield and reliability of the display device can be realized. Note that portions common to those in FIG. 47A are denoted by common reference numerals, and description thereof is omitted.

Not only the IC chip can be mounted on the substrate 170100, but also a driver circuit can be formed over the substrate 170100.

Figure 47B:
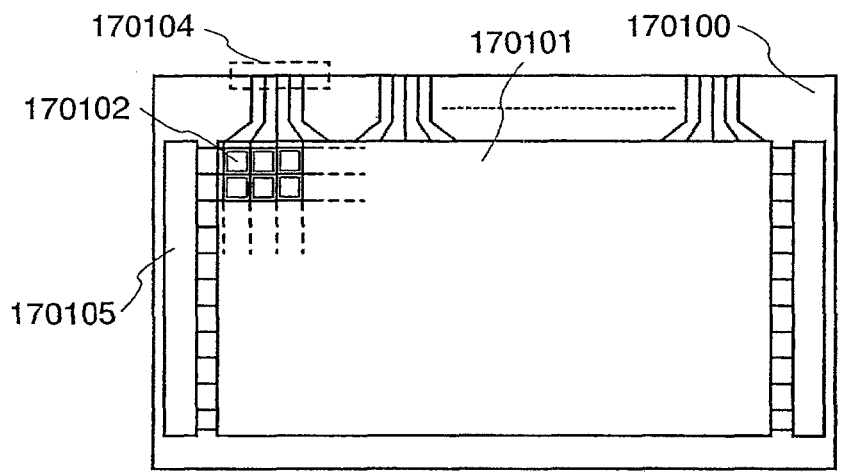

For example, as shown in FIG. 47B, a scan line driver circuit 170105 can be formed over the substrate 170100. In this case, the cost can be reduced by reduction in the number of components. Further, reliability can be improved by reduction in the number of connection points between components. Since the driving frequency of the scan line driver circuit 170105 is low, the scan line driver circuit 170105 can be easily formed using amorphous silicon or microcrystalline silicon as a semiconductor layer of a transistor. Note that an IC chip for outputting a signal to the signal line may be mounted on the substrate 170100 by a COG method. Alternatively, an FPC on which an IC chip for outputting a signal to the signal line is mounted by a TAB method may be provided on the substrate 170100. In addition, an IC chip for controlling the scan line driver circuit 170105 may be mounted on the substrate 170100 by a COG method. Alternatively, an FPC on which an IC chip for controlling the scan line driver circuit 170105 is mounted by a TAB method may be provided on the substrate 170100. Note that portions common to those in FIG. 47A are denoted by common reference numerals, and description thereof is omitted.

Figure 47C:
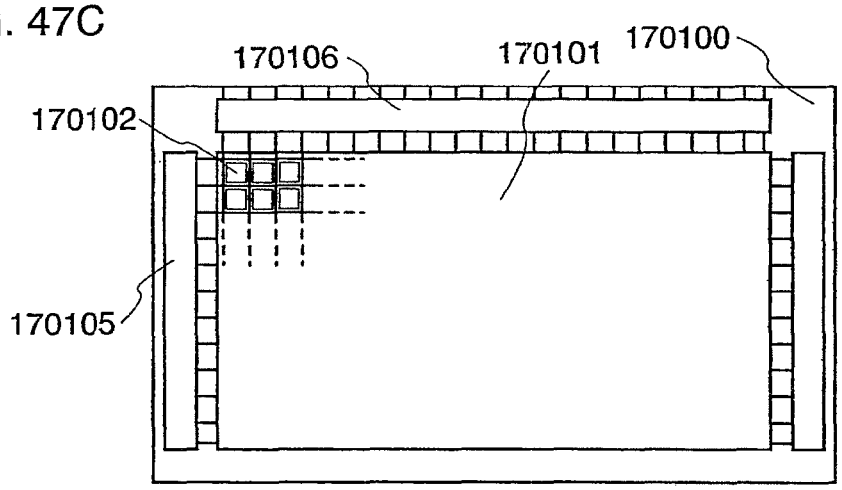

As another example, as shown in FIG. 47C, the scan line driver circuit 170105 and a signal line driver circuit 170106 can be formed over the substrate 170100. Thus, the cost can be reduced by reduction in the number of components. Further, reliability can be improved by reduction in the number of connection points between components. Note that an IC chip for controlling the scan line driver circuit 170105 may be mounted on the substrate 170100 by a COG method. Alternatively, an FPC on which an IC chip for controlling the scan line driver circuit 170105 is mounted by a TAB method may be provided on the substrate 170100. Further, an IC chip for controlling the signal line driver circuit 170106 may be mounted on the substrate 170100 by a COG method. Alternatively, an FPC on which an IC chip for controlling the signal line driver circuit 170106 is mounted by a TAB method may be provided on the substrate 170100. Note that portions common to those in FIG. 47A are denoted by common reference numerals, and description thereof is omitted.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 10

In this embodiment mode, a method for driving a display device is described. In particular, a method for driving a liquid crystal display device is described.

A liquid crystal display panel which can be used for a liquid crystal display device described in this embodiment mode has a structure in which a liquid crystal material is interposed between two substrates. Each of the two substrates is provided with an electrode for controlling an electric field applied to the liquid crystal material. A liquid crystal material corresponds to a material, the optical and electrical properties of which are changed by an electric field externally applied. Accordingly, a liquid crystal panel corresponds to a device in which desired optical and electrical properties can be obtained by controlling voltage applied to the liquid crystal material using the electrode included in each of the two substrates. In addition, a large number of electrodes are arranged in a planar manner, each of the electrodes corresponds to a pixel, and voltages applied to the pixels are individually controlled; therefore, a clear image can be displayed on a liquid crystal display panel.

Here, response time of the liquid crystal material due to change in an electric field depends on a gap (a cell gap) between the two substrates and a type or the like of the liquid crystal material, and is generally several milliseconds to several ten milliseconds. When the amount of change in the electric field is small, the response time of the liquid crystal material is further lengthened. This characteristic causes defects in image display, such as an after image, a phenomenon in which traces can be seen, and decrease in contrast when the liquid crystal panel displays a moving image. In particular, when a half tone is changed into another half tone (when change in the electric field is small), a degree of the above-described defects become noticeable.

On the other hand, as a particular problem of a liquid crystal panel using an active matrix method, fluctuation in writing voltage due to constant charge driving is given. Constant charge driving in this embodiment mode is described below.

A pixel circuit using an active matrix method includes a switch which controls writing and a capacitor which holds a charge. A method for driving the pixel circuit using the active matrix method corresponds to a method in which predetermined voltage is written in a pixel circuit with a switch in an on state, and immediately after that, a charge in the pixel circuit is held (a hold state) with the switch in an off state. At the time of the hold state, exchange of the charge between inside and outside of the pixel circuit is not performed (a constant charge). In general, period when the switch is in an off state is approximately several hundreds (the number of scan lines) of times longer than a period when the switch is in an on state. Accordingly, it may be considered that the switch of the pixel circuit be almost always in an off state. As described above, constant charge driving in this embodiment mode corresponds to a driving method in which a pixel circuit is in a hold state in almost all periods in driving a liquid crystal panel.

Next, electrical properties of the liquid crystal material are described. A dielectric constant as well as optical properties of the liquid crystal material are changed when an electric field externally applied is changed. That is, when it is considered that each pixel of the liquid crystal panel be a capacitor (a liquid crystal element) interposed between two electrodes, the capacitor corresponds to a capacitor, capacitance of which is changed in accordance with applied voltage. This phenomenon is called dynamic capacitance.

When a capacitor, the capacitance of which is changed in accordance with applied voltage in this manner is driven by the constant charge driving, the following problem occurs. When capacitance of a liquid crystal element is changed in a hold state in which a charge is not moved, applied voltage is also changed. This can be understood from the fact that the amount of charges is constant in a relational expression of (the amount of charges)=(capacitance)×(applied voltage).

Figure 45A:
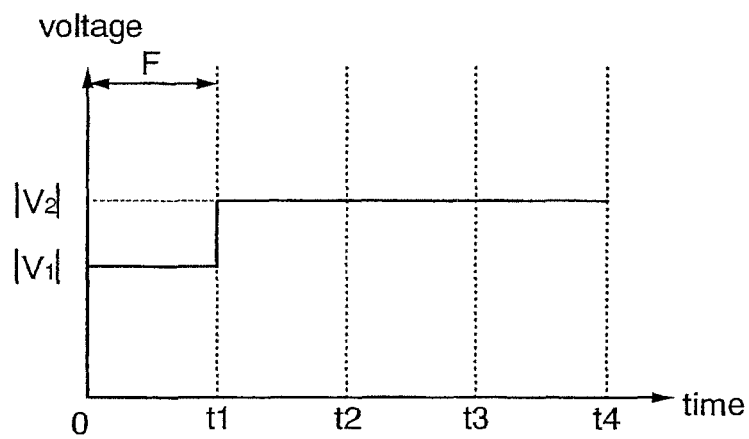
FIGS. 45A to 45C shows one driving method of a semiconductor device according to the invention.
Figure 45B:
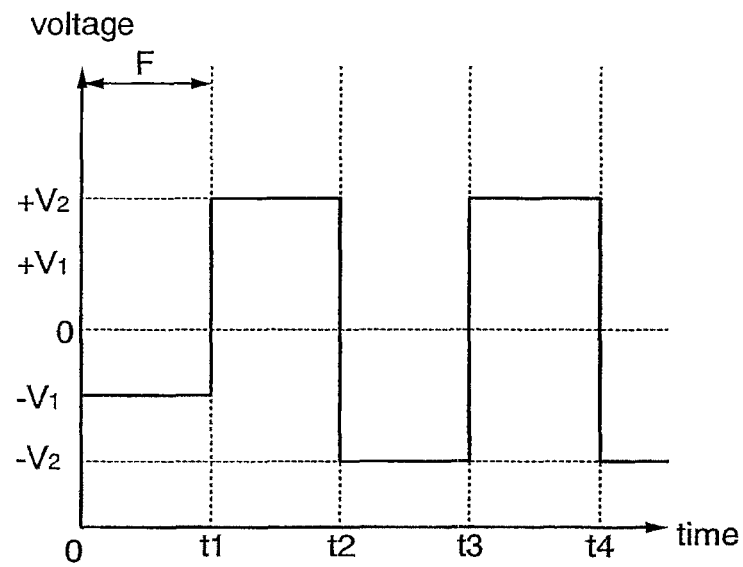
Figure 45C:
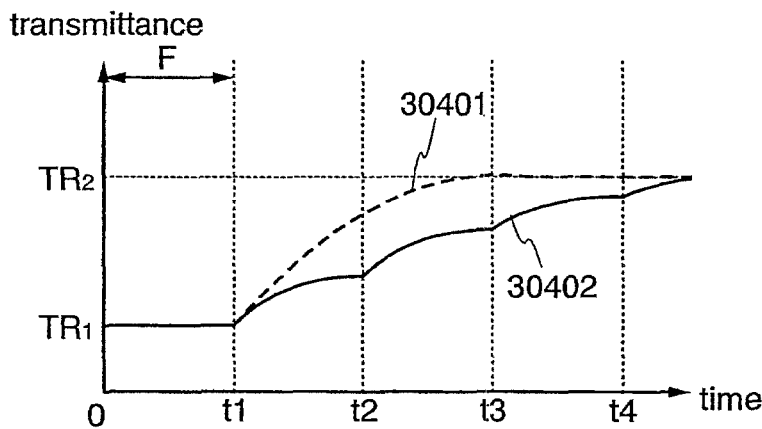

Because of the above-described reasons, voltage at the time of a hold state is changed from voltage at the time of writing since constant charge driving is performed in a liquid crystal panel using an active matrix method. Accordingly, change in transmittance of the liquid crystal element is different from change in transmittance of a liquid crystal element in a driving method which does not take a hold state. FIGS. 45A to 45C show this state. FIG. 45A shows an example of controlling voltage written in a pixel circuit when time is represented by a horizontal axis and an absolute value of the voltage is represented by a vertical axis. FIG. 45B shows an example of controlling voltage written in the pixel circuit when time is represented by a horizontal axis and the voltage is represented by a vertical axis. FIG. 45C shows change in transmittance of the liquid crystal element over time in the case where the voltage shown in FIG. 45A or 45B is written in the pixel circuit when time is represented by a horizontal axis and an absolute value of the voltage is represented by a vertical axis. In each of FIGS. 45A to 45C, a period F indicates a period for rewriting the voltage, and time for rewriting the voltage is denoted by $t_1$, $t_2$, $t_3$, and $t_4$.

Here, writing voltage corresponding to image data input to the liquid crystal display device corresponds to $|V_1|$ in rewriting at the time of 0 and corresponds to $|V_2|$ in rewriting at the time of $t_1$, $t_2$, $t_3$, and $t_4$ (see FIG. 45A).

Polarity of the writing voltage corresponding to image data input to the liquid crystal display device may be switched periodically (inversion driving: see FIG. 45B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of a flicker caused by inversion driving can be reduced since the inversion period is short. Further, the inversion period may be a period which is integral times the period of rewriting voltage. In this case, power consumption can be reduced since the inversion period is long and frequency of writing voltage can be decreased by changing the polarity.

FIG. 45C shows change in transmittance of the liquid crystal element over time when voltage as shown in FIG. 45A or 45B is applied to the liquid crystal element. Here, the voltage $|V_1|$ is applied to the liquid crystal element, and transmittance of the liquid crystal element after enough time passes corresponds to $TR_1$. Similarly, the voltage $|V_2|$ is applied to the liquid crystal element, and transmittance of the liquid crystal element after enough time passes corresponds to $TR_2$. When the voltage applied to the liquid crystal element is changed from $|V_1|$ to $|V_2|$ at the time of $t_1$, transmittance of the liquid crystal element does not immediately become $TR_2$ but slowly changes as shown by a dashed line 30401. For example, when the period of rewriting voltage is the same as a frame period (16.7 milliseconds) of an image signal of 60 Hz, time for several frames is necessary until transmittance is changed to $TR_2$.

Note that smooth change in transmittance over time as shown in the dashed line 30401 corresponds to change in transmittance over time when the voltage $|V_2|$ is accurately applied to the liquid crystal element. In an actual liquid crystal panel, for example, a liquid crystal panel using an active matrix method, transmittance of the liquid crystal element does not changed over time as shown by the dashed line 30401 but gradually changes over time as shown by a solid line 30402. This is because voltage at the time of a hold state is changed from voltage at the time of writing due to constant charge driving, and it is impossible to reach intended voltage only by one writing. Accordingly, the response time of transmittance of the liquid crystal element becomes further longer than original response time (the dashed line 30401) in appearance, so that defects in image display, such as an after image, a phenomenon in which traces can be seen, or decrease in contrast notably occur.

Figure 46A:
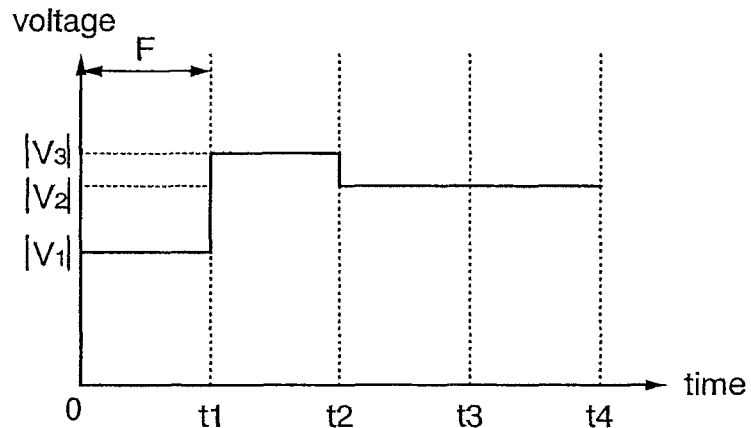
FIGS. 46A to 46C shows one driving method of a semiconductor device according to the invention.
Figure 46B:
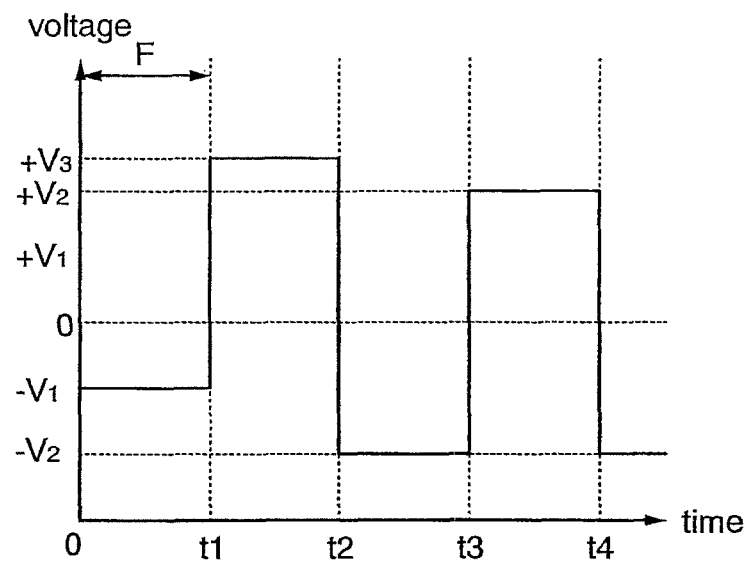
Figure 46C:
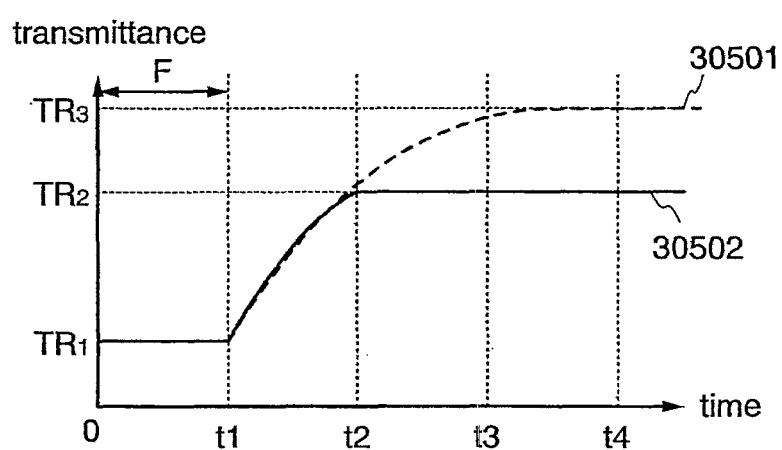

By using overdriving, it is possible to solve a phenomenon in which the response time in appearance becomes further longer because of shortage of writing by dynamic capacitance and constant charge driving as well as length of the original response time of the liquid crystal element. FIGS. 46A to 46C show this state. FIG. 46A shows an example of controlling voltage written in a pixel circuit when time is represented by a horizontal axis and an absolute value of the voltage is represented by a vertical axis. FIG. 46B shows an example of controlling voltage written in the pixel circuit when time is represented by a horizontal axis and the voltage is represented by a vertical axis. FIG. 46C shows change in transmittance of the liquid crystal element over time in the case where the voltage shown in FIG. 46A or 46B is written in the pixel circuit when time is represented by a horizontal axis and an absolute value of the voltage is represented by a vertical axis. In each of FIGS. 46A to 46C, a period F indicates a period for rewriting the voltage, and time for rewriting the voltage is denoted by $t_1$, $t_2$, $t_3$, and $t_4$.

Here, writing voltage corresponding to image data input to the liquid crystal display device corresponds to $|V_1|$ in rewriting at the time of 0, corresponds to $|V_3|$ in rewriting at the time of $t_1$, and corresponds to $|V_2|$ in rewriting at the time of $t_2$, $t_3$, and $t_4$ (see FIG. 46A).

Polarity of the writing voltage corresponding to image data input to the liquid crystal display device may be switched periodically (inversion driving: see FIG. 46B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of a flicker caused by inversion driving can be reduced since the inversion period is short. Further, the inversion period may be a period which is integral times the period of rewriting voltage. In this case, power consumption can be reduced since the inversion period is long and frequency of writing voltage can be decreased by changing the polarity.

FIG. 46C shows change in transmittance of the liquid crystal element over time when voltage as shown in FIG. 46A or 46B is applied to the liquid crystal element. Here, the voltage $|V_1|$ is applied to the liquid crystal element and transmittance of the liquid crystal element after enough time passes corresponds to $TR_1$. Similarly, the voltage $|V_2|$ is applied to the liquid crystal element and transmittance of the liquid crystal element after enough time passes corresponds to $TR_2$. Similarly, the voltage $|V_3|$ is applied to the liquid crystal element and transmittance of the liquid crystal element after enough time passes corresponds to $TR_3$. When the voltage applied to the liquid crystal element is changed from $|V_1|$ to $|V_3|$ at the time of $t_1$, transmittance of the liquid crystal element is tried to be changed to $TR_3$ for several frames as shown by a dashed line 30501. However, application of the voltage $|V_3|$ is terminated at the time of $t_2$, and the voltage $|V_2|$ is applied after the time of $t_2$. Therefore, transmittance of the liquid crystal element does not become as shown by the dashed line 30501 but becomes as shown by a solid line 30502. Here, it is preferable that a value of the voltage $|V_3|$ be set so that transmittance is approximately $TR_2$ at the time of $t_2$. Here, the voltage $|V_3|$ is also referred to as overdriving voltage.

The response time of the liquid crystal element can be controlled to some extent by changing $|V_3|$, which is the overdriving voltage. This is because the response time of the liquid crystal element is changed by strength of an electric field. Specifically, the response time of the liquid crystal element becomes shorter as the electric field is stronger, and the response time of the liquid crystal element becomes longer as the electric field is weaker.

It is preferable that $|V_3|$, which is the overdriving voltage, be changed in accordance with the amount of change in the voltage, that is, the voltage $|V_1|$ and the voltage $|V_2|$ which provide intended transmittance $TR_1$ and $TR_2$. This is because appropriate response time can be always obtained by changing $|V_3|$, which is the overdriving voltage, in accordance with change in the response time of the liquid crystal element even when the response time of the liquid crystal element is changed by the amount of change in the voltage.

It is preferable that $|V_3|$, which is the overdriving voltage, be changed depending on a mode of the liquid crystal element, such as a TN-mode, a VA-mode, an IPS-mode, or an OCB-mode. This is because appropriate response time can be always obtained by changing $|V_3|$, which is the overdriving voltage, in accordance with change in the response time of the liquid crystal element even when the response time of the liquid crystal element is changed depending on the mode of the liquid crystal element.

The voltage rewriting period F may be the same as a frame period of an input signal. In this case, a liquid crystal display device with low manufacturing cost can be obtained since a peripheral driver circuit of the liquid crystal display device can be simplified.

The voltage rewriting period F may be shorter than the frame period of the input signal. For example, the voltage rewriting period F may be one half the frame period of the input signal, or one third or less the frame period of the input signal. It is effective to combine this method with a measure against deterioration in quality of a moving image caused by hold driving of the liquid crystal display device, such as black data insertion driving, backlight blinking, backlight scanning, or intermediate image insertion driving by motion compensation. That is, since required response time of the liquid crystal element is short in the measure against deterioration in quality of a moving image caused by hold driving of the liquid crystal display device, the response time of the liquid crystal element can be relatively shortened easily by using the overdriving method described in this embodiment mode. Although the response time of the liquid crystal element can be essentially shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method, such as overdriving.

The voltage rewriting period F may be longer than the frame period of the input signal. For example, the voltage rewriting period F may be twice the frame period of the input signal, or three times or more the frame period of the input signal. It is effective to combine this method with a means (a circuit) which determines whether voltage is not rewritten for a long period or not. That is, when the voltage is not rewritten for a long period, an operation of the circuit can be stopped during a period where no voltage is rewritten without performing a rewriting operation of the voltage. Therefore, a liquid crystal display device with low power consumption can be obtained.

Next, a specific method for changing the overdriving voltage $|V_3|$ in accordance with the voltage $|V_1|$ and the voltage $|V_2|$, which provide intended transmittance $TR_1$ and $TR_2$, is described.

Since an overdriving circuit corresponds to a circuit for appropriately controlling the overdriving voltage $|V_3|$ in accordance with the voltage $|V_1|$ and the voltage $|V_2|$, which provide intended transmittance $TR_1$ and $TR_2$, signals input to the overdriving circuit are a signal related to the voltage $|V_1|$, which provides intended transmittance $TR_1$, and a signal related to the voltage $|V_2|$, which provides intended transmittance $TR_2$; and a signal output from the overdriving circuit is a signal related to the overdriving voltage $|V_3|$. Here, each of these signals may have an analog voltage value such as the voltage applied to the liquid crystal element (e.g., $|V_1|$, $|V_2|$, or $|V_3|$) or may be a digital signal for supplying the voltage applied to the liquid crystal element. Here, the signal related to the overdriving circuit is described as a digital signal.

Figure 82A:
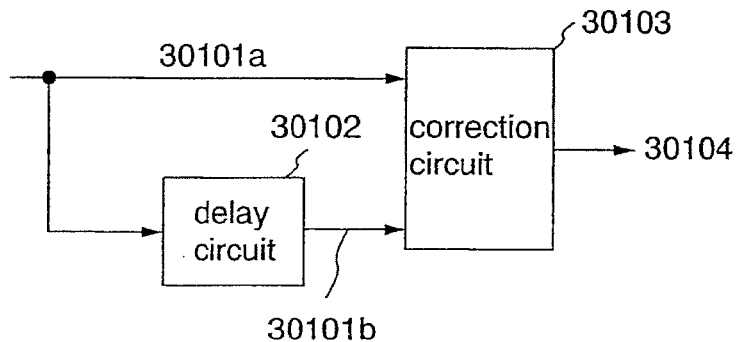
FIGS. 82A to 82E each show one driving method of a semiconductor device according to the invention.

First, a general structure of the overdriving circuit is described with reference to FIG. 82A. Here, input image signals 30101a and 30101b are used as signals for controlling the overdriving voltage. As a result of processing these signals, an output image signal 30104 is to be output as a signal which provides the overdriving voltage.

Since the voltage $|V_1|$ and the voltage $|V_2|$, which provide intended transmittance $TR_1$ and $TR_2$, are image signals in adjacent frames, it is preferable that the input image signals 30101a and 30101b be also image signals in adjacent frames. In order to obtain such signals, the input image signal 30101a is input to a delay circuit 30102 in FIG. 82A and a signal which is consequently output can be used as the input image signal 30101b. For example, a memory can be given as the delay circuit 30102. That is, the input image signal 30101a is stored in the memory in order to delay the input image signal 30101a for one frame, and at the same time, a signal stored in the previous frame is extracted from the memory as the input image signal 30101b, and the input image signal 30101a and the input image signal 30101b are simultaneously input to a correction circuit 30103. Therefore, the image signals in adjacent frames can be handled. By inputting the image signals in adjacent frames to the correction circuit 30103, the output image signal 30104 can be obtained. Note that when a memory is used as the delay circuit 30102, a memory having capacity for storing an image signal for one frame in order to delay the input image signal 30101a for one frame (i.e., a frame memory) can be obtained. Thus, the memory can have a function as a delay circuit without causing excess and deficiency of memory capacity.

Next, the delay circuit 30102 formed mainly for reducing memory capacity is described. Since memory capacity can be reduced by using such a circuit as the delay circuit 30102, manufacturing cost can be reduced.

Figure 82B:
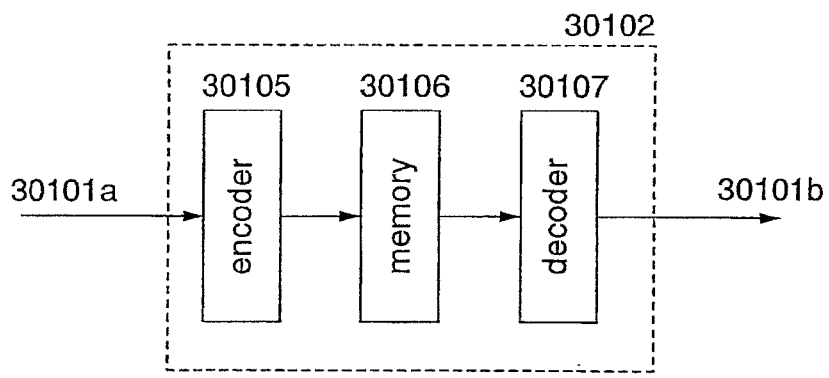

Specifically, a delay circuit as shown in FIG. 82B can be used as the delay circuit 30102 having such characteristics. The delay circuit shown in FIG. 82B includes an encoder 30105, a memory 30106, and a decoder 30107.

Operations of the delay circuit 30102 shown in FIG. 82B are as follows. First, compression processing is performed by the encoder 30105 before the input image signal 30101a is stored in the memory 30106. Thus, size of data to be stored in the memory 30106 can be reduced. Accordingly, memory capacity can be reduced, and manufacturing cost can be reduced. Then, a compressed image signal is transferred to the decoder 30107 and extension processing is performed here. Thus, the signal which has been compressed by the encoder 30105 can be restored. Here, compression and extension processing which is performed by the encoder 30105 and the decoder 30107 may be reversible processing. Accordingly, since the image signal does not deteriorate even after compression and extension processing is performed, memory capacity can be reduced without causing deterioration of quality of an image, which is finally displayed on a device. Further, compression and extension processing which is performed by the encoder 30105 and the decoder 30107 may be non-reversible processing. Accordingly, since size of data of the compressed image signal can be made extremely small, memory capacity can be significantly reduced.

As a method for reducing memory capacity, various methods can be used as well as the above-described method. For example, a method in which color information included in an image signal is reduced (e.g., tone reduction from 260 thousand colors to 65 thousand colors is performed) or the amount of data is reduced (resolution is reduced) without performing image compression by an encoder can be used.

Figure 82C:
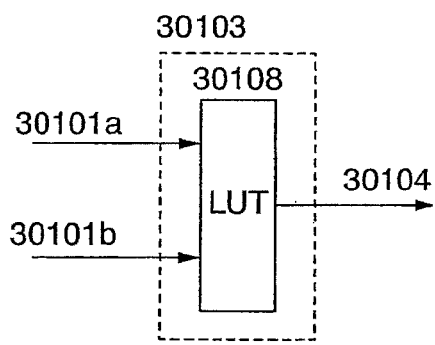

Next, specific examples of the correction circuit 30103 are described with reference to FIGS. 88C to 88E. The correction circuit 30103 corresponds to a circuit for outputting an output image signal of a certain value from two input image signals. Here, when a relation between the two input image signals and the output image signal is non-linear and it is difficult to calculate the relation by simple operation, a look up table (LUT) may be used as the correction circuit 30103. Since the relation between the two input image signals and the output image signal is calculated in advance by measurement in a LUT, the output image signal corresponding to the two input image signals can be calculated only by seeing the LUT (see FIG. 82C). By using a LUT 30108 as the correction circuit 30103, the correction circuit 30103 can be realized without complicated circuit design or the like.

Since the LUT 30108 is one of memories, it is preferable to reduce memory capacity as much as possible in order to reduce manufacturing cost. As an example of the correction circuit 30103 for realizing reduction in memory capacity, a circuit shown in FIG. 82D can be considered. The correction circuit 30103 shown in FIG. 82D includes a LUT 30109 and an adder 30110. Difference data between the input image signal 30101a and the output image signal 30104 to be output is stored in the LUT 30109. That is, corresponding difference data from the input image signal 30101a and the input image signal 30101b is extracted from the LUT 30109, and the extracted difference data and the input image signal 30101a are added by the adder 30110, so that the output image signal 30104 can be obtained. Note that when data stored in the LUT 30109 is difference data, memory capacity of the LUT 30109 can be reduced. This is because data size of difference data is smaller than that of the output image signal 30104 as it is, so that memory capacity necessary for the LUT 30109 can be reduced.

In addition, when the output image signal can be calculated by simple operation such as four arithmetic operations of the two input image signals, the correction circuit 30103 can be realized by combination of simple circuits such as an adder, a subtractor, and a multiplier. Accordingly, it is not necessary to use an LUT, and manufacturing cost can be significantly reduced. As such a circuit, a circuit shown in FIG. 82E can be considered. The correction circuit 30103 shown in FIG. 82E includes a subtractor 30111, a multiplier 30112, and an adder 30113. First, difference between the input image signal 30101a and the input image signal 30101b is calculated by the subtractor 30111. After that, a differential value is multiplied by an appropriate coefficient by using the multiplier 30112. Then, the differential value multiplied by the appropriate coefficient is added to the input image signal 30101a by the adder 30113; thus, the output image signal 30104 can be obtained. By using such a circuit, it is not necessary to use the LUT. Therefore, manufacturing cost can be significantly reduced.

Figure 82E:
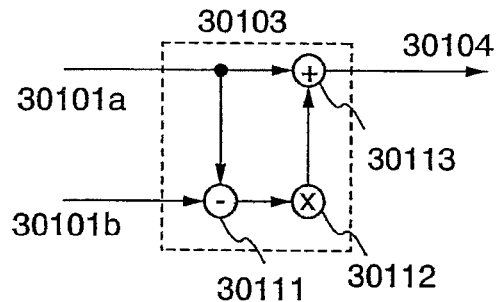
Figure 82D:
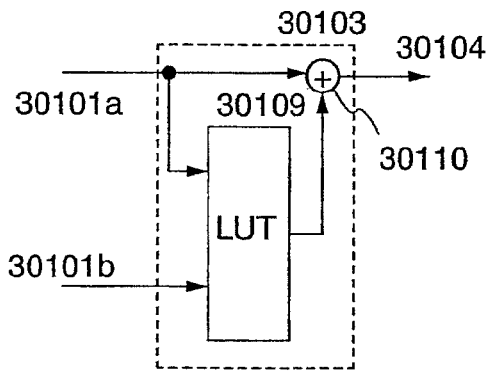

By using the correction circuit 30103 shown in FIG. 82E under a certain condition, output of the inappropriate output image signal 30104 can be prevented. The condition is that a differential value between the output image signal 30104 applying the overdriving voltage and the input image signals 30101a and 30101b has linearity. Inclination of this linearity corresponds to a coefficient to be multiplied by using the adder 30112. That is, it is preferable that the correction circuit 30103 shown in FIG. 82E be used for a liquid crystal element having such properties. As a liquid crystal element having such properties, an IPS-mode liquid crystal element in which response time has little gray-scale dependency is considered.

For example, when the correction circuit 30103 shown in FIG. 82E is used for an IPS mode liquid crystal element in this manner, manufacturing cost can be significantly reduced and an overdriving circuit which can prevent output of the inappropriate output image signal 30104 can be obtained.

Operations which are similar to those of the circuit shown in FIGS. 82A to 82E may be realized by software processing. As the memory used for the delay circuit, another memory included in the liquid crystal display device, a memory included in a device which transfers an image displayed on the liquid crystal display device (e.g., a video card or the like included in a personal computer or a device similar to the personal computer) can be used. Accordingly, not only can manufacturing cost be reduced, intensity of overdriving, availability, or the like can be selected in accordance with user's preference.

Figure 83A:
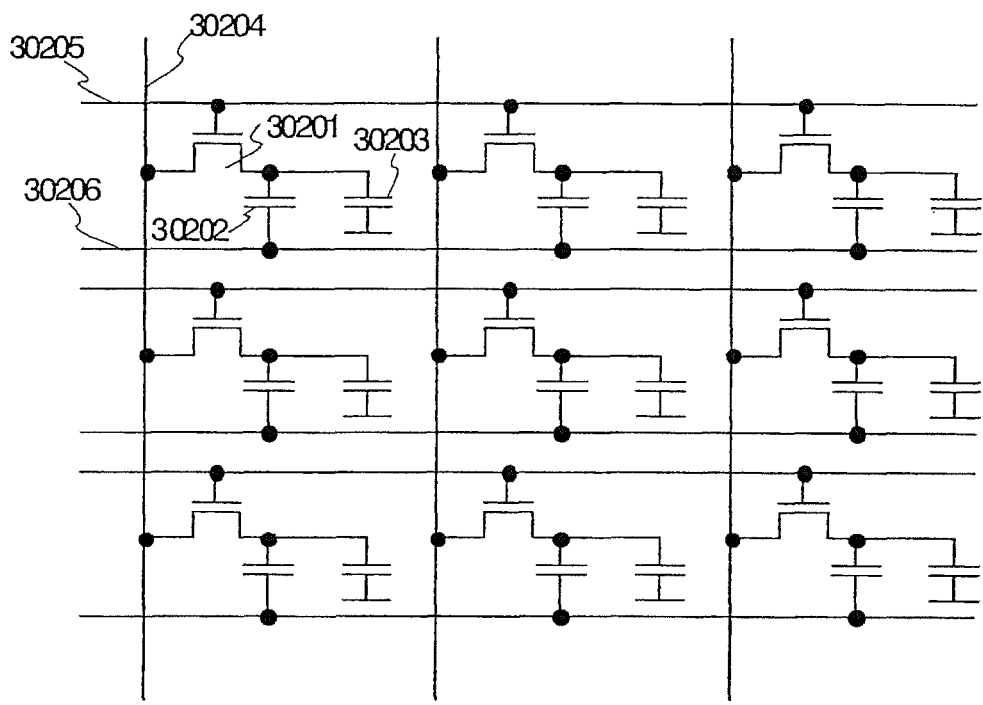
FIGS. 83A and 83B each show one driving method of a semiconductor device according to the invention.

Next, driving which controls a potential of a common line is described with reference to FIGS. 83A and 83B. FIG. 83A shows a plurality of pixel circuits in which one common line is provided with respect to one scan line in a display device using a display element which has capacitive properties, such as a liquid crystal element. Each of the pixel circuits shown in FIG. 83A includes a transistor 30201, an auxiliary capacitor 30202, a display element 30203, a video signal line 30204, a scan line 30205, and a common line 30206.

A gate electrode of the transistor 30201 is electrically connected to the scan line 30205, one of a source electrode and a drain electrode of the transistor 30201 is electrically connected to the video signal line 30204, and the other of the source electrode and the drain electrode of the transistor 30201 is electrically connected to one electrode of the auxiliary capacitor 30202 and one electrode of the display element 30203. The other electrode of the auxiliary capacitor 30202 is electrically connected to the common line 30206.

First, in each of pixels selected by the scan line 30205, voltage corresponding to a video signal is applied to the display element 30203 and the auxiliary capacitor 30202 through the video signal line 30204 since the transistor 30201 is turned on. At this time, when the video signal is a signal which makes all of pixels connected to the common line 30206 display a minimum gray scale or a maximum gray scale, it is not necessary that the video signal be written in each of the pixels through the video signal line 30204. Voltage applied to the display element 30203 can be changed by changing a potential of the common line 30206 instead of writing the video signal through the video signal line 30204.

Figure 83B:
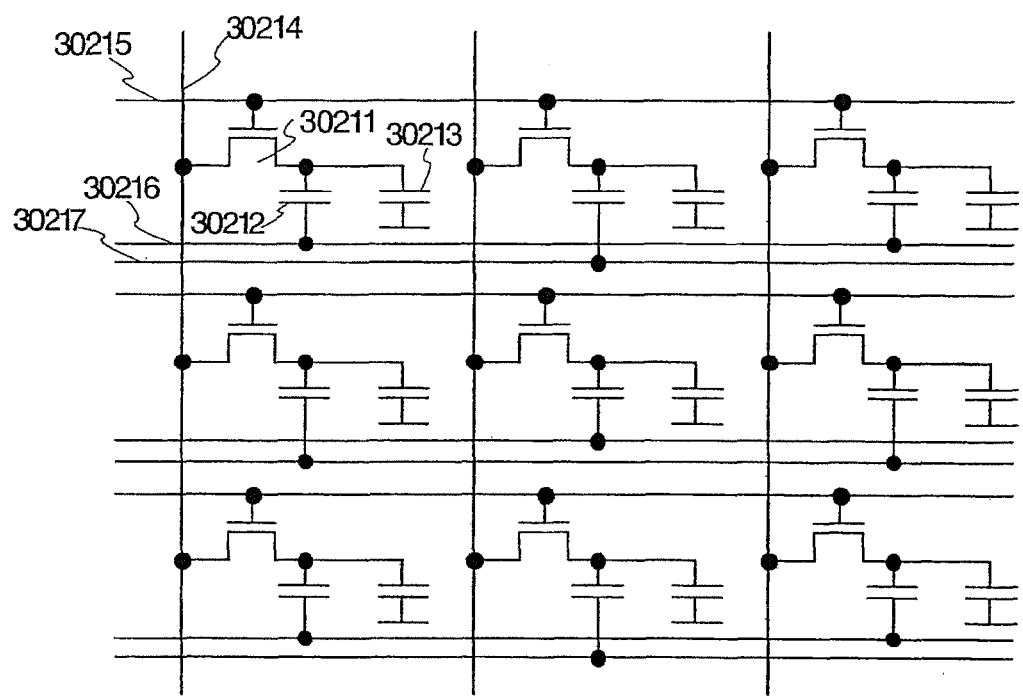

Next, FIG. 83B shows diagram showing a plurality of pixel circuits in which two common lines are provided with respect to one scan line in a display device using a display element which has capacitive properties, such as a liquid crystal element. Each of the pixel circuits shown in FIG. 83B includes a transistor 30211, an auxiliary capacitor 30212, a display element 30213, a video signal line 30214, a scan line 30215, a first common line 30216, and a second common line 30217.

A gate electrode of the transistor 30211 is electrically connected to the scan line 30215, one of a source electrode and a drain electrode of the transistor 30211 is electrically connected to the video signal line 30214, and the other of the source electrode and the drain electrode of the transistor 30211 is electrically connected to one electrode of the auxiliary capacitor 30212 and one electrode of the display element 30213. The other electrode of the auxiliary capacitor 30212 is electrically connected to the first common line 30216. Further, in a pixel which is adjacent to the pixel, the other electrode of the auxiliary capacitor 30212 is electrically connected to the second common line 30217.

In the pixel circuits shown in FIG. 83B, the number of pixels which are electrically connected to one common line is small. Accordingly, by changing a potential of the first common line 30216 or the second common line 30217 instead of writing a video signal through the video signal line 30214, frequency of changing voltage applied to the display element 30213 is significantly increased. In addition, source inversion driving or dot inversion driving can be performed. By performing source inversion driving or dot inversion driving, reliability of the element can be improved and a flicker can be suppressed.

Figure 84A:
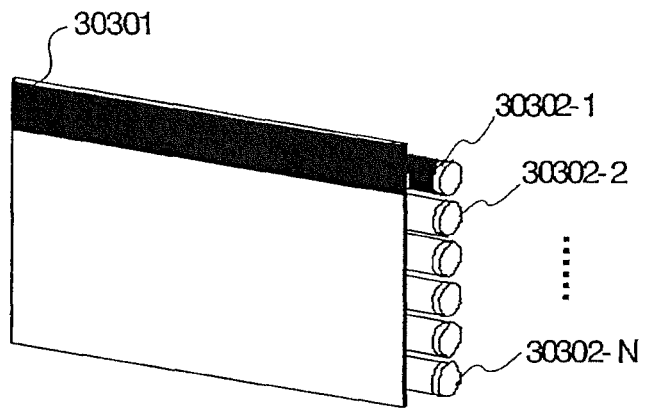
FIGS. 84A to 84C each show one driving method of a semiconductor device according to the invention.

Next, a scanning backlight is described with reference to FIGS. 84A to 84C. FIG. 84A shows a scanning backlight in which cold cathode fluorescent lamps are arranged. The scanning backlight shown in FIG. 84A includes a diffusion plate 30301 and N pieces of cold cathode fluorescent lamps 30302-1 to 30302-N. The N pieces of the cold cathode fluorescent lamps 30302-1 to 30302-N are arranged on the back side of the diffusion plate 30301, so that the N pieces of the cold cathode fluorescent lamps 30302-1 to 30302-N can be scanned while luminance thereof is changed.

Change in luminance of each of the cold cathode fluorescent lamps in scanning is described with reference to FIG. 84C. First, luminance of the cold cathode fluorescent lamp 30302-1 is changed for a certain period. After that, luminance of the cold cathode fluorescent lamp 30302-2 which is provided adjacent to the cold cathode fluorescent lamp 30302-1 is changed for the same period. In this manner, luminance is changed sequentially from the cold cathode fluorescent lamps 30302-1 to 30302-N. Note that although luminance which is changed for a certain period is set to be lower than original luminance in FIG. 84C, it may be higher than original luminance. In addition, although scanning is performed from the cold cathode fluorescent lamps 30302-1 to 30302-N, scanning may be performed from the cold cathode fluorescent lamps 30302-N to 30302-1, which is in a reversed order.

Figure 84B:
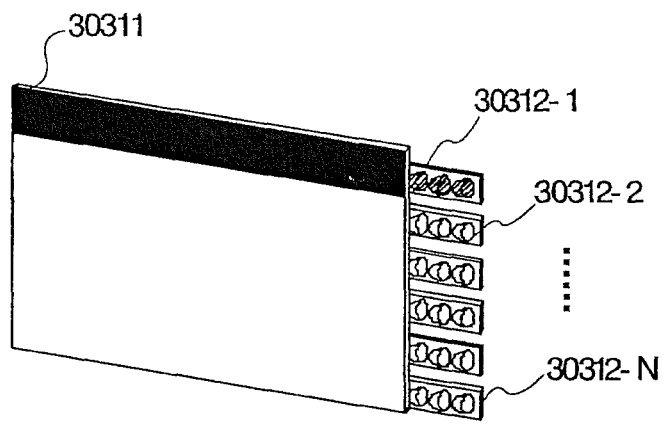
Figure 84C:
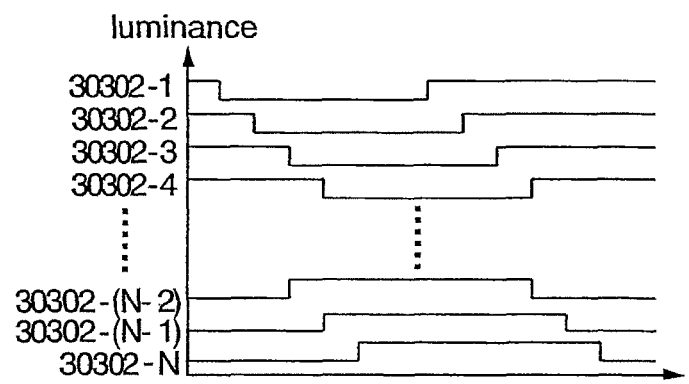

By performing driving as in FIGS. 84A to 84C, average luminance of the backlight can be decreased. Therefore, power consumption of the backlight, which mainly takes up power consumption of the liquid crystal display device, can be reduced.

Note that an LED may be used as a light source of the scanning backlight. FIG. 84B shows the scanning backlight in that case. The scanning backlight shown in FIG. 84B includes a diffusion plate 30311 and light sources 30312-1 to 30312-N, in each of which LEDs are arranged. When the LED is used as the light source of the scanning backlight, it is advantageous in that the backlight can be thin and lightweight and that a color reproduction area can be widened. Further, since the LEDs which are arranged in each of the light sources 30312-1 to 30312-N can be similarly scanned, a dot scanning backlight can also be obtained. By using the dot scanning backlight, image quality of a moving image can be further improved.

When the LED is used as the light source of the backlight, driving can be performed by changing luminance as shown in FIG. 84C as well.

Figure 85A:
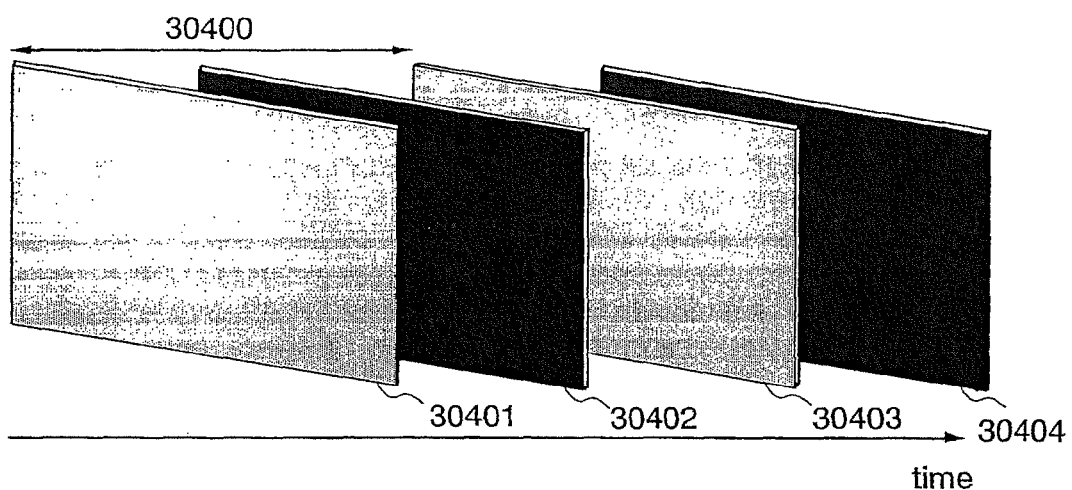
FIGS. 85A and 85B each show one driving method of a semiconductor device according to the invention.

Next, high frequency driving is described with reference to FIGS. 85A and 85B. FIG. 85A is a view in which one image and one intermediate image are displayed in one frame period 30400. Reference numeral 30401 denotes an image of the frame; 30402 denotes an intermediate image of the frame; 30403 denotes an image of the next frame; and 30404 denotes an intermediate image of the next frame.

The intermediate image 30402 of the frame may be an image which is made based on video signals of the frame and the next frame. Alternatively, the intermediate image 30402 of the frame may be an image which is made from the image 30401 of the frame. Further alternatively, the intermediate image 30402 of the frame may be a black image. Thus, image quality of a moving image of a hold-type display device can be improved. When one image and one intermediate image are displayed in the one frame period 30400, there is an advantage in that consistency with a frame rate of the video signal can be easily obtained and an image processing circuit is not complicated.

Figure 85B:
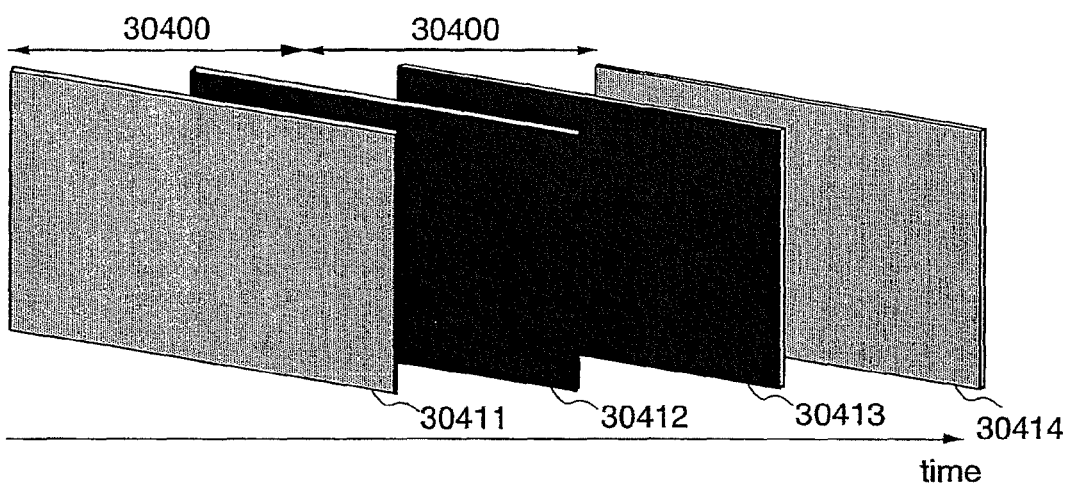

FIG. 85B is a view in which one image and two intermediate images are displayed in a period with two successive one frame periods 30400 (i.e., two frame periods). Reference numeral 30411 denotes an image of the frame; 30412 denotes an intermediate image of the frame; 30413 denotes an intermediate image of the next frame; and 30414 denotes an image of a frame after next.

Each of the intermediate image 30412 of the frame and the intermediate image 30413 of the next frame may be an image which is made based on video signals of the frame, the next frame, and the frame after next. Alternatively, each of the intermediate image 30412 of the frame and the intermediate image 30413 of the next frame may be a black image. When one image and two intermediate images are displayed in the two frame periods, there is an advantage in that operating frequency of a peripheral driver circuit is not so high and image quality of a moving image can be effectively improved.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 11

In this embodiment mode, a peripheral portion of a liquid crystal panel is described.

Figure 49:
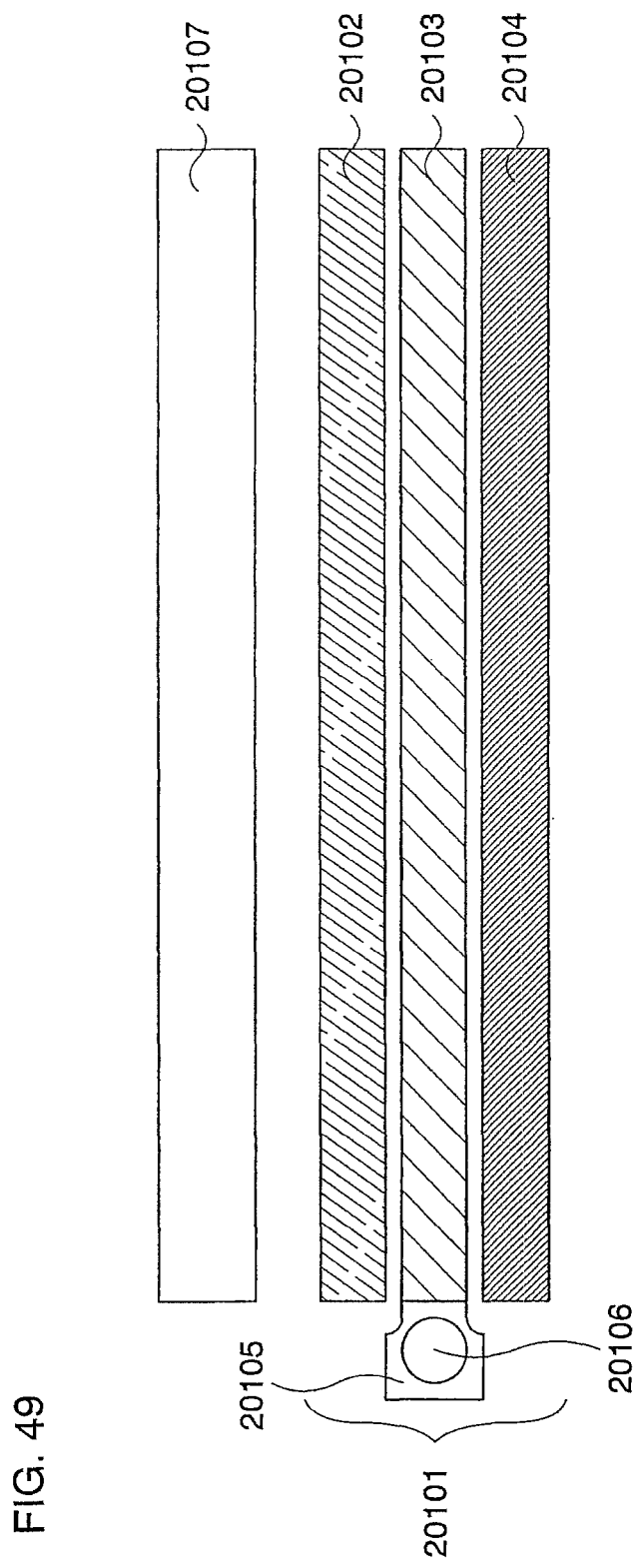
FIG. 49 shows a peripheral component of a semiconductor device according to the invention.

FIG. 49 shows an example of a liquid crystal display device including a so-called edge-light type backlight unit 20101 and a liquid crystal panel 20107. An edge-light type corresponds to a type in which a light source is provided at an end of a backlight unit and fluorescence of the light source is emitted from the entire light-emitting surface. The edge-light type backlight unit is thin and can save power.

The backlight unit 20101 includes a diffusion plate 20102, a light guide plate 20103, a reflection plate 20104, a lamp reflector 20105, and a light source 20106.

The light source 20106 has a function to emit light as necessary. For example, as the light source 20106, a cold cathode fluorescent lamp, a hot cathode fluorescent lamp, a light-emitting diode, an inorganic EL element, an organic EL element, or the like can be used.

FIGS. 50A to 50D each show a detailed structure of the edge-light type backlight unit. Note that description of a diffusion plate, a light guide plate, a reflection plate, and the like is omitted.

Figure 50A:
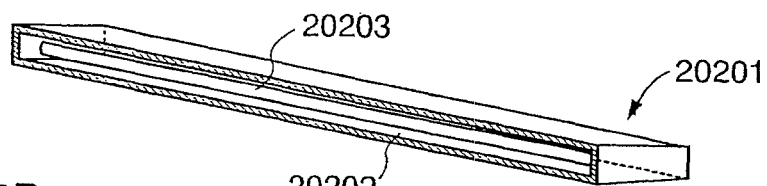
FIGS. 50A to 50D each show a peripheral component of a semiconductor device according to the invention.

A backlight unit 20201 shown in FIG. 50A has a structure in which a cold cathode fluorescent lamp 20203 is used as a light source. A lamp reflector 20202 is provided to efficiently reflect light from the cold cathode fluorescent lamp 20203. Such a structure is often used for a large display device because luminance from the cold cathode fluorescent lamp 20203 is high.

Figure 50B:
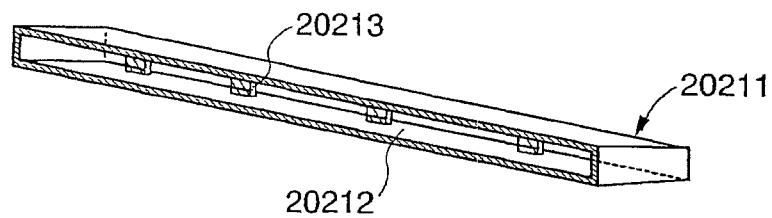

A backlight unit 20211 shown in FIG. 50B has a structure in which light-emitting diodes (LEDs) 20213 are used as light sources. For example, the light-emitting diodes (LEDs) 20213 which emit white light are provided at a predetermined interval. Further, a lamp reflector 20212 is provided to efficiently reflect light from the light-emitting diodes (LEDs) 20213.

Figure 50C:
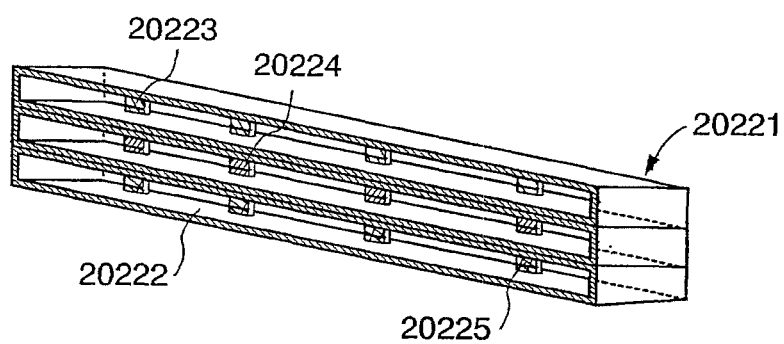

A backlight unit 20221 shown in FIG. 50C has a structure in which light-emitting diodes (LEDs) 20223, light-emitting diodes (LEDs) 20224, and light-emitting diodes (LEDs) 20225 of each color of RGB are used as light sources. The light-emitting diodes (LEDs) 20223, the light-emitting diodes (LEDs) 20224, and the light-emitting diodes (LEDs) 20225 of each color of RGB are each provided at a predetermined interval. By using the light-emitting diodes (LEDs) 20223, 20224, and 20225 of each color of RGB, color reproducibility can be improved. In addition, a lamp reflector 20222 is provided to efficiently reflect light from the light-emitting diodes.

Figure 50D:
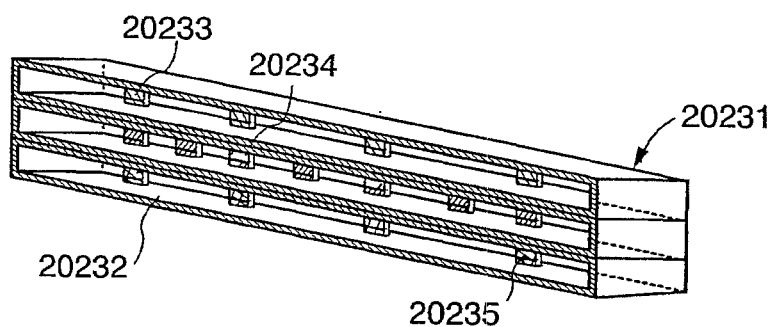

A backlight unit 20231 shown in FIG. 50D has a structure in which light-emitting diodes (LEDs) 20233, light-emitting diodes (LEDs) 20234, and light-emitting diodes (LEDs) 20235 of each color of RGB are used as light sources. For example, among the light-emitting diodes (LEDs) 20233, the light-emitting diodes (LEDs) 20234, and the light-emitting diodes (LEDs) 20235 of each color of RGB, the light-emitting diodes of a color with low emission intensity (e.g., green) are provided more than other light-emitting diodes. By using the light-emitting diodes (LEDs) 20233, 20234, and 20235 of each color of RGB, color reproducibility can be improved. In addition, a lamp reflector 20232 is provided to efficiently reflect light from the light-emitting diodes.

FIG. 53 shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 20500 includes a diffusion plate 20501, a light-shielding plate 20502, a lamp reflector 20503, a light source 20504, and a liquid crystal panel 20505.

The light source 20504 has a function to emit light as necessary. For example, as the light source 20504, a cold cathode fluorescent lamp, a hot cathode fluorescent lamp, a light-emitting diode, an inorganic EL element, an organic EL element, or the like can be used.

Figure 51:
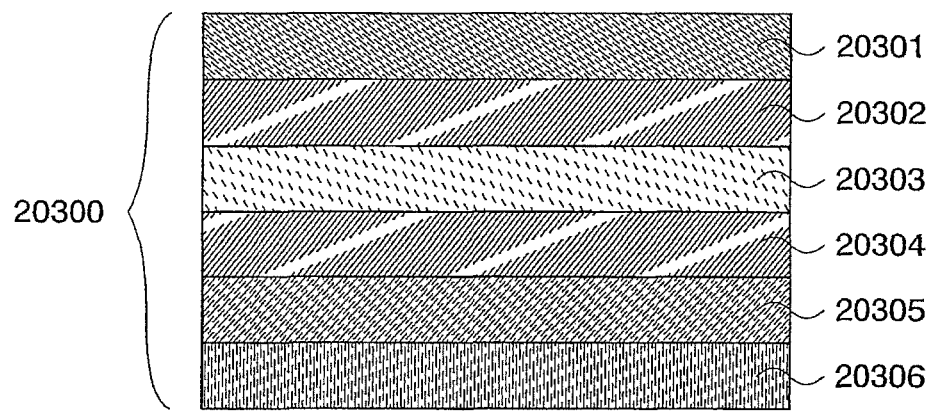
FIG. 51 shows a peripheral component of a semiconductor device according to the invention.

FIG. 51 shows an example of a structure of a polarizing plate (also referred to as a polarizing film).

A polarizing film 20300 includes a protective film 20301, a substrate film 20302, a PVA polarizing film 20303, a substrate film 20304, an adhesive layer 20305, and a mold release film 20306.

When the PVA polarizing film 20303 is interposed between films (the substrate film 20302 and the substrate film 20304) to be base materials, reliability can be improved. Note that the PVA polarizing film 20303 may be interposed by triacetyl cellulose (TAC) films with high light-transmitting properties and high durability. Note also that the substrate films and the TAC films each function as a protective film of a polarizer included in the PVA polarizing film 20303.

The adhesive layer 20305 which is to be attached to a glass substrate of the liquid crystal panel is attached to one of the substrate films (the substrate film 20304). Note that the adhesive layer 20305 is formed by applying an adhesive to one of the substrate films (the substrate film 20304). The adhesive layer 20305 is provided with the mold release film 20306 (a separate film).

The other of the substrates films (the substrate film 20302) is provided with the protective film 20301.

A hard coating scattering layer (an anti-glare layer) may be provided on a surface of the polarizing film 20300. Since the surface of the hard coating scattering layer has minute unevenness formed by AG treatment and has an anti-glare function which scatters external light, reflection of external light in the liquid crystal panel and surface reflection can be prevented.

A treatment in which a plurality of optical thin film layers having different refractive indexes are layered (also referred to as anti-reflection treatment or AR treatment) may be performed on the surface of the polarizing film 20300. The plurality of layered optical thin film layers having different refractive indexes can reduce reflectivity on the surface by an interference effect of light.

Figure 52A:
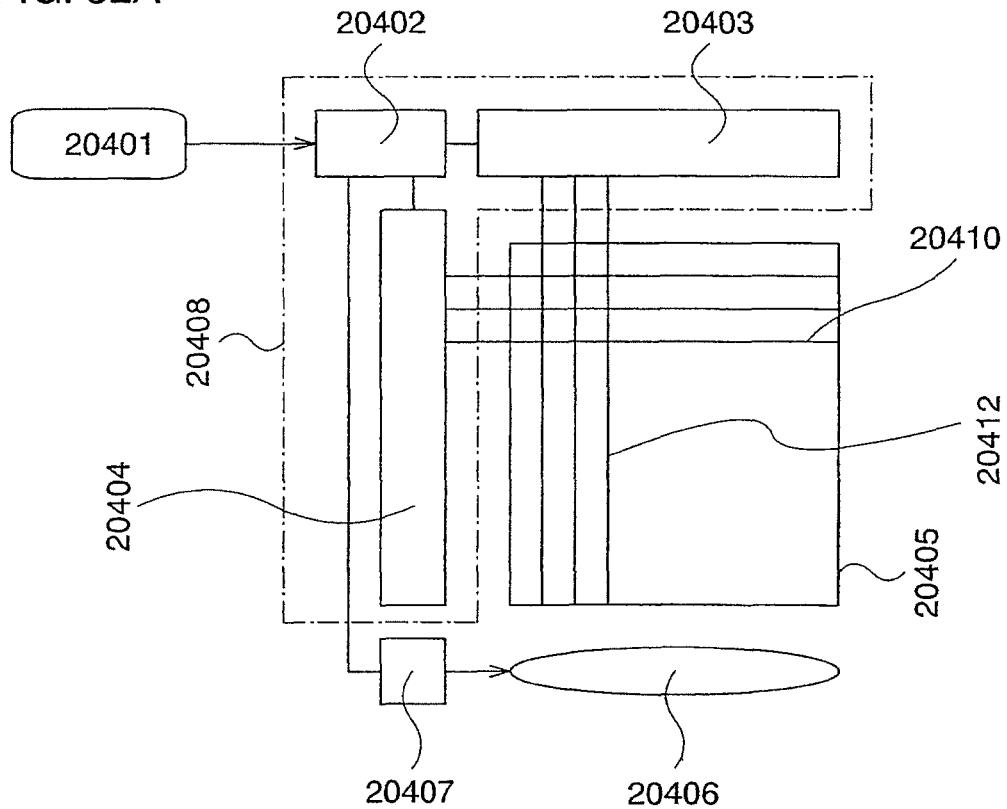
FIGS. 52A to 52C each show a structure of a peripheral circuit in a semiconductor device according to the invention.
Figure 52B:
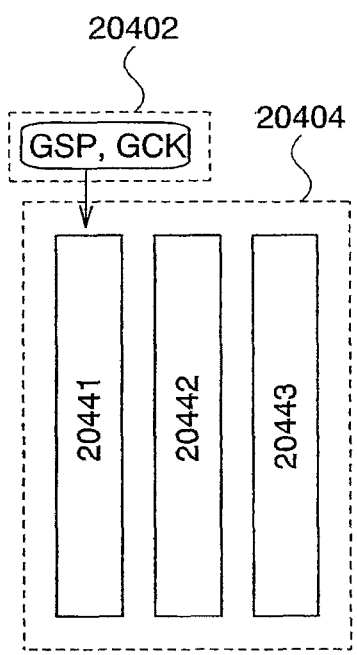
Figure 52C:
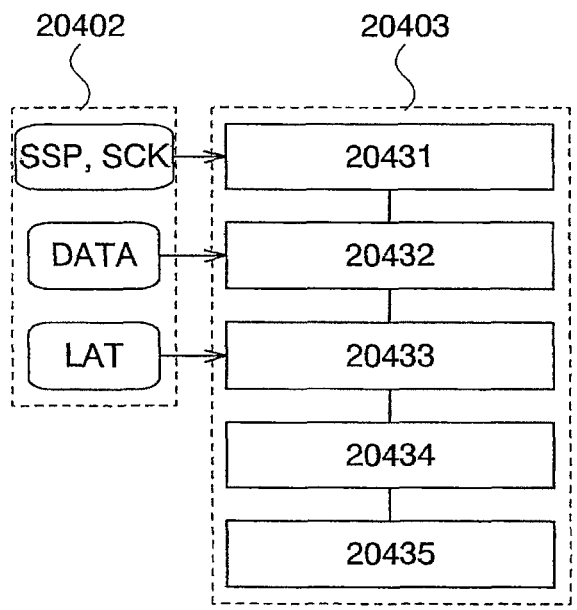

FIGS. 52A to 52C show examples of a system block of a liquid crystal display device.

In a pixel portion 20405, signal lines 20412 which are extended from a signal line driver circuit 20403 are provided. In the pixel portion 20405, scan lines 20410 which are extended from a scan line driver circuit 20404 are also provided. Further, a plurality of pixels are arranged in matrix in cross regions of the signal lines 20412 and the scan lines 20410. Note that each of the plurality of pixels includes a switching element. Therefore, voltage for controlling inclination of liquid crystal molecules can be separately input to each of the plurality of pixels. A structure in which a switching element is provided in each cross region in this manner is referred to as an active matrix type. Note that the invention is not limited to such an active matrix type, and a structure of a passive matrix type may be used. In a passive matrix type, a switching element is not included in each pixel, so that a process is simple.

A driver circuit portion 20408 includes a control circuit 20402, the signal line driver circuit 20403, and the scan line driver circuit 20404. An image signal 20401 is input to the control circuit 20402. The signal line driver circuit 20403 and the scan line driver circuit 20404 are controlled by the control circuit 20402 in accordance with this image signal 20401. The control circuit 20402 inputs a control signal to each of the signal line driver circuit 20403 and the scan line driver circuit 20404. Then, in accordance with the control signal, the signal line driver circuit 20403 inputs a video signal to each of the signal lines 20412 and the scan line driver circuit 20404 inputs a scan signal to each of the scan lines 20410. Then, the switching element included in the pixel is selected in accordance with the scan signal, and the video signal is input to a pixel electrode of the pixel.

The control circuit 20402 also controls a power supply 20407 in accordance with the image signal 20401. The power supply 20407 includes a means to supply power to a lighting unit 20406. As the lighting unit 20406, an edge-light type backlight unit or a direct-type backlight unit can be used. Note that a front light may be used as the lighting unit 20406.

A front light corresponds to a plate-like lighting unit including a luminous body and a light conducting body, which is attached to the front surface side of a pixel portion and illuminates the whole area. By using such a lighting unit, the pixel portion can be uniformly illuminated at low power consumption.

As shown in FIG. 52B, the scan line driver circuit 20404 includes a shift register 20441, a level shifter 20442, and a circuit functioning as a buffer 20443. A signal such as a gate start pulse (GSP) or a gate clock signal (GCK) is input to the shift register 20441.

As shown in FIG. 52C, the signal line driver circuit 20403 includes a shift register 20431, a first latch 20432, a second latch 20433, a level shifter 20434, and a circuit functioning as a buffer 20435. The circuit functioning as the buffer 20435 corresponds to a circuit which has a function to amplify a weak signal and includes an operational amplifier or the like. A signal such as a start pulse (SSP) is input to the level shifter 20434, and data (DATA) such as a video signal is input to the first latch 20432. A latch (LAT) signal can be temporally held in the second latch 20433 and is simultaneously input to the pixel portion 20405. This is referred to as line sequential driving. Therefore, when a pixel in which not line sequential driving but dot sequential driving is performed is employed, the second latch can be omitted.

In this embodiment mode, various types of liquid crystal panels can be used. For example, a structure in which a liquid crystal layer is sealed between two substrates can be used for the liquid crystal panel. A transistor, a capacitor, a pixel electrode, an alignment film, or the like is formed over one substrate. A polarizing plate, a retardation plate, or a prism sheet may be provided on the surface opposite to a top surface of one substrate. A color filter, a black matrix, an opposite electrode, an alignment film, or the like is provided on the other substrate. A polarizing plate or a retardation plate may be provided on the surface opposite to a top surface of the other substrate. Note that the color filter and the black matrix may be formed over the top surface of one substrate. In addition, three-dimensional display can be performed by providing a slit (a grid) on the top surface or the surface opposite to the top surface of one substrate.

Each of the polarizing plate, the retardation plate, and the prism sheet can be provided between the two substrates. Alternatively, each of the polarizing plate, the retardation plate, and the prism sheet can be integrated with one of the two substrates.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 12

In this embodiment mode, a structure and an operation of a pixel which can be applied to a liquid crystal display device are described.

In this embodiment mode, as an operation mode of a liquid crystal element, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Microcell) mode, an OCB (Optical Compensated Birefringence) mode, an FLC (Ferroelectric Liquid Crystal) mode, an AFLC (AntiFerroelectric Liquid Crystal) mode, or the like can be used.

Figure 54A:
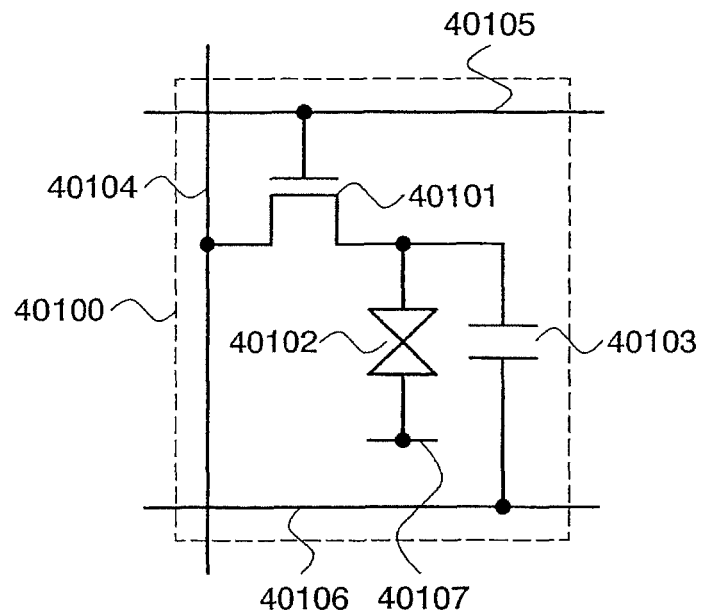
FIGS. 54A and 54B each show a structure of a panel circuit in a semiconductor device according to the invention.

FIG. 54A shows an example of a pixel structure which can be applied to the liquid crystal display device.

A pixel 40100 includes a transistor 40101, a liquid crystal element 40102, and a capacitor 40103. A gate of the transistor 40101 is connected to a wiring 40105. A first terminal of the transistor 40101 is connected to a wiring 40104. A second terminal of the transistor 40101 is connected to a first electrode of the liquid crystal element 40102 and a first electrode of the capacitor 40103. A second electrode of the liquid crystal element 40102 corresponds to an opposite electrode 40107. A second electrode of the capacitor 40103 is connected to a wiring 40106.

The wiring 40104 functions as a signal line. The wiring 40105 functions as a scan line. The wiring 40106 functions as a capacitor line. The transistor 40101 functions as a switch. The capacitor 40103 functions as a storage capacitor.

It is only necessary that the transistor 40101 function as a switch. The transistor 40101 may be a p-channel transistor or an n-channel transistor.

Figure 54B:
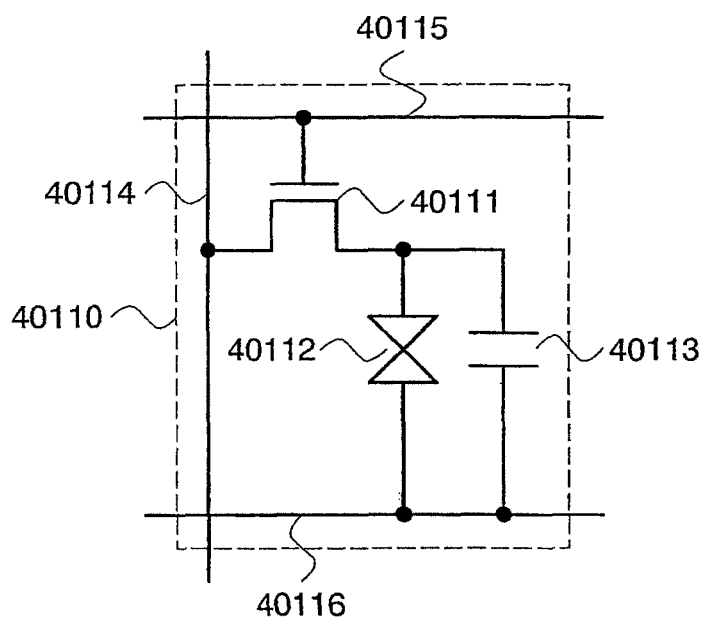

FIG. 54B shows an example of a pixel structure which can be applied to the liquid crystal display device. In particular, FIG. 54B shows an example of a pixel structure which can be applied to a liquid crystal display device suitable for a lateral electric field mode (including an IPS mode and an FFS mode).

A pixel 40110 includes a transistor 40111, a liquid crystal element 40112, and a capacitor 40113. A gate of the transistor 40111 is connected to a wiring 40115. A first terminal of the transistor 40111 is connected to a wiring 40114. A second terminal of the transistor 40111 is connected to a first electrode of the liquid crystal element 40112 and a first electrode of the capacitor 40113. A second electrode of the liquid crystal element 40112 is connected to a wiring 40116. A second electrode of the capacitor 40103 is connected to the wiring 40116.

The wiring 40114 functions as a signal line. The wiring 40115 functions as a scan line. The wiring 40116 functions as a capacitor line. The transistor 40111 functions as a switch. The capacitor 40113 functions as a storage capacitor.

It is only necessary that the transistor 40111 function as a switch. The transistor 40111 may be a p-channel transistor or an n-channel transistor.

Figure 55:
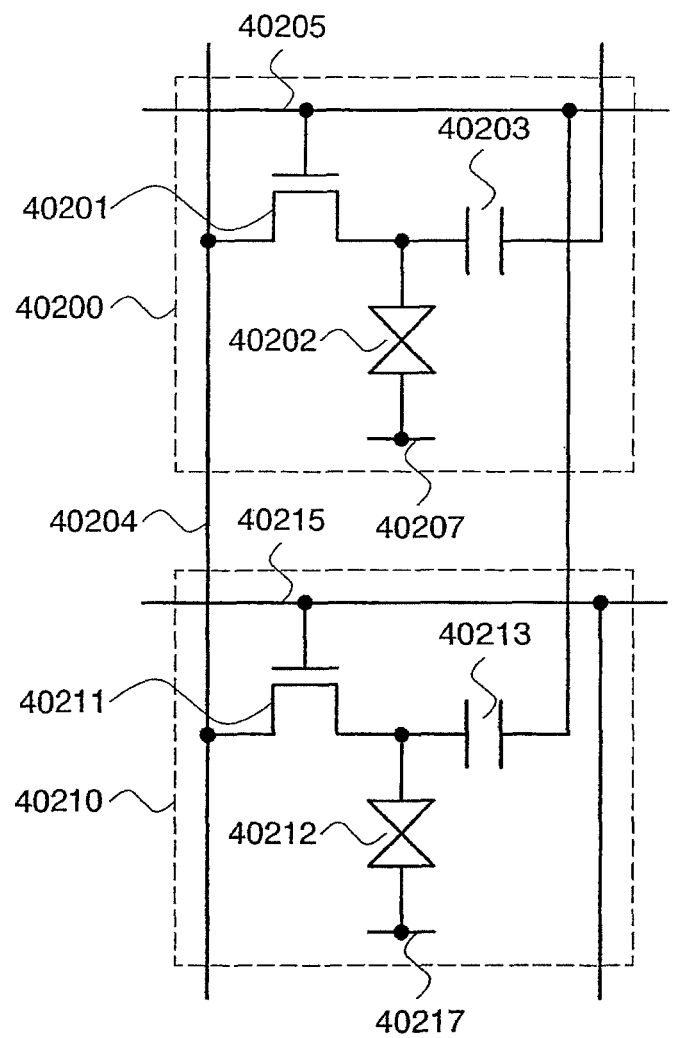
FIG. 55 shows a structure of a panel circuit in a semiconductor device according to the invention.

FIG. 55 shows an example of a pixel structure which can be applied to the liquid crystal display device. In particular, FIG. 55 shows an example of a pixel structure in which an aperture ratio of a pixel can be increased by reducing the number of wirings.

FIG. 55 shows two pixels (a pixel 40200 and a pixel 40210) which are provided in the same column direction. For example, when the pixel 40200 is provided in an N-th row, the pixel 40210 is provided in an (N+1)th row.

The pixel 40200 includes a transistor 40201, a liquid crystal element 40202, and a capacitor 40203. A gate of the transistor 40201 is connected to a wiring 40205. A first terminal of the transistor 40201 is connected to a wiring 40204. A second terminal of the transistor 40201 is connected to a first electrode of the liquid crystal element 40202 and a first electrode of the capacitor 40203. A second electrode of the liquid crystal element 40202 corresponds to an opposite electrode 40207. A second electrode of the capacitor 40203 is connected to a wiring which is the same as that connected to a gate of a transistor in the previous row.

The pixel 40210 includes a transistor 40211, a liquid crystal element 40212, and a capacitor 40213. A gate of the transistor 40211 is connected to a wiring 40215. A first terminal of the transistor 40211 is connected to the wiring 40204. A second terminal of the transistor 40211 is connected to a first electrode of the liquid crystal element 40212 and a first electrode of the capacitor 40213. A second electrode of the liquid crystal element 40212 corresponds to an opposite electrode 40217. A second electrode of the capacitor 40213 is connected to a wiring which is the same as that connected to the gate of the transistor in the previous row (i.e., the wiring 40205).

The wiring 40204 functions as a signal line. The wiring 40205 functions as a scan line of the N-th row, and also as a capacitor line of the (N+1)th row. The transistor 40201 functions as a switch. The capacitor 40203 functions as a storage capacitor.

The wiring 40215 functions as a scan line of the (N+1)th row, and also as a capacitor line of an (N+2)th row. The transistor 40211 functions as a switch. The capacitor 40213 functions as a storage capacitor.

It is only necessary that each of the transistor 40201 and the transistor 40211 function as a switch. Each of the transistor 40201 and the transistor 40211 may be a p-channel transistor or an n-channel transistor.

Figure 56:
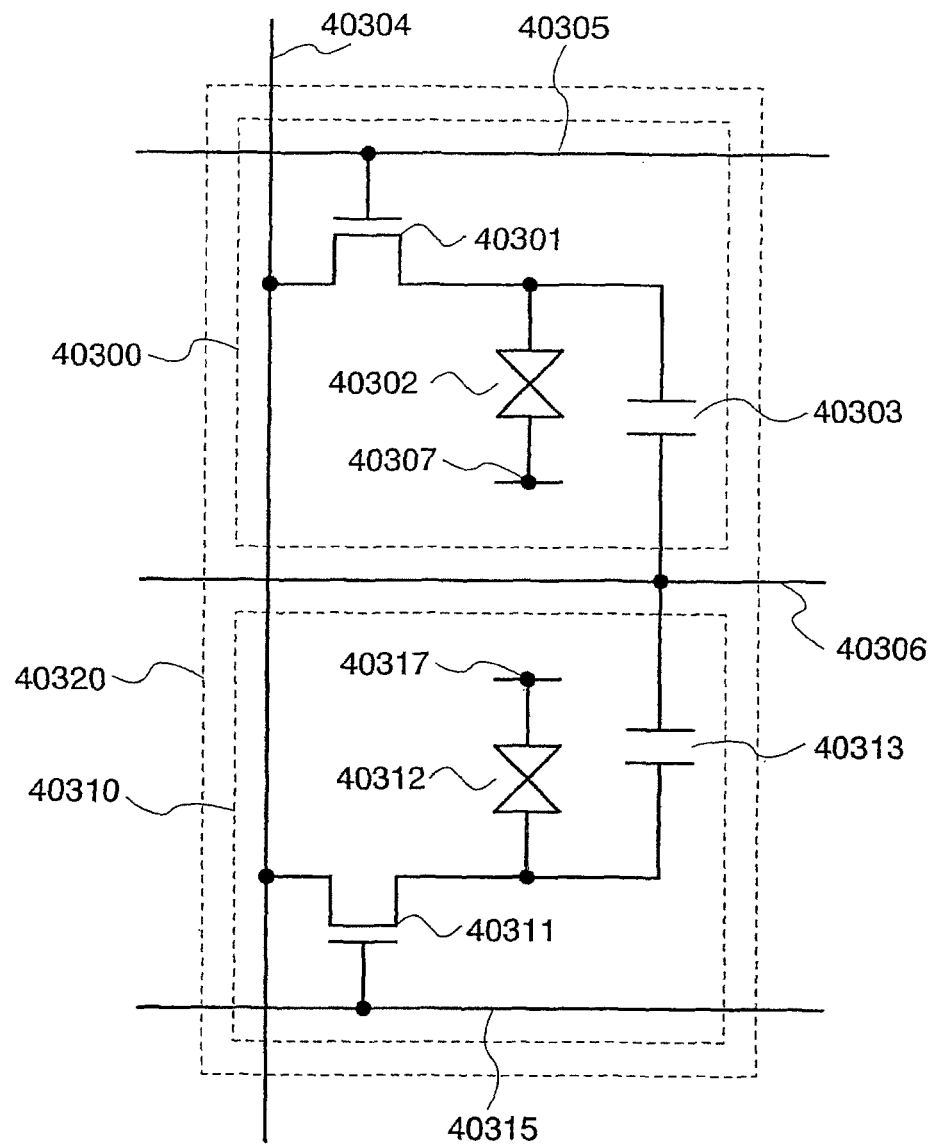
FIG. 56 shows a structure of a panel circuit in a semiconductor device according to the invention.

FIG. 56 shows an example of a pixel structure which can be applied to the liquid crystal display device. In particular, FIG. 56 shows an example of a pixel structure in which a viewing angle can be improved by using a subpixel.

A pixel 40320 includes a subpixel 40300 and a subpixel 40310. Although the case where the pixel 40320 includes two subpixels is described below, the pixel 40320 may include three or more subpixels.

The subpixel 40300 includes a transistor 40301, a liquid crystal element 40302, and a capacitor 40303. A gate of the transistor 40301 is connected to a wiring 40305. A first terminal of the transistor 40301 is connected to a wiring 40304. A second terminal of the transistor 40301 is connected to a first electrode of the liquid crystal element 40302 and a first electrode of the capacitor 40303. A second electrode of the liquid crystal element 40302 corresponds to an opposite electrode 40307. A second electrode of the capacitor 40303 is connected to a wiring 40306.

The subpixel 40310 includes a transistor 40311, a liquid crystal element 40312, and a capacitor 40313. A gate of the transistor 40311 is connected to a wiring 40315. A first terminal of the transistor 40311 is connected to the wiring 40304. A second terminal of the transistor 40311 is connected to a first electrode of the liquid crystal element 40312 and a first electrode of the capacitor 40313. A second electrode of the liquid crystal element 40312 corresponds to an opposite electrode 40317. A second electrode of the capacitor 40313 is connected to the wiring 40306.

The wiring 40304 functions as a signal line. The wiring 40305 functions as a scan line. The wiring 40315 functions as a signal line. The wiring 40306 functions as a capacitor line. The transistor 40301 functions as a switch. The transistor 40311 functions as a switch. The capacitor 40303 functions as a storage capacitor. The capacitor 40313 functions as a storage capacitor.

It is only necessary that the transistor 40301 function as a switch. The transistor 40301 may be a p-channel transistor or an n-channel transistor. It is only necessary that the transistor 40311 function as a switch. The transistor 40311 may be a p-channel transistor or an n-channel transistor.

A video signal input to the subpixel 40300 may be a value which is different from that of a video signal input to the subpixel 40310. In this case; the viewing angle can be widened because alignment of liquid crystal molecules of the liquid crystal element 40302 is different from alignment of liquid crystal molecules of the liquid crystal element 40312.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 13

In this embodiment mode, various liquid crystal modes are described.

First, various liquid crystal modes are described with reference to cross-sectional views.

Figure 57A:
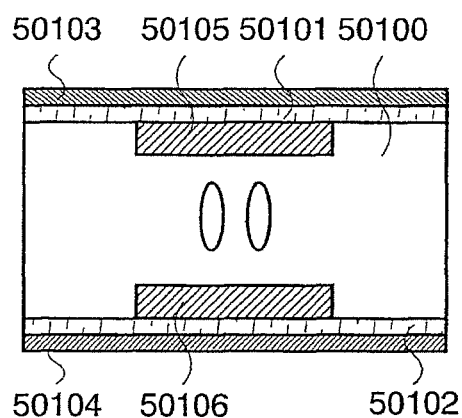
FIGS. 57A and 57B are cross-sectional views of display elements in a semiconductor device according to the invention.
Figure 57B:
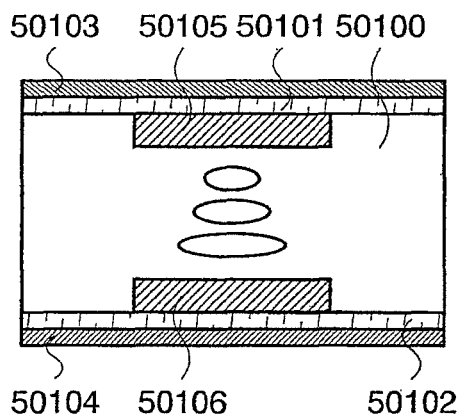

FIGS. 57A and 57B are schematic views of cross sections of a TN mode.

A liquid crystal layer 50100 is held between a first substrate 50101 and a second substrate 50102 which are provided so as to be opposite to each other. A first electrode 50105 is formed on a top surface of the first substrate 50101. A second electrode 50106 is formed on a top surface of the second substrate 50102. A first polarizing plate 50103 is provided on a surface of the first substrate 50101, which does not face the liquid crystal layer 50100. A second polarizing plate 50104 is provided on a surface of the second substrate 50102, which does not face the liquid crystal layer 50100. Note that the first polarizing plate 50103 and the second polarizing plate 50104 are provided so as to be in a cross nicol state.

The first polarizing plate 50103 may be provided on the top surface of the first substrate 50101, that is, may be provided between the first substrate 50101 and the liquid crystal layer 50100. The second polarizing plate 50104 may be provided on the top surface of the second substrate 50102, that is, may be provided between the second substrate 50102 and the liquid crystal layer 50100.

It is only necessary that at least one of the first electrode 50105 and the second electrode 50106 have light-transmitting properties (a transmissive or reflective liquid crystal display device). Alternatively, both the first electrode 50105 and the second electrode 50106 may have light-transmitting properties, and part of one of the electrodes may have reflectivity (a transflective liquid crystal display device).

FIG. 57A is a schematic view of a cross section in the case where voltage is applied to the first electrode 50105 and the second electrode 50106 (referred to as a vertical electric field mode).

FIG. 57B is a schematic view of a cross section in the case where voltage is not applied to the first electrode 50105 and the second electrode 50106.

Figure 58A:
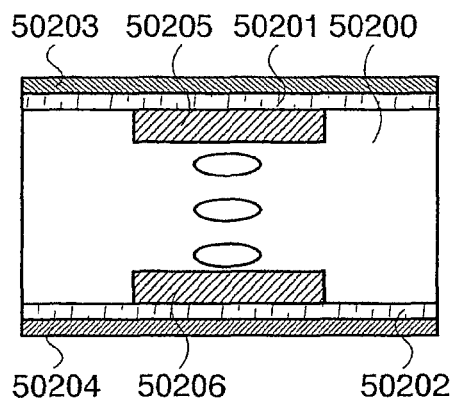
FIGS. 58A to 58D are cross-sectional views of display elements in a semiconductor device according to the invention.
Figure 58B:
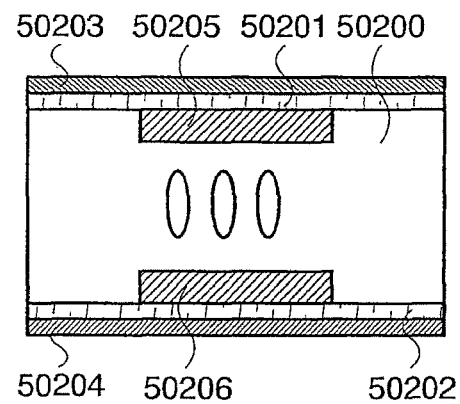

FIGS. 58A and 58B are schematic views of cross sections of a VA mode. In the VA mode, liquid crystal molecules are aligned such that they are vertical to a substrate when there is no electric field.

A liquid crystal layer 50200 is held between a first substrate 50201 and a second substrate 50202 which are provided so as to be opposite to each other. A first electrode 50205 is formed on a top surface of the first substrate 50201. A second electrode 50206 is formed on a top surface of the second substrate 50202. A first polarizing plate 50203 is provided on a surface of the first substrate 50201, which does not face the liquid crystal layer. A second polarizing plate 50204 is provided on a surface of the second substrate 50202, which does not face the liquid crystal layer. Note that the first polarizing plate 50203 and the second polarizing plate 50204 are provided so as to be in a cross nicol state.

The first polarizing plate 50203 may be provided on the top surface of the first substrate 50201, that is, may be provided between the first substrate 50201 and the liquid crystal layer. The second polarizing plate 50204 may be provided on the top surface of the second substrate 50202, that is, may be provided between the second substrate 50202 and the liquid crystal layer 50200.

It is only necessary that at least one of the first electrode 50205 and the second electrode 50206 have light-transmitting properties (a transmissive or reflective liquid crystal display device). Alternatively, both the first electrode 50205 and the second electrode 50206 may have light-transmitting properties, and part of one of the electrodes may have reflectivity (a transflective liquid crystal display device).

FIG. 58A is a schematic view of a cross section in the case where voltage is applied to the first electrode 50205 and the second electrode 50206 (referred to as a vertical electric field mode).

FIG. 58B is a schematic view of a cross section in the case where voltage is not applied to the first electrode 50205 and the second electrode 50206.

Figure 58C:
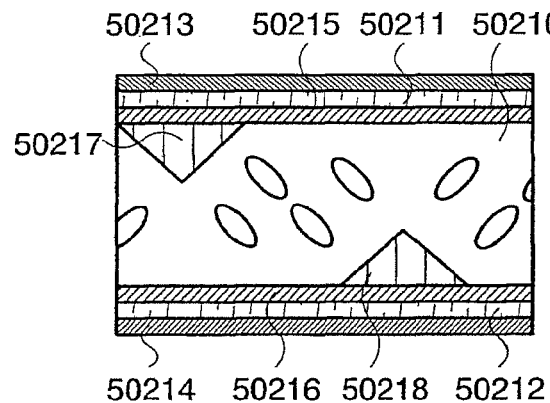
Figure 58D:
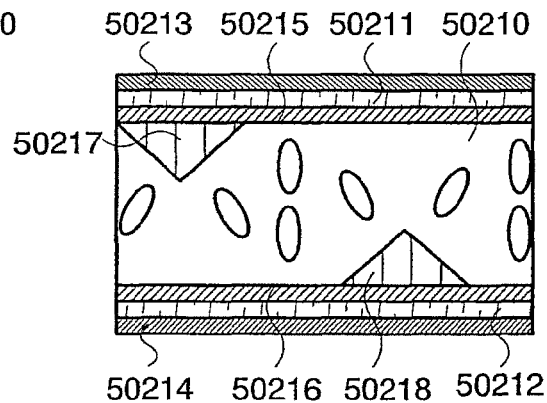

FIGS. 58C and 58D are schematic views of cross sections of an MVA mode. In the MVA mode, viewing angle dependency of each portion is compensated by each other.

A liquid crystal layer 50210 is held between a first substrate 50211 and a second substrate 50212 which are provided so as to be opposite to each other. A first electrode 50215 is formed on a top surface of the first substrate 50211. A second electrode 50216 is formed on a top surface of the second substrate 50212. A first projection 50217 for controlling alignment is formed on the first electrode 50215. A second projection 50218 for controlling alignment is formed over the second electrode 50216. A first polarizing plate 50213 is provided on a surface of the first substrate 50211, which does not face the liquid crystal layer 50210. A second polarizing plate 50214 is provided on a surface of the second substrate 50212, which does not face the liquid crystal layer 50210. Note that the first polarizing plate 50213 and the second polarizing plate 50214 are provided so as to be in a cross nicol state.

The first polarizing plate 50213 may be provided on the top surface of the first substrate 50211, that is, may be provided between the first substrate 50211 and the liquid crystal layer. The second polarizing plate 50214 may be provided on the top surface of the second substrate 50212, that is, may be provided between the second substrate 50212 and the liquid crystal layer.

It is only necessary that at least one of the first electrode 50215 and the second electrode 50216 have light-transmitting properties (a transmissive or reflective liquid crystal display device). Alternatively, both the first electrode 50215 and the second electrode 50216 may have light-transmitting properties, and part of one of the electrodes may have reflectivity (a transflective liquid crystal display device).

FIG. 58C is a schematic view of a cross section in the case where voltage is applied to the first electrode 50215 and the second electrode 50216 (referred to as a vertical electric field mode).

FIG. 58D is a schematic view of a cross section in the case where voltage is not applied to the first electrode 50215 and the second electrode 50216.

Figure 59A:
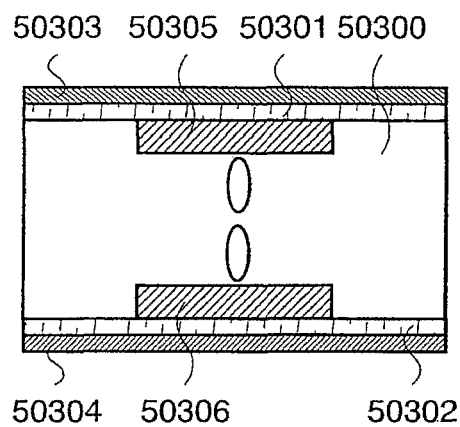
FIGS. 59A to 59D are cross-sectional views of display elements in a semiconductor device according to the invention.
Figure 59B:
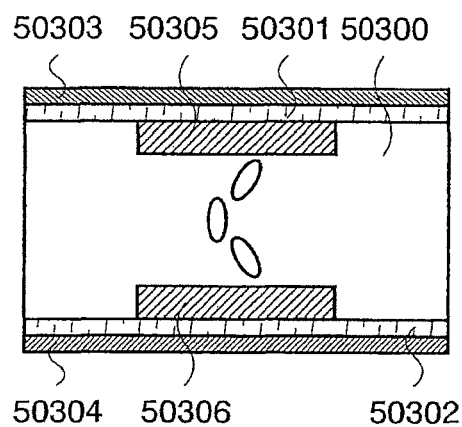

FIGS. 59A and 59B are schematic views of cross sections of an OCB mode. In the OCB mode, viewing angle dependency is low because alignment of liquid crystal molecules in a liquid crystal layer can be optically compensated. This state of the liquid crystal molecules is referred to as bend alignment.

A liquid crystal layer 50300 is held between a first substrate 50301 and a second substrate 50302 which are provided so as to be opposite to each other. A first electrode 50305 is formed on a top surface of the first substrate 50301. A second electrode 50306 is formed on a top surface of the second substrate 50302. A first polarizing plate 50303 is provided on a surface of the first substrate 50301, which does not face the liquid crystal layer 50300. A second polarizing plate 50304 is provided on a surface of the second substrate 50302, which does not face the liquid crystal layer 50300. Note that the first polarizing plate 50303 and the second polarizing plate 50304 are provided so as to be in a cross nicol state.

The first polarizing plate 50303 may be provided on the top surface of the first substrate 50301, that is, may be provided between the first substrate 50301 and the liquid crystal layer 50300. The second polarizing plate 50304 may be provided on the top surface of the second substrate 50302, that is, may be provided between the second substrate 50302 and the liquid crystal layer 50300.

It is only necessary that at least one of the first electrode 50305 and the second electrode 50306 have light-transmitting properties (a transmissive or reflective liquid crystal display device). Alternatively, both the first electrode 50305 and the second electrode 50306 may have light-transmitting properties, and part of one of the electrodes may have reflectivity (a transflective liquid crystal display device).

FIG. 59A is a schematic view of a cross section in the case where voltage is applied to the first electrode 50305 and the second electrode 50306 (referred to as a vertical electric field mode).

FIG. 59B is a schematic view of a cross section in the case where voltage is not applied to the first electrode 50305 and the second electrode 50306.

Figure 59C:
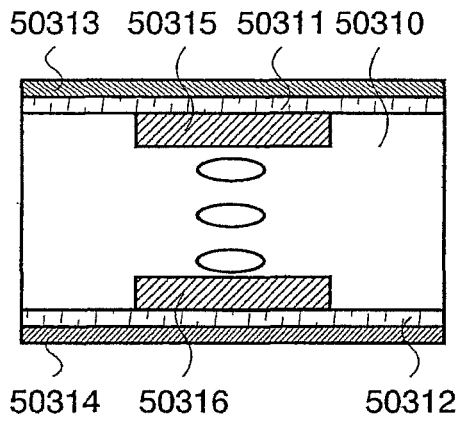
Figure 59D:
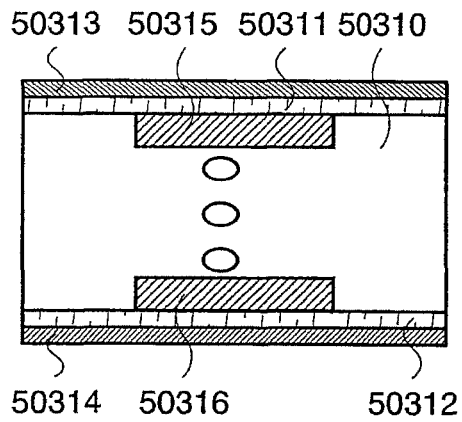

FIGS. 59C and 59D are schematic views of cross sections of an FLC mode or an AFLC mode.

A liquid crystal layer 50310 is held between a first substrate 50311 and a second substrate 50312 which are provided so as to be opposite to each other. A first electrode 50315 is formed on a top surface of the first substrate 50311. A second electrode 50316 is formed on a top surface of the second substrate

50312. A first polarizing plate 50313 is provided on a surface of the first substrate 50311, which does not face the liquid crystal layer 50310. A second polarizing plate 50314 is provided on a surface of the second substrate 50312, which does not face the liquid crystal layer 50310. Note that the first polarizing plate 50313 and the second polarizing plate 50314 are provided so as to be in a cross nicol state.

The first polarizing plate 50313 may be provided on the top surface of the first substrate 50311, that is, may be provided between the first substrate 50311 and the liquid crystal layer 50310. The second polarizing plate 50314 may be provided on the top surface of the second substrate 50312, that is, may be provided between the second substrate 50312 and the liquid crystal layer 50310.

It is only necessary that at least one of the first electrode 50315 and the second electrode 50316 have light-transmitting properties (a transmissive or reflective liquid crystal display device). Alternatively, both the first electrode 50315 and the second electrode 50316 may have light-transmitting properties, and part of one of the electrodes may have reflectivity (a transflective liquid crystal display device).

FIG. 59C is a schematic view of a cross section in the case where voltage is applied to the first electrode 50315 and the second electrode 50316 (referred to as a vertical electric field mode).

FIG. 59D is a schematic view of a cross section in the case where voltage is not applied to the first electrode 50315 and the second electrode 50316.

Figure 60A:
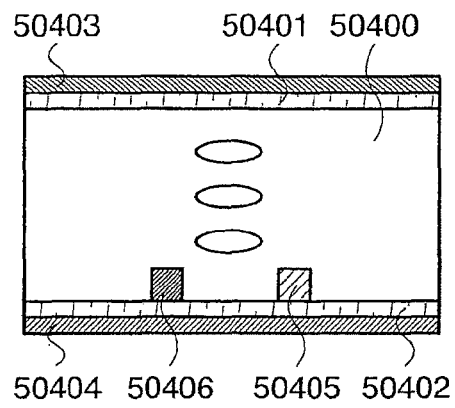
FIGS. 60A to 60D are cross-sectional views of display elements in a semiconductor device according to the invention.
Figure 60B:
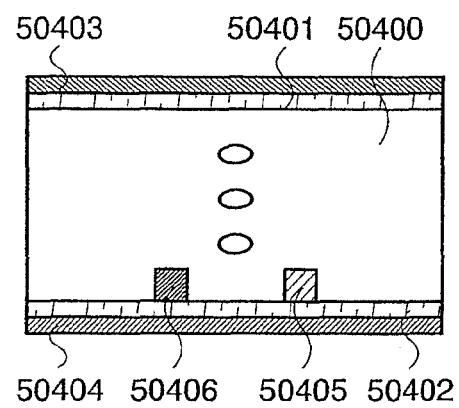

FIGS. 60A and 60B are schematic views of cross sections of an IPS mode. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50400 is held between a first substrate 50401 and a second substrate 50402 which are provided so as to be opposite to each other. A first electrode 50405 and a second electrode 50406 are formed on a top surface of the second substrate 50402. A first polarizing plate 50403 is provided on a surface of the first substrate 50401, which does not face the liquid crystal layer 50400. A second polarizing plate 50404 is provided on a surface of the second substrate 50402, which does not face the liquid crystal layer 50400. Note that the first polarizing plate 50403 and the second polarizing plate 50404 are provided so as to be in a cross nicol state.

The first polarizing plate 50403 may be provided on the top surface of the first substrate 50401, that is, may be provided between the first substrate 50401 and the liquid crystal layer 50400. The second polarizing plate 50404 may be provided on the top surface of the second substrate 50402, that is, may be provided between the second substrate 50402 and the liquid crystal layer 50400.

It is only necessary that at least one of the first electrode 50405 and the second electrode 50406 have light-transmitting properties (a transmissive or reflective liquid crystal display device). Alternatively, both the first electrode 50405 and the second electrode 50406 may have light-transmitting properties, and part of one of the electrodes may have reflectivity (a transflective liquid crystal display device).

FIG. 60A is a schematic view of a cross section in the case where voltage is applied to the first electrode 50405 and the second electrode 50406 (referred to as a vertical electric field mode).

FIG. 60B is a schematic view of a cross section in the case where voltage is not applied to the first electrode 50405 and the second electrode 50406.

Figure 60C:
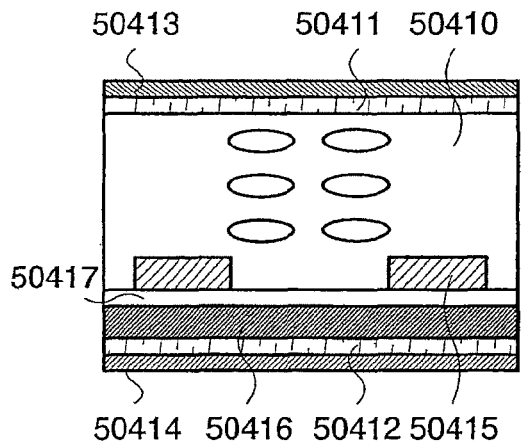
Figure 60D:
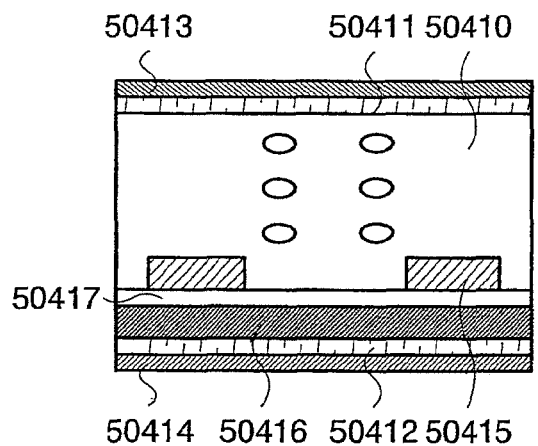

FIGS. 60C and 60D are schematic views of cross sections of an FFS mode. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50410 is held between a first substrate 50411 and a second substrate 50412 which are provided so as to be opposite to each other. A second electrode 50416 is formed on a top surface of the second substrate 50412. An insulating film 50417 is formed on a top surface of the second electrode 50416. A first electrode 50415 is formed over the insulating film 50417. A first polarizing plate 50413 is provided on a surface of the first substrate 50411, which does not face the liquid crystal layer 50410. A second polarizing plate 50414 is provided on a surface of the second substrate 50412, which does not face the liquid crystal layer 50410. Note that the first polarizing plate 50413 and the second polarizing plate 50414 are provided so as to be in a cross nicol state.

The first polarizing plate 50413 may be provided on the top surface of the first substrate 50411, that is, may be provided between the first substrate 50411 and the liquid crystal layer 50410. The second polarizing plate 50414 may be provided on the top surface of the second substrate 50412, that is, may be provided between the second substrate 50412 and the liquid crystal layer 50410.

It is only necessary that at least one of the first electrode 50415 and the second electrode 50416 have light-transmitting properties (a transmissive or reflective liquid crystal display device). Alternatively, both the first electrode 50415 and the second electrode 50416 may have light-transmitting properties, and part of one of the electrodes may have reflectivity (a transflective liquid crystal display device).

FIG. 60C is a schematic view of a cross section in the case where voltage is applied to the first electrode 50415 and the second electrode 50416 (referred to as a vertical electric field mode).

FIG. 60D is a schematic view of a cross section in the case where voltage is not applied to the first electrode 50415 and the second electrode 50416.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 14

In this embodiment mode, a pixel structure of a display device is described. In particular, a pixel structure of a liquid crystal display device is described.

Pixel structures in the case where each liquid crystal mode and a transistor are combined are described with reference to cross-sectional views of pixels.

As the transistor, a thin film transistor (TFT) including a non-single crystalline semiconductor layer typified by amorphous silicon, polycrystalline silicon, microcrystalline (also referred to as semi-amorphous) silicon, or the like can be used.

As a structure of the transistor, a top-gate structure, a bottom-gate structure, or the like can be used. Note that a channel-etched transistor, a channel-protective transistor, or the like can be used as a bottom-gate transistor.

Figure 61:
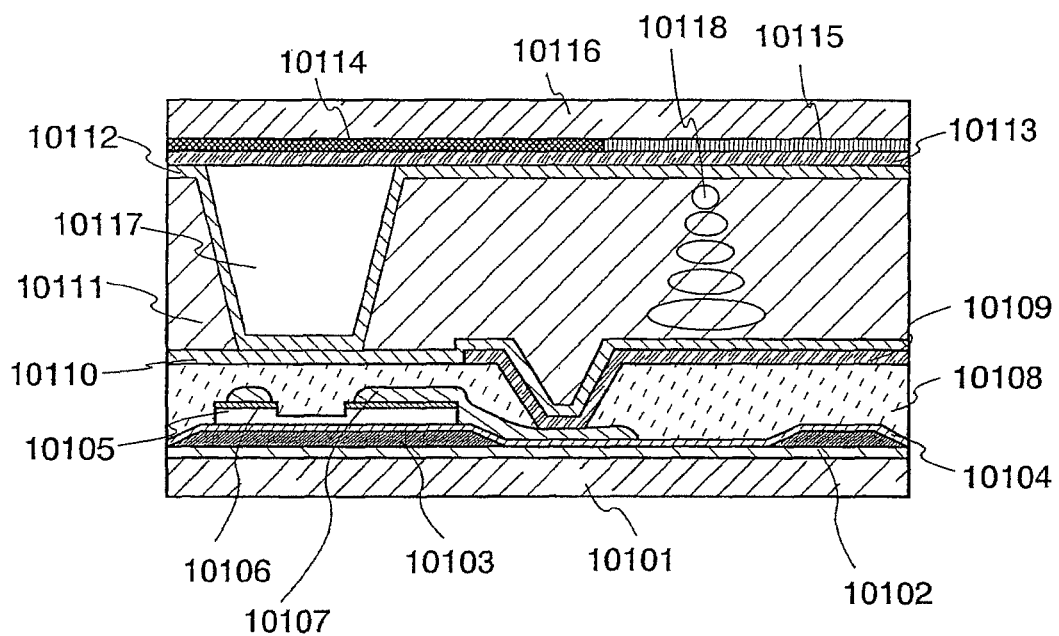
FIG. 61 is a top plan view of a pixel in a semiconductor device according to the invention.

FIG. 61 is an example of a cross-sectional view of a pixel in the case where a TN mode and a transistor are combined. A liquid crystal 10111 having liquid crystal molecules 10118 is held between a first substrate 10101 and a second substrate 10116. The first substrate 10101 is provided with a transistor, a pixel electrode, an alignment film, and the like. The second substrate 10116 is provided with a light-shielding film 10114, a color filter 10115, an opposite electrode, an alignment film, and the like. In addition, a spacer 10117 is provided between the first substrate 10101 and the second substrate 10116. By applying the pixel structure shown in FIG. 61 to a liquid crystal display device, a liquid crystal display device can be formed at low cost.

Figure 62A:
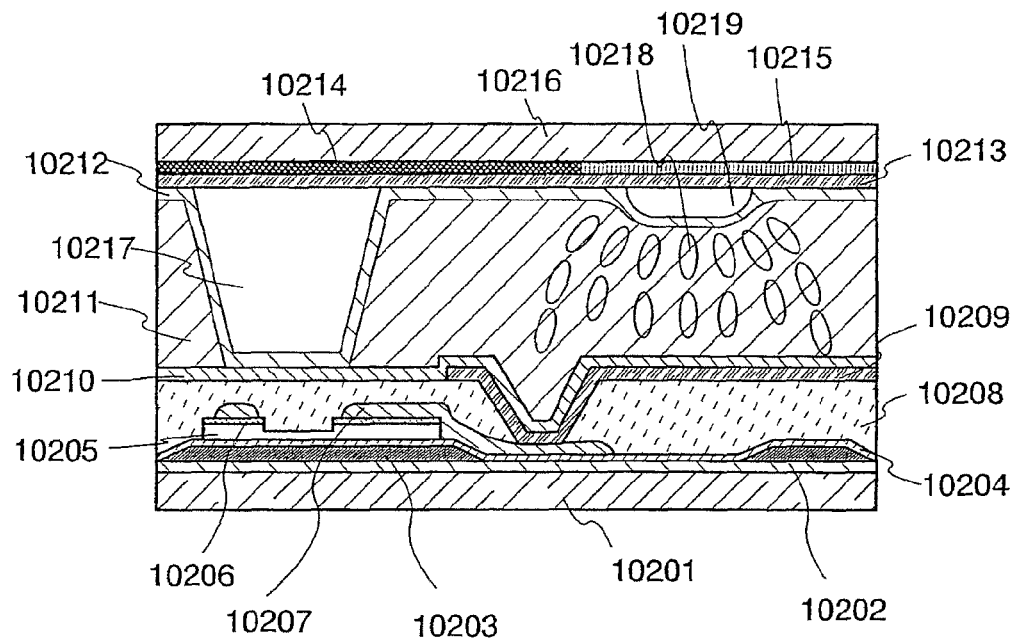
FIGS. 62A and 62B each are top plan views of a pixel in a semiconductor device according to the invention.

FIG. 62A is an example of a cross-sectional view of a pixel in the case where an MVA (Multi-domain Vertical Alignment) mode and a transistor are combined. A liquid crystal 10211 having liquid crystal molecules 10218 is held between a first substrate 10201 and a second substrate 10216. The first substrate 10201 is provided with a transistor, a pixel electrode, an alignment film, and the like. The second substrate 10216 is provided with a light-shielding film 10214, a color filter 10215, an opposite electrode, a projection 10219 for alignment control, an alignment film, and the like. In addition, a spacer 10217 is provided between the first substrate 10201 and the second substrate 10216. By applying the pixel structure shown in FIG. 62A to a liquid crystal display device, a liquid crystal display device having a wide viewing angle, high response speed, and high contrast can be obtained.

Figure 62B:
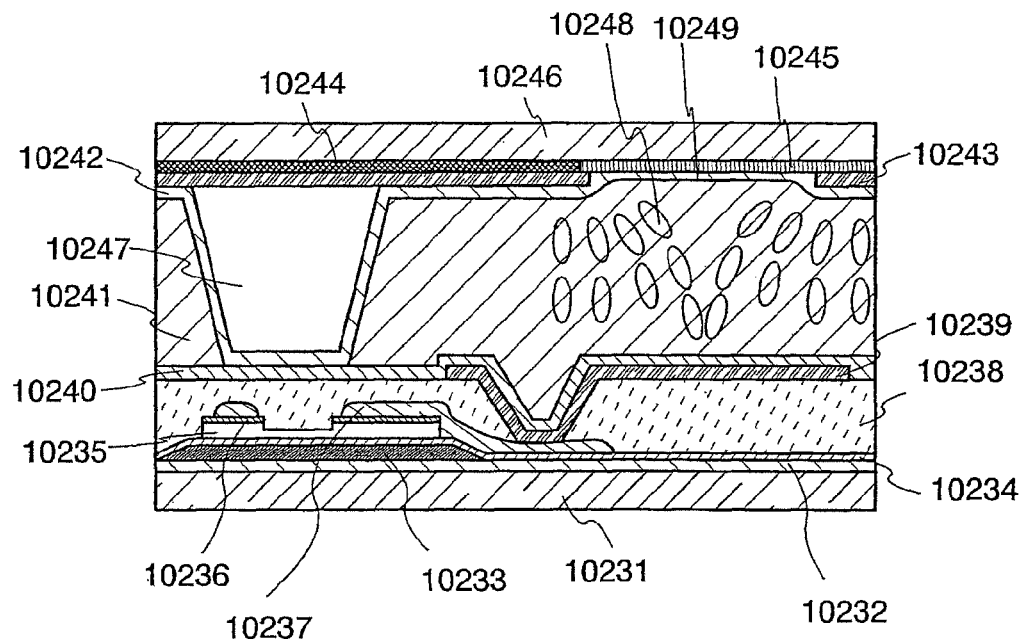

FIG. 62B is an example of a cross-sectional view of a pixel in the case where a PVA (Patterned Vertical Alignment) mode and a transistor are combined. A liquid crystal 10241 having liquid crystal molecules 10248 is held between a first substrate 10231 and a second substrate 10246. The first substrate 10231 is provided with a transistor, a pixel electrode, an alignment film, and the like. The second substrate 10246 is provided with a light-shielding film 10244, a color filter 10245, an opposite electrode, an alignment film, and the like. Note that the pixel electrode includes an electrode notch portion 10249. In addition, a spacer 10247 is provided between the first substrate 10231 and the second substrate 10246. By applying the pixel structure shown in FIG. 62B to a liquid crystal display device, a liquid crystal display device having a wide viewing angle, high response speed, and high contrast can be obtained.

Figure 63A:
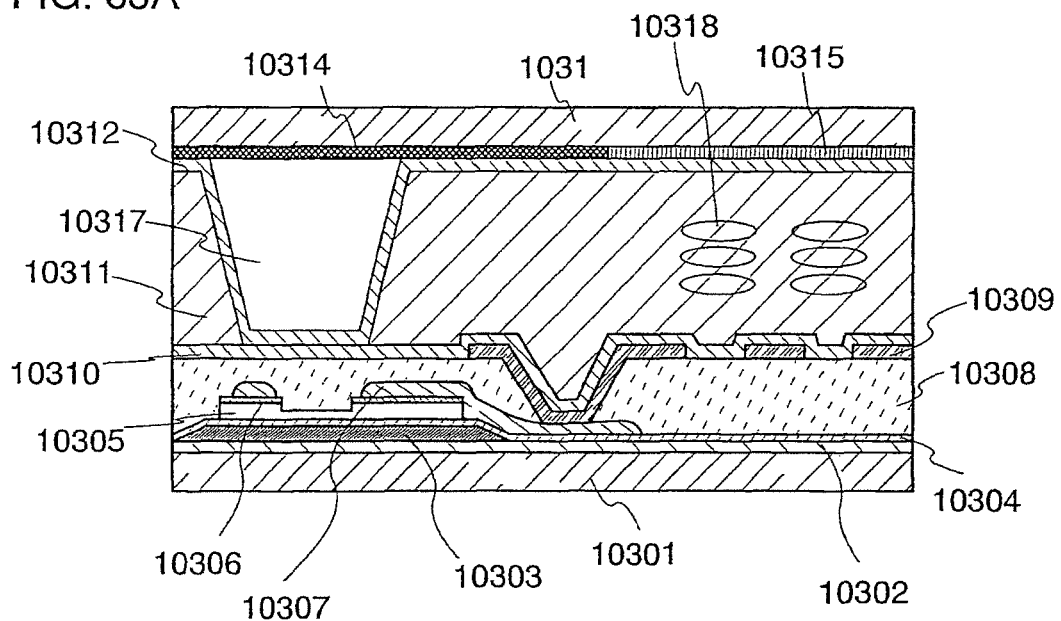
FIGS. 63A and 63B each are top plan views of a pixel in a semiconductor device according to the invention.

FIG. 63A is an example of a cross-sectional view of a pixel in the case where an IPS (In-Plane-Switching) mode and a transistor are combined. A liquid crystal 10311 having liquid crystal molecules 10318 is held between a first substrate 10301 and a second substrate 10316. The first substrate 10301 is provided with a transistor, a pixel electrode, a common electrode, an alignment film, and the like. The second substrate 10316 is provided with a light-shielding film 10314, a color filter 10315, an alignment film, and the like. In addition, a spacer 10317 is provided between the first substrate 10301 and the second substrate 10316. By applying the pixel structure shown in FIG. 63A to a liquid crystal display device, a liquid crystal display device having a wide viewing angle and response speed with low dependency on gray scale in principle can be obtained.

Figure 63B:
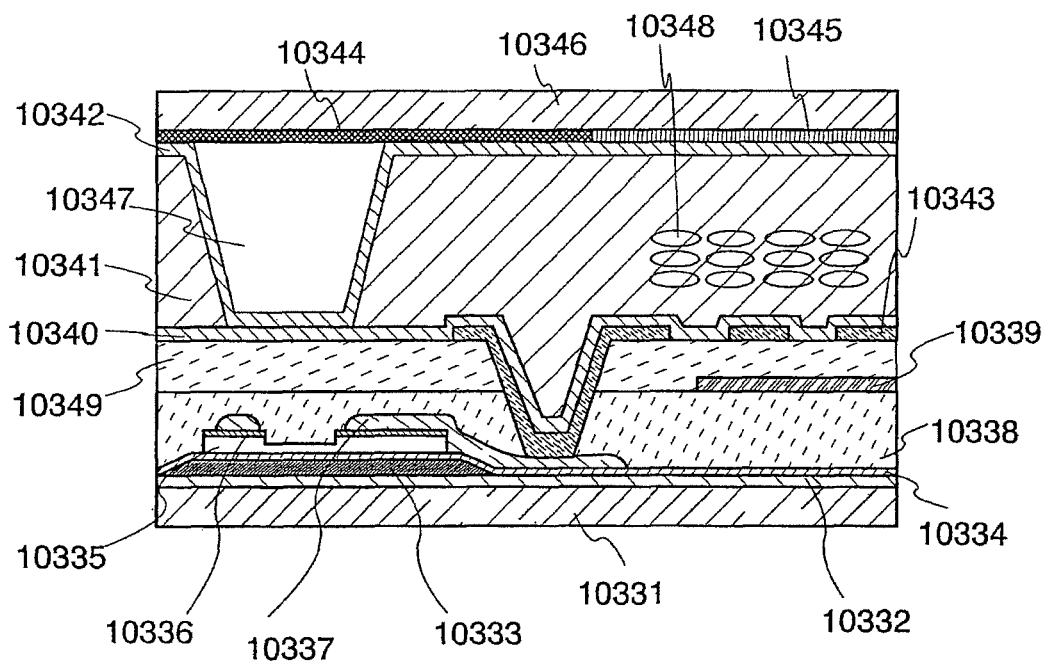

FIG. 63B is an example of a cross-sectional view of a pixel in the case where an FFS (Fringe Field Switching) mode and a transistor are combined. A liquid crystal 10341 having liquid crystal molecules 10348 is held between a first substrate 10331 and a second substrate 10346. The first substrate 10331 is provided with a transistor, a pixel electrode, a common electrode, an alignment film, and the like. The second substrate 10346 is provided with a light-shielding film 10344, a color filter 10345, an alignment film, and the like. In addition, a spacer 10347 is provided between the first substrate 10331 and the second substrate 10346. By applying the pixel structure shown in FIG. 63B to a liquid crystal display device, a liquid crystal display device having a wide viewing angle and response speed with low dependency on gray scale in principle can be obtained.

Here, materials which can be used for conductive layers or insulating films are described.

As a first insulating film 10102 in FIG. 61, a first insulating film 10202 in FIG. 62A, a first insulating film 10232 in FIG. 62B, a first insulating film 10302 in FIG. 63A, and a first insulating film 10332 in FIG. 63B, an insulating film such as a silicon oxide film, a silicon nitride film, or a silicon oxynitride (SiOxNy) film can be used. Alternatively, an insulating film having a stacked-layer structure in which two or more of a silicon oxide film, a silicon nitride film, a silicon oxynitride (SiOxNy) film, and the like are combined can be used.

As a first conductive layer 10103 in FIG. 61, a first conductive layer 10203 in FIG. 62A, a first conductive layer 10233 in FIG. 62B, a first conductive layer 10303 in FIG. 63A, and a first conductive layer 10333 in FIG. 63B, Mo, Ti, Al, Nd, Cr, or the like can be used. Alternatively, a stacked-layer structure in which two or more of Mo, Ti, Al, Nd, Cr, and the like are combined can be used.

As a second insulating film 10104 in FIG. 61, a second insulating film 10204 in FIG. 62A, a second insulating film 10234 in FIG. 62B, a second insulating film 10304 in FIG. 63A, and a second insulating film 10334 in FIG. 63B, a thermal oxide film, a silicon oxide film, a silicon nitride film, a silicon oxynitride film, or the like can be used. Alternatively, a stacked-layer structure in which two or more of a thermal oxide film, a silicon oxide film, a silicon nitride film, a silicon oxynitride film, and the like are combined can be used. Note that a silicon oxide film is preferably used as a portion in contact with a semiconductor layer. This is because a trap level at an interface with the semiconductor layer is decreased when a silicon oxide film is used. Note also that a silicon nitride film is preferably used as a portion in contact with Mo. This is because a silicon nitride film does not oxidize Mo.

As a first semiconductor layer 10105 in FIG. 61, a first semiconductor layer 10205 in FIG. 62A, a first semiconductor layer 10235 in FIG. 62B, a first semiconductor layer 10305 in FIG. 63A, and a first semiconductor layer 10335 in FIG. 63B, silicon, silicon germanium (SiGe), or the like can be used.

As a second semiconductor layer 10106 in FIG. 61, a second semiconductor layer 10206 in FIG. 62A, a second semiconductor layer 10236 in FIG. 62B, a second semiconductor layer 10306 in FIG. 63A, and a second semiconductor layer 10336 in FIG. 63B, silicon including phosphorus or the like can be used, for example.

As a light-transmitting material of a second conductive layer 10107, a third conductive layer 10109, and a fourth conductive layer 10113 in FIG. 61; a second conductive layer 10207, a third conductive layer 10209, and a fourth conductive layer 10213 in FIG. 62A; a second conductive layer 10237, a third conductive layer 10239, and a fourth conductive layer 10243 in FIG. 62B; a second conductive layer 10307 and a third conductive layer 10309 in FIG. 63A; and a second conductive layer 10337, a third conductive layer 10339, and a fourth conductive layer 10343 in FIG. 63B, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, a tin oxide film, or the like can be used. Note that IZO is a light-transmitting conductive material formed by sputtering using a target in which zinc oxide (ZnO) of 2 to 20 wt % is mixed into ITO.

As a reflective material of the second conductive layer 10107 and the third conductive layer 10109 in FIG. 61; the second conductive layer 10207 and the third conductive layer 10209 in FIG. 62A; the second conductive layer 10237 and the third conductive layer 10239 in FIG. 62B; the second conductive layer 10307 and the third conductive layer 10309 in FIG. 63A; and the second conductive layer 10337, the third conductive layer 10339, and the fourth conductive layer 10343 in FIG. 63B, Ti, Mo, Ta, Cr, W, Al, or the like can be used. Alternatively, a two-layer structure in which Al and Ti, Mo, Ta, Cr, or W are stacked, or a three-layer structure in which Al is interposed between metals such as Ti, Mo, Ta, Cr, and W may be used.

As the third insulating film 10108 in FIG. 61, the third insulating film 10208 in FIG. 62A, the third insulating film 10238 in FIG. 62B, the third conductive layer 10239 in FIG. 62B, the third insulating film 10308 in FIG. 63A, and the third insulating film 10338 and the fourth insulating film 10349 in FIG. 63B, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane can be used. Note that siloxane is a material in which a skeleton structure is formed by a bond of silicon (Si) and oxygen (O). As a substitute, an organic group containing at least hydrogen (such as an alkyl group or an aryl group) is used. Alternatively, a fluoro group, or a fluoro group and an organic group containing at least hydrogen may be used as a substituent.

As a first alignment film 10110 and a second alignment film 10112 in FIG. 61; a first alignment film 10210 and a second alignment film 10212 in FIG. 62A; a first alignment film 10240 and a second alignment film 10242 in FIG. 62B; a first alignment film 10310 and a second alignment film 10312 in FIG. 63A; and a first alignment film 10340 and a second alignment film 10342 in FIG. 63B, a film of a high molecular compound such as polyimide can be used.

Next, the pixel structure in the case where each liquid crystal mode and the transistor are combined is described with reference to a top plan view (a layout diagram) of the pixel.

Note that as the liquid crystal mode, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Microcell) mode, an OCB (Optical Compensated Birefringence) mode, an FLC (Ferroelectric Liquid Crystal) mode, an AFLC (AntiFerroelectric Liquid Crystal) mode, or the like can be used.

Figure 64:
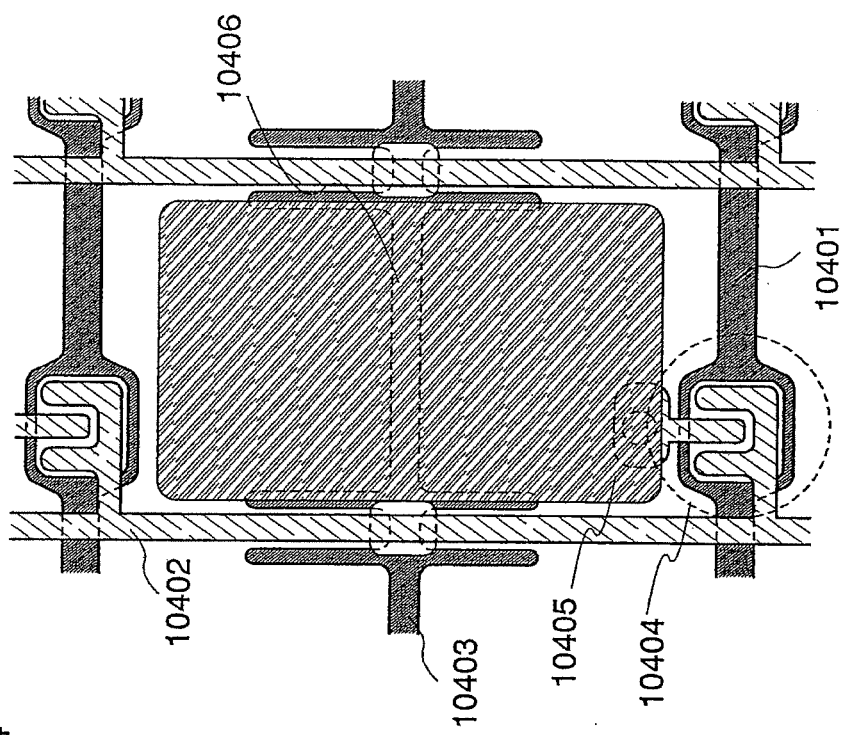
FIG. 64 shows an example of a pixel layout of a semiconductor device according to the invention.

FIG. 64 is an example of a top plan view of a pixel in the case where a TN mode and a transistor are combined. By applying the pixel structure shown in FIG. 64 to a liquid crystal display device, a liquid crystal display device can be formed at low cost.

The pixel shown in FIG. 64 includes a scan line 10401, a video signal line 10402, a capacitor line 10403, a transistor 10404, a pixel electrode 10405, and a pixel capacitor 10406.

Figure 65A:
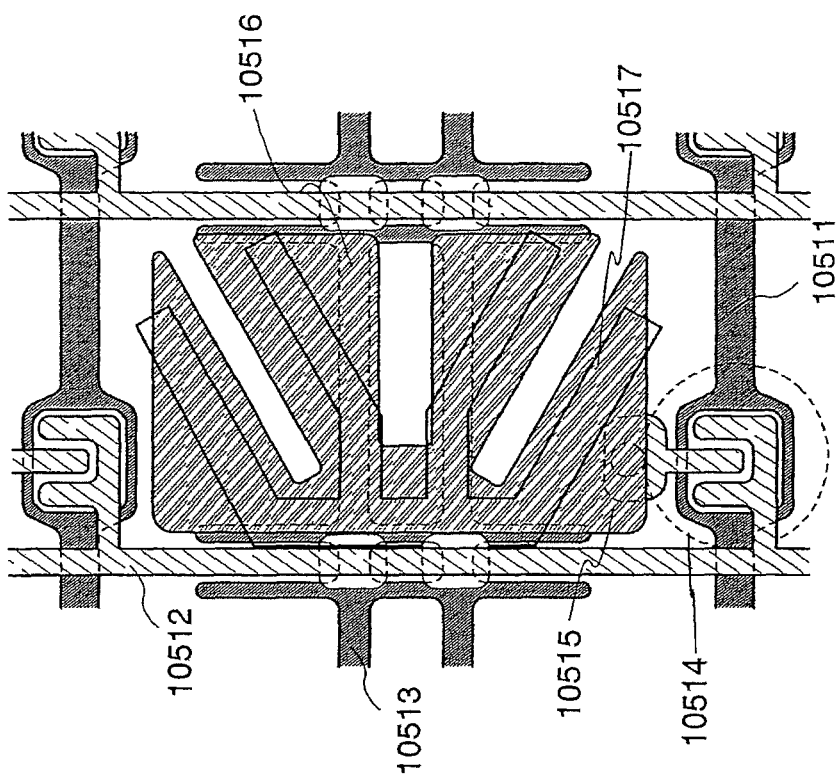
FIGS. 65A and 65B each show an example of a pixel layout of a semiconductor device according to the invention.

FIG. 65A is an example of a top plan view of a pixel in the case where an MVA mode and a transistor are combined. By applying the pixel structure shown in FIG. 65A to a liquid crystal display device, a liquid crystal display device having a wide viewing angle, high response speed, and high contrast can be obtained.

The pixel shown in FIG. 65A includes a scan line 10501, a video signal line 10502, a capacitor line 10503, a transistor 10504, a pixel electrode 10505, a pixel capacitor 10506, and a projection 10507 for alignment control.

Figure 65B:
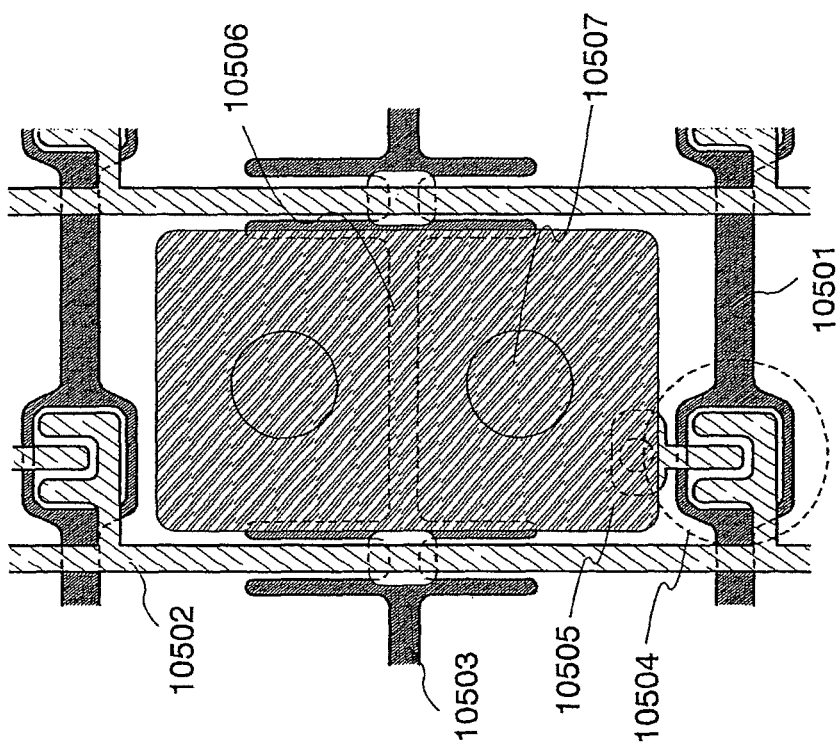

FIG. 65B is an example of a top plan view of a pixel in the case where a PVA mode and a transistor are combined. By applying the pixel structure shown in FIG. 65B to a liquid crystal display device, a liquid crystal display device having a wide viewing angle, high response speed, and high contrast can be obtained.

The pixel shown in FIG. 65B includes a scan line 10511, a video signal line 10512, a capacitor line 10513, a transistor 10514, a pixel electrode 10515, a pixel capacitor 10516, and an electrode notch portion 10517.

Figure 66A:
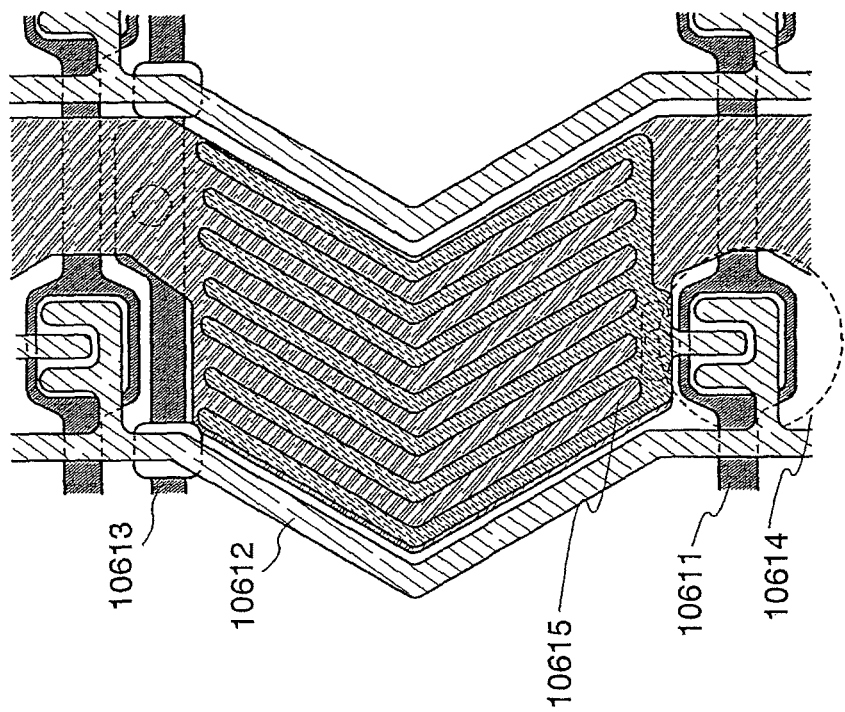
FIGS. 66A and 66B each show an example of a pixel layout of a semiconductor device according to the invention.

FIG. 66A is an example of a top plan view of a pixel in the case where an IPS mode and a transistor are combined. By applying the pixel structure shown in FIG. 66A to a liquid crystal display device, a liquid crystal display device having a wide viewing angle and response speed with low dependency on gray scale in principle can be obtained.

The pixel shown in FIG. 66A includes a scan line 10601, a video signal line 10602, a common electrode 10603, a transistor 10604, and a pixel electrode 10605.

Figure 66B:
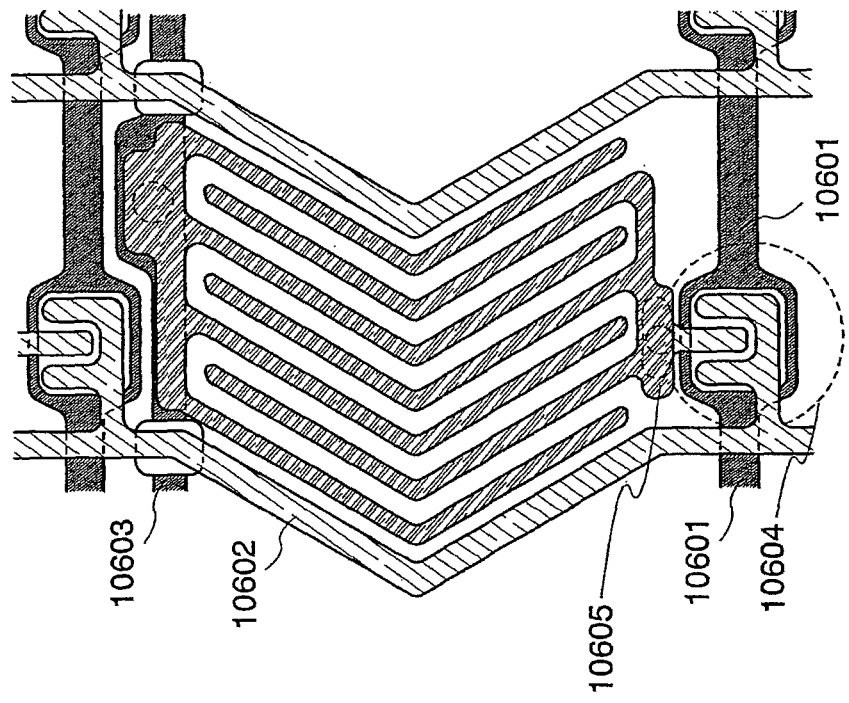

FIG. 66B is an example of a top plan view of a pixel in the case where an FFS mode and a transistor are combined. By applying the pixel structure shown in FIG. 66B to a liquid crystal display device, a liquid crystal display device having a wide viewing angle and response speed with low dependency on gray scale in principle can be obtained.

The pixel shown in FIG. 66B includes a scan line 10611, a video signal line 10612, a common electrode 10613, a transistor 10614, and a pixel electrode 10615.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 15

In this embodiment mode, a structure and an operation of a pixel in a display device are described.

Figures 67A, 67B:
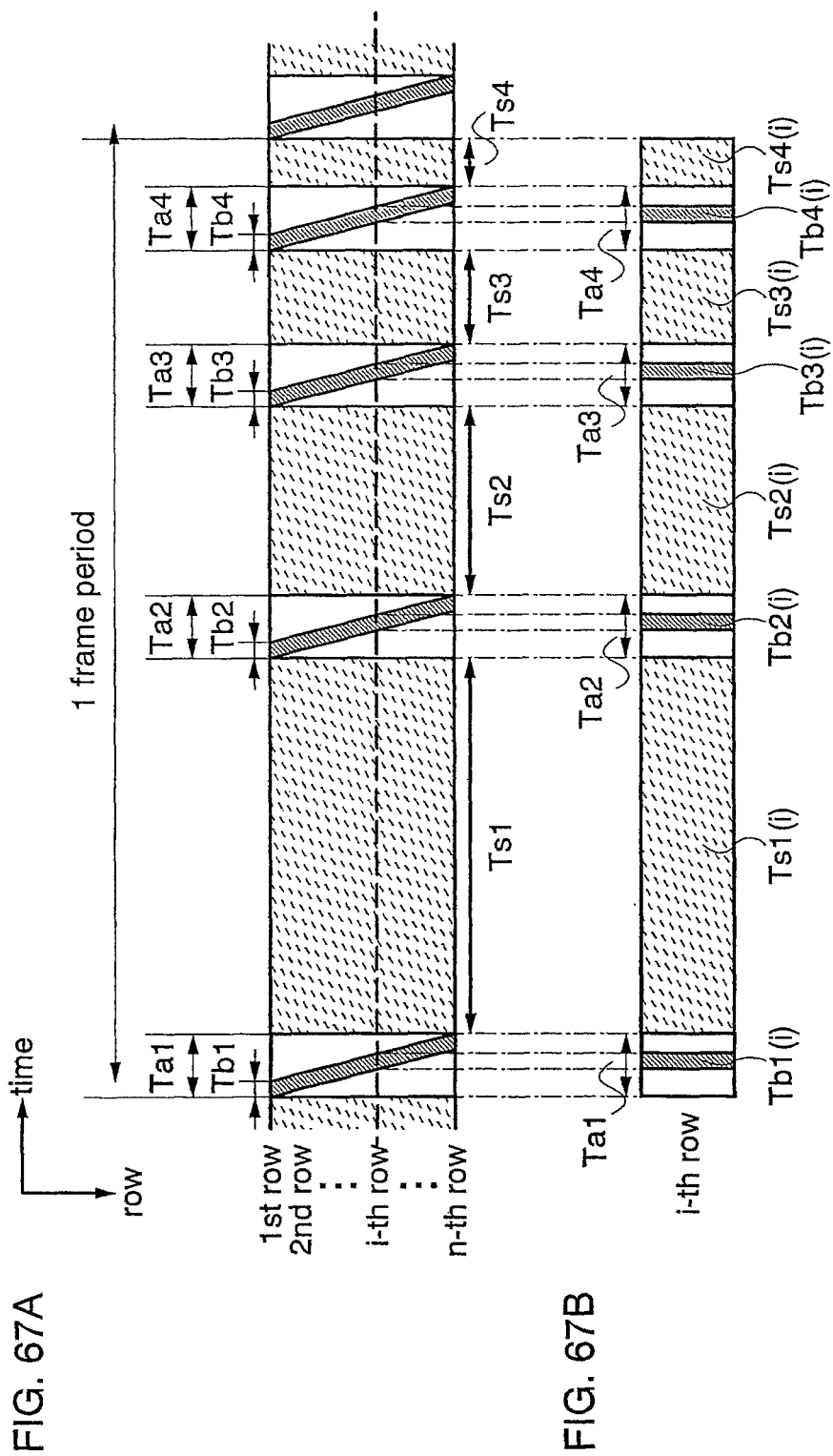
FIGS. 67A and 67B show one driving method of a semiconductor device according to the invention.

FIGS. 67A and 67B are timing charts showing an example of digital time gray scale drive. The timing chart of FIG. 67A shows a driving method when a signal writing period (an address period) to a pixel and a light-emitting period (a sustain period) are divided.

One frame period is a period for fully displaying an image for one display region. One frame period includes a plurality of subframe periods, and one subframe period includes an address period and a sustain period. Address periods Ta1 to Ta4 indicate time for writing signals to pixels in all rows, and periods Tb1 to Tb4 indicate time for writing signals to pixels in one row (or one pixel). Sustain periods Ts1 to Ts4 indicate time for maintaining a lighting state or a non-lighting state in accordance with a video signal written to the pixel, and a ratio of the length of the sustain periods is set to satisfy Ts1:Ts2:Ts3:Ts4=$2^3:2^2:2^1:2^0$=8:4:2:1. A gray scale is expressed depending on which sustain period light emission is performed.

Here, the i-th pixel row is described with reference to FIG. 67B. First, in the address period Ta1, a pixel selection signal is input to a scan line in order from a first row, and in a period Tb1(i) in the address period Ta1, a pixel in the i-th row is selected. Then, while the pixel in the i-th row is selected, a video signal is input to the pixel in the i-th row from a signal line. Then, when the video signal is written to the pixel in the i-th row, the pixel in the i-th row maintains the signal until a signal is input again. Lighting and non-lighting of the pixel in the i-th row in the sustain period Ts1 are controlled by the written video signal. Similarly, in the address periods Ta2, Ta3, and Ta4, a video signal is input to the pixel in the i-th row, and lighting and non-lighting of the pixel in the i-th row in the sustain periods Ts2, Ts3, and Ts4 are controlled by the video signal. Then, in each subframe period, a pixel to which a signal for not lighting in the address period and for lighting when the sustain period starts after the address period ends is written is lit.

Here, the case where a 4-bit gray scale is expressed; however, the number of bits and the number of gray scales are not limited thereto. Note that lighting is not needed to be performed in order of Ts1, Ts2, Ts3, and Ts4, and the order may be random or light emission may be performed in the period divided into a plurality of periods. A ratio of lighting time of Ts1, Ts2, Ts3, and Ts4 is not needed to be power-of-two, and may be the same length or slightly different from a power of two.

Next, a driving method when a signal writing period (an address period) to a pixel and a light-emitting period (a sustain period) are not divided is described. A pixel in a row in which a writing operation of a video signal is completed maintains the signal until another signal is written to the pixel (or the signal is erased). Data holding time is a period between the writing operation and until another signal is written to the pixel. In the data holding time, the pixel is lit or not lit in accordance with the video signal written to the pixel. The same operations are performed until the last row, and the address period ends. Then, an operation proceeds to a signal writing operation in a next subframe period sequentially from a row in which the data holding time ends.

As described above, in the case of a driving method in which a pixel is lit or not lit in accordance with a video signal written to the pixel immediately after the signal writing operation is completed and the data holding time starts, signals cannot be input to two rows at the same time. Accordingly, address periods need to be prevented from overlapping. Therefore, the data holding time cannot be made shorter than the address period. As a result, it becomes difficult to perform high-level gray scale display.

Figures 68A, 68B:
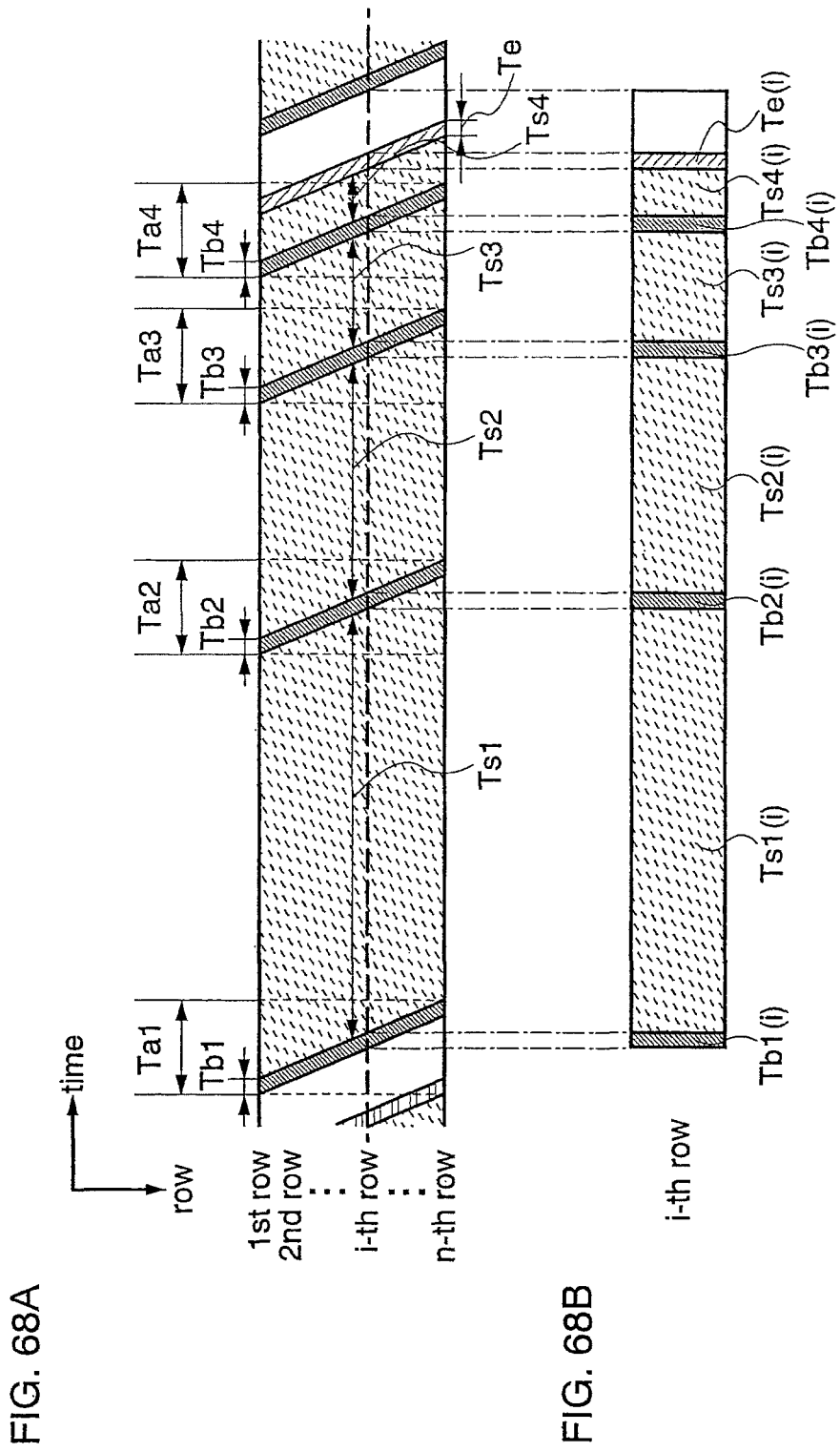
FIGS. 68A and 68B show one driving method of a semiconductor device according to the invention.

Thus, the data holding time is set to be shorter than the address period by providing an erasing period. FIG. 68A shows a driving method when the data holding time is set shorter than the address period by providing an erasing period.

Here, the i-th pixel row is described with reference to FIG. 68B. In the address period Ta1, a pixel scan signal is input to a scan line in order from a first row, and a pixel is selected. Then, in the period Tb1(i), while the pixel in the i-th row is selected, a video signal is input to the pixel in the i-th row. Then, when the video signal is written to the pixel in the i-th row, the pixel in the i-th row maintains the signal until a signal is input again. Lighting and non-lighting of the pixel in the i-th row in the sustain period Ts1(i) are controlled by the written video signal. That is, the pixel in the i-th row is lit or not lit in accordance with the video signal written to the pixel immediately after the writing operation of the video signal to the i-th row is completed. Similarly, in the address periods Ta2, Ta1, and Ta4, a video signal is input to the pixel in the i-th row, and lighting and non-lighting of the pixel in the i-th row in the sustain periods Ts2, Ts3, and Ts4 are controlled by the video signal. Then, the end of a sustain period Ts4(i) is set by the start of an erasing operation. This is because the pixel is forced to be not lit regardless of the video signal written to the pixel in the i-th row in an erasing time Te(i). That is, the data holding time of the pixel in the i-th row ends when the erasing time Te(i) starts.

Thus, a display device with a high-level gray scale, a high duty ratio (a ratio of a lighting period in one frame period) can be provided, in which data holding time is shorter than an address period without dividing the address period and a sustain period can be provided. Reliability of a display element can be improved since instantaneous luminance can be lowered.

Here, the case where a 4-bit gray scale is expressed; however, the number of bits and the number of gray scales are not limited thereto. Note that lighting is not needed to be performed in order of Ts1, Ts2, Ts3, and Ts4, and the order may be random or light emission may be performed in the period divided into a plurality of periods. A ratio of lighting time of Ts1, Ts2, Ts3, and Ts4 is not needed to be power-of-two, and may be the same length or slightly different from a power of two.

A structure and an operation of a pixel to which digital time gray scale drive can be applied are described.

Figure 69:
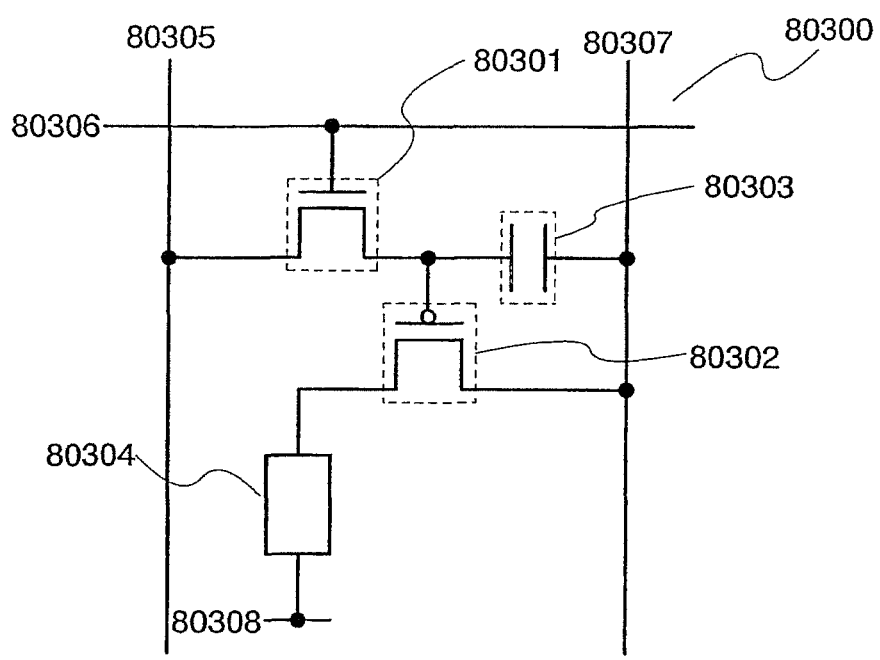
FIG. 69 shows a structure of a pixel in a semiconductor device according to the invention.

FIG. 69 is a diagram showing an example of a pixel structure to which digital time gray scale drive can be applied.

A pixel 80300 includes a switching transistor 80301, a driving transistor 80302, a light-emitting element 80304, and a capacitor 80303. A gate of the switching transistor 80301 is connected to a scan line 80306, a first electrode (one of a source electrode and a drain electrode) of the switching transistor 80301 is connected to a signal line 80305, and a second electrode (the other of the source electrode and the drain electrode) of the switching transistor 80301 is connected to a gate of the driving transistor 80302. The gate of the driving transistor 80302 is connected to a power supply line 80307 through the capacitor 80303, a first electrode of the driving transistor 80302 is connected to the power supply line 80307, and a second electrode of the driving transistor 80302 is connected to a first electrode (a pixel electrode) of the light-emitting element 80304. A second electrode of the light-emitting element 80304 corresponds to a common electrode 80308.

The second electrode of the light-emitting element 80304 (the common electrode 80308) is set to a low power supply potential. The low power supply potential is a potential satisfying the low power supply potential<a high power supply potential based on the high power supply potential set to the power supply line 80307. As the low power supply potential, GND, 0 V, and the like may be employed, for example. A potential difference between the high power supply potential and the low power supply potential is applied to the light-emitting element 80304, and a current is supplied to the light-emitting element 80304. Here, in order to make the light-emitting element 80304 emit light, each potential is set so that the potential difference between the high power supply potential and the low power supply potential is a forward threshold voltage or more.

Gate capacitance of the driving transistor 80302 may be used as a substitute for the capacitor 80303, so that the capacitor 80303 can be omitted. The gate capacitance of the driving transistor 80302 may be formed in a region where a source region, a drain region, an LDD region, or the like overlaps with the gate electrode. Alternatively, capacitance may be formed between a channel region and the gate electrode.

In the case of voltage-input voltage driving method, a video signal is input to the gate of the driving transistor 80302 so that the driving transistor 80302 is in either of two states of being sufficiently turned on and turned off. That is, the driving transistor 80302 operates in a linear region.

The video signal such that the driving transistor 80302 operates in a saturation region is input, so that a current can be supplied to the light-emitting element 80304. When the light-emitting element 80304 is an element luminance of which is determined in accordance with a current, luminance decay due to deterioration of the light-emitting element 80304 can be suppressed. Further, when the video signal is an analog signal, a current corresponding to the video signal can be supplied to the light-emitting element 80304. In this case, analog gray scale drive can be performed.

A structure and an operation of a pixel called a threshold voltage compensation pixel are described. A threshold voltage compensation pixel can be applied to digital time gray scale drive and analog gray scale drive.

Figure 70:
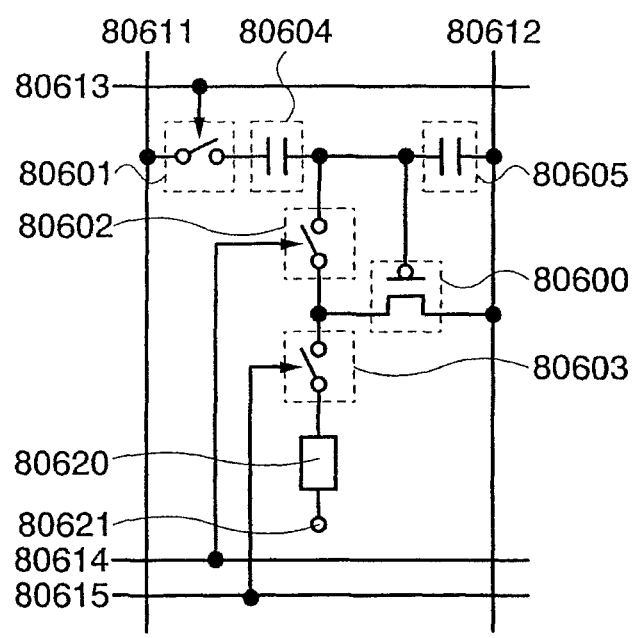
FIG. 70 shows a structure of a pixel in a semiconductor device according to the invention.

FIG. 70 is a diagram showing an example of a structure of a pixel called a threshold voltage compensation pixel.

The pixel in FIG. 70 includes a driving transistor 80600, a first switch 80601, a second switch 80602, a third switch 80603, a first capacitor 80604, a second capacitor 80605, and a light-emitting element 80620. A gate of the driving transistor 80600 is connected to a signal line 80611 through the first capacitor 80604 and the first switch 80601 in this order. Further, the gate of the driving transistor 80600 is connected to a power supply line 80612 through the second capacitor 80605. A first electrode of the driving transistor 80600 is connected to the power supply line 80612. A second electrode of the driving transistor 80600 is connected to a first electrode of the light-emitting element 80620 through the third switch 80603. Further, the second electrode of the driving transistor 80600 is connected to the gate of the driving transistor 80600 through the first electrode of the light-emitting element 80620. A second electrode of the light-emitting element 80620 corresponds to a common electrode 80621. Note that on/off of the first switch 80601, the second switch 80602, and the third switch 80603 is controlled by a signal input to a first scan line 80613, a signal input to a second scan line 80615, and a signal input to a third scan line 80614, respectively.

A pixel structure shown in FIG. 70 is not limited thereto. For example, a switch, a resistor, a capacitor, a transistor, a logic circuit, or the like may be added to the pixel in FIG. 70. For example, the second switch 80602 may include a p-channel transistor or an n-channel transistor, the third switch 80603 may include a transistor with polarity opposite to that of the second switch 80602, and the second switch 80602 and the third switch 80603 may be controlled by the same scan line.

A structure and an operation of a pixel called a current input pixel are described. A current input pixel can be applied to digital gray scale drive and analog gray scale drive.

Figure 71:
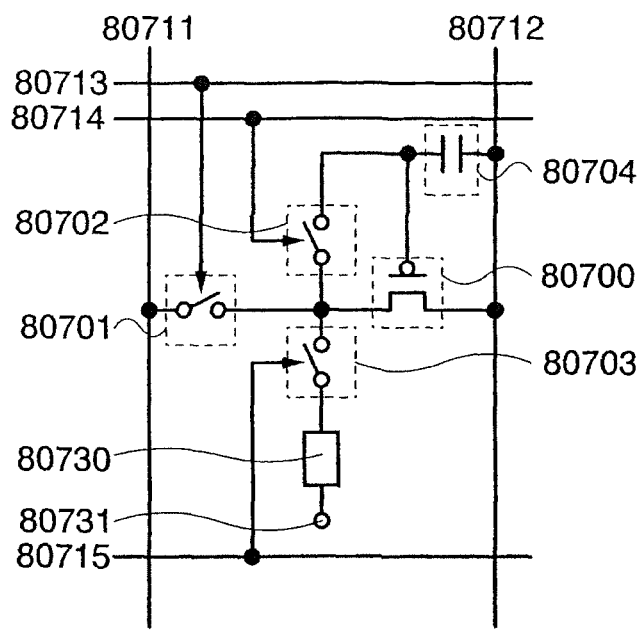
FIG. 71 shows a structure of a pixel in a semiconductor device according to the invention.

FIG. 71 is a diagram showing an example of a structure of a pixel called a current input pixel.

The pixel in FIG. 71 includes a driving transistor 80700, a first switch 80701, a second switch 80702, a third switch 80703, a capacitor 80704, and a light-emitting element 80730. A gate of the driving transistor 80700 is connected to a signal line 80711 through the second switch 80702 and the first switch 80701 in this order. Further, the gate of the driving transistor 80700 is connected to a power supply line 80712 through the capacitor 80704. A first electrode of the driving transistor 80700 is connected to the power supply line 80712. A second electrode of the driving transistor 80700 is connected to the signal line 80711 through the first switch 80701. Further, the second electrode of the driving transistor 80700 is connected to a first electrode of the light-emitting element 80730 through the third switch 80703. A second electrode of the light-emitting element 80730 corresponds to a common electrode 80731. Note that on/off of the first switch 80701, the second switch 80702, and the third switch 80703 is controlled by a signal input to a first scan line 80713, a signal input to a second scan line 80714, and a signal input to a third scan line 80715, respectively.

A pixel structure shown in FIG. 71 is not limited thereto. For example, a switch, a resistor, a capacitor, a transistor, a logic circuit, or the like may be added to the pixel in FIG. 71. For example, the first switch 80701 may include a p-channel transistor or an n-channel transistor, the second switch 80702 may include a transistor with the same polarity as that of the first switch 80701, and the first switch 80701 and the second switch 80702 may be controlled by the same scan line. The second switch 80702 may be provided between the gate of the driving transistor 80700 and the signal line 80711.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 16

In this embodiment mode, a pixel structure of a display device is described. In particular, a pixel structure of a display device using an organic EL element is described.

Figure 72A:
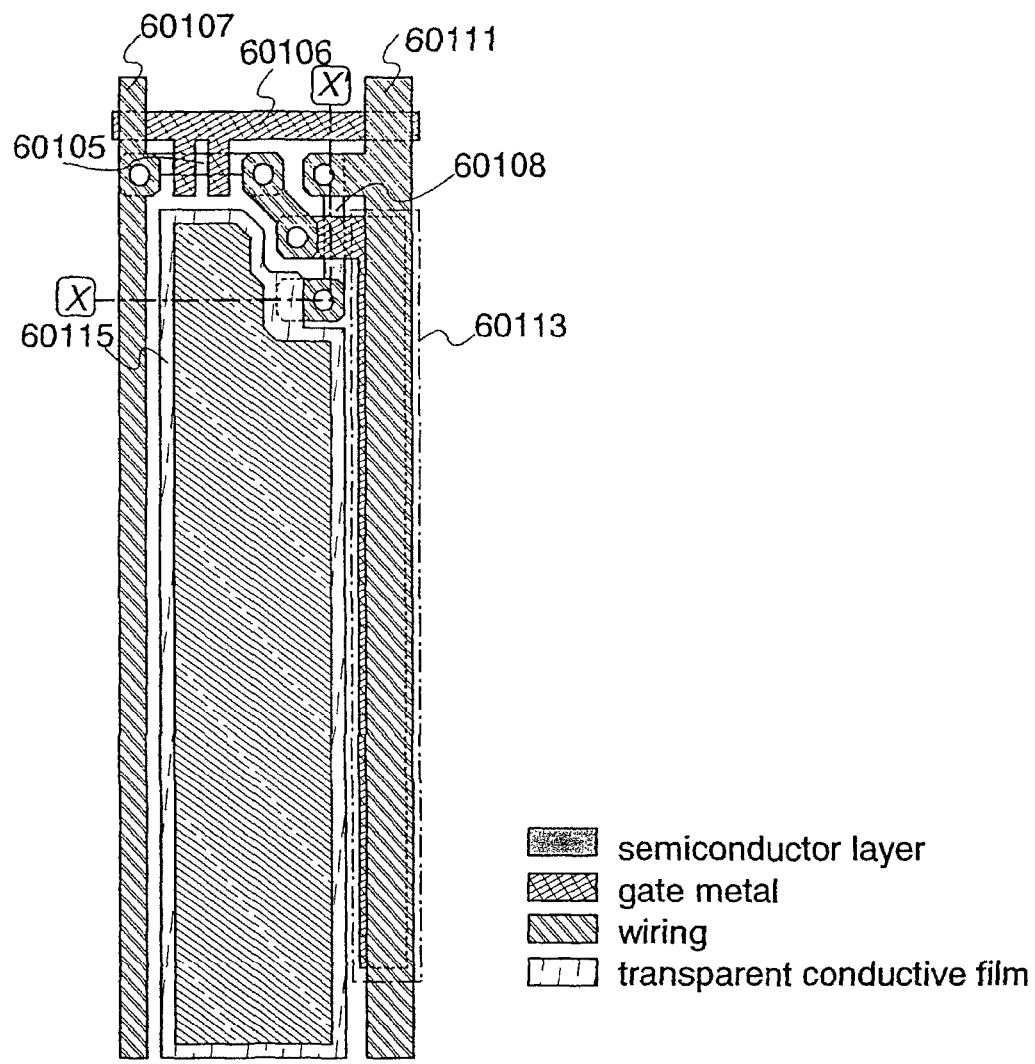
FIG. 72A shows an example of a pixel layout of a semiconductor device according to the invention.
Figure 72B:
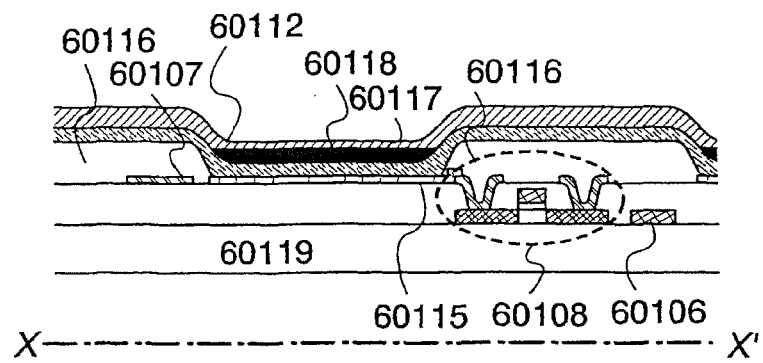
FIG. 72B is a cross-sectional view thereof.

FIG. 72A shows an example of a top plan view (a layout diagram) of a pixel including two transistors. FIG. 72B shows an example of a cross-sectional view along X-X' in FIG. 72A.

FIGS. 72A and 72B show a first transistor 60105, a first wiring 60106, a second wiring 60107, a second transistor 60108, a third wiring 60111, an opposite electrode 60112, a capacitor 60113, a pixel electrode 60115, a partition wall 60116, an organic conductive film 60117, an organic thin film 60118, and a substrate 60119. Note that it is preferable that the first transistor 60105 be used as a switching transistor, the second transistor 60108 as a driving transistor, the first wiring 60106 as a gate signal line, the second wiring 60107 as a source signal line, and the third wiring 60111 as a current supply line.

A gate electrode of the first transistor 60105 is electrically connected to the first wiring 60106, one of a source electrode and a drain electrode of the first transistor 60105 is electrically connected to the second wiring 60107, and the other of the source electrode or the drain electrode of the first transistor 60105 is electrically connected to a gate electrode of the second transistor 60108 and one electrode of the capacitor 60113. Note that the gate electrode of the first transistor 60105 includes a plurality of gate electrodes. Accordingly, a leakage current in the off state of the first transistor 60105 can be reduced.

One of a source electrode and a drain electrode of the second transistor 60108 is electrically connected to the third wiring 60111, and the other of the source electrode or the drain electrode of the second transistor 60108 is electrically connected to the pixel electrode 60115. Accordingly, a current flowing to the pixel electrode 60115 can be controlled by the second transistor 60108.

The organic conductive film 60117 is provided over the pixel electrode 60115, and the organic thin film 60118 (an organic compound layer) is further provided thereover. The opposite electrode 60112 is provided over the organic thin film 60118 (the organic compound layer). Note that the opposite electrode 60112 may be formed over a surface of all pixels to be commonly connected to all the pixels, or may be patterned using a shadow mask or the like.

Light emitted from the organic thin film 60118 (the organic compound layer) is transmitted through either the pixel electrode 60115 or the opposite electrode 60112.

In FIG. 72B, the case where light is emitted to the pixel electrode side, that is, a side on which the transistor and the like are formed is referred to as bottom emission; and the case where light is emitted to the opposite electrode side is referred to as top emission.

In the case of bottom emission, it is preferable that the pixel electrode 60115 be formed of a light-transmitting conductive film. In the case of top emission, it is preferable that the opposite electrode 60112 be formed of a light-transmitting conductive film.

In a light-emitting device for color display, EL elements having respective light emission colors of RGB may be separately formed, or an EL element with a single color may be formed over an entire surface uniformly and light emission of RGB can be obtained by using a color filter.

Note that the structures shown in FIGS. 72A and 72B are examples, and various structures can be employed for a pixel layout, a cross-sectional structure, a stacking order of electrodes of an EL element, and the like, as well as the structures shown in FIGS. 72A and 72B. Further, as a light-emitting element, various elements such as a crystalline element such as an LED, and an element formed of an inorganic thin film can be used as well as the element formed of the organic thin film shown in the drawing.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 17

In this embodiment mode, a structure of an EL element is described. In particular, a structure of an organic EL element is described.

A structure of a mixed junction EL element is described. As an example, a structure is described, which includes a layer (a mixed layer) in which a plurality of materials among a hole injecting material, a hole transporting material, a light-emitting material, an electron transporting material, an electron injecting material, and the like are mixed (hereinafter referred to as a mixed junction type EL element), which is different from a stacked-layer structure where a hole injecting layer formed of a hole injecting material, a hole transporting layer formed of a hole transporting material, a light-emitting layer formed of a light-emitting material, an electron transporting layer formed of an electron transporting material, an electron injecting layer formed of an electron injecting material, and the like are clearly distinguished.

FIGS. 73A to 73E are schematic views each showing a structure of a mixed junction type EL element. Note that a layer interposed between the anode 190101 and the cathode 190102 corresponds to an EL layer.

Figure 73A:
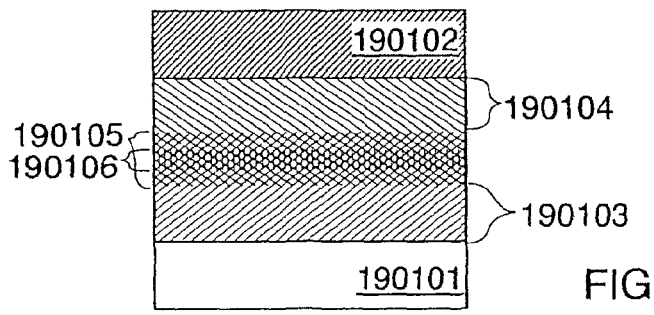
FIGS. 73A to 73E are cross-sectional views of display elements in a semiconductor device according to the invention.

In the structure shown in FIG. 73A, the EL layer includes the EL layer includes a hole transporting region 190103 formed of a hole transporting material and an electron transporting region 190104 formed of an electron transporting material. The hole transporting region 190103 is closer to the anode than the electron transporting region 190104. A mixed region 190105 including both the hole transporting material and the electron transporting material is provided between the hole transporting region 190103 and the electron transporting region 190104.

In the direction from the anode 190101 to the cathode 190102, a concentration of the hole transporting material in the mixed region 190105 is decreased and a concentration of the electron transporting material in the mixed region 190105 is increased.

A concentration gradient can be freely set. For example, a ratio of concentrations of each functional material may be changed (a concentration gradient may be formed) in the mixed region 190105 including both the hole transporting material and the electron transporting material, without including the hole transporting layer 190103 formed of only the hole transporting material. Alternatively, a ratio of concentrations of each functional material may be changed (a concentration gradient may be formed) in the mixed region 190105 including both the hole transporting material and the electron transporting material, without including the hole transporting layer 190103 formed of only the hole transporting material and the electron transporting layer 190104 formed of only the electron transporting material. A ratio of concentrations may be changed depending on a distance from the anode or the cathode. Further, the ratio of concentrations may be changed continuously.

A region 190106 to which a light-emitting material is added is included in the mixed region 190105. A light emission color of the EL element can be controlled by the light-emitting material. Further, carriers can be trapped by the light-emitting material. As the light-emitting material, various fluorescent dyes as well as a metal complex having a quinoline skeleton, a benzooxazole skeleton, or a benzothiazole skeleton can be used. The light emission color of the EL element can be controlled by adding the light-emitting material.

As the anode 190101, an electrode material having a high work function is preferably used in order to inject holes efficiently. For example, a transparent electrode formed of indium tin oxide (ITO), indium zinc oxide (IZO), ZnO, $SnO_2$, $In_2O_3$, or the like can be used. When a light-transmitting property is not needed, the anode 190101 may be formed of an opaque metal material.

As the hole transporting material, an aromatic amine compound or the like can be used.

As the electron transporting material, a metal complex having a quinoline derivative, 8-quinolinol, or a derivative thereof as a ligand (especially tris(8-quinolinolato)aluminum ($Alq_3$)), or the like can be used.

As the cathode 190102, an electrode material having a low work function is preferably used in order to inject electrons efficiently. For example, a metal such as aluminum, indium, magnesium, silver, calcium, barium, or lithium can be used by itself. Alternatively, an alloy of the aforementioned metal or an alloy of the aforementioned metal and another metal may be used.

Figure 73B:
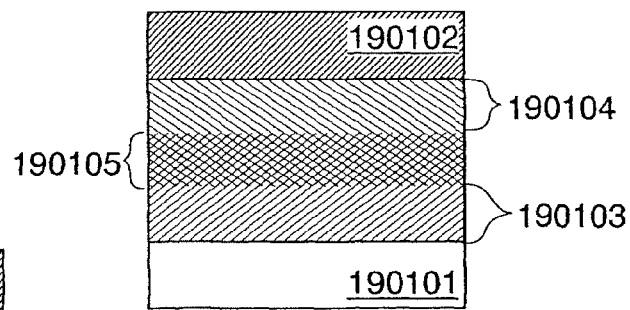

FIG. 73B is the schematic view of the structure of the EL element, which is different from that of FIG. 73A. Note that the same portions as those in FIG. 73A are denoted by the same reference numerals, and description thereof is omitted.

In FIG. 73B, a region to which a light-emitting material is added is not included. However, when a material (electron-transporting and light-emitting material) having both an electron transporting property and a light-emitting property, for example, tris(8-quinolinolato)aluminum ($Alq_3$) is used as a material added to the electron transporting region 190104, light emission can be performed.

Alternatively, as a material added to the hole transporting region 190103, a material (a hole-transporting and light-emitting material) having both a hole transporting property and a light-emitting property may be used.

Figure 73C:
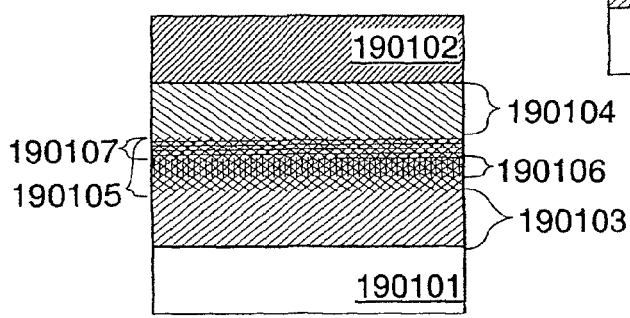

FIG. 73C is the schematic view of the structure of the EL element, which is different from those of FIGS. 73A and 73B. Note that the same portions as those in FIGS. 73A and 73B are denoted by the same reference numerals, and description thereof is omitted.

In FIG. 73C, a region 190107 included in the mixed region 190105 is provided, to which a hole blocking material having a larger energy difference between the highest occupied molecular orbital and the lowest unoccupied molecular orbital than the hole transporting material is added. The region 190107 to which the hole blocking material is added is provided closer to the cathode 190102 than the region 190106 to which the light-emitting material is added in the mixed region 190105; thus, a recombination rate of carriers and light emission efficiency can be increased. The aforementioned structure provided with the region 190107 to which the hole blocking material is added is especially effective in an EL element which utilizes light emission (phosphorescence) by a triplet exciton.

Figure 73D:

FIG. 73D is the schematic view of the structure of the EL element, which is different from those of FIGS. 73A to 73C. Note that the same portions as those in FIGS. 73A to 73C are denoted by the same reference numerals, and description thereof is omitted.

In FIG. 73D, a region 190108 included in the mixed region 190105 is provided, to which an electron blocking material having a larger energy difference between the highest occupied molecular orbital and the lowest unoccupied molecular orbital than the electron transporting material is added. The region 190108 to which the electron blocking material is added is provided closer to the anode 190101 than the region 190106 to which the light-emitting material is added in the mixed region 190105; thus, a recombination rate of carriers and light emission efficiency can be increased. The aforementioned structure provided with the region 190108 to which the electron blocking material is added is especially effective in an EL element which utilizes light emission (phosphorescence) by a triplet exciton.

Figure 73E:
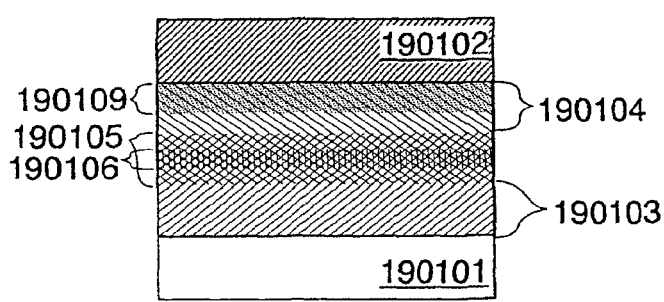

FIG. 73E is the schematic view of the structure of the mixed junction type EL element, which is different from those of FIGS. 73A to 73D. FIG. 73E shows an example of a structure where a region 190109 to which a metal material is added is included in part of an EL layer in contact with an electrode of the EL element. In FIG. 73E, the same portions as those in FIGS. 73A to 73D are denoted by the same reference numerals, and description thereof is omitted. In FIG. 73E, MgAg (an Mg—Ag alloy) may be used as the cathode 190102, and the region 190109 to which Al (aluminum) alloy is added may be included in a region of the electron transporting region 190104 to which the electron transporting material is added, which is in contact with the cathode 190102, for example. By the aforementioned structure, oxidation of the cathode can be prevented, and electron injection efficiency from the cathode can be increased. Therefore, the lifetime of the mixed junction type EL element can be extended, and a driving voltage can be lowered.

As a method of forming the aforementioned mixed junction type EL element, a co-evaporation method or the like can be used.

In the mixed junction type EL elements as shown in FIGS. 73A to 73E, a clear interface between the layers does not exist, and charge accumulation can be reduced. Thus, the lifetime of the EL element can be extended, and a driving voltage can be lowered.

Note that the structures shown in FIGS. 73A to 73E can be implemented in free combination with each other.

A structure of the mixed junction type EL element is not limited to those described above, and various structures can be freely used.

An organic material which forms an EL layer of an EL element may be a low molecular material or a high molecular material, and both of the materials may be used. When a low molecular material is used as an organic compound material, a film can be formed by an evaporation method. When a high molecular material is used as the EL layer, the high molecular material is dissolved in a solvent and a film can be formed by a spin coating method or an ink-jet method.

The EL layer may be formed of a middle molecular material. In this specification, a middle molecule organic light-emitting material denotes an organic light-emitting material without a sublimation property and with a polymerization degree of approximately 20 or less. When a middle molecular material is used as the EL layer, a film can be formed by an ink-jet method or the like.

A low molecular material, a high molecular material, and a middle molecular material may be used in combination.

An EL element may utilize either light emission (fluorescence) by a singlet exciton or light emission (phosphorescence) by a triplet exciton.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 18

In this embodiment mode, a structure of an EL element is described. In particular, a structure of an inorganic EL element is described.

As a base material to be used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (MN), gallium nitride (GaN), indium nitride (InN), or the like can be used, for example. Further, zinc selenide (ZnSe), zinc telluride (ZnTe), or the like; or a ternary mixed crystal such as calcium gallium sulfide ($CaGa_2S_4$), strontium gallium sulfide ($SrGa_2S_4$), or barium gallium sulfide ($BaGa_2S_4$) may be used.

As a luminescence center for localized light emission, manganese (Mn), copper (Cu), samarium (Sm), terbium (Tb), erbium (Er), thulium (Tm), europium (Eu), cerium (Ce), praseodymium (Pr), or the like can be used. Further, a halogen element such as fluorine (F) or chlorine (CO may be added for charge compensation.

On the other hand, as a luminescence center for donor-acceptor recombination light emission, a light-emitting material including a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

Figure 74A:
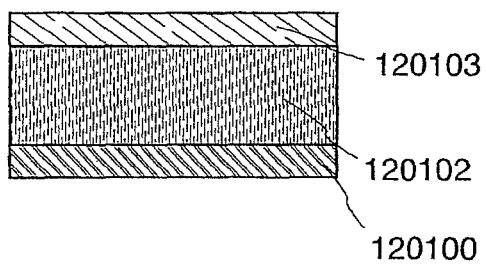
FIGS. 74A to 74C are cross-sectional views of display elements in a semiconductor device according to the invention.
Figure 74B:
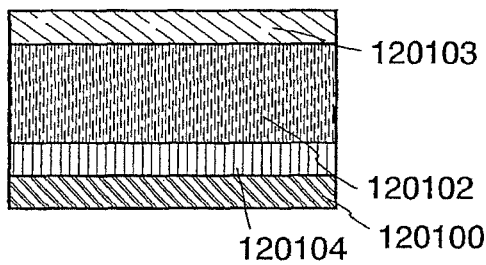
Figure 74C:
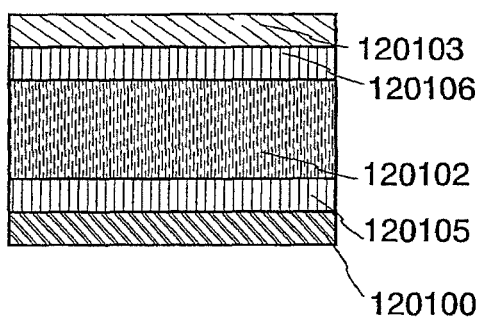

FIGS. 74A to 74C each show an example of a thin-film type inorganic EL element which can be used as a light-emitting element. In FIGS. 74A to 74C, the light-emitting element includes a first electrode layer 120100, an electroluminescent layer 120102, and a second electrode layer 120103.

The light-emitting elements in FIGS. 74B and 74C each have a structure where an insulating film is provided between the electrode layer and the electroluminescent layer in the light-emitting element in FIG. 74A. The light-emitting element in FIG. 74B includes an insulating film 120104 between the first electrode layer 120100 and the electroluminescent layer 120102. The light-emitting element in FIG. 74C includes an insulating film 120105 between the first electrode layer 120100 and the electroluminescent layer 120102, and an insulating film 120106 between the second electrode layer 120103 and the electroluminescent layer 120102. Accordingly, the insulating film may be provided between the electroluminescent layer and one of the electrode layers interposing the electroluminescent layer, or may be provided between the electroluminescent layer and each of the electrode layers interposing the electroluminescent layer. Further, the insulating film may be a single layer or stacked layers including a plurality of layers.

Figure 75A:
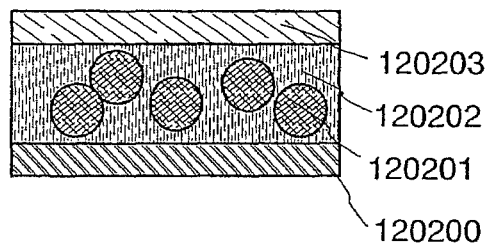
FIGS. 75A to 75C are cross-sectional views of display elements in a semiconductor device according to the invention.
Figure 75B:
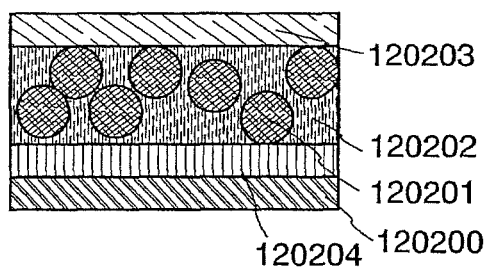
Figure 75C:
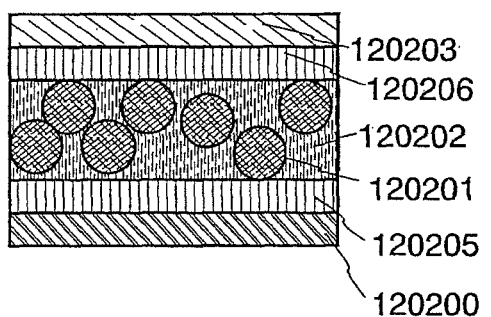

FIGS. 75A to 75C each show an example of a dispersion type inorganic EL element which can be used as a light-emitting element. A light-emitting element in FIG. 75A has a stacked-layer structure of a first electrode layer 120200, an electroluminescent layer 120202, and a second electrode layer 120203. The electroluminescent layer 120202 includes a light-emitting material 120201 held by a binder.

The light-emitting elements in FIGS. 75B and 75C each have a structure where an insulating film is provided between the electrode layer and the electroluminescent layer in the light-emitting element in FIG. 75A. The light-emitting element in FIG. 75B includes an insulating film 120204 between the first electrode layer 120200 and the electroluminescent layer 120202. The light-emitting element in FIG. 75C includes an insulating film 120205 between the first electrode layer 120200 and the electroluminescent layer 120202, and an insulating film 120206 between the second electrode layer 120203 and the electroluminescent layer 120202. Accordingly, the insulating film may be provided between the electroluminescent layer and one of the electrode layers interposing the electroluminescent layer, or may be provided between the electroluminescent layer and each of the electrode layers interposing the electroluminescent layer. Further, the insulating film may be a single layer or stacked layers including a plurality of layers.

The insulating film 120204 is provided in contact with the first electrode layer 120200 in FIG. 75B; however, the insulating film 120204 may be provided in contact with the second electrode layer 120203 by reversing the positions of the insulating film and the electroluminescent layer.

It is preferable that a material which can be used for the insulating films such as the insulating film 120104 in FIG. 74B and the insulating film 120204 in FIG. 75B has high withstand voltage and dense film quality. Further, the material preferably has high dielectric constant. For example, silicon oxide ($SiO_2$), yttrium oxide ($Y_2O_3$), titanium oxide ($TiO_2$), aluminum oxide (Al$_2$O$_3$), hafnium oxide (HfO$_2$), tantalum oxide (Ta$_2$O$_5$), barium titanate (BaTiO$_3$), strontium titanate (SrTiO$_3$), lead titanate (PbTiO$_3$), silicon nitride (Si$_3$N$_4$), or zirconium oxide (ZrO$_2$); or a mixed film of those materials or a stacked-layer film including two or more of those materials can be used. The insulating film can be formed by sputtering, evaporation, CVD, or the like. Alternatively, the insulating film may be formed by dispersing particles of these insulating materials in a binder. A binder material may be formed using a material similar to that of a binder contained in the electroluminescent layer, by using a method similar thereto. The thickness of the insulating film is not particularly limited, but preferably in the range of 10 to 1000 nm.

The light-emitting element can emit light when a voltage is applied between the pair of electrode layers interposing the electroluminescent layer. The light-emitting element can operate with DC drive or AC drive.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 19

In this embodiment mode, an example of a display device is described. In particular, the case where a display device is optically treated is described.

Figure 76A:
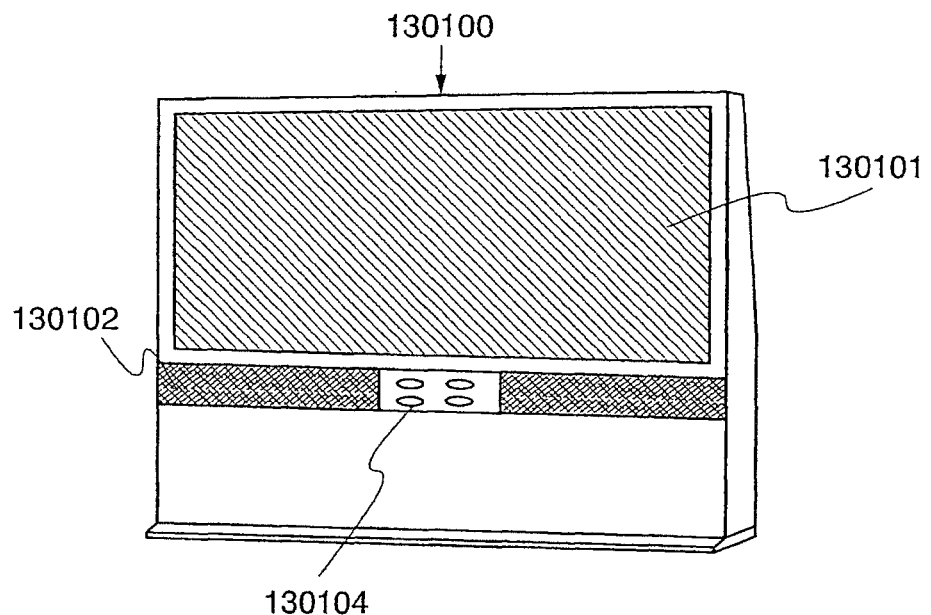
FIGS. 76A and 76B each show a structure of a semiconductor device according to the invention.
Figure 76B:
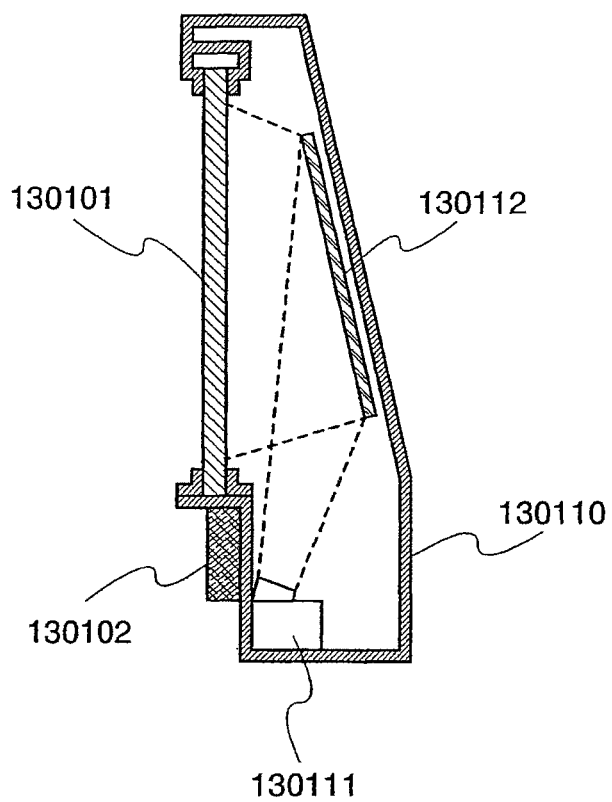

A rear projection display device 130100 in FIGS. 76A and 76B is provided with a projector unit 130111, a mirror 130112, and a screen panel 130101. The rear projection display device 130100 may also be provided with a speaker 130102 and operation switches 130104. The projector unit 130111 is provided at a lower portion of a housing 130110 of the rear projection display device 130100, and projects incident light for projecting an image based on a video signal to the mirror 130112. The rear projection display device 130100 displays an image projected from a rear surface of the screen panel 130101.

Figure 77:
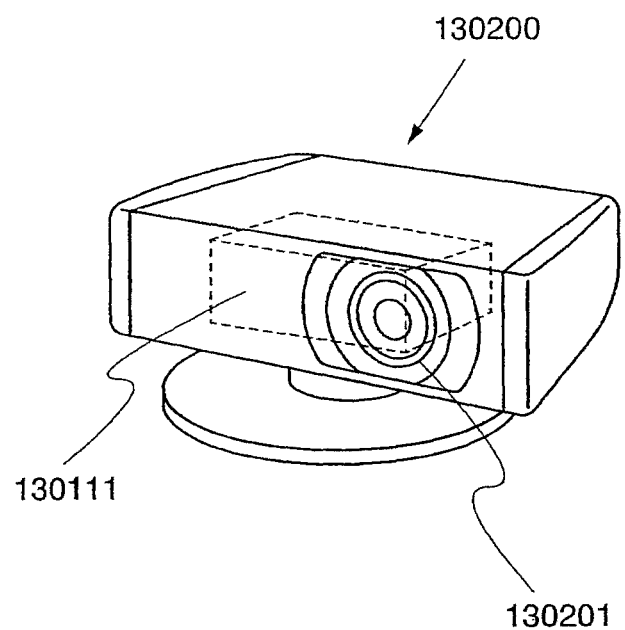
FIG. 77 shows a structure of a semiconductor device according to the invention.

FIG. 77 shows a front projection display device 130200. The front projection display device 130200 is provided with the projector unit 130111 and a projection optical system 130201. The projection optical system 130201 projects an image to a screen or the like provided at the front.

Hereinafter, a structure of the projector unit 130111 which is applied to the rear projection display device 130100 in FIGS. 76A and 76B and the front projection display device 130200 in FIG. 77 is described.

Figure 78:
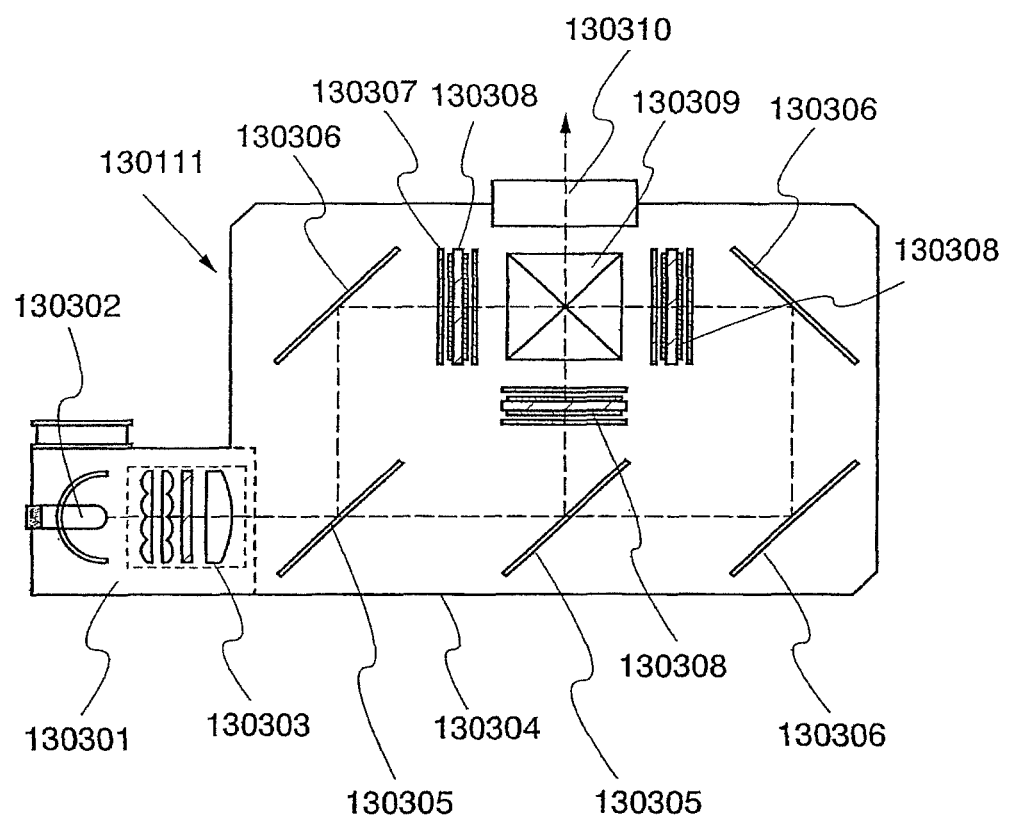
FIG. 78 shows a structure of a semiconductor device according to the invention.

FIG. 78 shows a structure example of the projector unit 130111. The projector unit 130111 is provided with a light source unit 130301 and a modulation unit 130304. The light source unit 130301 is provided with a light source optical system 130303 including lenses and a light source lamp 130302. The light source lamp 130302 is stored in a housing so that stray light is not scattered. As the light source lamp 130302, a high-pressure mercury lamp or a xenon lamp, for example, which can emit a large amount of light is used. The light source optical system 130303 is provided with an optical lens, a film having a function to polarize light, a film for adjusting phase difference, an IR film, or the like as appropriate. The light source unit 130301 is provided so that incident light is incident on the modulation unit 130304. The modulation unit 130304 is provided with a plurality of display panels 130308, a color filter, a dichroic mirror 130305, a total reflection mirror 130306, a retardation plate 130307, a prism 130309, and a projection optical system 130310. Light emitted from the light source unit 130301 is split into a plurality of optical paths by the dichroic mirror 130305.

Each optical path is provided with a color filter which transmits light with a predetermined wavelength or wavelength range and the display panel 130308. The transmissive display panel 130308 modulates transmitted light based on a video signal. Light of each color transmitted through the display panel 130308 is incident on the prism 130309, and an image is displayed on the screen through the projection optical system 130310. Note that a Fresnel lens may be provided between the mirror and the screen. Projected light which is projected by the projector unit 130111 and reflected by the mirror is converted into generally parallel light by the Fresnel lens to be projected on the screen. Displacement between a chief ray and an optical axis is preferably ±10° or less, and more preferably, ±5° or less.

Figure 79:
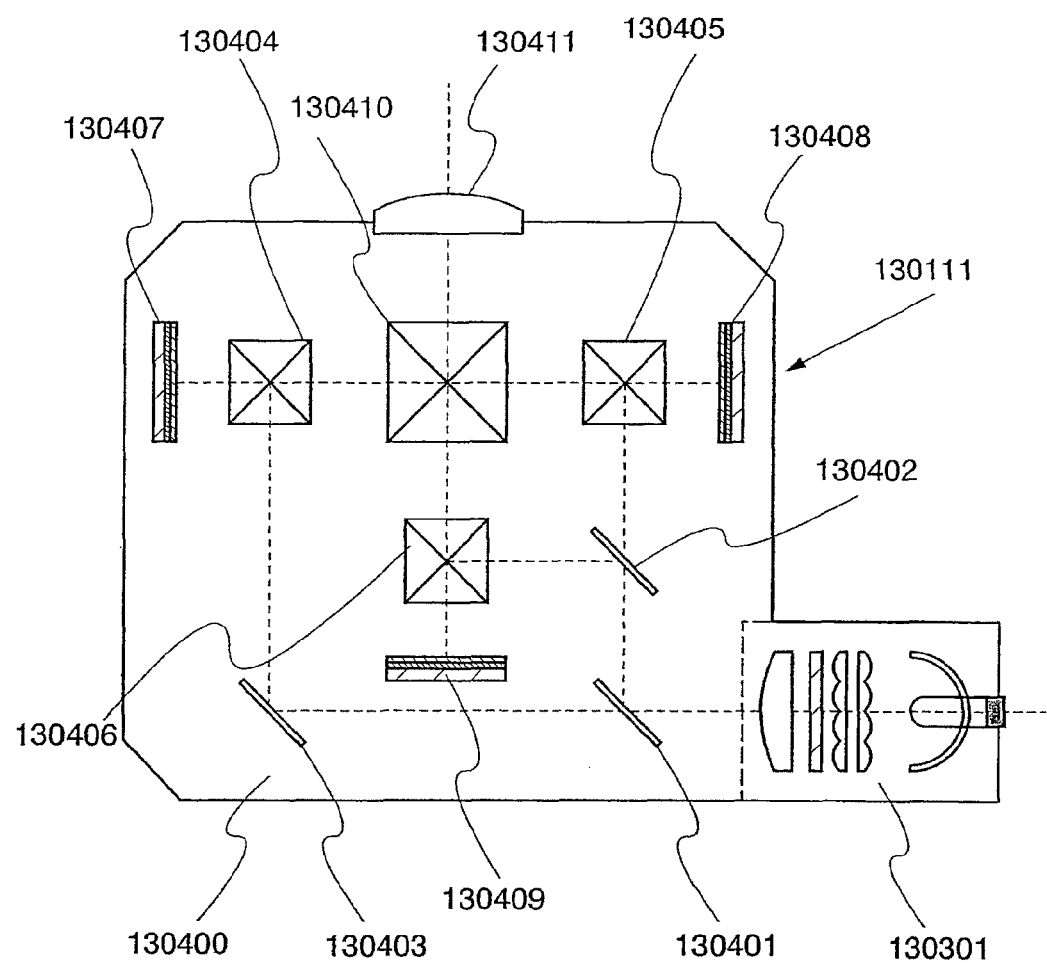
FIG. 79 shows a structure of a semiconductor device according to the invention.

The projector unit 130111 shown in FIG. 79 is provided with reflective display panels 130407, 130408, and 130409.

The projector unit 130111 in FIG. 79 is provided with the light source unit 130301 and a modulation unit 130400. The light source unit 130301 may have a structure similar to FIG. 78. Light from the light source unit 130301 is split into a plurality of optical paths by dichroic mirrors 130401 and 130402 and a total reflection mirror 130403 to be incident on polarization beam splitters 130404, 130405, and 130406. The polarization beam splitters 130404, 130405, and 130406 are provided corresponding to the reflective display panels 130407, 130408, and 130409 which correspond to respective colors. The reflective display panels 130407, 130408, and 130409 modulate reflected light based on a video signal. Light of each color, which are reflected by the reflective display panels 130407, 130408, and 130409, is incident on a prism 130410 to be composed, and projected through a projection optical system 130411.

Among light emitted from the light source unit 130301, only light in a wavelength region of red is transmitted through the dichroic mirror 130401 and light in wavelength regions of green and blue is reflected by the dichroic mirror 130401. Further, only the light in the wavelength region of green is reflected by the dichroic mirror 130402. The light in the wavelength region of red, which is transmitted through the dichroic mirror 130401, is reflected by the total reflection mirror 130403 and incident on the polarization beam splitter 130404. The light in the wavelength region of blue is incident on the polarization beam splitter 130405. The light in the wavelength region of green is incident on the polarization beam splitter 130406. The polarization beam splitters 130404, 130405, and 130406 have a function to split incident light into P-polarized light and S-polarized light and a function to transmit only P-polarized light. The reflective display panels 130407, 130408, and 130409 polarize incident light based on a video signal.

Only the S-polarized light corresponding to each color is incident on the reflective display panels 130407, 130408, and 130409 corresponding to each color. Note that the reflective display panels 130407, 130408, and 130409 may be liquid crystal panels. In this case, the liquid crystal panel operates in an electrically controlled birefringence (ECB) mode. Liquid crystal molecules are vertically aligned at an angle to a substrate. Accordingly, in the reflective display panels 130407, 130408, and 130409, when a pixel is turned off, display molecules are aligned not to change a polarization state of incident light so as to reflect the incident light. When the pixel is turned on, alignment of the display molecules is changed, and the polarization state of the incident light is changed.

The projector unit 130111 in FIG. 79 can be applied to the rear projection display device 130100 in FIGS. 76A and 76B and the front projection display device 130200 in FIG. 77.

Figure 80A:
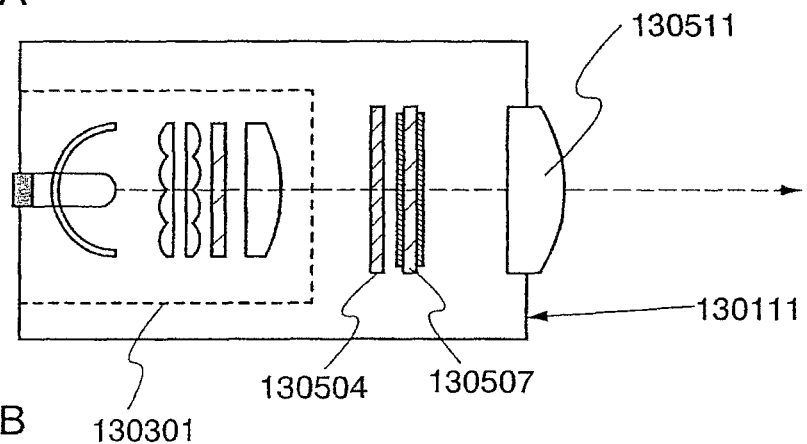
FIGS. 80A to 80C each show a structure of a semiconductor device according to the invention.
Figure 80B:
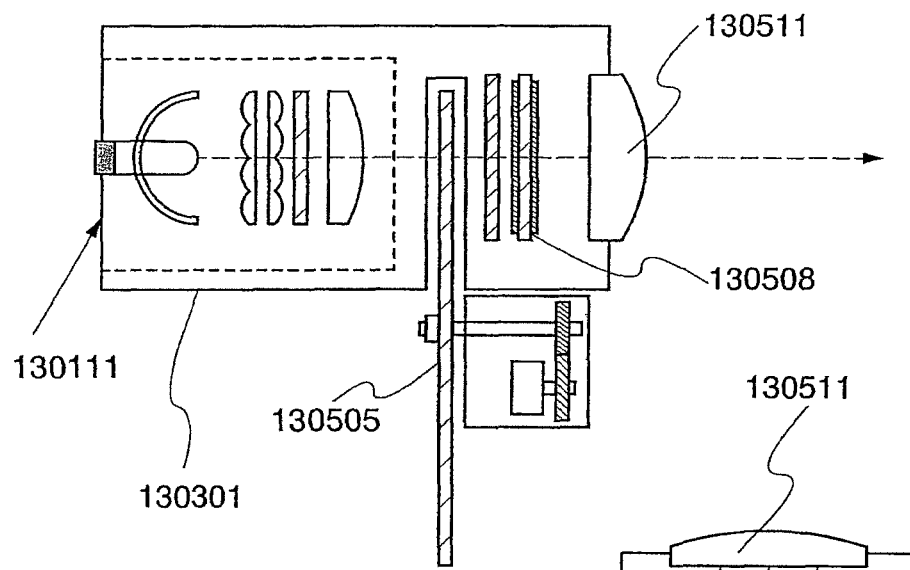
Figure 80C:
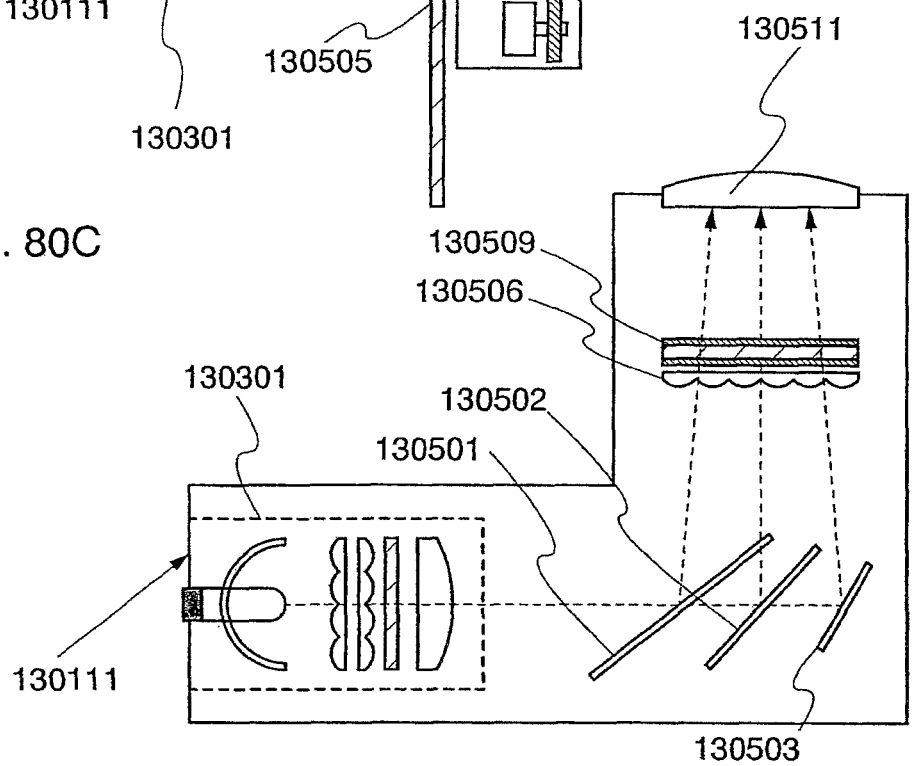

FIGS. 80A to 80C each show a single-panel type projector unit. The projector unit 130111 shown in FIG. 80A is provided with the light source unit 130301, a display panel 130507, a projection optical system 130511, and a retardation plate 130504. The projection optical system 130511 includes one or a plurality of lenses. The display panel 130507 may be provided with a color filter.

FIG. 80B shows a structure of the projector unit 130111 operating in a field sequential mode. The field sequential mode corresponds to a mode in which color display is performed by light of respective colors such as red, green, and blue sequentially incident on a display panel with a time lag, without a color filter. A high definition image can be displayed particularly by combination with a display panel with high-speed response to change in input signal. The projector unit 130111 in FIG. 80B is provided with a rotating color filter plate 130505 including a plurality of color filters with red, green, blue, or the like between the light source unit 130301 and a display panel 130508.

FIG. 80C shows a structure of the projector unit 130111 with a color separation system using a micro lens, as a color display method. The color separation system corresponds to a system in which color display is realized by providing a micro lens array 130506 on the side of a display panel 130509, on which light is incident, and light of each color is emitted from each direction. The projector unit 130111 employing this system has little loss of light due to a color filter, so that light from the light source unit 130301 can be efficiently utilized. The projector unit 130111 in FIG. 80C is provided with dichroic mirrors 130501, 130502, and 130503 so that light of each color is emitted to the display panel 130509 from each direction.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 20

In this embodiment mode, examples of electronic devices are described.

Figure 81:
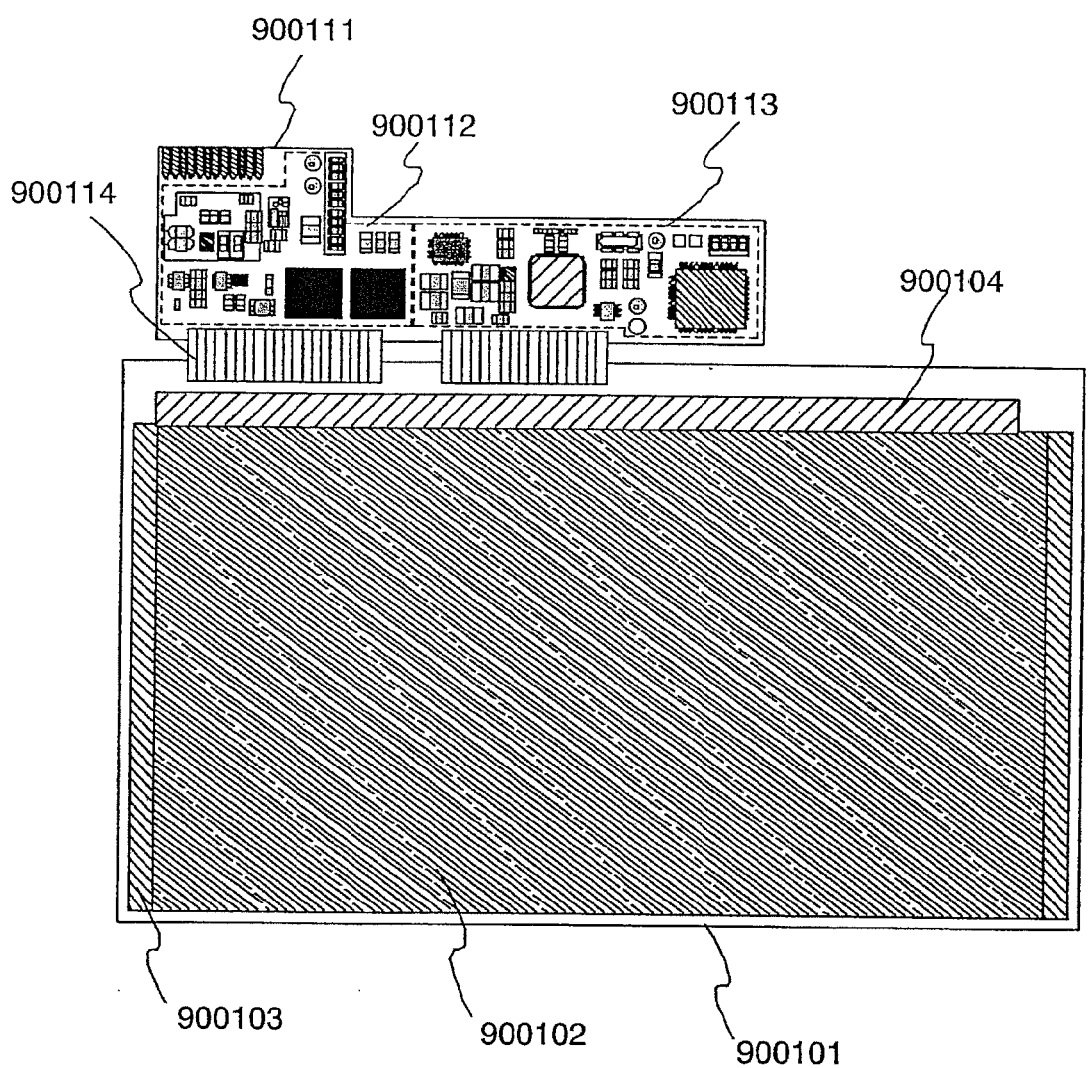
FIG. 81 shows a structure of a semiconductor device according to the invention.

FIG. 81 shows a display panel module combining a display panel 900101 and a circuit board 900111. The display panel 900101 includes a pixel portion 900102, a scan line driver circuit 900103, and a signal line driver circuit 900104. The circuit board 900111 is provided with a control circuit 900112, a signal dividing circuit 900113, and the like, for example. The display panel 900101 and the circuit board 900111 are connected to each other by a connection wiring 900114. An FPC or the like can be used as the connection wiring.

Figure 86:
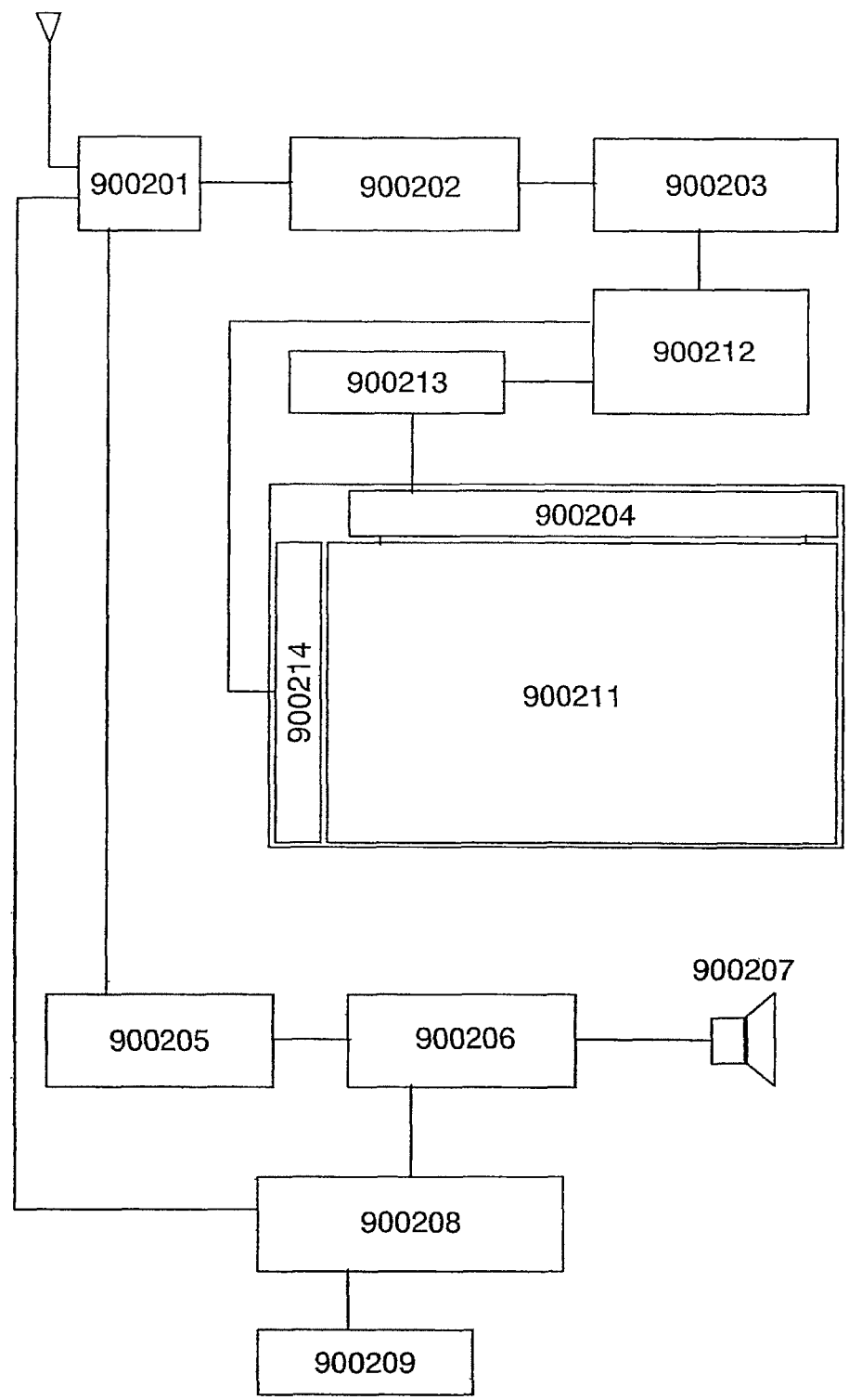
FIG. 86 shows a structure of a semiconductor device according to the invention.

FIG. 86 is a block diagram showing a main structure of a television receiver. A tuner 900201 receives a video signal and an audio signal. The video signals are processed by an video signal amplifier circuit 900202; a video signal processing circuit 900203 which converts a signal output from the video signal amplifier circuit 900202 into a color signal corresponding to each color of red, green and blue; and a control circuit 900212 which converts the video signal into the input specification of a driver circuit. The control circuit 900212 outputs a signal to each of a scan line driver circuit 900214 and a signal line driver circuit 900204. The scan line driver circuit 900214 and the signal line driver circuit 900204 drive a display panel 900211. When performing digital drive, a structure may be employed in which a signal dividing circuit 900213 is provided on the signal line side so that an input digital signal is divided into m signals (m is a positive integer) to be supplied.

Among the signals received by the tuner 900201, an audio signal is transmitted to an audio signal amplifier circuit 900205, and an output thereof is supplied to a speaker 900207 through an audio signal processing circuit 900206. A control circuit 900208 receives control information on receiving station (receiving frequency) and volume from an input portion 900209 and transmits signals to the tuner 900201 or the audio signal processing circuit 900206.

Figure 87A:
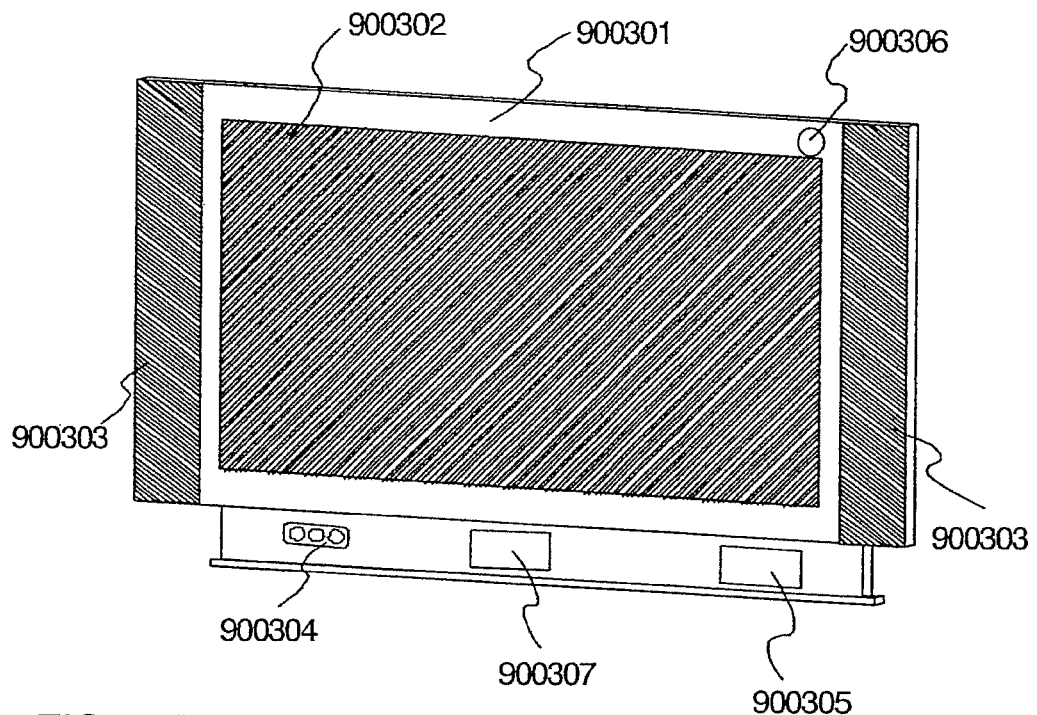
FIGS. 87A and 87B show electronic devices using a semiconductor device according to the invention.

FIG. 87A shows a television receiver incorporated with a display panel module, which is different from FIG. 86. In FIG. 87A, a display screen 900302 incorporated in a housing 900301 is formed using the display panel module. Note that speakers 900303, input means (an operation key 900304, a connection terminal 900305, a sensor 900306 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900307), and the like may be provided as appropriate.

Figure 87B:
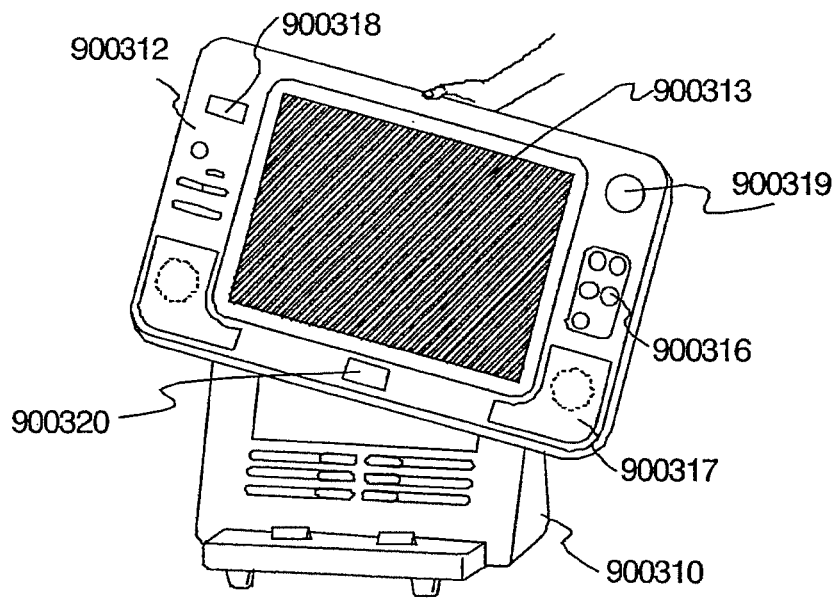

FIG. 87B shows a television receiver in which only a display can be carried wirelessly. The television receiver is provided with a display portion 900313, a speaker portion 900317, input means (an operation key 900316, a connection terminal 900318, a sensor 900319 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900320), and the like as appropriate. A battery and a signal receiver are incorporated in a housing 900312. The battery drives the display portion 900313, the speaker portion 900317, the sensor 900319, and the microphone 900320. The battery can be repeatedly charged by a charger 900310. The charger 900310 can transmit and receive a video signal and transmit the video signal to the signal receiver of the display. The device in FIG. 87B is controlled by the operation key 900316. Alternatively, the device in FIG. 87B can transmit a signal to the charger 900310 by operating the operation key 900316. That is, the device may be an image and audio interactive communication device. Further alternatively, by operating the operation key 900316, the device in FIG. 87B may transmit a signal to the charger 900310 and another electronic device is made to receive a signal which can be transmitted from the charger 900310; thus, the device in FIG. 87B can control communication of another electronic device. That is, the device may be a general-purpose remote control device. Note that the contents (or part thereof) described in each drawing of this embodiment mode can be applied to the display portion 900313.

Next, a structure example of a mobile phone is described with reference to FIG. 88.

A display panel 900501 is detachably incorporated in a housing 900530. The shape and size of the housing 900530 can be changed as appropriate in accordance with the size of the display panel 900501. The housing 900530 which fixes the display panel 900501 is fitted in a printed wiring board 900531 to be assembled as a module.

The display panel 900501 is connected to the printed wiring board 900531 through an FPC 900513. The printed wiring board 900531 is provided with a speaker 900532, a microphone 900533, a transmitting/receiving circuit 900534, a signal processing circuit 900535 including a CPU, a controller, and the like, and a sensor 900541 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an operation key 900536, a battery 900537, and an antenna 900540 are combined and stored in a housing 900539. A pixel portion of the display panel 900501 is provided to be seen from an opening window formed in the housing 900539.

In the display panel 900501, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 900501 by COG (Chip On Glass). Alternatively, the IC chip may be connected to a glass substrate by using TAB (Tape Automated Bonding) or a printed wiring board. With such a structure, power consumption of a display device can be reduced and operation time of the mobile phone per charge can be extended. Further, reduction in cost of the mobile phone can be realized.

Figure 88:
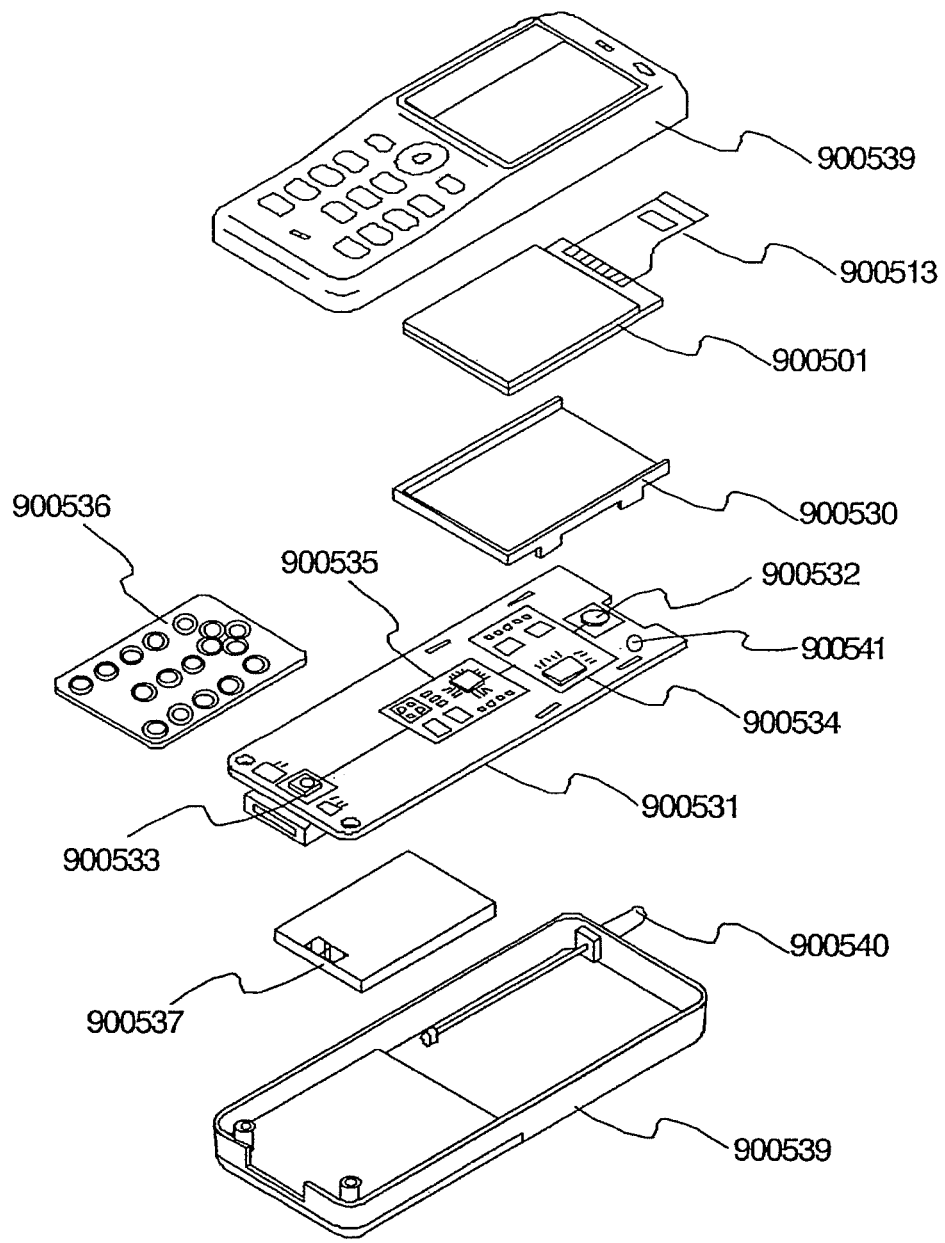
FIG. 88 shows a structure of a semiconductor device according to the invention.

The mobile phone in FIG. 88 has various functions such as, but not limited to, a function to display various kinds of information (e.g., a still image, a moving image, and a text image); a function to display a calendar, a date, the time, and the like on a display portion; a function to operate or edit the information displaying on the display portion; a function to control processing by various kinds of software (programs); a function of wireless communication; a function to communicate with another mobile phone, a fixed phone, or an audio communication device by using the wireless communication function; a function to connect with various computer networks by using the wireless communication function; a function to transmit or receive various kinds of data by using the wireless communication function; a function to operate a vibrator in accordance with incoming call, reception of data, or an alarm; and a function to generate a sound in accordance with incoming call, reception of data, or an alarm.

Figure 89A:
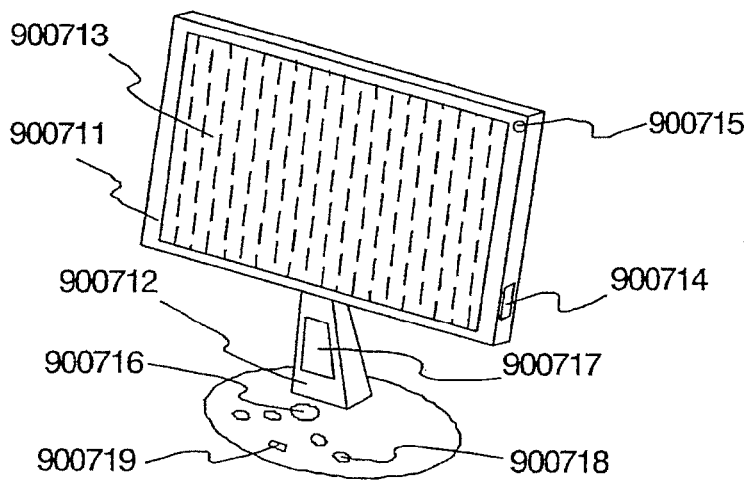
FIGS. 89A to 89C show electronic devices using a semiconductor device according to the invention.

FIG. 89A shows a display, which includes a housing 900711, a support base 900712, a display portion 900713, a speaker 900717, an LED lamp 900719, input means (a connection terminal 900714, a sensor 900715 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), a microphone 900716, and an operation key 900718), and the like. The display in FIG. 89A can have various functions such as, but not limited to, a function to display various kinds of information (e.g., a still image, a moving image, and a text image) on the display portion.

Figure 89B:
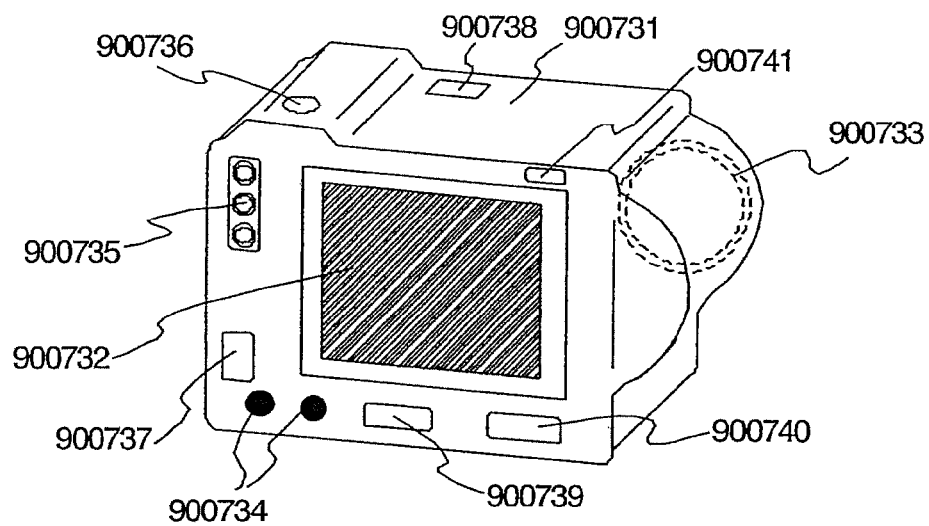

FIG. 89B shows a camera, which includes a main body 900731, a display portion 900732, a shutter button 900736, a speaker 900740, an LED lamp 900741, input means (an image receiving portion 900733, operation keys 900734, an external connection port 900735, a connection terminal 900737, a sensor 900738 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900739), and the like. The camera in FIG. 89B can have various functions such as, but not limited to, a function to photograph a still image or a moving image; a function to automatically adjust the photographed image (the still image or the moving image); a function to store the photographed image in a recording medium (provided externally or incorporated in the camera); and a function to display the photographed image on the display portion.

Figure 89C:
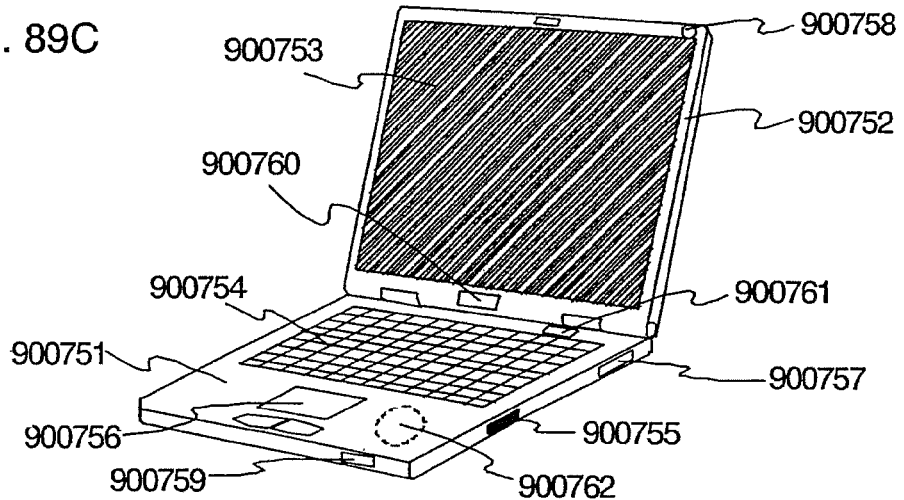

FIG. 89C shows a computer, which includes a main body 900751, a housing 900752, a display portion 900753, a speaker 900760, an LED lamp 900761, a reader/writer 900762, input means (a keyboard 900754, an external connection port 900755, a pointing device 900756, a connection terminal 900757, a sensor 900758 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900759), and the like. The computer in FIG. 89C can have various functions such as, but not limited to, a function to display various kinds of information (e.g., a still image, a moving image, and a text image) on the display portion; a function to control processing by various kinds of software (programs); a communication function such as wireless communication or wire communication; a function to connect with various computer networks by using the communication function; and a function to transmit or receive various kinds of data by using the communication function.

Figure 96A:
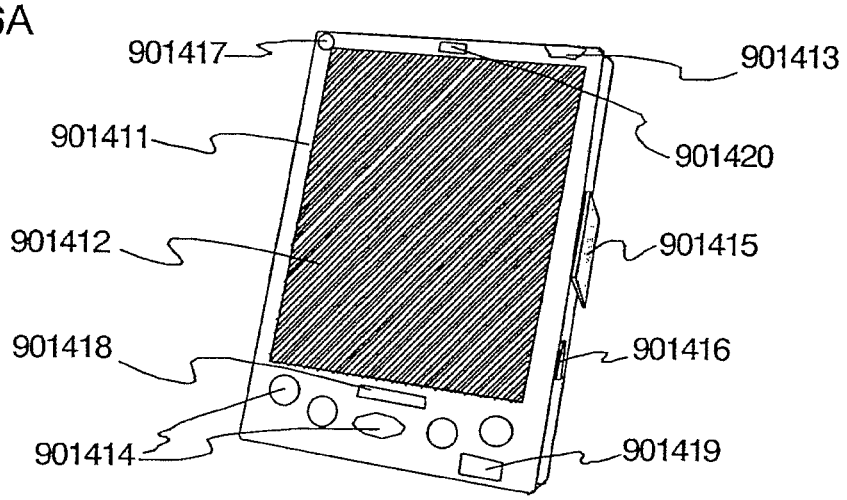
FIGS. 96A to 96C show electronic devices using a semiconductor device according to the invention.

FIG. 96A shows a mobile computer, which includes a main body 901411, a display portion 901412, a switch 901413, a speaker 901419, an LED lamp 901420, input means (operation keys 901414, an infrared port 901415, a connection terminal 901416, a sensor 901417 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901418), and the like. The mobile computer in FIG. 96A can have various functions such as, but not limited to, a function to display various kinds of information (e.g., a still image, a moving image, and a text image) on a display portion; a touch panel function provided on the display portion; a function to display a calendar, a date, the time, and the like on the display portion; a function to control processing by various kinds of software (programs); a function of wireless communication; a function to connect with various computer networks by using the wireless communication function; and a function to transmit or receive various kinds of data by using the wireless communication function.

Figure 96B:
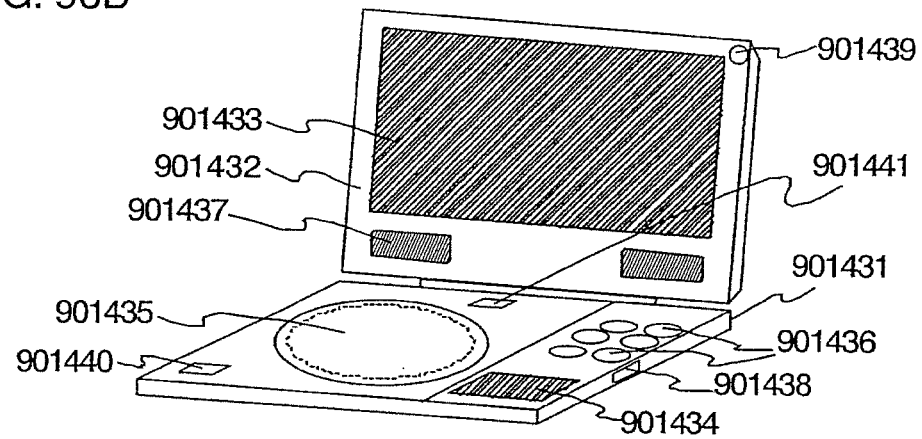

FIG. 96B shows a portable image reproducing device having a recording medium (e.g., a DVD reproducing device), which includes a main body 901431, a housing 901432, a display portion A 901433, a display portion B 901434, a speaker portion 901437, an LED lamp 901441, input means (a recording medium (e.g., DVD) reading portion 901435, operation keys 901436, a connection terminal 901438, a sensor 901439 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901440), and the like. The display portion A 901433 mainly displays image information and the display portion B 901434 mainly displays text information.

Figure 96C:
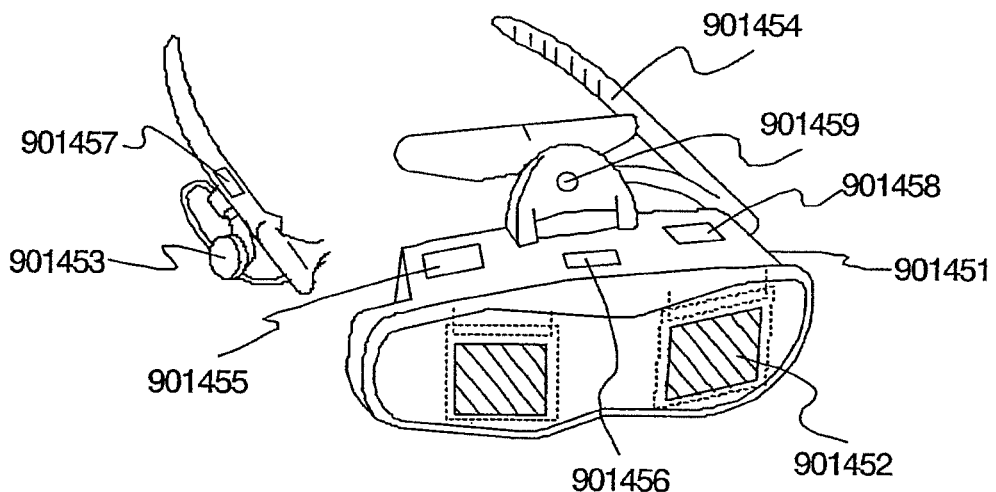

FIG. 96C shows a goggle-type display, which includes a main body 901451, a display portion 901452, an earphone 901453, a support portion 901454, an LED lamp 901459, a speaker 901458, input means (a connection terminal 901455, a sensor 901456 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901457), and the like. The goggle-type display in FIG. 96C can have various functions such as, but not limited to, a function to display an externally obtained image (e.g., a still image, a moving image, and a text image) on the display portion.

Figure 97A:
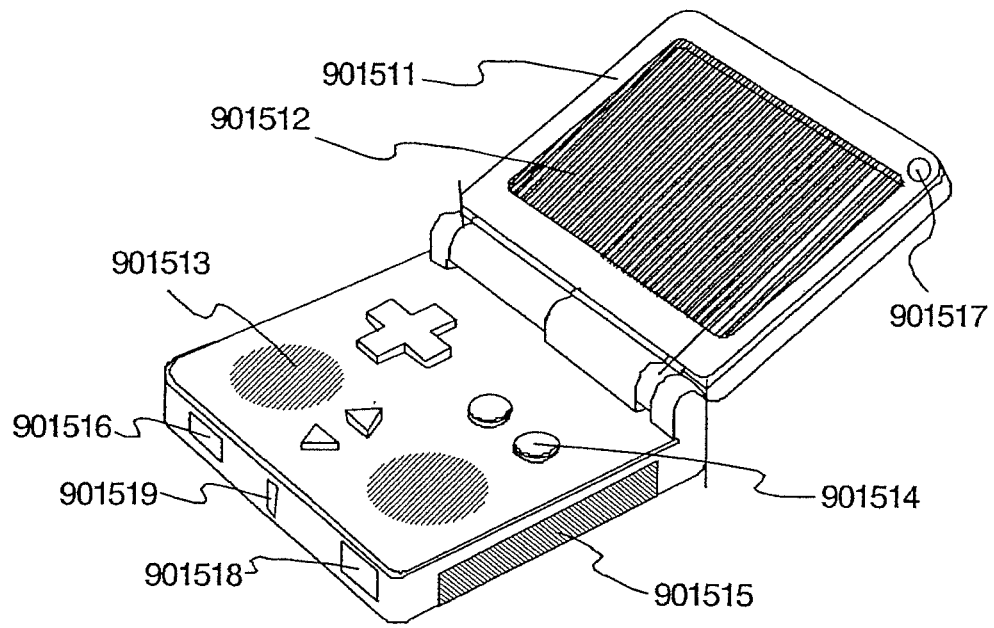
FIGS. 97A and 97B show electronic devices using a semiconductor device according to the invention.

FIG. 97A shows a portable game machine, which includes a housing 901511, a display portion 901512, a speaker portion 901513, a recording medium insert portion 901515, an LED lamp 901519, input means (an operation key 901514, a connection terminal 901516, a sensor 901517 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901518), and the like. The portable game machine in FIG. 97A can have various functions such as, but not limited to, a function to read a program or data stored in the recording medium to display on the display portion; and a function to share information by wireless communication with another portable game machine.

Figure 97B:
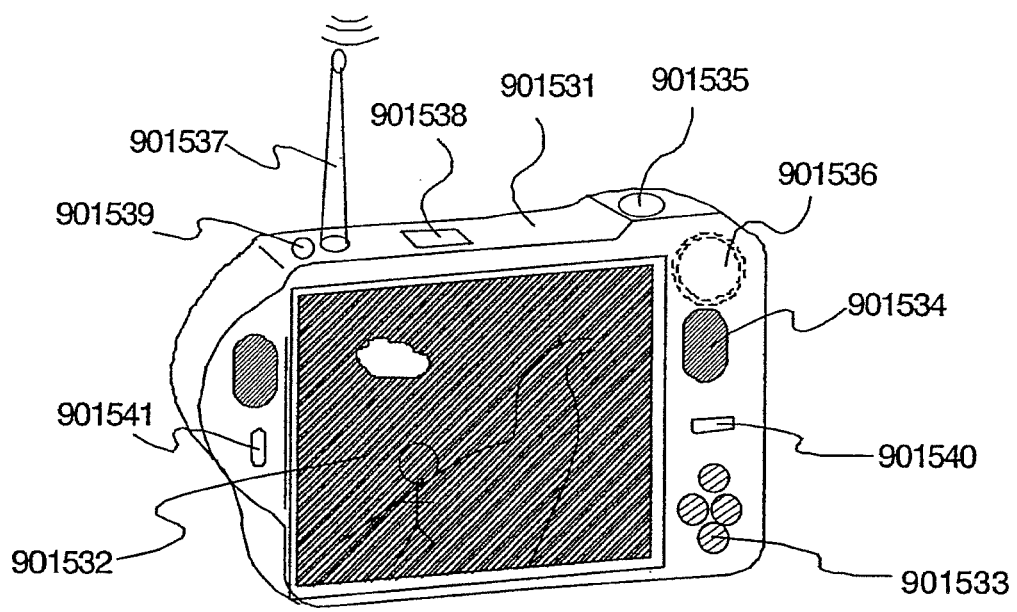

FIG. 97B shows a digital camera having a television reception function, which includes a housing 901531, a display portion 901532, a speaker 901534, a shutter button 901535, an LED lamp 901541, input means (an operation key 901533, an image receiving portion 901536, an antenna 901537, a connection terminal 901538, a sensor 901539 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901540), and the like. The digital camera having a television reception function in FIG. 97B can have various functions such as, but not limited to, a function to photograph a still image or a moving image; a function to automatically adjust the photographed image; a function to obtain various kinds of information from the antenna; a function to store the photographed image or the information obtained from the antenna; and a function to display the photographed image or the information obtained from the antenna on the display portion.

Figure 98:
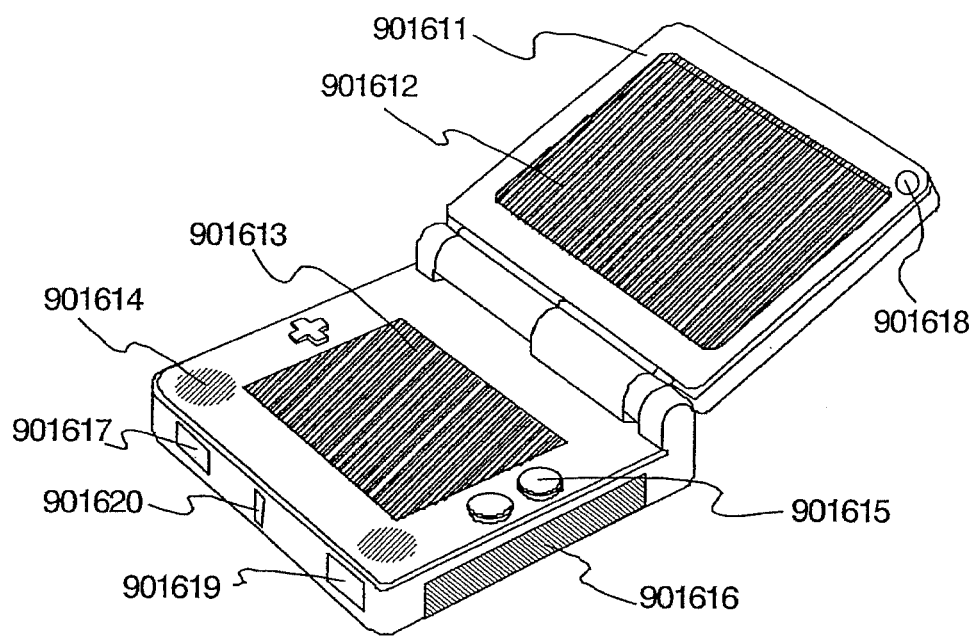
FIG. 98 shows an electronic device using a semiconductor device according to the invention.
Figure 100A:
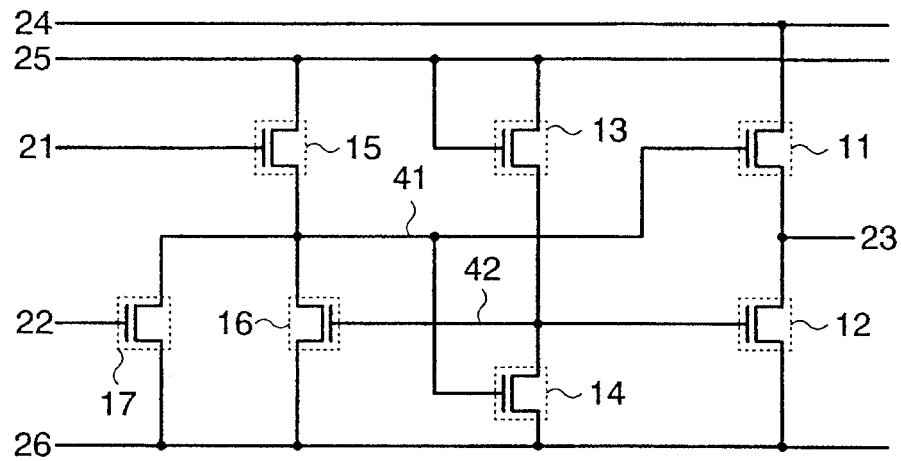
FIG. 100A shows a structure of a conventional flip-flop.
Figure 100B:
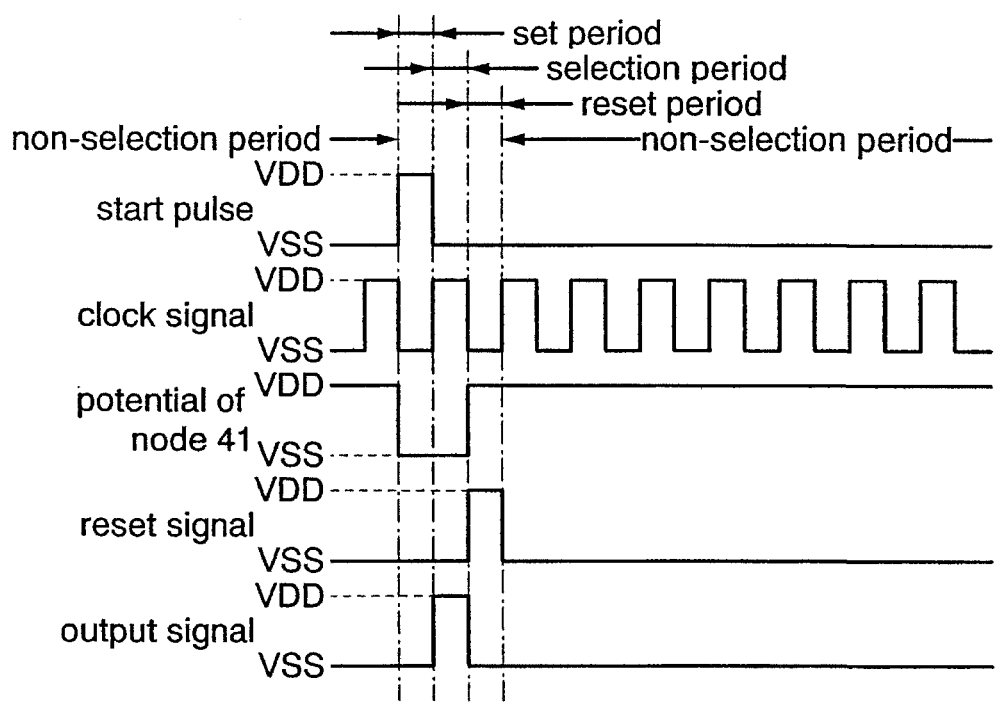
FIG. 100B is a timing chart thereof.

FIG. 98 shows a portable game machine, which includes a housing 901611, a first display portion 901612, a second display portion 901613, a speaker portion 901614, a recording medium insert portion 901616, an LED lamp 901620, input means (an operation key 901615, a connection terminal 901617, a sensor 901418 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901619), and the like. The portable game machine in FIG. 98 can have various functions such as, but not limited to, a function to read a program or data stored in the recording medium to display on the display portion; and a function to share information by wireless communication with another portable game machine.

As shown in FIGS. 89A to 89C, 96A to 96C, 97A, 97B, and 98, the electronic device includes a display portion for displaying some kind of information.

Next, application examples of a semiconductor device are described.

Figure 90:
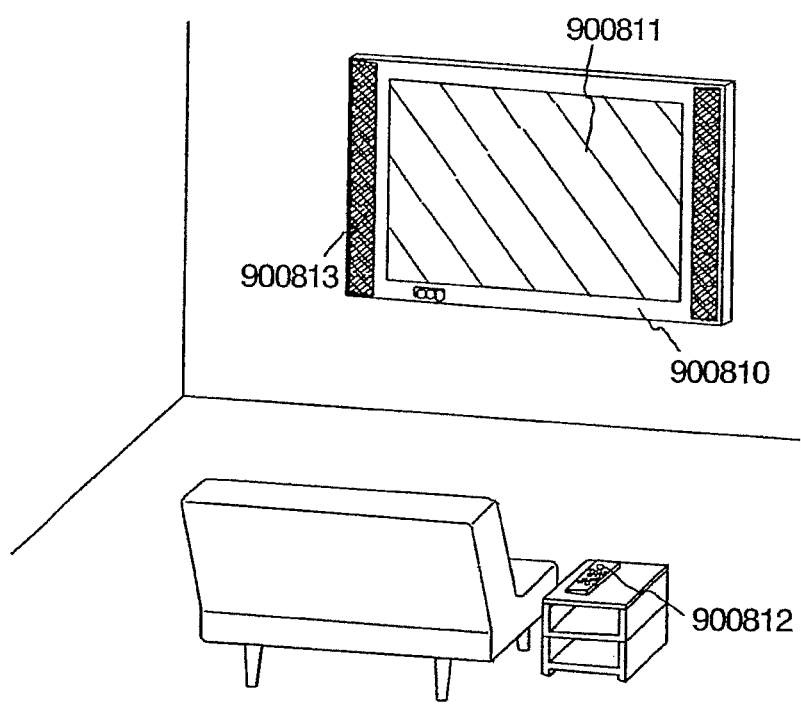
FIG. 90 shows an electronic device using a semiconductor device according to the invention.

FIG. 90 shows an example where a semiconductor device is incorporated in a constructed object. FIG. 90 shows a housing 900810, a display portion 900811, a remote control device 900812 which is an operation portion, a speaker portion 900813, and the like. The semiconductor device is incorporated in the constructed object as a wall-hanging type and can be provided without requiring a large space.

Figure 91:
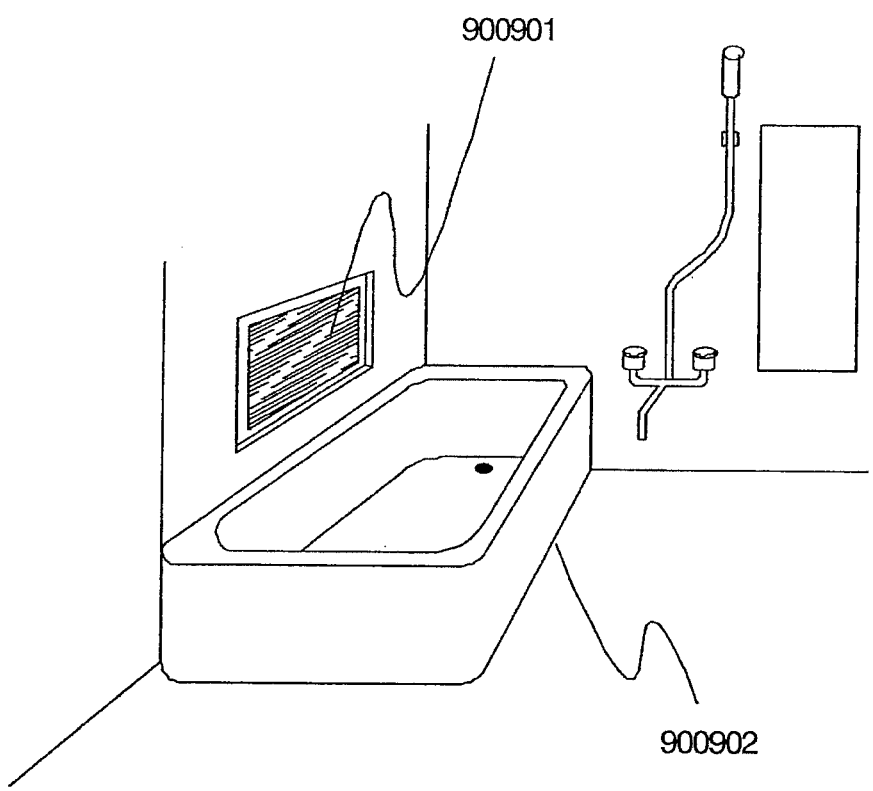
FIG. 91 shows an electronic device using a semiconductor device according to the invention.

FIG. 91 shows another example where a semiconductor device is incorporated in a constructed object. A display panel 900901 is incorporated with a prefabricated bath 900902, and a person who takes a bath can view the display panel 900901. The display panel 900901 has a function to display information by an operation by a person who takes a bath; and a function to be used as an advertisement or an entertainment means.

The semiconductor device can be provided not only to a side wall of the prefabricated bath 900902 as shown in FIG. 91, but also to various places. For example, the semiconductor device can be incorporated with part of a mirror, a bathtub itself, or the like. At this time, a shape of the display panel 900901 may be changed in accordance with a shape of the mirror or the bathtub.

Figure 92:
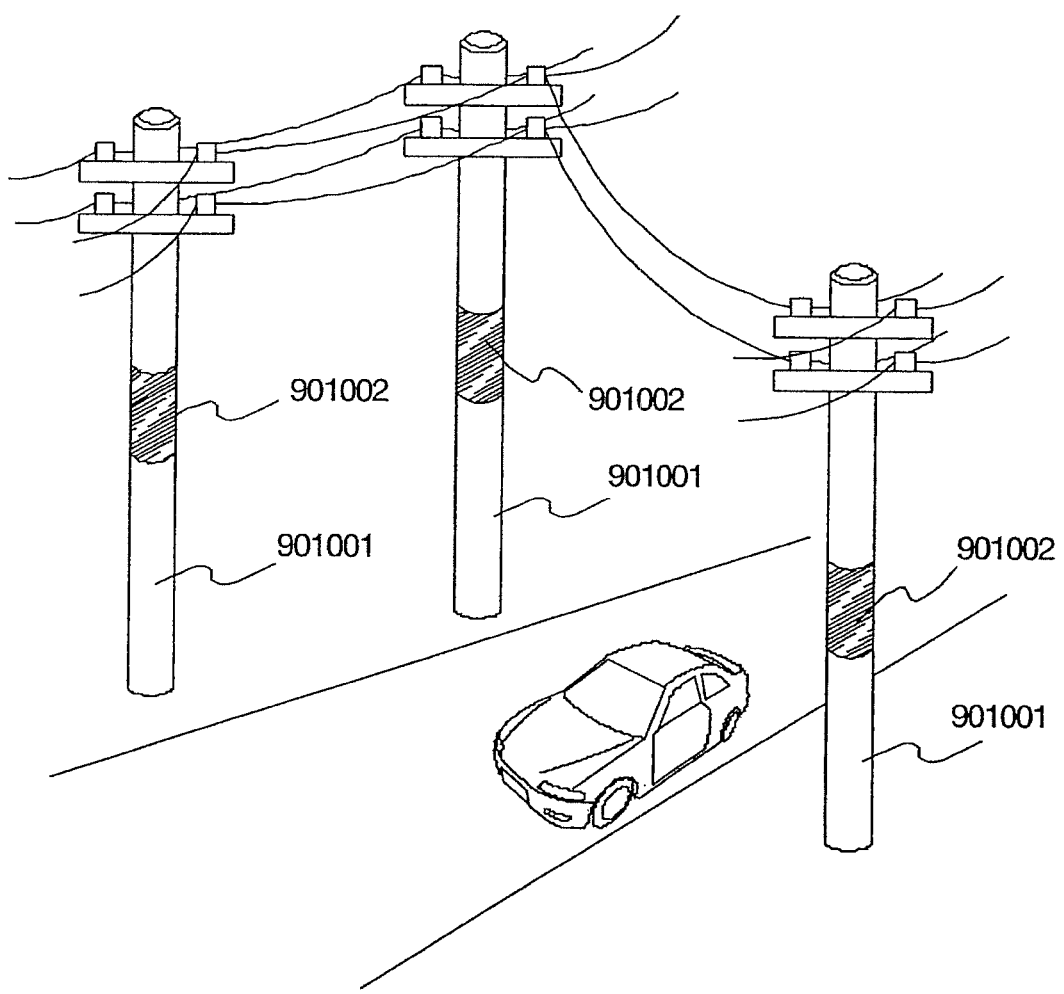
FIG. 92 shows an electronic device using a semiconductor device according to the invention.

FIG. 92 shows another example where a semiconductor device is incorporated in a constructed object. A display panel 901002 is bent and attached to a curved surface of a column-shaped object 901001. Here, a utility pole is described as the column-shaped object 901001.

The display panel 901002 in FIG. 92 is provided at a position higher than a human viewpoint. When the same images are displayed on the display panels 901002 provided in constructed objects which stand together in large numbers outdoors, such as utility poles, advertisement can be performed to unspecified number of viewers. Since it is easy for the display panel 901002 to display the same images and instantly switch images by external control, highly effective information display and advertisement effect can be expected. When provided with self-luminous display elements, the display panel 901002 can be effectively used as a highly visible display medium even at night. When the display panel 901002 is provided in the utility pole, a power supply means for the display panel 901002 can be easily obtained. In an emergency such as disaster, the display panel 901002 can also be used as a means to transmit correct information to victims rapidly.

As the display panel 901002, a display panel in which a switching element such as an organic transistor is provided over a film-shaped substrate, and a display element is driven, so that an image can be displayed can be used, for example.

In this embodiment mode, a wall, a column-shaped object, and a prefabricated bath are shown as examples of a constructed object; however, this embodiment mode is not limited thereto, and various constructed objects can be provided with a semiconductor device.

Next, examples where a semiconductor device is incorporated with a moving object are described.

Figure 93:
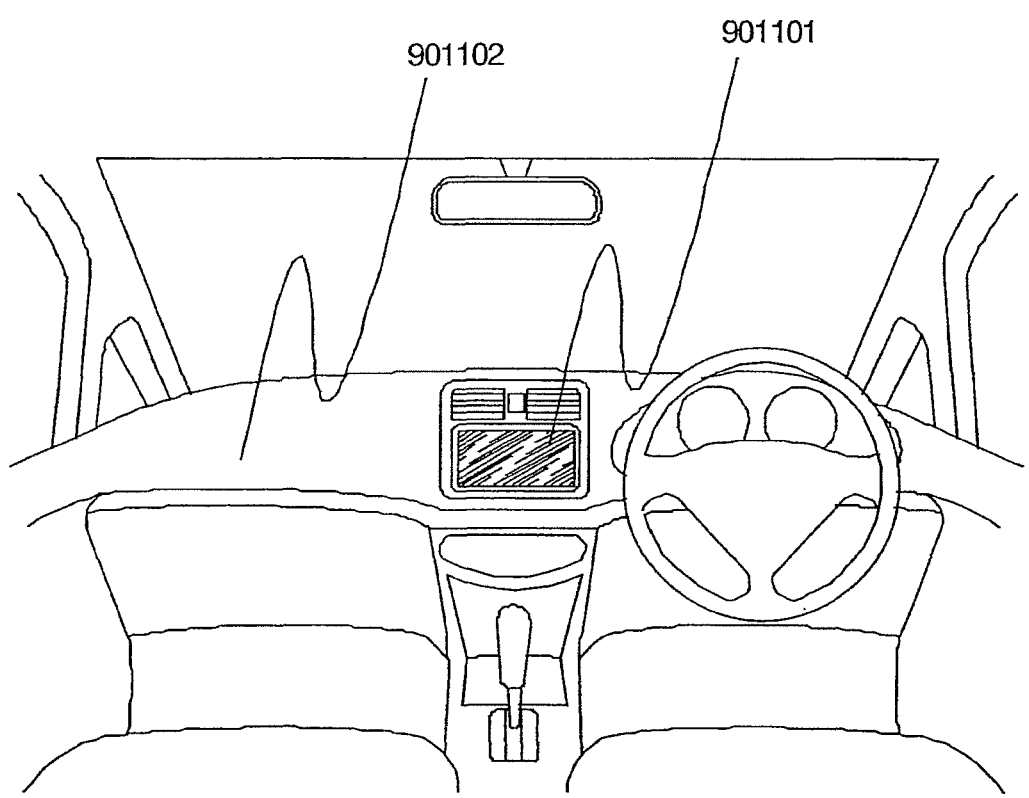
FIG. 93 shows an electronic device using a semiconductor device according to the invention.

FIG. 93 shows an example where a semiconductor device is incorporated with a car. A display panel 901102 is incorporated with a car body 901101, and can display an operation of the car body or information input from inside or outside the car body on demand. Note that a navigation function may be provided.

The semiconductor device can be provided not only to the car body 901101 as shown in FIG. 93, but also to various places. For example, the semiconductor device can be incorporated with a glass window, a door, a steering wheel, a gear shift, a seat, a rear-view mirror, and the like. At this time, a shape of the display panel 901102 may be changed in accordance with a shape of an object provided with the semiconductor device.

Figure 94A:
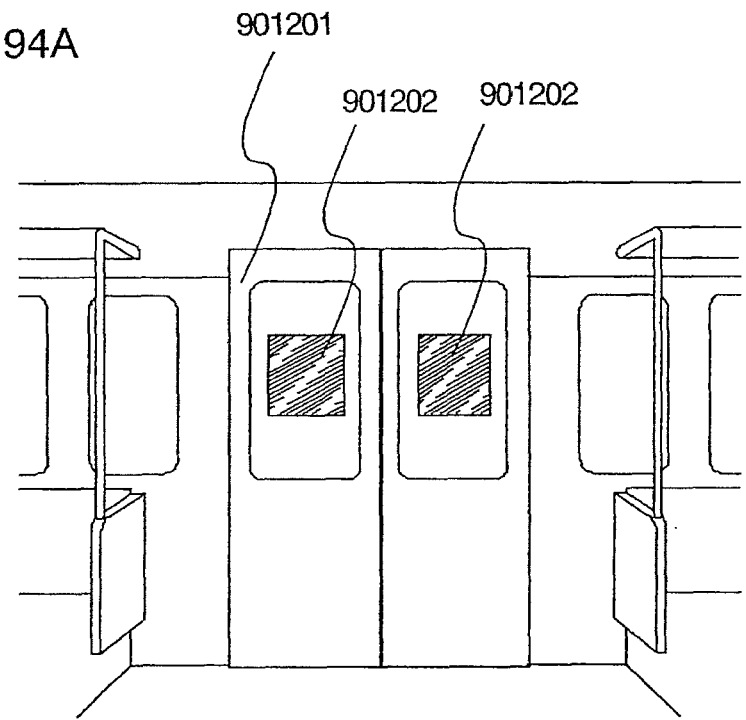
FIGS. 94A and 94B show electronic devices using a semiconductor device according to the invention.
Figure 94B:
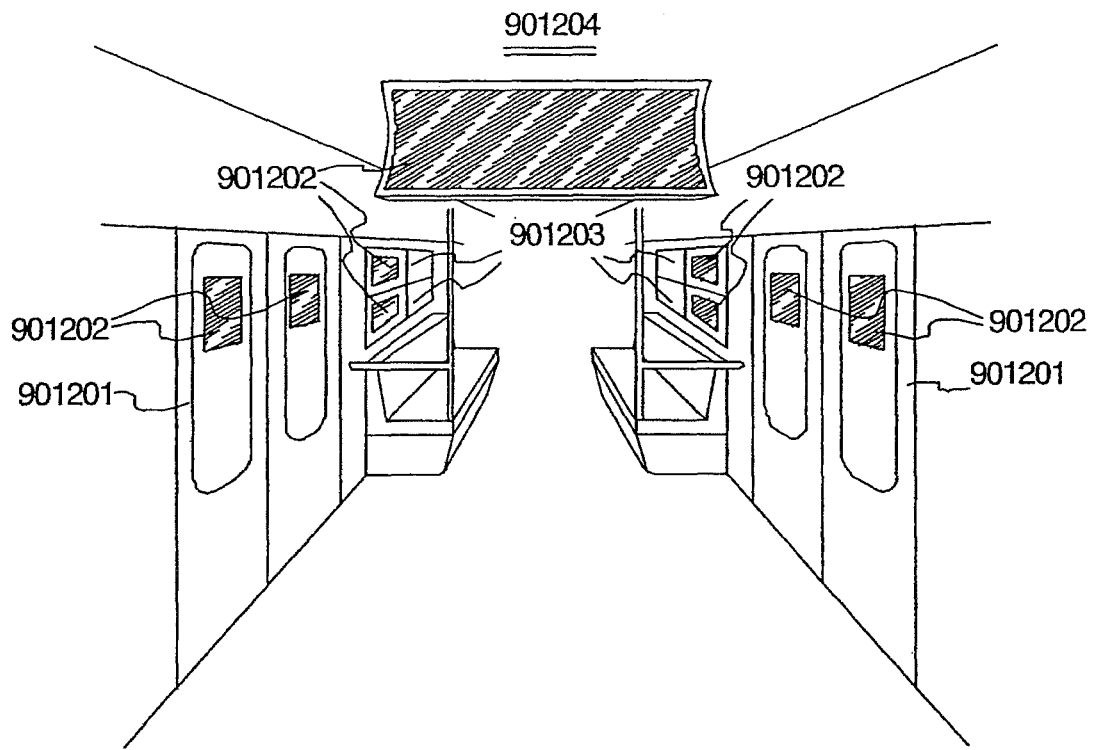

FIGS. 94A and 94B show examples where a semiconductor device is incorporated with a train car are described.

FIG. 94A shows an example where a display panel 901202 is provided in glass of a door 901201 in a train car, which has an advantage compared with a conventional advertisement using paper in that labor cost for changing an advertisement is not necessary. Since the display panel 901202 can instantly switch images displaying on a display portion by an external signal, images on the display panel can be switched in every time period when types of passengers on the train are changed, for example; thus, more effective advertisement effect can be expected.

FIG. 94B shows an example where the display panels 901202 are provided to a glass window 901203 and a ceiling 901204 as well as the glass of the door 901201 in the train car. In this manner, the semiconductor device can be easily provided to a place where the semiconductor device has been difficult to be provided conventionally; thus, effective advertisement effect can be obtained. Further, the semiconductor device can instantly switch images displayed on a display portion by an external signal; thus, cost and time for changing an advertisement can be reduced, and more flexible advertisement management and information transmission can be realized.

The semiconductor device can be provided not only to the door 901201, the glass window 901203, and the ceiling 901204 as shown in FIG. 94, but also to various places. For example, the semiconductor device can be incorporated with a strap, a seat, a handrail, a floor, and the like. At this time, a shape of the display panel 901202 may be changed in accordance with a shape of an object provided with the semiconductor device.

Figure 95A:
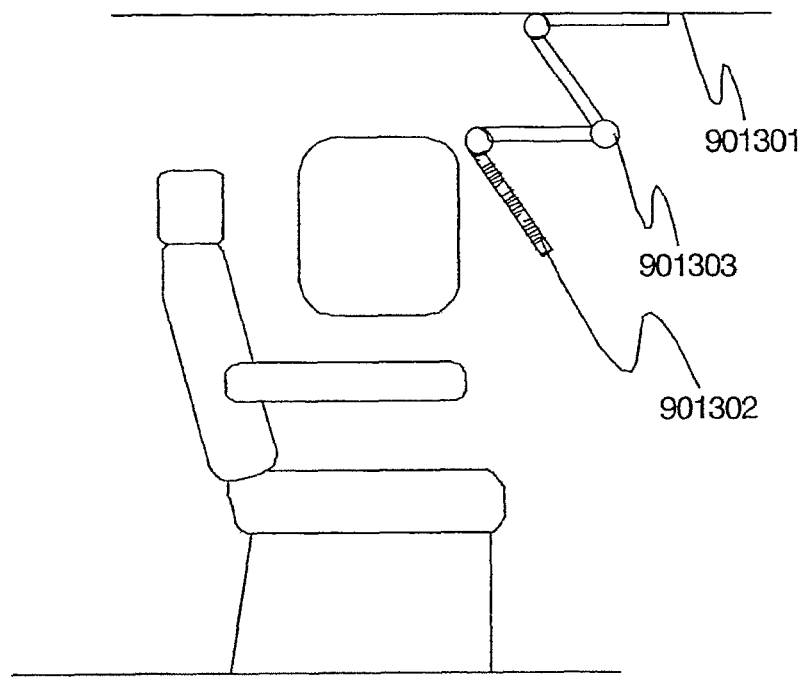
FIGS. 95A and 95B show an electronic device using a semiconductor device according to the invention.
Figure 95B:
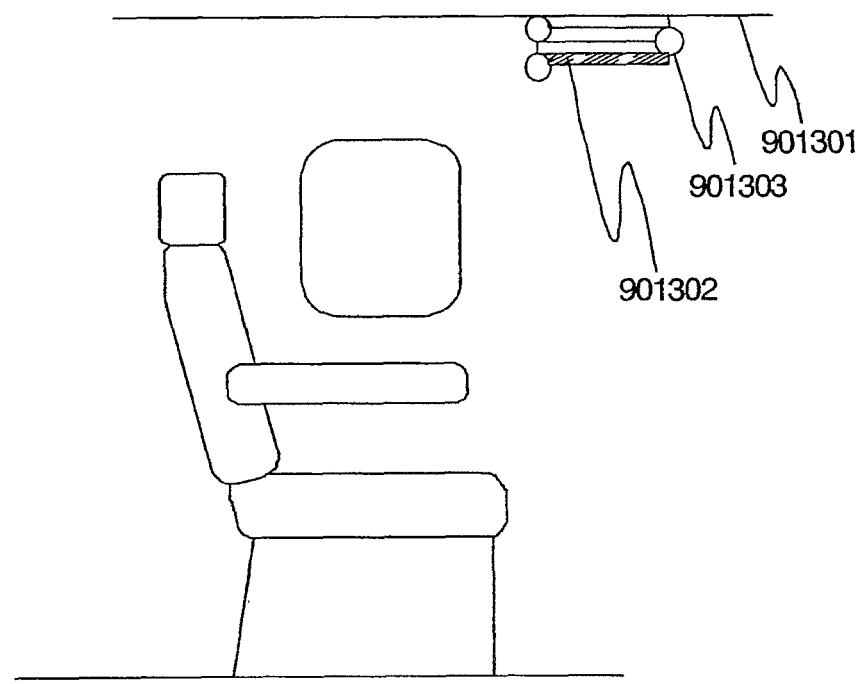

FIGS. 95A and 95B show an example where a semiconductor device is incorporated with a passenger airplane.

FIG. 95A shows a shape of a display panel 901302 attached to a ceiling 901301 above a seat of the passenger airplane when the display panel 901302 is used. The display panel 901302 is incorporated with the ceiling 901301 using a hinge portion 901303, and the passenger can view the display panel 901302 by stretching of the hinge portion 901303. The display panel 901302 has a function to display information by an operation by the passenger and a function to be used as an advertisement or an entertainment means. In addition, when the hinge portion is bent and put in the ceiling 901301 of the airplane as shown in FIG. 95B, safety in taking-off and landing can be assured. Note that when a display element in the display panel is lit in an emergency, the display panel can also be used as an information transmission means and an evacuation light.

The semiconductor device can be provided not only to the ceiling 901301 as shown in FIGS. 95A and 95B, but also to various places. For example, the semiconductor device can be incorporated with a seat, a table attached to a seat, an armrest, a window, and the like. A large display panel which a large number of people can view may be provided at a wall of an airframe. At this time, a shape of the display panel 901302 may be changed in accordance with a shape of an object provided with the semiconductor device.

Note that in this embodiment mode, bodies of a train car, a car, and an airplane are shown as a moving object; however, the invention is not limited thereto, and a semiconductor device can be provided to various objects such as a motorcycle, an four-wheel drive car (including a car, a bus, and the like), a train (including a monorail, a railroad car, and the like), and a vessel. Since a semiconductor device can instantly switch images displayed on a display panel in a moving object by an external signal, a moving object is provided with the semiconductor device, so that the moving object can be used as an advertisement display board for an unspecified number of customers, an information display board in disaster, and the like.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

The contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 21

As described above, this specification includes at least the following invention.

One aspect of the invention is a liquid crystal display device which includes a pixel including a liquid crystal element and a driver circuit. The driver circuit includes a first transistor, a second transistor, a third transistor, a fourth transistor, a fifth transistor, a sixth transistor, a seventh transistor, and an eighth transistor. Note that the following connection relationships are included in at least a part of the driver circuit. A first electrode of the first transistor is electrically connected to a fourth wiring, and a second electrode of the first transistor is electrically connected to a third wiring. A first electrode of the second transistor is electrically connected to a sixth wiring, and a second electrode of the second transistor is electrically connected to a third wiring. A first electrode of the third transistor is electrically connected to a fifth wiring, a second electrode of the third transistor is electrically connected to a gate electrode of the second transistor, and a gate electrode of the third transistor is electrically connected to the fifth wiring. A first electrode of the fourth transistor is electrically connected to the sixth wiring, a second electrode of the fourth transistor is electrically connected to the gate electrode of the second transistor, and a gate electrode of the fourth transistor is electrically connected to a gate electrode of the first transistor. A first electrode of the fifth transistor is electrically connected to the fifth wiring, a second electrode of the fifth transistor is electrically connected to the gate electrode of the first transistor, and a gate electrode of the fifth transistor is electrically connected to a first wiring. A first electrode of the sixth transistor is electrically connected to the sixth wiring, a second electrode of the sixth transistor is electrically connected to the gate electrode of the first transistor, and a gate electrode of the sixth transistor is electrically connected to the gate electrode of the second transistor. A first electrode of the seventh transistor is electrically connected to the sixth wiring, a second electrode of the seventh transistor is electrically connected to the gate electrode of the first transistor, and a gate electrode of the seventh transistor is electrically connected to a second wiring. A first electrode of the eighth transistor is electrically connected to the sixth wiring, a second electrode of the eighth transistor is electrically connected to the gate electrode of the second transistor, and a gate electrode of the eighth transistor is electrically connected to the first wiring.

In the liquid crystal display device which includes the pixel including the liquid crystal element and the driver circuit, a value of a ratio W/L of the channel width W to the channel length L of the first transistor may be the highest among those of W/L of the first to eighth transistors in the driver circuit.

In the liquid crystal display device which includes the pixel including the liquid crystal element and the driver circuit, the value of the ratio W/L of the channel width W to the channel length L of the first transistor may be twice to five times higher than the value of W/L of the fifth transistor in the driver circuit.

In the liquid crystal display device which includes the pixel including the liquid crystal element and the driver circuit, the channel length L of the third transistor may be larger than the channel length L of the fourth transistor.

In the liquid crystal display device which includes the pixel including the liquid crystal element and the driver circuit, a capacitor may be provided between the second electrode and the gate electrode of the first transistor.

In the liquid crystal display device which includes the pixel including the liquid crystal element and the driver circuit, the first to eighth transistors may be n-channel transistors.

In the liquid crystal display device which includes the pixel including the liquid crystal element and the driver circuit, amorphous silicon may be used as semiconductor layers of the first to eighth transistors.

Another aspect of the invention is a liquid crystal display device which includes a pixel including a liquid crystal element, a first driver circuit, and a second driver circuit. The following connection relationships are included in at least part of the first and second driver circuits. The first driver circuit includes a first transistor, a second transistor, a third transistor, a fourth transistor, a fifth transistor, a sixth transistor, a seventh transistor, and an eighth transistor. A first electrode of the first transistor is electrically connected to a fourth wiring, and a second electrode of the first transistor is electrically connected to a third wiring. A first electrode of the second transistor is electrically connected to a sixth wiring, and a second electrode of the second transistor is electrically connected to a third wiring. A first electrode of the third transistor is electrically connected to a fifth wiring, a second electrode of the third transistor is electrically connected to a gate electrode of the second transistor, and a gate electrode of the third transistor is electrically connected to the fifth wiring. A first electrode of the fourth transistor is electrically connected to the sixth wiring, a second electrode of the fourth transistor is electrically connected to the gate electrode of the second transistor, and a gate electrode of the fourth transistor is electrically connected to a gate electrode of the first transistor. A first electrode of the fifth transistor is electrically connected to the fifth wiring, a second electrode of the fifth transistor is electrically connected to the gate electrode of the first transistor, and a gate electrode of the fifth transistor is electrically connected to a first wiring. A first electrode of the sixth transistor is electrically connected to the sixth wiring, a second electrode of the sixth transistor is electrically connected to the gate electrode of the first transistor, and a gate electrode of the sixth transistor is electrically connected to the gate electrode of the second transistor. A first electrode of the seventh transistor is electrically connected to the sixth wiring, a second electrode of the seventh transistor is electrically connected to the gate electrode of the first transistor, and a gate electrode of the seventh transistor is electrically connected to a second wiring. A first electrode of the eighth transistor is electrically connected to the sixth wiring, a second electrode of the eighth transistor is electrically connected to the gate electrode of the second transistor, and a gate electrode of the eighth transistor is electrically connected to the first wiring. In addition, the second driver circuit includes a ninth transistor, a tenth transistor, an eleventh transistor, a twelfth transistor, a thirteenth transistor, a fourteenth transistor, a fifteenth transistor, and a sixteenth transistor. A first electrode of the ninth transistor is electrically connected to a tenth wiring, and a second electrode of the ninth transistor is electrically connected to a ninth wiring. A first electrode of the tenth transistor is electrically connected to a twelfth wiring, and a second electrode of the tenth transistor is electrically connected to the ninth wiring. A first electrode of the eleventh transistor is electrically connected to an eleventh wiring, a second electrode of the eleventh transistor is electrically connected to a gate electrode of the tenth transistor, and a gate electrode of the eleventh transistor is electrically connected to the eleventh wiring. A first electrode of the twelfth transistor is electrically connected to the twelfth wiring, a second electrode of the twelfth transistor is electrically connected to the gate electrode of the tenth transistor, and a gate electrode of the twelfth transistor is electrically connected to a gate electrode of the ninth transistor. A first electrode of the thirteenth transistor is electrically connected to the eleventh wiring, a second electrode of the thirteenth transistor is electrically connected to the gate electrode of the ninth transistor, and a gate electrode of the thirteenth transistor is electrically connected to a seventh wiring. A first electrode of the fourteenth transistor is electrically connected to the twelfth wiring, a second electrode of the fourteenth transistor is electrically connected to the gate electrode of the ninth transistor, and a gate electrode of the fourteenth transistor is electrically connected to the gate electrode of the tenth transistor. A first electrode of the fifteenth transistor is electrically connected to the twelfth wiring, a second electrode of the fifteenth transistor is electrically connected to the gate electrode of the ninth transistor, and a gate electrode of the fifteenth transistor is electrically connected to an eighth wiring. A first electrode of the sixteenth transistor is electrically connected to the twelfth wiring, a second electrode of the sixteenth transistor is electrically connected to the gate electrode of the tenth transistor, and a gate electrode of the sixteenth transistor is electrically connected to the seventh wiring.

In the liquid crystal display device which includes the pixel including the liquid crystal element, the first driver circuit, and the second driver circuit, the fourth wiring and the tenth wiring may be electrically connected, the fifth wiring and the eleventh wiring may be electrically connected, and the sixth wiring and the twelfth wiring may be electrically connected.

In the liquid crystal display device which includes the pixel including the liquid crystal element, the first driver circuit, and the second driver circuit, the fourth wiring and the tenth wiring may be the same wiring, the fifth wiring and the eleventh wiring may be the same wiring, and the sixth wiring and the twelfth wiring may be the same wiring.

In the liquid crystal display device which includes the pixel including the liquid crystal element, the first driver circuit, and the second driver circuit, the third wiring and the ninth wiring may be electrically connected.

In the liquid crystal display device which includes the pixel including the liquid crystal element, the first driver circuit, and the second driver circuit, the third wiring and the ninth wiring may be the same wiring.

In the liquid crystal display device which includes the pixel including the liquid crystal element, the first driver circuit, and the second driver circuit, a value of the ratio W/L of the channel width W to the channel length L of the first transistor may be the highest among those of W/L of the first to eighth transistors, and a value of the ratio W/L of the channel width W to the channel length L of the ninth transistor may be the highest among those of W/L of the ninth to sixteenth transistors.

In the liquid crystal display device which includes the pixel including the liquid crystal element, the first driver circuit, and the second driver circuit, the value of the ratio W/L of the channel width W to the channel length L of the first transistor may be twice to five times higher than the value of W/L of the fifth transistor, and the value of the ratio W/L of the channel width W to the channel length L of the ninth transistor may be twice to five times higher than the value of W/L of the thirteenth transistor.

In the liquid crystal display device which includes the pixel including the liquid crystal element, the first driver circuit, and the second driver circuit, the channel length L of the third transistor may be larger than the channel length L of the fourth transistor, and the channel length L of the eleventh transistor may be larger than the channel length L of the twelfth transistor.

In the liquid crystal display device which includes the pixel including the liquid crystal element, the first driver circuit, and the second driver circuit, a capacitor may be provided between the second electrode and the gate electrode of the first transistor, and a capacitor may be provided between the second electrode and the gate electrode of the ninth transistor.

In the liquid crystal display device which includes the pixel including the liquid crystal element, the first driver circuit, and the second driver circuit, the first to sixteenth transistors may be n-channel transistors.

In the liquid crystal display device which includes the pixel including the liquid crystal element, the first driver circuit, and the second driver circuit, amorphous silicon may be used as semiconductor layers of the first to sixteenth transistors.

Various electronic devices can be provided with any of the aforementioned liquid crystal display devices.

Each liquid crystal display device in this embodiment mode corresponds to the liquid crystal display device disclosed in this specification. Therefore, operation effects similar to those in the other embodiment modes are obtained.

This application is based on Japanese Patent Application serial No. 2006-269905 filed in Japan Patent Office on Sep. 29, 2006, the entire contents of which are hereby incorporated by reference.

What is claimed is:

1. A display device comprising:
a pixel; and
a driver circuit,
wherein the driver circuit includes a first transistor, a second transistor, a third transistor, a fourth transistor, a fifth transistor, a sixth transistor, a seventh transistor, and an eighth transistor;
a first terminal of the first transistor is electrically connected to a fourth wiring, and a second terminal of the first transistor is electrically connected to a third wiring;
a first terminal of the second transistor is electrically connected to a sixth wiring, and a second terminal of the second transistor is electrically connected to the third wiring;
a first terminal of the third transistor is electrically connected to a seventh wiring, a second terminal of the third transistor is electrically connected to a gate of the second transistor, and a gate of the third transistor is electrically connected to the seventh wiring;
a first terminal of the fourth transistor is electrically connected to the sixth wiring, a second terminal of the fourth transistor is electrically connected to the gate of the second transistor, and a gate of the fourth transistor is electrically connected to a gate of the first transistor;
a first terminal of the fifth transistor is electrically connected to a fifth wiring, a second terminal of the fifth transistor is electrically connected to the gate of the first transistor, and a gate of the fifth transistor is electrically connected to a first wiring;
a first terminal of the sixth transistor is electrically connected to the sixth wiring, a second terminal of the sixth transistor is electrically connected to the gate of the first transistor, and a gate of the sixth transistor is electrically connected to the gate of the second transistor;
a first terminal of the seventh transistor is electrically connected to the sixth wiring, a second terminal of the seventh transistor is electrically connected to the gate of the first transistor, and a gate of the seventh transistor is electrically connected to a second wiring; and
a first terminal of the eighth transistor is electrically connected to the sixth wiring, a second terminal of the eighth transistor is electrically connected to the gate of the second transistor, and a gate of the eighth transistor is electrically connected to the first wiring,
wherein a value of a ratio W/L of a channel width W to a channel length L of the first transistor is the highest among values of W/L of the first to eighth transistors.

2. The display device according to claim 1, wherein the value of the ratio W/L of the channel width W to the channel length L of the first transistor is twice to five times higher than the value of W/L of the fifth transistor.

3. The display device according to claim 1, wherein a channel length L of the third transistor is larger than a channel length L of the fourth transistor.

4. The display device according to claim 1, wherein a capacitor is provided between the second terminal and the gate of the first transistor.

5. The display device according to claim 1, wherein the first to eighth transistors are n-channel transistors.

6. The display device according to claim 1, wherein each of the first to eighth transistors contains an amorphous silicon layer.

7. The display device according to claim 1, wherein each of the first to eighth transistors contains an amorphous InGaZnO layer.

8. The display device according to claim 1, wherein the display device is one of a liquid crystal display device and an EL display device.

9. The display device according to claim 1, wherein the display device is incorporated in one selected from the group consisting of a camera, a computer, an image reproducing device, a goggle-type display, and a game machine.

10. A computer comprising:
a main body including a keyboard and an LED lamp; and
a housing including a display portion, the display portion including a pixel and a driver circuit,
wherein the driver circuit includes a first transistor, a second transistor, a third transistor, a fourth transistor, a fifth transistor, a sixth transistor, a seventh transistor, and an eighth transistor;
a first terminal of the first transistor is electrically connected to a fourth wiring, and a second terminal of the first transistor is electrically connected to a third wiring;
a first terminal of the second transistor is electrically connected to a sixth wiring, and a second terminal of the second transistor is electrically connected to the third wiring;
a first terminal of the third transistor is electrically connected to a seventh wiring, a second terminal of the third transistor is electrically connected to a gate of the second transistor, and a gate of the third transistor is electrically connected to the seventh wiring;
a first terminal of the fourth transistor is electrically connected to the sixth wiring, a second terminal of the fourth transistor is electrically connected to the gate of the second transistor, and a gate of the fourth transistor is electrically connected to a gate of the first transistor;
a first terminal of the fifth transistor is electrically connected to a fifth wiring, a second terminal of the fifth transistor is electrically connected to the gate of the first transistor, and a gate of the fifth transistor is electrically connected to a first wiring;
a first terminal of the sixth transistor is electrically connected to the sixth wiring, a second terminal of the sixth transistor is electrically connected to the gate of the first transistor, and a gate of the sixth transistor is electrically connected to the gate of the second transistor;
a first terminal of the seventh transistor is electrically connected to the sixth wiring, a second terminal of the seventh transistor is electrically connected to the gate of the first transistor, and a gate of the seventh transistor is electrically connected to a second wiring; and
a first terminal of the eighth transistor is electrically connected to the sixth wiring, a second terminal of the eighth transistor is electrically connected to the gate of the second transistor, and a gate of the eighth transistor is electrically connected to the first wiring,
wherein a value of a ratio W/L of a channel width W to a channel length L of the first transistor is the highest among values of W/L of the first to eighth transistors.

11. The computer according to claim 10, wherein the value of the ratio W/L of the channel width W to the channel length L of the first transistor is twice to five times higher than the value of W/L of the fifth transistor.

12. The computer according to claim 10, wherein a channel length L of the third transistor is larger than a channel length L of the fourth transistor.

13. The computer according to claim 10, wherein a capacitor is provided between the second terminal and the gate of the first transistor.

14. The computer according to claim 10, wherein the first to eighth transistors are n-channel transistors.

15. The computer according to claim 10, wherein each of the first to eighth transistors contains an amorphous silicon layer.

16. The computer according to claim 10, wherein each of the first to eighth transistors contains an amorphous InGaZnO layer.

* * * * *

UNITED STATES PATENT AND TRADEMARK OFFICE
CERTIFICATE OF CORRECTION

PATENT NO. : 8,520,159 B2
APPLICATION NO. : 13/174895
DATED : August 27, 2013
INVENTOR(S) : Atsushi Umezaki and Hiroyuki Miyake Page 1 of 1

It is certified that error appears in the above-identified patent and that said Letters Patent is hereby corrected as shown below:

In the Specifications

Column 49, line 62, replace "1539A" with --39A--;

Column 50, line 33, replace "40Q" with --40G--;

Column 60, line 12, replace "Al" with --Al--;

Column 88, line 28, replace "Ta1" with --Ta3--;

Column 95, line 56, replace "MN" with --AlN--;

Column 95, line 66, replace "CO" with --Cl--.

Signed and Sealed this
Twenty-eighth Day of January, 2014

Michelle K. Lee
*Deputy Director of the United States Patent and Trademark Office*